US012006336B2

(12) United States Patent
Geum et al.

(10) Patent No.: US 12,006,336 B2
(45) Date of Patent: Jun. 11, 2024

(54) POLYCYCLIC COMPOUND AND ORGANIC LIGHT-EMITTING DEVICE COMPRISING SAME

(71) Applicant: LG CHEM, LTD., Seoul (KR)

(72) Inventors: Sujeong Geum, Daejeon (KR); Dong Hoon Lee, Daejeon (KR); Dongheon Kim, Daejeon (KR); Ki Kon Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 672 days.

(21) Appl. No.: 15/734,323

(22) PCT Filed: Jul. 24, 2019

(86) PCT No.: PCT/KR2019/009167

§ 371 (c)(1),
(2) Date: Dec. 2, 2020

(87) PCT Pub. No.: WO2020/022770

PCT Pub. Date: Jan. 30, 2020

(65) Prior Publication Data

US 2021/0277026 A1 Sep. 9, 2021

(30) Foreign Application Priority Data

Jul. 24, 2018 (KR) ........................ 10-2018-0085936

(51) Int. Cl.
*H10K 85/60* (2023.01)
*C07F 5/02* (2006.01)
(Continued)

(52) U.S. Cl.
CPC ......... *C07F 5/027* (2013.01); *H10K 85/6572* (2023.02); *H10K 50/11* (2023.02); *H10K 50/15* (2023.02); *H10K 2101/20* (2023.02)

(58) Field of Classification Search
CPC ............................ H10K 2101/20; C07F 5/027
See application file for complete search history.

(56) References Cited

U.S. PATENT DOCUMENTS

2015/0236274 A1* 8/2015 Hatakeyama ........ H10K 85/322 548/405
2018/0069182 A1 3/2018 Hatakeyama et al.
(Continued)

FOREIGN PATENT DOCUMENTS

CN 107266484 10/2017
CN 107501311 12/2017
(Continued)

*Primary Examiner* — Sean M DeGuire
(74) *Attorney, Agent, or Firm* — Bryan Cave Leighton Paisner LLP

(57) ABSTRACT

Provided is a compound of Formula 1:

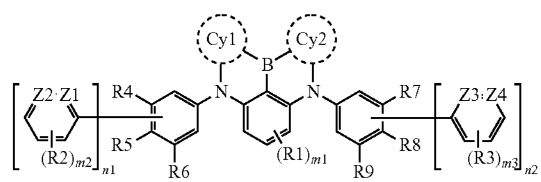

wherein:
Cy1 and Cy2 are each independently an aromatic hydrocarbon ring or aromatic hetero ring that is substituted or unsubstituted;
R1 to R9 are each independently hydrogen, deuterium, a halogen group, a cyano group, a nitro group, or a substituted or unsubstituted: silyl, alkyl, alkoxy, cycloalkyl, aryl, amine, or heterocyclic group;
m1 is 0 to 3, and m2 and m3 are each 0 to 5;
when m1 to m3 are each 2 or more, the substituents in the parenthesis are the same or different; and
(Continued)

Z1 to Z4 are each independently CH or N, and n1 and n2 are each 0 to 2, and when Z1 to Z4 are each CH, n1+n2 is 2 to 4, and when one or more of Z1 to Z4 are N, n1+n2 is 1 to 4, and an organic light emitting device including the same.

18 Claims, 4 Drawing Sheets

(51) Int. Cl.

| | |
|---|---|
| *H10K 50/11* | (2023.01) |
| *H10K 50/15* | (2023.01) |
| *H10K 101/20* | (2023.01) |

(56) References Cited

U.S. PATENT DOCUMENTS

| | | | | |
|---|---|---|---|---|
| 2018/0094000 | A1 | 4/2018 | Hatakeyama et al. | |
| 2018/0301629 | A1 | 10/2018 | Hatakeyama et al. | |
| 2019/0027694 | A1 | 1/2019 | Hatakeyama et al. | |
| 2019/0207112 | A1 | 7/2019 | Hatakeyama et al. | |
| 2019/0386220 | A1 | 12/2019 | Kita et al. | |
| 2020/0176679 | A1* | 6/2020 | Jeong | C09K 11/06 |
| 2020/0190116 | A1 | 6/2020 | Hatakeyama et al. | |

FOREIGN PATENT DOCUMENTS

| | | | | |
|---|---|---|---|---|
| JP | 2017-126606 | | 7/2017 | |
| KR | 2017039020 | A * | 4/2017 | C07D 307/91 |
| KR | 10-2017-0130434 | | 11/2017 | |
| KR | 10-2017-0130435 | | 11/2017 | |
| KR | 10-1876763 | | 7/2018 | |
| WO | 2016-152418 | | 9/2016 | |
| WO | 2017-126443 | | 7/2017 | |
| WO | 2017-164093 | | 9/2017 | |
| WO | 2017-188111 | | 11/2017 | |

* cited by examiner

POLYCYCLIC COMPOUND AND ORGANIC LIGHT-EMITTING DEVICE COMPRISING SAME

CROSS-REFERENCE TO RELATED APPLICATION(S)

This application is a National Stage Application of International Application No. PCT/KR2019/009167 filed on Jul. 24, 2019, which claims priority to and the benefit of Korean Patent Application No. 10-2018-0085936 filed in the Korean Intellectual Property Office on Jul. 24, 2018, the entire contents of which are incorporated herein by reference.

TECHNICAL FIELD

The present specification relates to a compound and an organic light emitting device including the same.

BACKGROUND

In the present specification, an organic light emitting device is a light emitting device using an organic semiconductor material, and requires an exchange of holes and/or electrons between electrodes and organic semiconductor materials. The organic light emitting device can be roughly divided into the following two light emitting devices depending on the operation principle. The first organic light emitting device is a light emitting device in which an exciton is formed in an organic material layer by a photon that flows from an external light source to the device, the exciton is separated into electrons and holes, and the electrons and the holes are each transferred to different electrodes and used as a current source (voltage source). The second organic light emitting device is a light emitting device in which holes and/or electrons are injected into organic semiconductor material layers forming an interface with an electrode by applying a voltage or current to two or more electrodes, and the device is operated by the injected electrons and holes.

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer has in many cases a multi-layered structure composed of different materials in order to improve the efficiency and stability of the organic light emitting device, and for example, can be composed of a hole injection layer, a hole transport layer, a light emitting layer, an electron blocking layer, an electron transport layer, an electron injection layer, and the like. In such a structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls down again to a ground state. Such an organic light emitting device has been known to have characteristics such as self-emission, high brightness, high efficiency, a low driving voltage, a wide viewing angle, and high contrast.

In an organic light emitting device, materials used as an organic material layer can be classified into a light emitting material and a charge transport material, for example, a hole injection material, a hole transport material, an electron blocking material, an electron transport material, an electron injection material, and the like depending on the function. The light emitting materials include blue, green, and red light emitting materials according to the light emitting color, and yellow and orange light emitting materials required for implementing a much better natural color.

Furthermore, a host/dopant system can be used as a light emitting material for the purpose of enhancing color purity and light emitting efficiency through energy transfer. The principle is that when a small amount of dopant which has a smaller energy band and better light emitting efficiency than those of a host mainly constituting a light emitting layer is mixed with the light emitting layer, the excitons generated by the host are transported to the dopant to emit light with high efficiency. In this case, it is possible to obtain light with a desired wavelength according to the type of dopant used because the wavelength of the host moves to the wavelength range of the dopant.

In order to fully exhibit the above-described excellent characteristics of the organic light emitting device, a material constituting an organic material layer in a device, for example, a hole injection material, a hole transport material, a light emitting material, an electron blocking material, an electron transport material, an electron injection material, and the like need to be supported by stable and efficient materials, so that there is a continuous need for developing a new material.

In a host and dopant system that emits general fluorescence, singlet energy of a host is transferred to a dopant in the form of light energy through foster energy transfer. The excited singlet energy of the energy-transferred dopant emits fluorescent light while becoming singlet energy in the ground state. In contrast, in the case of a compound having a small triplet energy—singlet energy value ($\Delta E_{ST}$), the triplet energy of the compound can be partially harvested as a singlet energy by a reverse intersystem crossing (hereinafter, referred to as 'RISC'). When the compound is applied to an organic light emitting device, the efficiency of the device is increased.

In general, an exciton in a singlet state will fall quickly from the excited state to the ground state while emitting light, but the excited state lifetime of the exciton in the triplet state is prolonged more than that of the exciton in the singlet state, and thus can be recovered as the RISC, but can also be annihilated in a non-emission form.

PRIOR ART DOCUMENT (Patent Document 1) Japanese Patent Application Laid-Open No. 2017-126606

BRIEF DESCRIPTION OF INVENTION

Technical Problem

The present specification describes a compound and an organic light emitting device including the same.

Technical Solution

An exemplary embodiment of the present specification provides a compound of Formula 1:

Formula 1

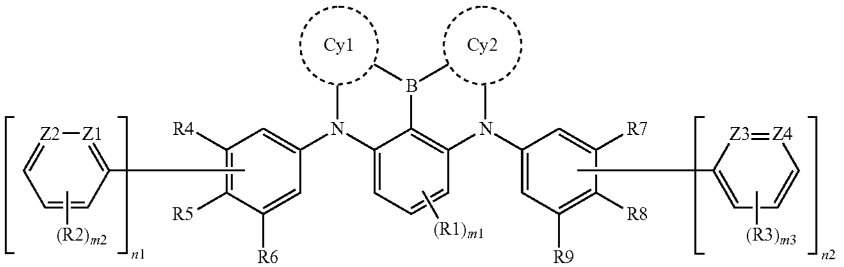

In Formula 1:

Cy1 and Cy2 are the same as or different from each other, and are each independently a substituted or unsubstituted aromatic hydrocarbon ring, or a substituted or unsubstituted aromatic hetero ring;

R1 to R9 are the same as or different from each other, and are each independently hydrogen, deuterium, a halogen group, a cyano group, a nitro group, a substituted or unsubstituted silyl group, a substituted or unsubstituted alkyl group, a substituted or unsubstituted alkoxy group, a substituted or unsubstituted cycloalkyl group, a substituted or unsubstituted aryl group, a substituted or unsubstituted amine group, or a substituted or unsubstituted heterocyclic group;

m1 is an integer from 0 to 3, m2 and m3 are each an integer from 0 to 5, and when m1 to m3 are each 2 or more, two or more substituents in the parenthesis are the same as or different from each other; and Z1 to Z4 are the same as or different from each other, and are each independently CH or N, and n1 and n2 are each an integer from 0 to 2, and when Z1 to Z4 are each CH, n1+n2 is an integer from 2 to 4, and when one or more of Z1 to Z4 are N, n1+n2 is an integer from 1 to 4.

Further, the present invention provides an organic light emitting device including: a first electrode; a second electrode provided to face the first electrode; and an organic material layer having one or more layers provided between the first electrode and the second electrode, in which one or more layers of the organic material layer include the above-described compound.

Advantageous Effects

The compound described in the present specification can be used as a material for an organic material layer of an organic light emitting device.

When an organic light emitting device including the compound according to an exemplary embodiment of the present specification is manufactured, it is possible to obtain an organic light emitting device having excellent light emitting efficiency, a low driving voltage, high efficiency, and a long service life.

EXPLANATION OF REFERENCE NUMERALS AND SYMBOLS

Figure 1:
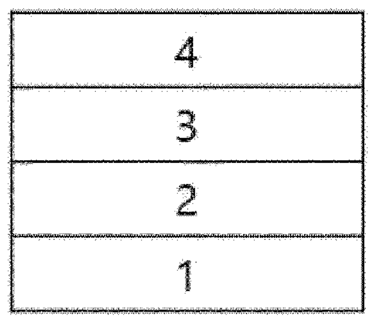
FIG. 1 illustrates an example of an organic light emitting device composed of a substrate 1, a positive electrode 2, a hole transport layer 6, a light emitting layer 3, and a negative electrode 4.

1: Substrate
2: Positive electrode
3: Light emitting layer
4: Negative electrode
5: Hole injection layer
6: Hole transport layer
6*a*: First hole transport layer
6*b*: Second hole transport layer
7: Light emitting layer
8: Layer which simultaneously injects and transports electrons

DETAILED DESCRIPTION

Hereinafter, the present specification will be described in more detail.

The present specification provides a compound of the following Formula 1. Since

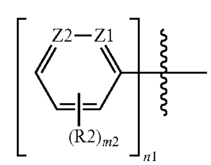

and/or

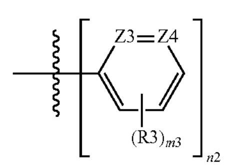

are/is bonded to an ortho position centered on a carbon atom that is linked to N of a core structure in the compound of the following Formula 1, aggregation of molecules is prevented by minimizing the stacking between molecules, so that it is possible to expect high efficiency when the compound of the following Formula 1 is applied to an organic light emitting device.

In particular, the case where all of Z1 to Z4 and n1+n2 of a substituent that is bonded to the ortho position centered on the carbon atom that is linked to N of the core structure in the compound of the following Formula 1 are CH and 2 or more, respectively, has an effect of increasing the efficiency of the device as described above by preventing the intermolecular interactions as compared to the case where n1+n2 is 0 or 1. Further, in the case where one or more of Z1 to Z4 and n1+n2 of the compound of the following Formula 1 are N and an integer from 1 to 4, respectively, an unshared electron pair of a nitrogen atom (N) and an empty orbital of a boron atom (B) are coordinately bonded to each other to enhance the thermal and chemical stability of a material including the boron atom (B) as compared to the case where n1+n2 is 0, so that when the compound is applied to a device, the service life of the device is increased.

Specifically, the molecule has a structurally increased volume and an empty orbital. The stability of the core itself is enhanced by introducing a substituent with a large steric hindrance around boron having a relatively Lewis acid character, thereby exhibiting a long service life characteristic of a device. In addition, the intermolecular (dopant-dopant and dopant-host) interactions can be inhibited by introducing a substituent having a large volume. It is possible to prevent the annihilation of excitons by interrupting the Dexter energy transfer between the triplet of a host and a dopant.

Furthermore, the compound of Formula 1 is a compound having a triplet energy-singlet energy value ($\Delta E_{ST}$) of 0.4 eV or less, and an exciton in a triplet state can be additionally recovered by the RISC mechanism.

When a compound of the following Formula 1 is used in an organic material layer of an organic light emitting device, efficiency and service life characteristics of the organic light emitting device are improved.

Formula 1

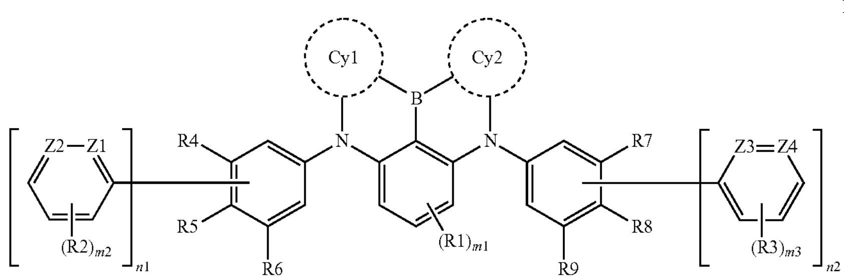

In Formula 1:

Cy1 and Cy2 are the same as or different from each other, and are each independently a substituted or unsubstituted aromatic hydrocarbon ring, or a substituted or unsubstituted aromatic hetero ring;

R1 to R9 are the same as or different from each other, and are each independently hydrogen, deuterium, a halogen group, a cyano group, a nitro group, a substituted or unsubstituted silyl group, a substituted or unsubstituted alkyl group, a substituted or unsubstituted alkoxy group, a substituted or unsubstituted cycloalkyl group, a substituted or unsubstituted aryl group, a substituted or unsubstituted amine group, or a substituted or unsubstituted heterocyclic group;

m1 is an integer from 0 to 3, m2 and m3 are each an integer from 0 to 5, and when m1 to m3 are each 2 or more, two or more substituents in the parenthesis are the same as or different from each other; and Z1 to Z4 are the same as or different from each other, and are each independently CH or N, and n1 and n2 are each an integer from 0 to 2, and when Z1 to Z4 are each CH, n1+n2 is an integer from 2 to 4, and when one or more of Z1 to Z4 are N, n1+n2 is an integer from 1 to 4.

When one part "includes" one constituent element in the present specification, unless otherwise specifically described, this does not mean that another constituent element is excluded, but means that another constituent element can be further included.

When one member is disposed "on" another member in the present specification, this includes not only a case where the one member is brought into contact with another member, but also a case where still another member is present between the two members.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term "substituted or unsubstituted" means being substituted with one or two or more substituents selected from the group consisting of deuterium (-D), a halogen group, a cyano group (—CN), a nitro group, a hydroxyl group, a silyl group, a boron group, an alkyl group, an alkoxy group, a cycloalkyl group, an aryl group, an amine group, and a heterocyclic group, being substituted with a substituent to which two or more substituents among the above-exemplified substituents are linked, or having no substituent. For example, "the substituent to which two or more substituents are linked" can be a terphenyl group. That is, the terphenyl group can also be an aryl group, and can be interpreted as a substituent to which three phenyl groups are linked.

Examples of the substituents will be described below, but are not limited thereto.

In the present specification, examples of a halogen group include fluorine (—F), chlorine (—Cl), bromine (—Br) or iodine (—I).

In the present specification, a silyl group can be —Si-$Y_aY_bY_c$, and $Y_a$, $Y_b$, and $Y_c$ can be each hydrogen, a substituted or unsubstituted alkyl group, a substituted or unsubstituted cycloalkyl group, or a substituted or unsubstituted aryl group. Specific examples of the silyl group include a trimethylsilyl group, a triethylsilyl group, a tert-butyldimethylsilyl group, a vinyldimethylsilyl group, a propyldimethylsilyl group, a dimethylphenylsilyl group, a triphenylsilyl group, a diphenylsilyl group, a phenylsilyl group, and the like, but are not limited thereto.

In the present specification, a boron group can be —$BY_dY_e$, and $Y_d$ and $Y_e$ can be each hydrogen, a substituted or unsubstituted alkyl group, a substituted or unsubstituted cycloalkyl group, or a substituted or unsubstituted aryl group. Specific examples of the boron group include a trimethylboron group, a triethylboron group, a tert-butyldimethylboron group, a triphenylboron group, a phenylboron group, and the like, but are not limited thereto.

In the present specification, the alkyl group can be straight-chained or branched, and the number of carbon atoms thereof is not particularly limited, but is preferably 1 to 60. According to an exemplary embodiment, the number of carbon atoms of the alkyl group is 1 to 30. According to another exemplary embodiment, the number of carbon atoms of the alkyl group is 1 to 20. According to still another exemplary embodiment, the number of carbon atoms of the alkyl group is 1 to 10. Specific examples of the alkyl group include a methyl group, an ethyl group, a propyl group, an n-propyl group, an isopropyl group, a butyl group, an n-butyl group, an isobutyl group, a tert-butyl group, a pentyl group, an n-pentyl group, a hexyl group, an n-hexyl group, a heptyl group, an n-heptyl group, an octyl group, an n-octyl group, and the like, but are not limited thereto.

In the present specification, the number of carbon atoms of the alkoxy group is not particularly limited, but is preferably 1 to 60. According to an exemplary embodiment, the number of carbon atoms of the alkoxy group is 1 to 30. According to another exemplary embodiment, the number of carbon atoms of the alkoxy group is 1 to 20. According to still another exemplary embodiment, the number of carbon atoms of the alkoxy group is 1 to 10. Specific examples of the alkoxy group include a methoxy group, an ethoxy group, a propoxy group, a butoxy group, and the like, but are not limited thereto.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to still another exemplary embodiment, the number of carbon atoms of the cycloalkyl group is 3 to 6. Specific examples thereof include a cyclopropyl group, a cyclobutyl group, a cyclopentyl group, a cyclohexyl group, a cycloheptyl group, a cyclooctyl group, and the like, but are not limited thereto.

In the present specification, an aryl group is not particularly limited, but has preferably 6 to 60 carbon atoms, and can be a monocyclic aryl group or a polycyclic aryl group. According to an exemplary embodiment, the number of carbon atoms of the aryl group is 6 to 30. According to another exemplary embodiment, the number of carbon atoms of the aryl group is 6 to 20. Examples of the monocyclic aryl group include the aryl group can be a phenyl group, a biphenyl group, a terphenyl group, a quaterphenyl group, and the like, but are not limited thereto. Examples of the polycyclic aryl group include a naphthyl group, an anthracenyl group, a phenanthrenyl group, a pyrenyl group, a perylenyl group, a triphenyl group, a chrysenyl group, a fluorenyl group, a triphenylenyl group, and the like, but are not limited thereto.

In the present specification, a fluorenyl group can be substituted, and two substituents can be bonded to each other to form a spiro structure.

When the fluorenyl group is substituted, the substituent can be a spirofluorenyl group such as a spiro fluorenyl group such as

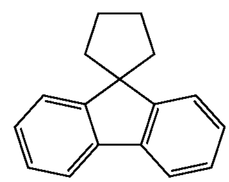

and

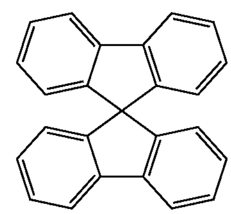

, and a substituted fluorenyl group such as

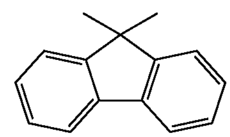

(a 9,9-dimethylfluorenyl group) and

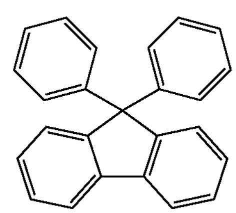 [SMILES: c1ccc(C2(c3ccccc3)c3ccccc3-c3ccccc32)cc1]

(a 9,9-diphenylfluorenyl group). However, the substituent is not limited thereto.

In the present specification, a heterocyclic group is a cyclic group including one or more of N, O, S, and Se as a heteroatom, and the number of carbon atoms thereof is not particularly limited, but is preferably 2 to 60. According to an exemplary embodiment, the number of carbon atoms of the heterocyclic group is 2 to 30. Examples of the heterocyclic group include a pyridine group, a pyrrole group, a pyrimidine group, a quinoline group, a pyridazinyl group, a furan group, a thiophene group, an imidazole group, a pyrazole group, a dibenzofuran group, a dibenzothiophene group, a carbazole group, a benzocarbazole group, a naphthobenzofuran group, a benzonaphthothiophene group, an indenocarbazole group, and the like, but are not limited thereto.

In the present specification, an amine group can be —$NY_fY_g$, and $Y_f$ and $Y_g$ can be each hydrogen, a substituted or unsubstituted alkyl group, a substituted or unsubstituted cycloalkyl group, a substituted or unsubstituted aryl group, or a substituted or unsubstituted heteroaryl group. Specific examples of the amine group include a dimethylamine group, a diphenylamine group, a dicyclohexylamine group, and the like, but are not limited thereto.

In the present specification, the above-described description on the heterocyclic group can be applied to a heteroaryl group except for an aromatic heteroaryl group.

In the present specification, the above-described description on the aryl group can be applied to an aromatic hydrocarbon ring except for a divalent aromatic hydrocarbon ring.

In the present specification, the above-described description on the heterocyclic group can be applied to an aromatic heterocyclic group except for a divalent and aromatic heterocyclic group.

In the present specification, the above-described description on the aryl group can be applied to an arylene group except for a divalent arylene group.

In the present specification, the above-described description on the aryl group can be applied to a heteroarylene group except for a divalent heteroarylene group.

According to an exemplary embodiment of the present specification, Cy1 and Cy2 are the same as or different from each other, and are each independently a substituted or unsubstituted aromatic hydrocarbon ring having 6 to 60 carbon atoms, or a substituted or unsubstituted aromatic hetero ring having 2 to 60 carbon atoms.

According to another exemplary embodiment, Cy1 and Cy2 are the same as or different from each other, and are each independently a substituted or unsubstituted aromatic hydrocarbon ring having 6 to 30 carbon atoms, or a substituted or unsubstituted aromatic hetero ring having 2 to 30 carbon atoms.

According to still another exemplary embodiment, Cy1 and Cy2 are the same as or different from each other, and are each independently an aromatic hydrocarbon ring having 6 to 30 carbon atoms, which is unsubstituted or substituted with an alkyl group having 1 to 20 carbon atoms, which is unsubstituted or substituted with deuterium or a halogen group, a trialkylsilyl group having 1 to 20 carbon atoms, an aryl group having 6 to 30 carbon atoms, a diarylamine group having 12 to 30 carbon atoms, or a heterocyclic group having 2 to 30 carbon atoms, or an aromatic hetero ring having 2 to 30 carbon atoms, which is unsubstituted or substituted with an alkyl group having 1 to 20 carbon atoms, which is unsubstituted or substituted with deuterium or a halogen group, a trialkylsilyl group having 1 to 20 carbon atoms, an aryl group having 6 to 30 carbon atoms, a diarylamine group having 12 to 30 carbon atoms, or a heterocyclic group having 2 to 30 carbon atoms.

In yet another exemplary embodiment, Cy1 and Cy2 are the same as or different from each other, and are each independently a substituted or unsubstituted benzene.

According to still yet another exemplary embodiment, Cy1 and Cy2 are the same as or different from each other, and are each independently a benzene which is unsubstituted or substituted with an alkyl group having 1 to 20 carbon atoms, which is unsubstituted or substituted with deuterium or a halogen group, a trialkylsilyl group having 1 to 20 carbon atoms, an aryl group having 6 to 30 carbon atoms, which is unsubstituted or substituted with deuterium, a diarylamine group having 12 to 30 carbon atoms, or a heterocyclic group having 2 to 30 carbon atoms.

According to a further exemplary embodiment, Cy1 and Cy2 are the same as or different from each other, and are each independently a benzene which is unsubstituted or substituted with a methyl group which is unsubstituted or substituted with deuterium or fluorine, an propyl group, a butyl group, a trimethylsilyl group, a phenyl group which is unsubstituted or substituted with deuterium, a diphenylamine group, or a carbazole group.

In another further exemplary embodiment, Cy1 and Cy2 are the same as or different from each other, and are each independently a benzene which is unsubstituted or substituted with a methyl group, a trifluoromethyl group, a methyl which is substituted with deuterium, an isopropyl group, a tert-butyl group, a trimethylsilyl group, a phenyl group, a phenyl-d5 group, a diphenylamine group, or a carbazole group.

According to still another further exemplary embodiment, Cy1 and Cy2 are the same as or different from each other, and are each independently a benzene which is unsubstituted or substituted with an alkyl group having 1 to 20 carbon atoms, an aryl group having 6 to 30 carbon atoms, or a diarylamine group having 12 to 30 carbon atoms.

In yet another further exemplary embodiment, Cy1 and Cy2 are the same as or different from each other, and are each independently a benzene which is unsubstituted or substituted with a methyl group, a tert-butyl group, a phenyl group, or a diphenylamine group.

According to an exemplary embodiment of the present specification, Formula 1 has the structure of Formula 2:

Formula 2

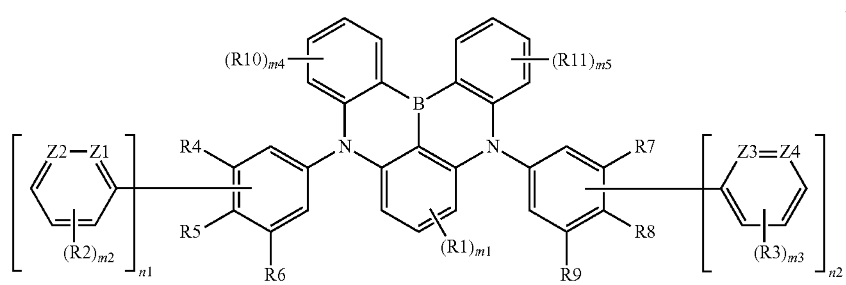

In Formula 2,

R1 to R9, Z1 to Z4, m1 to m3, n1, and n2 are the same as those defined in Formula 1, R10 and R11 are the same as or different from each other, and are each independently hydrogen, deuterium, a halogen group, a cyano group, a nitro group, a substituted or unsubstituted silyl group, a substituted or unsubstituted alkyl group, a substituted or unsubstituted alkoxy group, a substituted or unsubstituted cycloalkyl group, a substituted or unsubstituted aryl group, a substituted or unsubstituted amine group, or a substituted or unsubstituted heterocyclic group, and m4 and m5 are each an integer from 0 to 4, and when m4 and m5 are each 2 or more, a plurality of two or more substituents in the parenthesis are the same as or different from each other.

In an exemplary embodiment of the present specification, Z1 to Z4 are the same as or different from each other, and are each independently CH or N, and when Z1 to Z4 are each CH, n1+n2 is an integer from 2 to 4, and when one or more of Z1 to Z4 are N, n1+n2 is an integer from 1 to 4.

When n1 is 2, two substituents in the parenthesis are the same as or different from each other, and when n2 is 2, two substituents in the parenthesis are the same as or different from each other.

According to an exemplary embodiment of the present specification, R1 to R9 are the same as or different from each other, and are each independently hydrogen, deuterium, a halogen group, a cyano group, a nitro group, a trialkylsilyl group having 1 to 20 carbon atoms, a substituted or unsubstituted alkyl group having 1 to 20 carbon atoms, a substituted or unsubstituted alkoxy group having 1 to 20 carbon atoms, a substituted or unsubstituted cycloalkyl group having 3 to 30 carbon atoms, a substituted or unsubstituted aryl group having 6 to 30 carbon atoms, a substituted or unsubstituted diarylamine group having 12 to 30 carbon atoms, a substituted or unsubstituted dicycloalkylamine group having 12 to 30 carbon atoms, or a substituted or unsubstituted heterocyclic group having 2 to 30 carbon atoms.

According to an exemplary embodiment of the present specification, R2 to R9 are the same as or different from each other, and are each independently hydrogen, deuterium, a halogen group, a substituted or unsubstituted alkyl group having 1 to 20 carbon atoms, an aryl group having 6 to 30 carbon atoms, or a substituted or unsubstituted trialkylsilyl group having 1 to 20 carbon atoms.

According to another exemplary embodiment, R2 to R9 are the same as or different from each other, and are each independently hydrogen, deuterium, a halogen group, an alkyl group having 1 to 20 carbon atoms, which is unsubstituted or substituted with deuterium or a halogen group, an aryl group having 6 to 30 carbon atoms, or a substituted or unsubstituted trialkylsilyl group having 1 to 20 carbon atoms.

In still another exemplary embodiment, R2 to R9 are the same as or different from each other, and are each independently hydrogen, deuterium, a halogen group, an alkyl group having 1 to 20 carbon atoms, which is unsubstituted or substituted with deuterium or a halogen group, an aryl group having 6 to 30 carbon atoms, or a trialkylsilyl group having 1 to 20 carbon atoms.

According to yet another exemplary embodiment, R2 to R9 are the same as or different from each other, and are each independently hydrogen, deuterium, fluorine (fluoro), a methyl group which is unsubstituted or substituted with deuterium or fluorine, a tert-butyl group, a phenyl group, or a trimethylsilyl group.

According to an exemplary embodiment of the present specification, R1 is hydrogen, deuterium, a substituted or unsubstituted alkyl group having 1 to 20 carbon atoms, a substituted or unsubstituted aryl group having 6 to 30 carbon atoms, a substituted or unsubstituted arylamine group having 12 to 30 carbon atoms, a substituted or unsubstituted dicycloalkylamine group having 12 to 30 carbon atoms, or a substituted or unsubstituted heterocyclic group having 2 to 30 carbon atoms.

In another exemplary embodiment, R1 is hydrogen, deuterium, an alkyl group having 1 to 20 carbon atoms, a substituted or unsubstituted aryl group having 6 to 30 carbon atoms, an arylamine group having 12 to 30 carbon atoms, which is unsubstituted or substituted with a halogen group or an alkyl group having 1 to 20 carbon atoms, a dicycloalkylamine group having 12 to 30 carbon atoms, or a heterocyclic group having 2 to 30 carbon atoms, which is unsubstituted or substituted with an alkyl group having 1 to 20 carbon atoms or an aryl group having 6 to 20 carbon atoms.

According to yet another exemplary embodiment, R1 is hydrogen, deuterium, a substituted or unsubstituted methyl group, a substituted or unsubstituted butyl group, a substituted or unsubstituted phenyl group, a substituted or unsubstituted diphenylamine group, a substituted or unsubstituted dicyclohexylamine group, a substituted or unsubstituted carbazole group, or a substituted or unsubstituted dihydroacridine.

According to still yet another exemplary embodiment, R1 is hydrogen, deuterium, an alkyl group having 1 to 10 carbon atoms, an aryl group having 6 to 20 carbon atoms, which is unsubstituted or substituted with deuterium, a diphenylamine group which is unsubstituted or substituted with a halogen group or an alkyl group having 1 to 10 carbon atoms, a dicyclohexylamine group, a carbazole group which is unsubstituted or substituted with an alkyl group having 1 to 10 carbon atoms, or 9,10-dihydroacridine which is unsubstituted or substituted with an alkyl group having 1 to 10 carbon atoms or an aryl group having 6 to 20 carbon atoms.

In a further exemplary embodiment, R1 is hydrogen, deuterium, a methyl group, tert-butyl group, a phenyl group which is unsubstituted or substituted with deuterium, a diphenylamine group which is unsubstituted or substituted with fluorine, a methyl group, or a tert-butyl group, a dicyclohexylamine group, a carbazole group which is unsubstituted or substituted with a tert-butyl group, or a dihydroacridine group which is unsubstituted or substituted with a methyl group or a phenyl group.

According to another further exemplary embodiment, R1 is hydrogen, deuterium, an alkyl group having 1 to 10 carbon atoms, an aryl group having 6 to 20 carbon atoms, a diphenylamine group which is unsubstituted or substituted with an alkyl group having 1 to 10 carbon atoms, or a carbazole group.

According to still another further exemplary embodiment, R1 is hydrogen, deuterium, a methyl group, a tert-butyl group, a phenyl group, a diphenylamine group which is unsubstituted or substituted with a tert-butyl group, or a carbazole group.

According to yet another further exemplary embodiment, R1 is hydrogen, deuterium, an alkyl group having 1 to 10 carbon atoms, an aryl group having 6 to 30 carbon atoms, which is unsubstituted or substituted with deuterium, or —N(R201) (R202), R201 and R202 are the same as or different from each other, and are each independently a substituted or unsubstituted aryl group, or R201 and R202 are bonded to each other to form a substituted or unsubstituted ring.

According to still yet another further exemplary embodiment, R1 is hydrogen, deuterium, a methyl group, a tert-butyl group, a phenyl group which is unsubstituted or substituted with deuterium, or —N(R201) (R202).

According to a still further exemplary embodiment, R1 is hydrogen, deuterium, a methyl group, a tert-butyl group, a phenyl group, or —N(R201) (R202).

In an exemplary embodiment of the present specification, R201 and R202 are the same as or different from each other, and are each independently an aryl group having 6 to 20 carbon atoms, which is unsubstituted or substituted with a halogen group or an alkyl group having 1 to 10 carbon atoms, or R201 and R202 are bonded to each other to form a carbazole ring which is unsubstituted or substituted with an alkyl group having 1 to 10 carbon atoms or an aryl group having 6 to 20 carbon atoms; or a dihydroacridine ring which is unsubstituted or substituted with an alkyl group having 1 to 10 carbon atoms or an aryl group having 6 to 20 carbon atoms.

In an exemplary embodiment of the present specification, R201 and R202 are the same as or different from each other, and are each independently a phenyl group which is unsubstituted or substituted with fluorine, a methyl group, or a tert-butyl group, or R201 and R202 are bonded to each other to form a carbazole ring which is unsubstituted or substituted with a tert-butyl group; or a dihydroacridine ring which is unsubstituted or substituted with a methyl group or a phenyl group.

In an exemplary embodiment of the present specification, R201 and R202 are the same as or different from each other, and are each independently an aryl group having 6 to 20 carbon atoms, which is unsubstituted or substituted with an alkyl group having 1 to 10 carbon atoms, or R201 and R202 are bonded to each other to form a carbazole ring which is unsubstituted or substituted with an alkyl group having 1 to 10 carbon atoms or an aryl group having 6 to 20 carbon atoms.

In an exemplary embodiment of the present specification, R201 and R202 are the same as or different from each other, and are each independently a phenyl group which is unsubstituted or substituted with a tert-butyl group, or R201 and R202 are bonded to each other to form a carbazole ring.

According to an exemplary embodiment of the present specification, R2 and R3 are the same as or different from each other, and are each independently hydrogen; deuterium; a halogen group; an alkyl group having 1 to 20 carbon atoms, which is unsubstituted or substituted with deuterium or a halogen group; an aryl group having 6 to 30 carbon atoms; or a substituted or unsubstituted trialkylsilyl group having 1 to 20 carbon atoms.

In another exemplary embodiment, R2 and R3 are the same as or different from each other, and are each independently hydrogen; deuterium; a halogen group; an alkyl group having 1 to 20 carbon atoms, which is unsubstituted or substituted with deuterium or a halogen group; an aryl group having 6 to 30 carbon atoms; or a trialkylsilyl group having 1 to 20 carbon atoms.

According to still another exemplary embodiment, R2 and R3 are the same as or different from each other, and are each independently hydrogen; deuterium; fluorine (fluoro); a methyl group which is unsubstituted or substituted with deuterium or fluorine; a tert-butyl group; a phenyl group; or a trimethylsilyl group.

According to yet another exemplary embodiment, R2 and R3 are the same as or different from each other, and are each independently hydrogen; deuterium; fluorine (fluoro); a methyl group which is unsubstituted or substituted with deuterium or fluorine; or a tert-butyl group.

In the present specification, when Z1 or Z2 is CH, and m2 is 1 or more, hydrogen of the aforementioned CH can be replaced with R2. That is, the substituent of R2 is a concept including a substituent that is also linked to carbon of Z1 or Z2.

In the present specification, when Z3 or Z4 is CH, and m3 is 1 or more, hydrogen of the aforementioned CH can be replaced with R3. That is, the substituent of R3 is a concept including a substituent that is also linked to carbon of Z3 or Z4.

According to an exemplary embodiment of the present specification, m1 is an integer of 0 or 1.

According to an exemplary embodiment of the present specification, m2 and m3 are each an integer from 0 to 5.

According to an exemplary embodiment of the present specification, R2 is deuterium, and m2 is 5.

According to an exemplary embodiment of the present specification, R3 is deuterium, and m3 is 5.

According to an exemplary embodiment of the present specification, m2 and m3 are each 0 or 1.

According to an exemplary embodiment of the present specification, m4 and m5 are each an integer of 0 or 1.

In an exemplary embodiment of the present specification, R4 to R9 are the same as or different from each other, and are each independently hydrogen, deuterium, or a substituted or unsubstituted alkyl group having 1 to 20 carbon atoms.

In an exemplary embodiment of the present specification, R4 to R9 are the same as or different from each other, and are each independently hydrogen, deuterium, or an alkyl group having 1 to 10 carbon atoms.

In an exemplary embodiment of the present specification, R4 to R9 are the same as or different from each other, and are each independently hydrogen, deuterium, a methyl group, or a tert-butyl group.

In an exemplary embodiment of the present specification, R10 and R11 are the same as or different from each other, and are each independently hydrogen, deuterium, a halogen group, a cyano group, a nitro group, a trialkylsilyl group having 1 to 20 carbon atoms, a substituted or unsubstituted alkyl group having 1 to 20 carbon atoms, a substituted or unsubstituted alkoxy group having 1 to 20 carbon atoms, a substituted or unsubstituted cycloalkyl group having 3 to 30 carbon atoms, a substituted or unsubstituted aryl group having 6 to 30 carbon atoms, a substituted or unsubstituted diarylamine group having 12 to 30 carbon atoms, or a substituted or unsubstituted heterocyclic group having 2 to 30 carbon atoms.

According to another exemplary embodiment, R10 and R11 are the same as or different from each other, and are each independently hydrogen, a substituted or unsubstituted alkyl group having 1 to 20 carbon atoms, a substituted or unsubstituted trialkylsilyl group having 1 to 20 carbon atoms, a substituted or unsubstituted aryl group having 6 to 30 carbon atoms, a diarylamine group having 12 to 30 carbon atoms, or a substituted or unsubstituted heterocyclic group having 2 to 30 carbon atoms.

According to still another exemplary embodiment, R10 and R11 are the same as or different from each other, and are each independently hydrogen; an alkyl group having 1 to 20 carbon atoms, which is unsubstituted or substituted with deuterium or a halogen group; a trialkylsilyl group having 1 to 20 carbon atoms; an aryl group having 6 to 30 carbon atoms, which is unsubstituted or substituted with deuterium; a diarylamine group having 12 to 30 carbon atoms; or a heterocyclic group having 2 to 30 carbon atoms.

In yet another exemplary embodiment, R10 and R11 are the same as or different from each other, and are each independently hydrogen; a methyl group which is unsubstituted or substituted with deuterium or fluorine; a propyl group; a butyl group; a trimethylsilyl group; a phenyl group which is unsubstituted or substituted with deuterium; a diphenylamine group; or a carbazole group.

According to still yet another exemplary embodiment, R10 and R11 are the same as or different from each other, and are each independently hydrogen; a methyl group; a trifluoromethyl group; a methyl group which is substituted with deuterium; an isopropyl group; a tert-butyl group; a trimethylsilyl group; a phenyl group; a phenyl-d5 group; a diphenylamine group; or a carbazole group.

According to an exemplary embodiment of the present specification, Formula 1 is any one of the following Formulae 1-1 to 1-4.

Formula 1-1

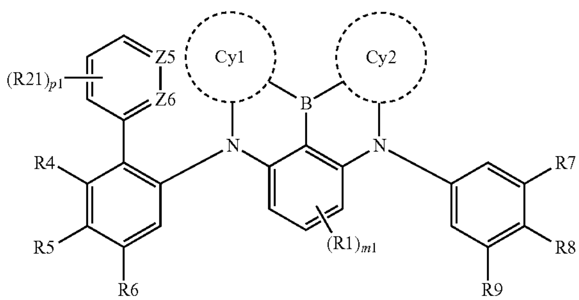

Formula 1-2

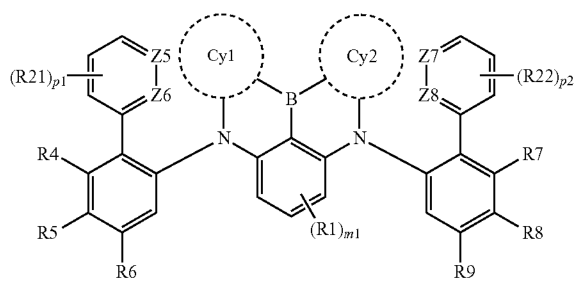

Formula 1-3

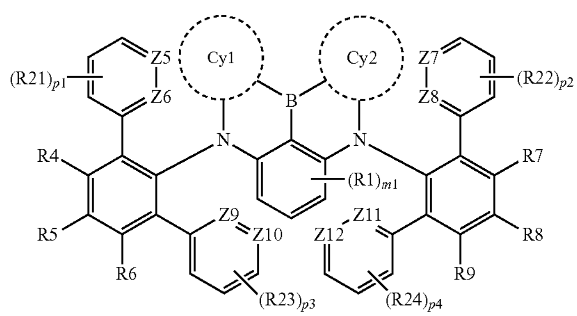

Formula 1-4

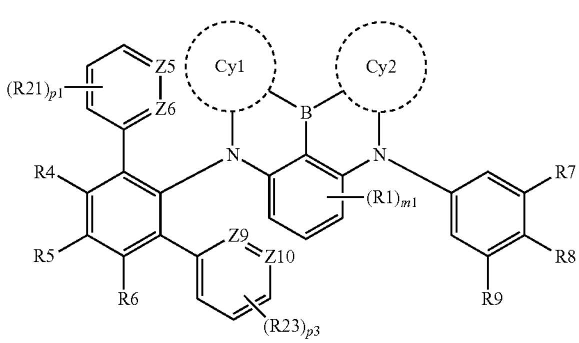

In Formulae 1-1 to 1-4,

Cy1, Cy2, R1, R4 to R9, and m1 are the same as those defined in Formula 1, one of Z5 and Z6 is N, and the other is N or CH, Z7 to Z12 are the same as or different from each other, and are each independently CH or N, R21 to R24 are the same as or different from each other, and are each independently hydrogen, deuterium, a halogen group, a cyano group, a nitro group, a substituted or unsubstituted silyl group, a substituted or unsubstituted alkyl group, a substituted or unsubstituted alkoxy group, a substituted or unsubstituted cycloalkyl group, a substituted or unsubstituted aryl group, a substituted or unsubstituted amine group, or a substituted or unsubstituted heterocyclic group, and p1 is an integer from 0 to 4, p2 to p4 are each an integer from 0 to 5, and when p1 to p4 are each 2 or more, two or more substituents in the parenthesis are the same as or different from each other.

According to an exemplary embodiment of the present specification, Formula 1 is any one of the following Formulae 1-1-1 to 1-1-4.

Formula 1-1-1

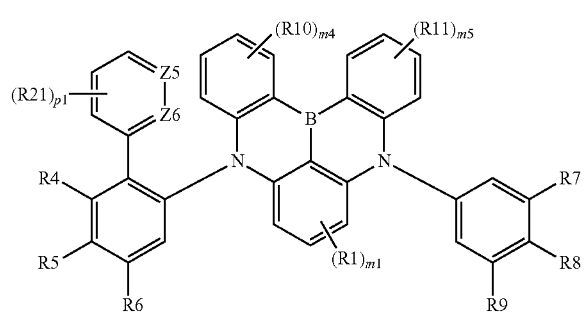

Formula 1-1-2

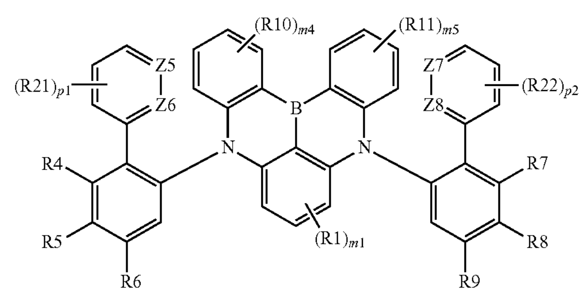

Formula 1-1-3

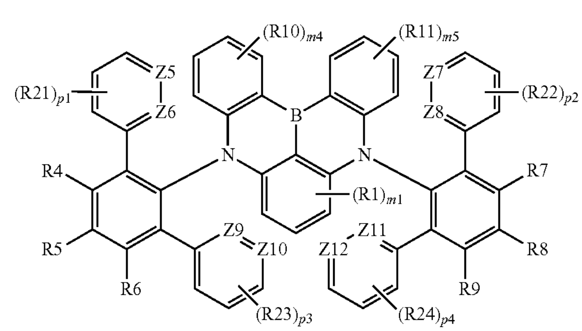

-continued

Formula 1-1-4

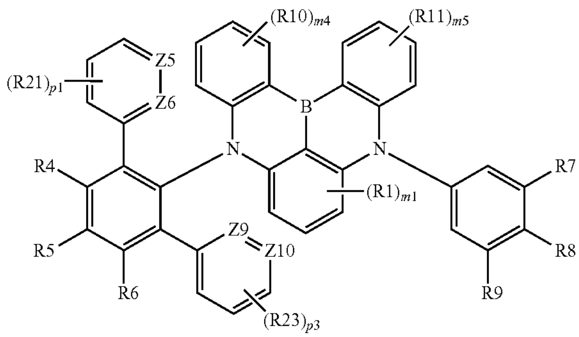

In Formulae 1-1-1 to 1-1-4,

R1, R4 to R9, and m1 are the same as those defined in Formula 1, one of Z5 and Z6 is N, and the other is N or CH, Z7 to Z12 are the same as or different from each other, and are each independently CH or N, R10, R11, and R21 to R24 are the same as or different from each other, and are each independently hydrogen, deuterium, a halogen group, a cyano group, a nitro group, a substituted or unsubstituted silyl group, a substituted or unsubstituted alkyl group, a substituted or unsubstituted alkoxy group, a substituted or unsubstituted cycloalkyl group, a substituted or unsubstituted aryl group, a substituted or unsubstituted amine group, or a substituted or unsubstituted heterocyclic group, p1 is an integer from 0 to 4, p2 to p4 are each an integer from 0 to 5, and when p1 to p4 are each 2 or more, two or more substituents in the parenthesis are the same as or different from each other, and m4 and m5 are each an integer from 0 to 4, and when m4 and m5 are each 2 or more, two or more substituents in the parenthesis are the same as or different from each other.

In an exemplary embodiment of the present specification, Formula 1 is any one of the following Formulae 1-1-5 to 1-1-7.

Formula 1-1-5

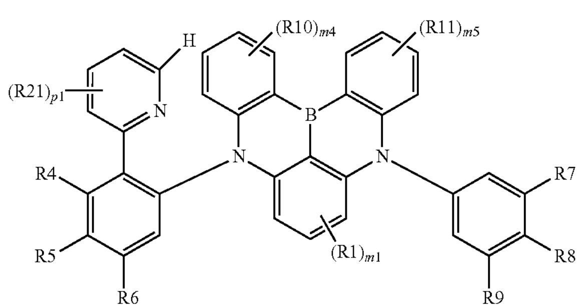

-continued

Formula 1-1-6

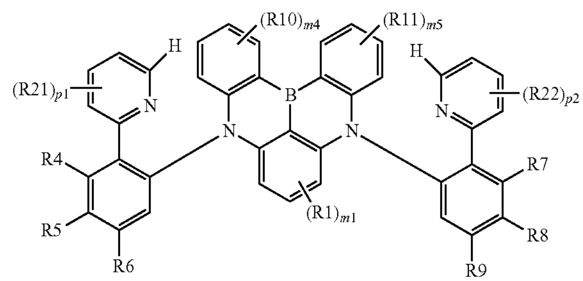

Formula 1-1-7

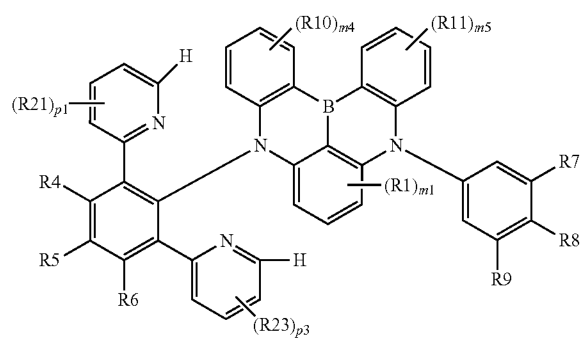

In Formulae 1-1-5 to 1-1-7,

R1, R4 to R9, and m1 are the same as those defined in Formula 1,

R10, R11, and R21 to R23 are the same as or different from each other, and are each independently hydrogen, deuterium, a halogen group, a cyano group, a nitro group, a substituted or unsubstituted silyl group, a substituted or unsubstituted alkyl group, a substituted or unsubstituted alkoxy group, a substituted or unsubstituted cycloalkyl group, a substituted or unsubstituted aryl group, a substituted or unsubstituted amine group, or a substituted or unsubstituted heterocyclic group, p1 to p3 are each an integer from 0 to 4, and when p1 to p3 are each 2 or more, two or more substituents in the parenthesis are the same as or different from each other, and m4 and m5 are each an integer from 0 to 4, and when m4 and m5 are each 2 or more, a plurality of two or more substituents in the parenthesis are the same as or different from each other.

In Formulae 1-1-5 to 1-1-7, a position where hydrogen (H) is indicated can be substituted with R21 or R22.

In an exemplary embodiment of the present specification, Formula 1 is any one of the following Formulae 1-1-8 to 1-1-10.

Formula 1-1-8

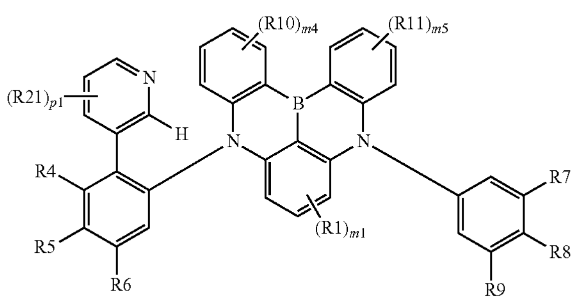

Formula 1-1-9

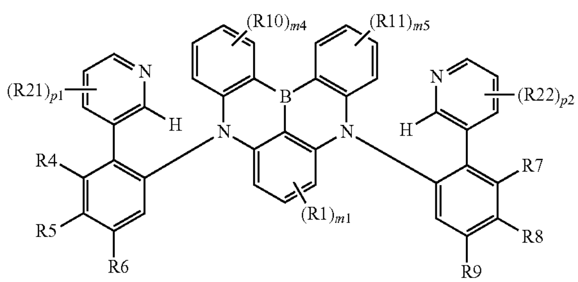

Formula 1-1-10

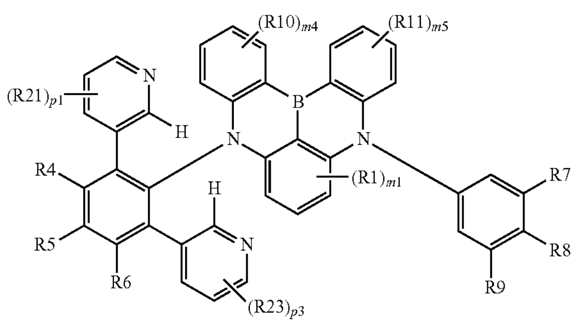

In Formulae 1-1-8 to 1-1-10,

R1, R4 to R9, and m1 are the same as those defined in Formula 1,

R10, R11, and R21 to R23 are the same as or different from each other, and are each independently hydrogen, deuterium, a halogen group, a cyano group, a nitro group, a substituted or unsubstituted silyl group, a substituted or unsubstituted alkyl group, a substituted or unsubstituted alkoxy group, a substituted or unsubstituted cycloalkyl group, a substituted or unsubstituted aryl group, a substituted or unsubstituted amine group, or a substituted or unsubstituted heterocyclic group, p1 to p3 are each an integer from 0 to 4, and when p1 to p3 are each 2 or more, two or more substituents in the parenthesis are the same as or different from each other, and m4 and m5 are each an integer from 0 to 4, and when m4 and m5 are each 2 or more, a plurality of two or more substituents in the parenthesis are the same as or different from each other.

In Formulae 1-1-8 to 1-1-10, a position where hydrogen (H) is indicated can be substituted with R21 or R22.

According to an exemplary embodiment of the present specification, one of Z5 and Z6 is N, and the other is N or CH.

According to another exemplary embodiment, Z5 is N, and Z6 is CH.

According to still another exemplary embodiment, Z5 is CH, and Z6 is N.

In an exemplary embodiment of the present specification, Z7 to Z12 are the same as or different from each other, and are each independently CH or N.

According to another exemplary embodiment, Z7 is N, and Z8 is CH.

According to still another exemplary embodiment, Z7 is CH, and Z8 is N.

According to yet another exemplary embodiment, Z7 and Z8 are each CH.

According to still yet another exemplary embodiment, Z7 and Z8 are each N.

According to an exemplary embodiment, Z9 is N, and Z10 is CH.

According to another exemplary embodiment, Z9 is CH, and Z10 is N.

According to still another exemplary embodiment, Z9 and Z10 are each CH.

According to yet another exemplary embodiment, Z9 and Z10 are each N.

According to an exemplary embodiment, Z11 is N, and Z12 is CH.

According to another exemplary embodiment, Z11 is CH, and Z12 is N.

According to still another exemplary embodiment, Z11 and Z12 are each CH.

According to yet another exemplary embodiment, Z11 and Z12 are each N.

In an exemplary embodiment of the present specification, R21 to R24 are the same as or different from each other, and are each independently hydrogen, deuterium, a halogen group, a cyano group, a nitro group, a trialkylsilyl group having 1 to 20 carbon atoms, a substituted or unsubstituted alkyl group having 1 to 20 carbon atoms, a substituted or unsubstituted alkoxy group having 1 to 20 carbon atoms, a substituted or unsubstituted cycloalkyl group having 3 to 30 carbon atoms, a substituted or unsubstituted aryl group having 6 to 30 carbon atoms, a diarylamine group having 12 to 30 carbon atoms, or a substituted or unsubstituted heterocyclic group having 2 to 30 carbon atoms.

According to another exemplary embodiment, R21 to R24 are the same as or different from each other, and are each independently hydrogen, deuterium, a halogen group, a substituted or unsubstituted alkyl group having 1 to 20 carbon atoms, a substituted or unsubstituted aryl group having 6 to 30 carbon atoms, or a substituted or unsubstituted trialkylsilyl group having 1 to 20 carbon atoms.

In still another exemplary embodiment, R21 to R24 are the same as or different from each other, and are each independently hydrogen, deuterium, a halogen group, a substituted or unsubstituted methyl group, a substituted or unsubstituted butyl group, a substituted or unsubstituted phenyl group, or a substituted or unsubstituted trimethylsilyl group.

According to yet another exemplary embodiment, R21 to R24 are the same as or different from each other, and are each independently hydrogen; deuterium; a halogen group; an alkyl group having 1 to 20 carbon atoms, which is unsubstituted or substituted with deuterium or fluorine; an aryl group having 6 to 30 carbon atoms; or a trialkylsilyl group having 1 to 20 carbon atoms.

In still yet another exemplary embodiment, R21 to R24 are the same as or different from each other, and are each independently hydrogen, deuterium, fluorine, a trifluoromethyl group, a methyl group, a tert-butyl group, a phenyl group, or a trimethylsilyl group.

According to an exemplary embodiment of the present specification, p1 to p4 are each 0 or 1.

According to an exemplary embodiment of the present specification, Formula 1 is any one of the following Formulae 2-1 to 2-3.

Formula 2-1

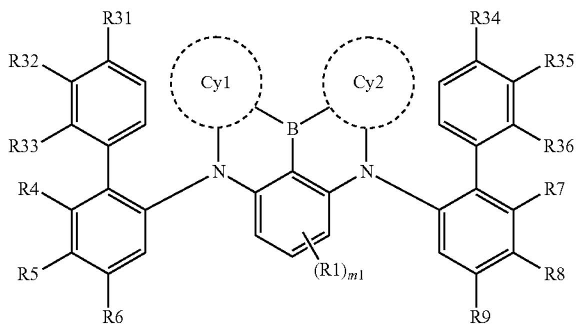

Formula 2-2

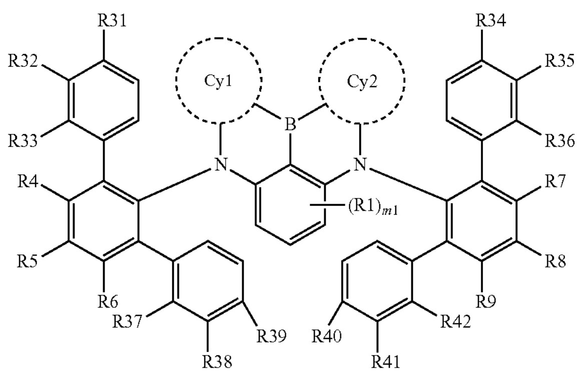

Formula 2-3

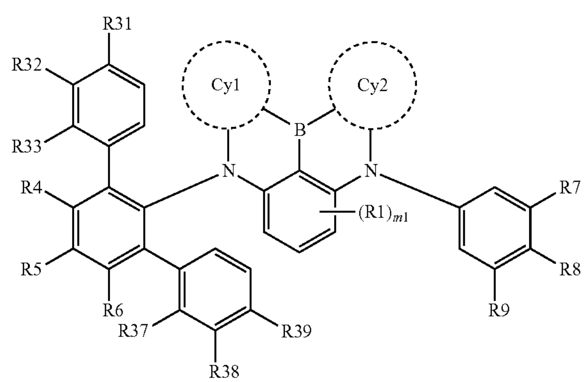

In Formulae 2-1 to 2-3,

Cy1, Cy2, R1, R4 to R9, and m1 are the same as those defined in Formula 1, and

R31 to R42 are the same as or different from each other, and are each independently hydrogen, deuterium, a halogen group, a cyano group, a nitro group, a substituted or unsubstituted silyl group, a substituted or unsubstituted alkyl group, a substituted or unsubstituted alkoxy group, a substituted or unsubstituted cycloalkyl group, a substituted or unsubstituted aryl group, a substituted or unsubstituted amine group, or a substituted or unsubstituted heterocyclic group.

According to an exemplary embodiment of the present specification, Formula 1 is any one of the following Formulae 2-1-1 to 2-1-3.

Formula 2-1-1

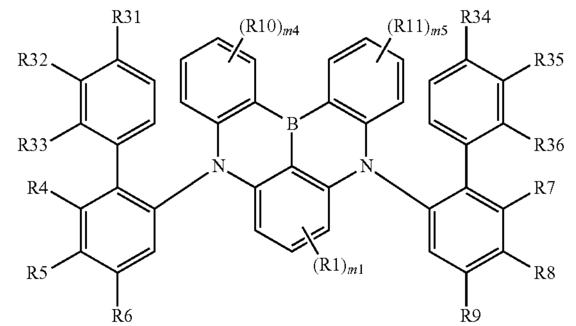

Formula 2-1-2

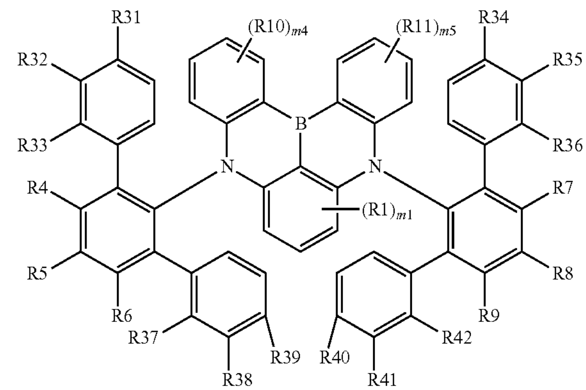

Formula 2-1-3

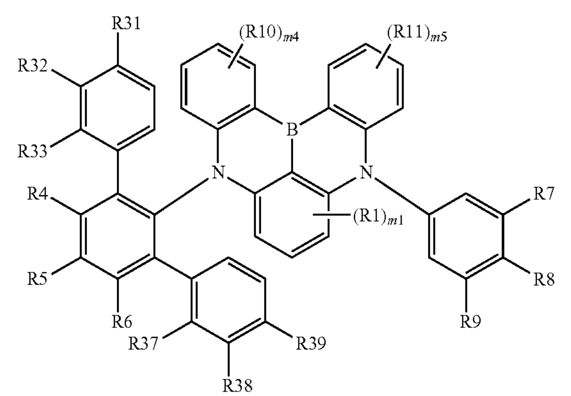

In Formulae 2-1-1 to 2-1-3,

R1, R4 to R9, and m1 are the same as those defined in Formula 1,

R10, R11, and R31 to R42 are the same as or different from each other, and are each independently hydrogen, deuterium, a halogen group, a cyano group, a nitro group, a substituted or unsubstituted silyl group, a substituted or unsubstituted alkyl group, a substituted or unsubstituted alkoxy group, a substituted or unsubstituted cycloalkyl group, a substituted or unsubstituted aryl group, a substituted or unsubstituted amine group, or a substituted or unsubstituted heterocyclic group, and m4 and m5 are each an integer from 0 to 4, and when m4 and m5 are each 2 or more, two or more substituents in the parenthesis are the same as or different from each other.

In an exemplary embodiment of the present specification, R31 to R42 are the same as or different from each other, and are each independently hydrogen, deuterium, a halogen group, a cyano group, a nitro group, a trialkylsilyl group having 1 to 20 carbon atoms, a substituted or unsubstituted alkyl group having 1 to 20 carbon atoms, a substituted or unsubstituted alkoxy group having 1 to 20 carbon atoms, a substituted or unsubstituted cycloalkyl group having 3 to 30 carbon atoms, a substituted or unsubstituted aryl group having 6 to 30 carbon atoms, a diarylamine group having 12 to 30 carbon atoms, or a substituted or unsubstituted heterocyclic group having 2 to 30 carbon atoms.

According to another exemplary embodiment, R31 to R42 are the same as or different from each other, and are each independently hydrogen, deuterium, a halogen group, a substituted or unsubstituted alkyl group having 1 to 20 carbon atoms, a substituted or unsubstituted aryl group having 6 to 30 carbon atoms, or a substituted or unsubstituted trialkylsilyl group having 1 to 20 carbon atoms.

In still another exemplary embodiment, R31 to R42 are the same as or different from each other, and are each independently hydrogen, deuterium, a halogen group, a substituted or unsubstituted methyl group, a substituted or unsubstituted butyl group, a substituted or unsubstituted phenyl group, or a substituted or unsubstituted trimethylsilyl group.

According to yet another exemplary embodiment, R31 to R42 are the same as or different from each other, and are each independently hydrogen; deuterium; a halogen group; an alkyl group having 1 to 20 carbon atoms, which is unsubstituted or substituted with deuterium or fluorine; an aryl group having 6 to 30 carbon atoms; or a trialkylsilyl group having 1 to 20 carbon atoms.

According to still yet another exemplary embodiment, R31 to R42 are the same as or different from each other, and are each independently hydrogen, deuterium, fluorine, a trifluoromethyl group, a methyl group, a tert-butyl group, a phenyl group, or a trimethylsilyl group.

According to an exemplary embodiment of the present invention, Formula 1 can be any one of the following compounds:

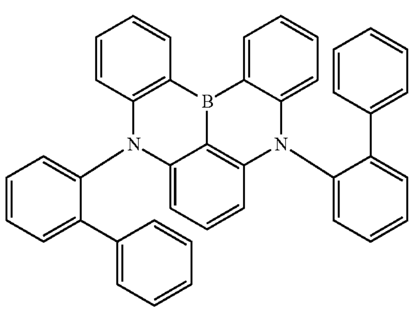

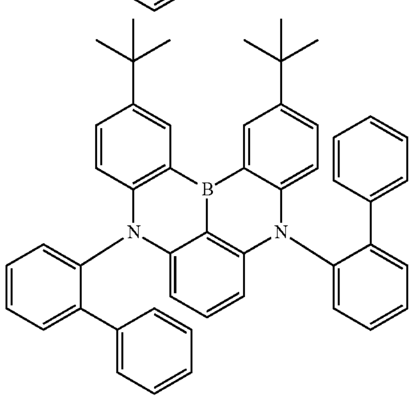

-continued

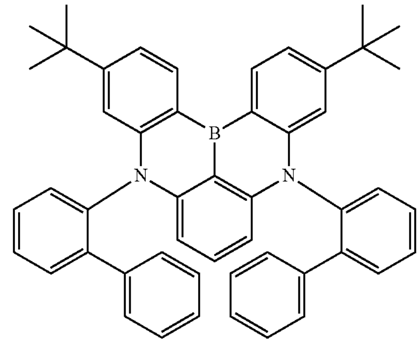

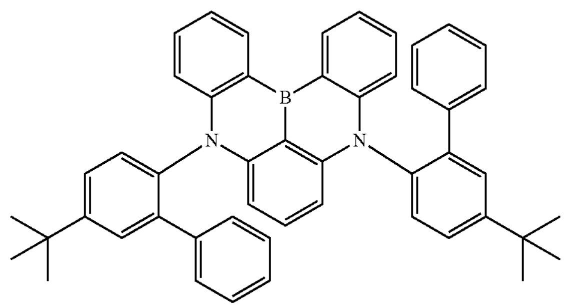

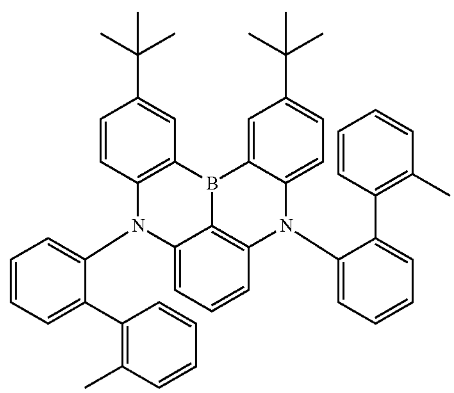

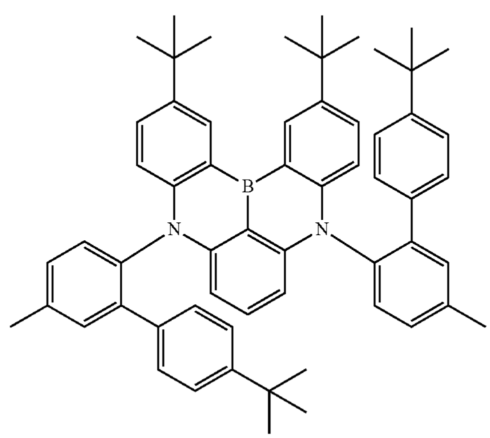

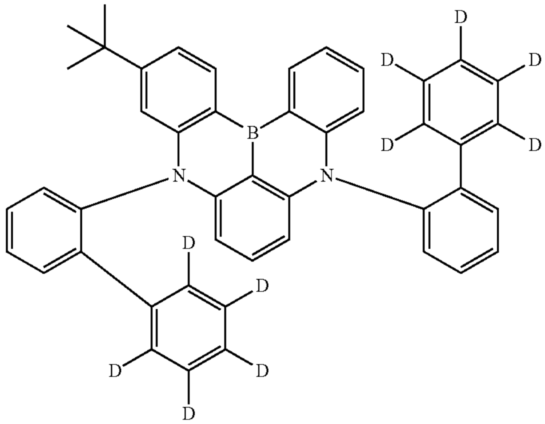
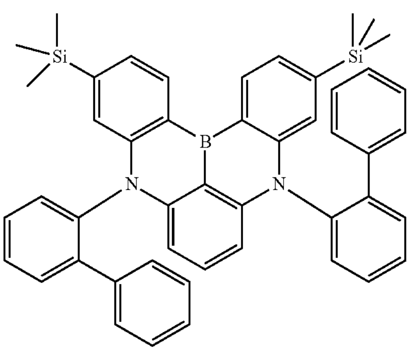
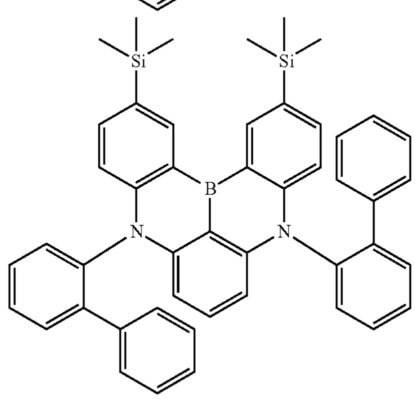
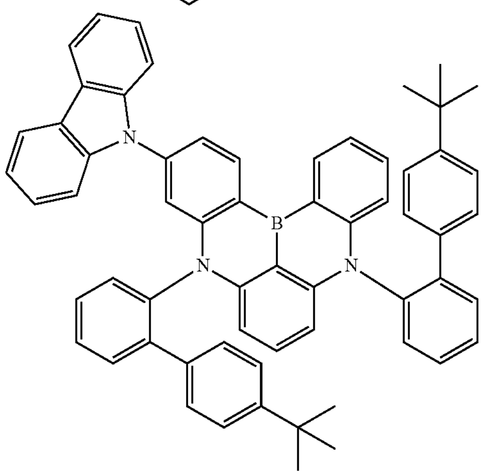
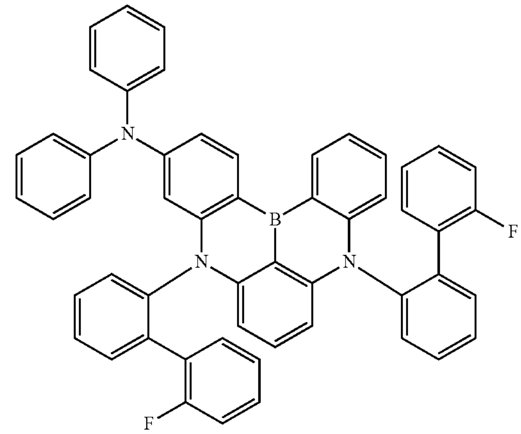
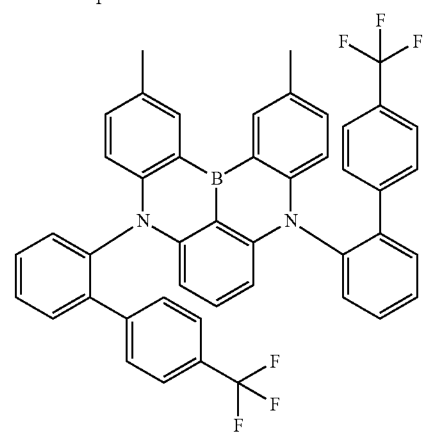
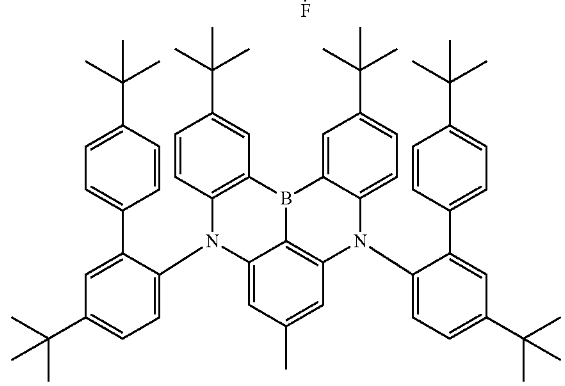
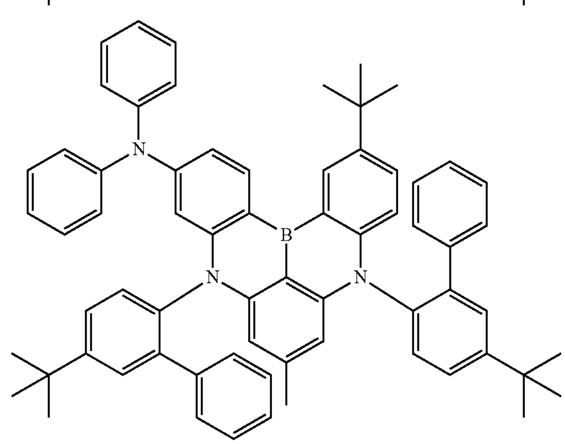

-continued
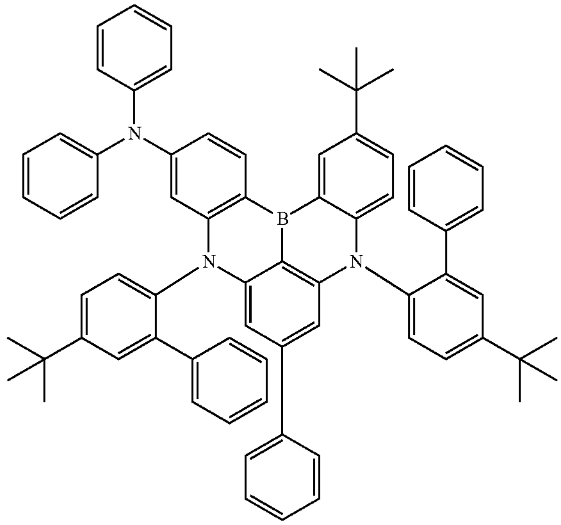
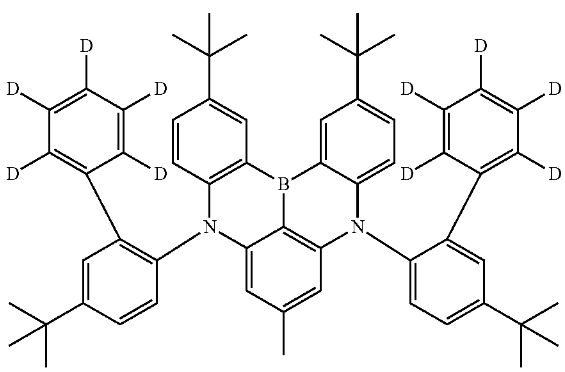
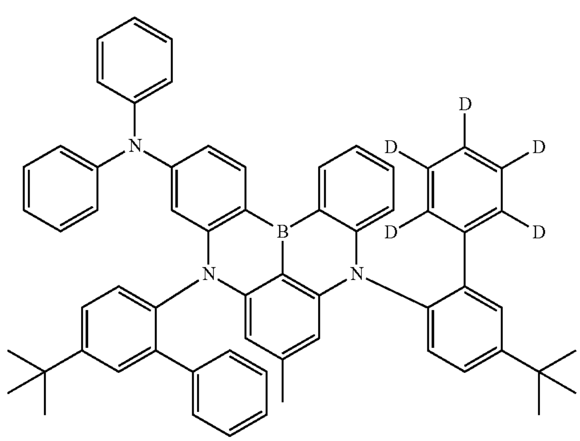
-continued
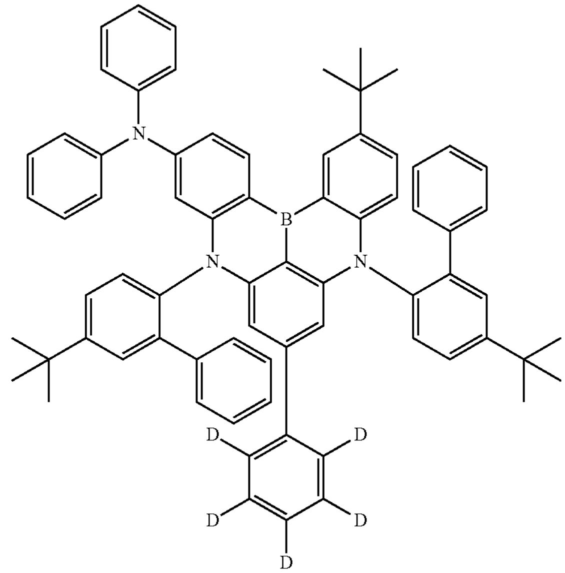
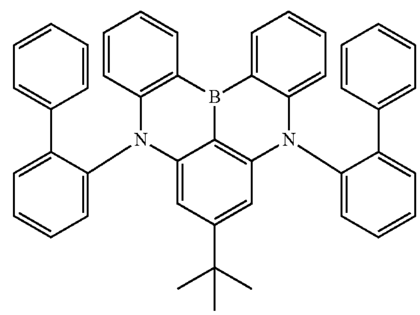
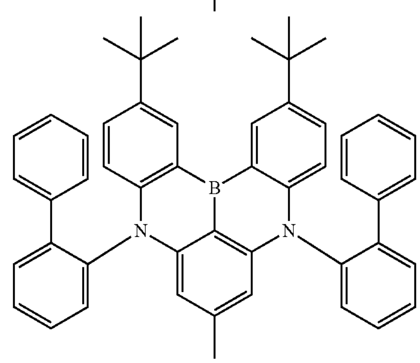
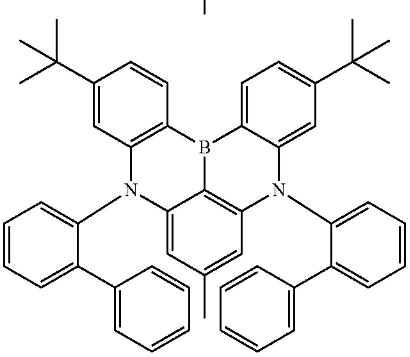

-continued
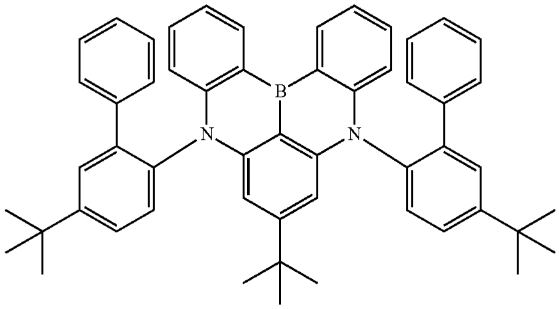
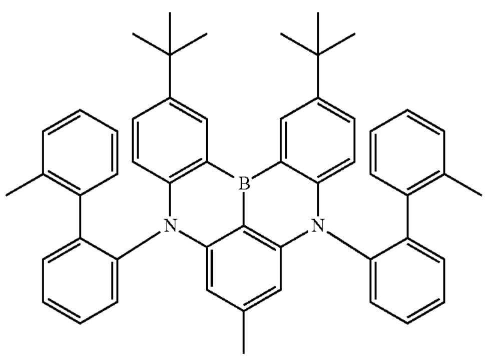
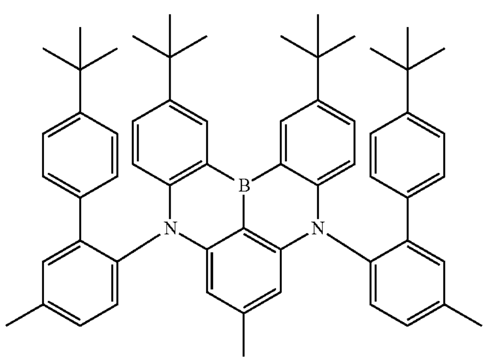
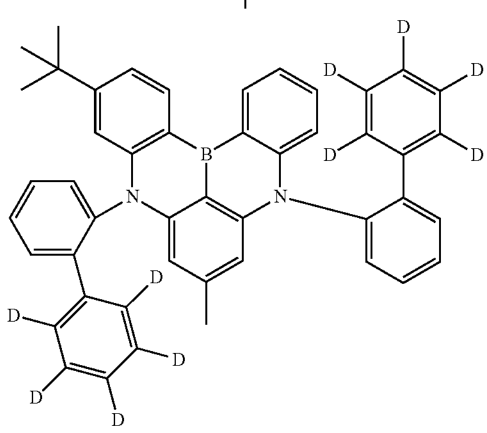
-continued
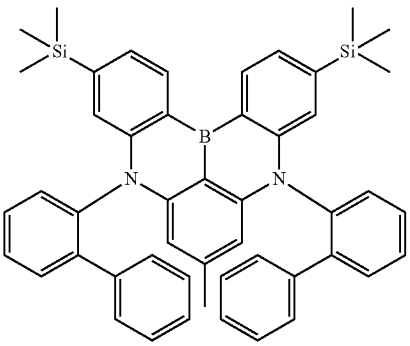
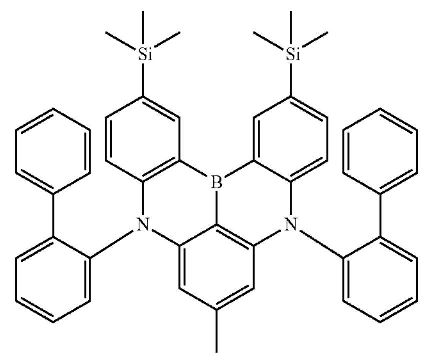
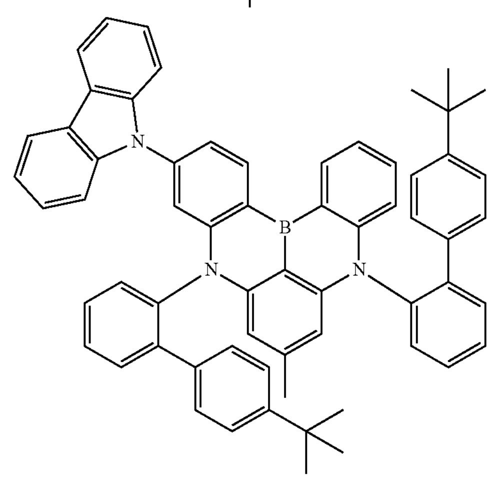
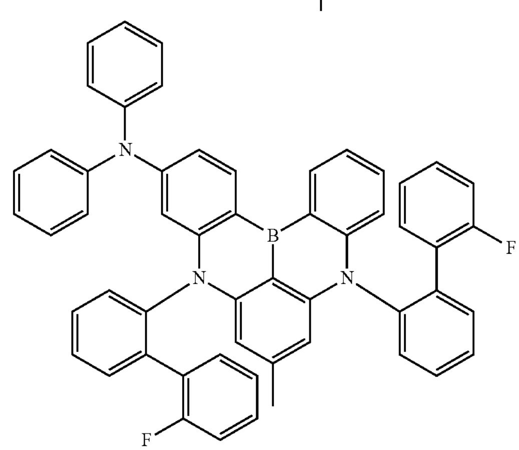

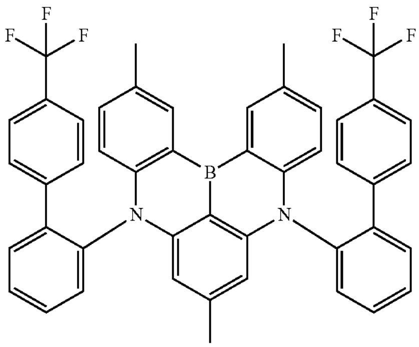
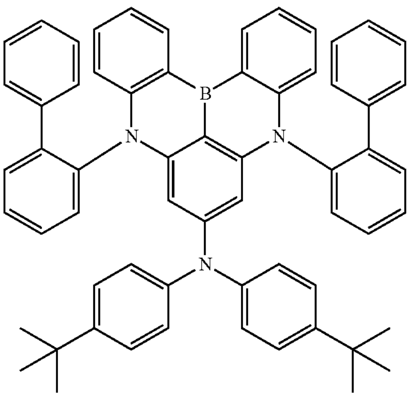
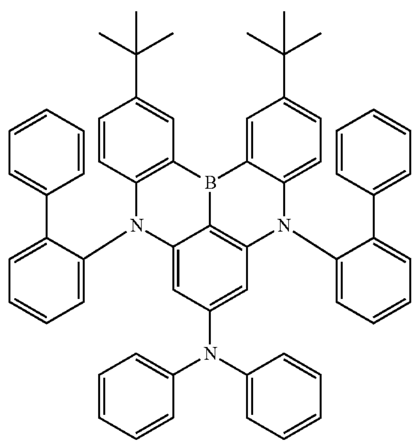
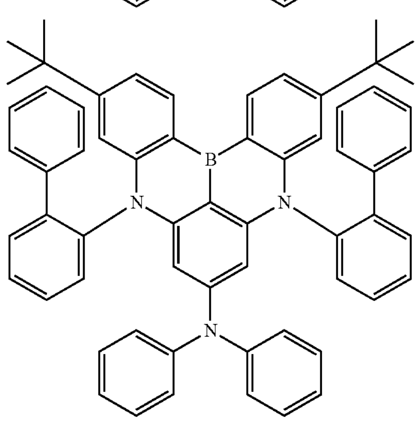
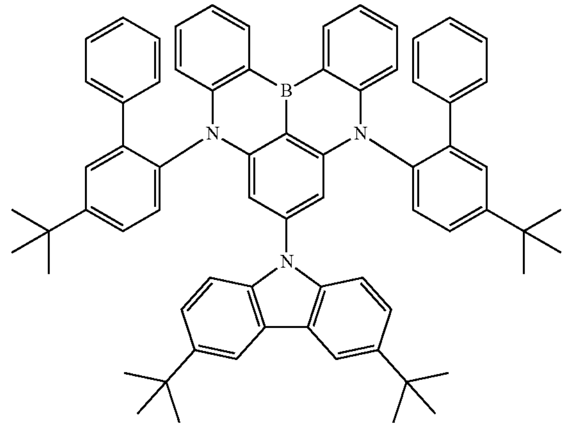
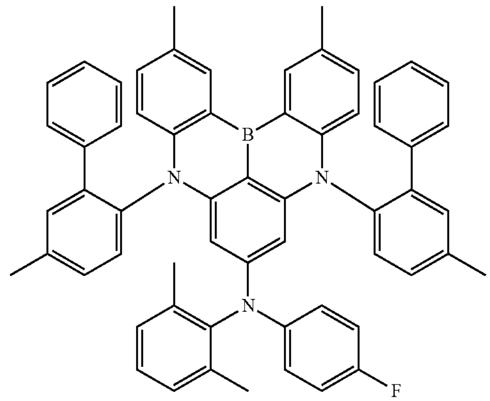
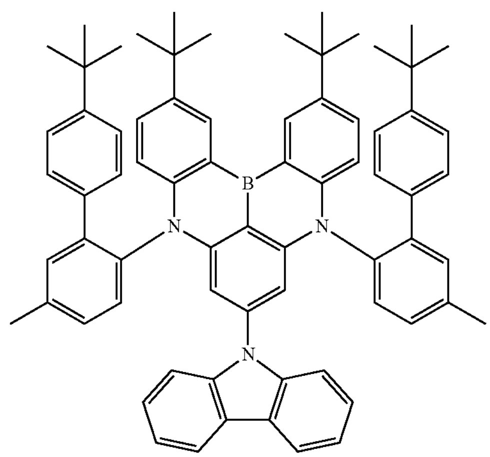
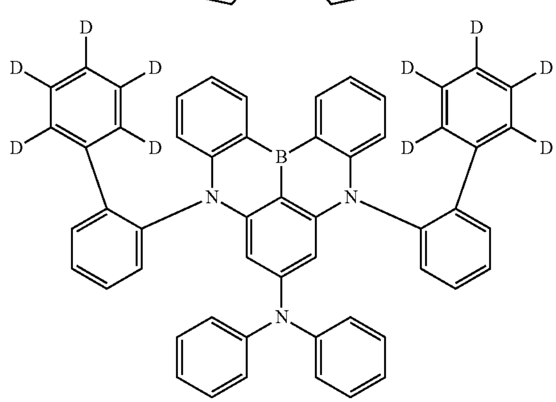

-continued
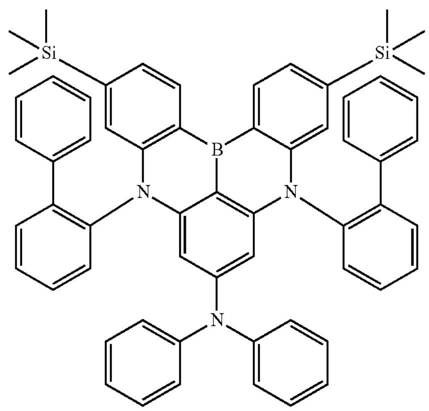
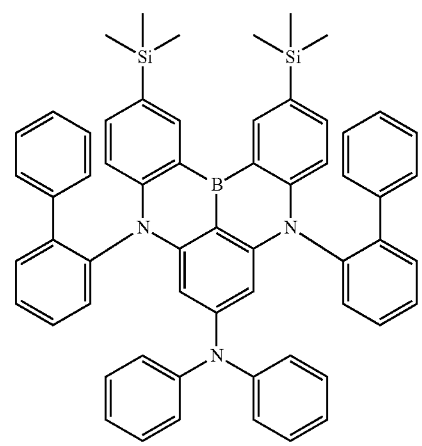
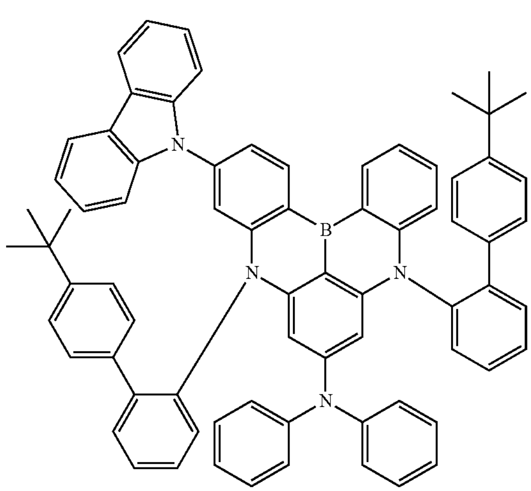
-continued
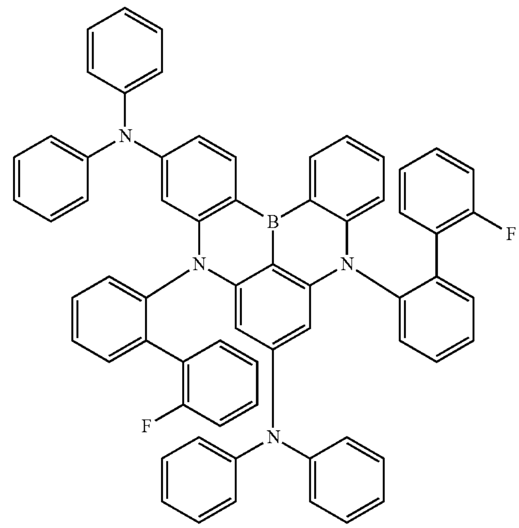
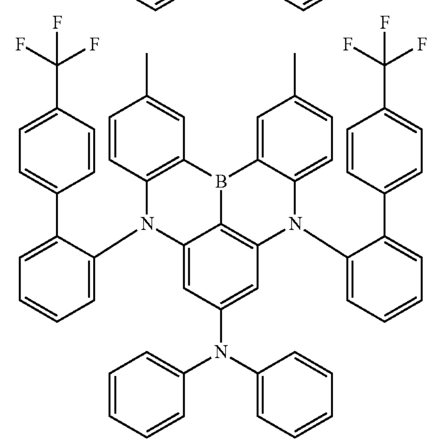
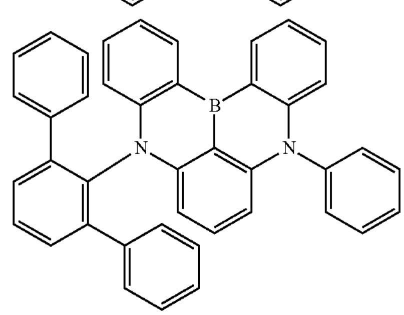
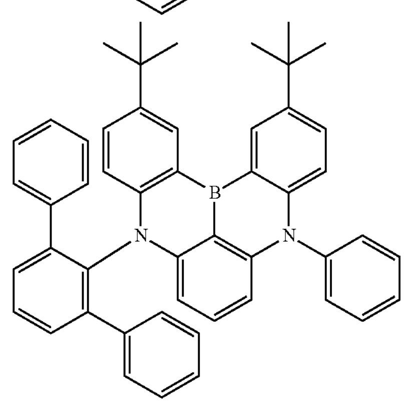

-continued
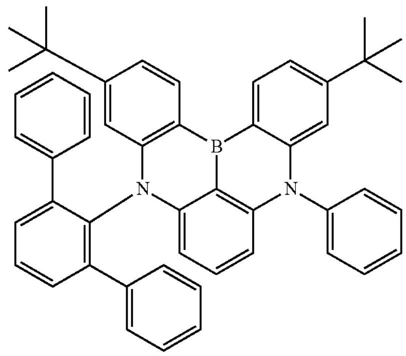
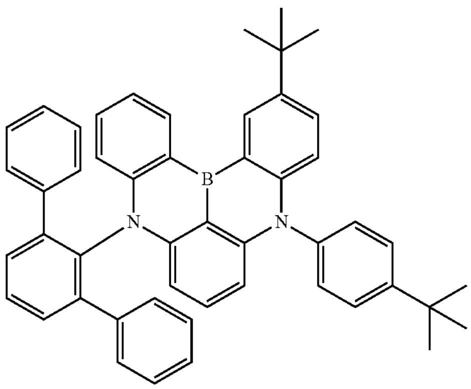
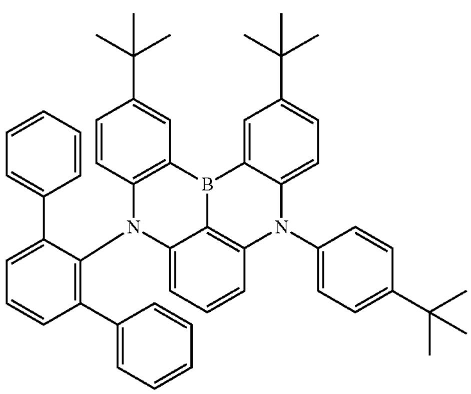
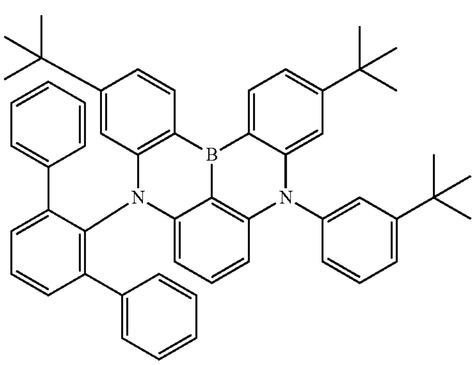
-continued
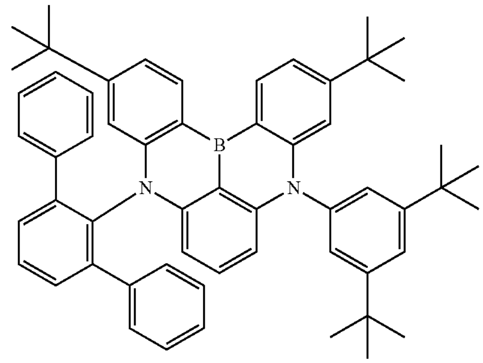
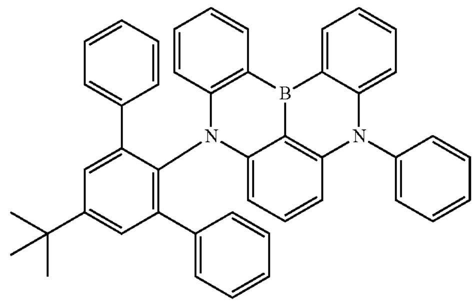
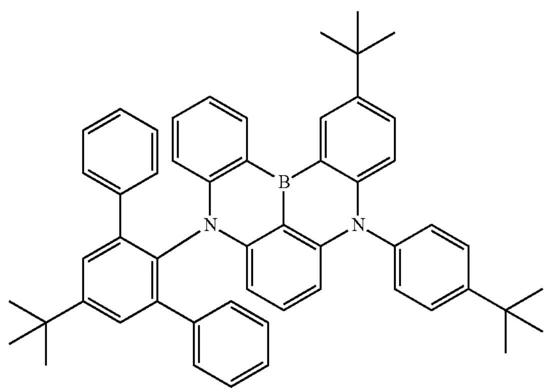
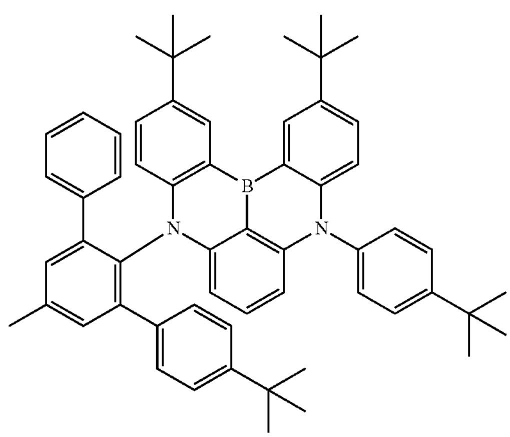

-continued
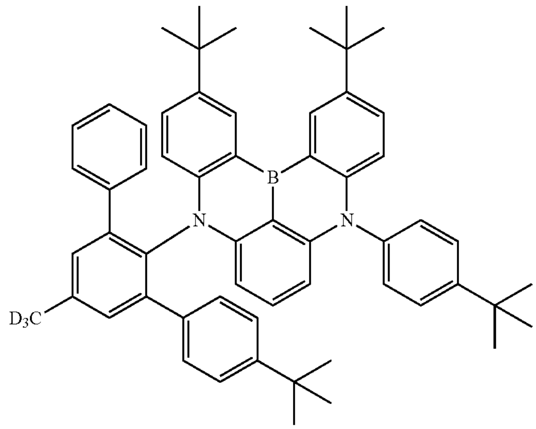
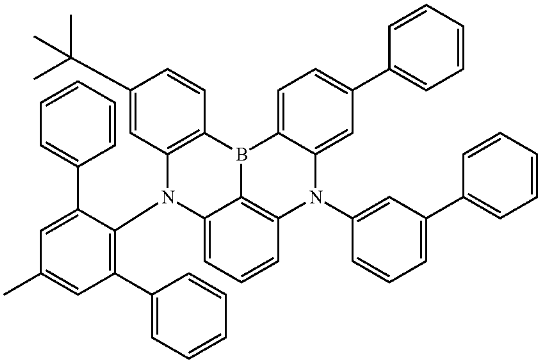
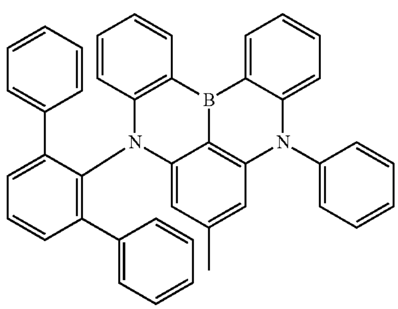
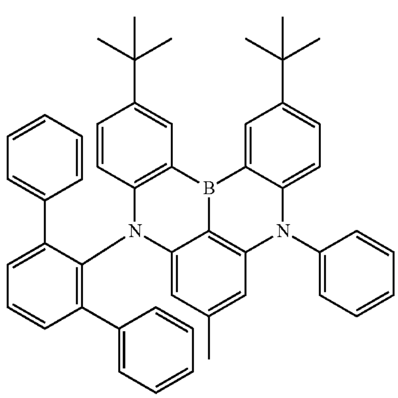
-continued
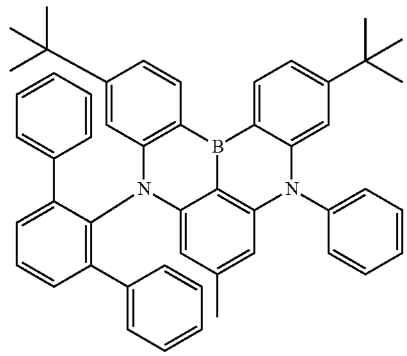
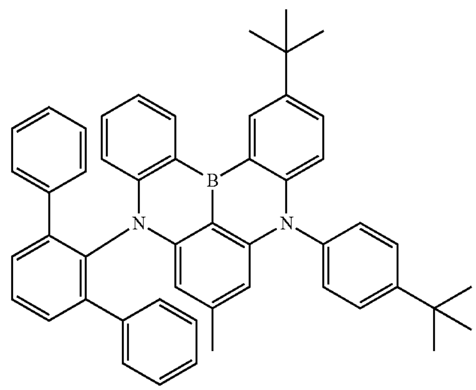
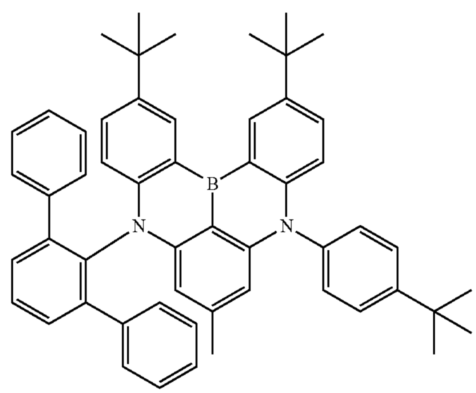
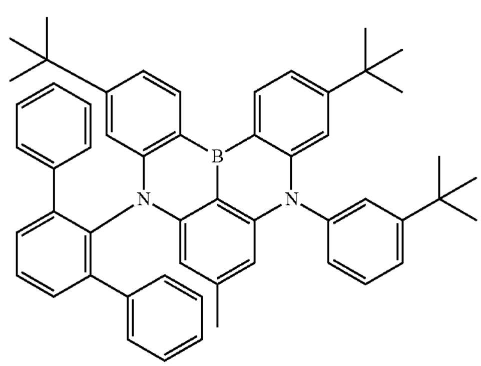

-continued
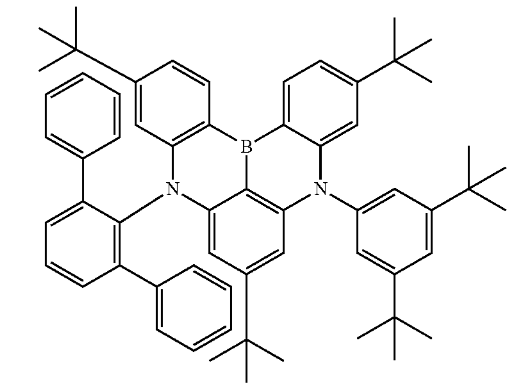
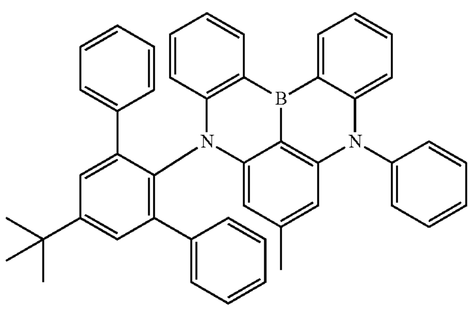
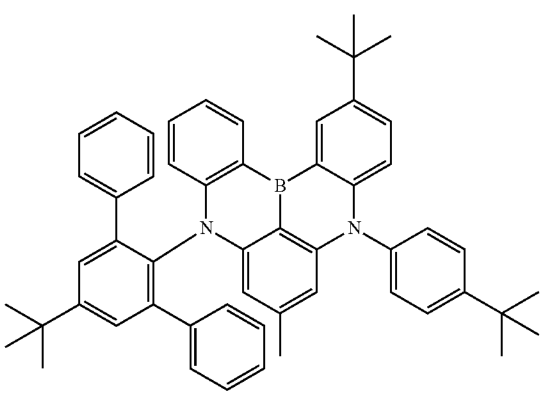
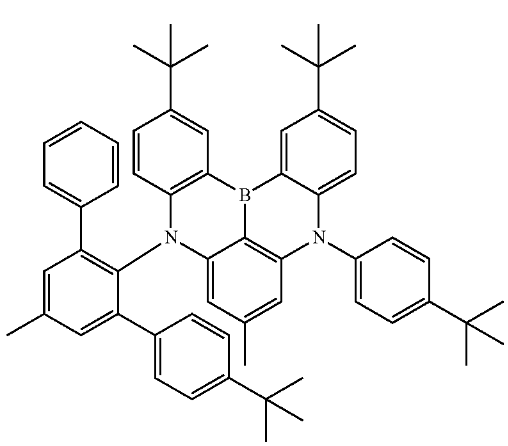
-continued
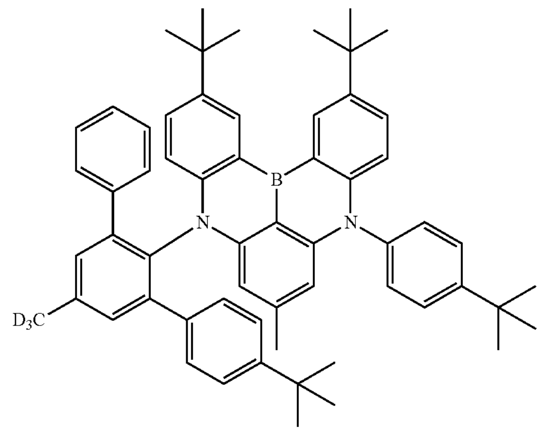
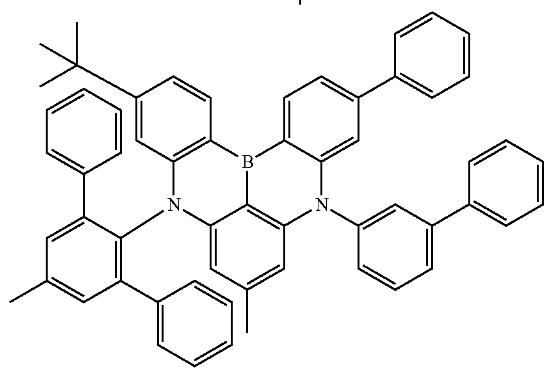
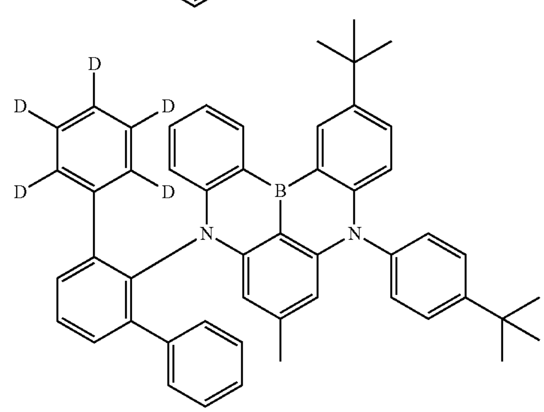
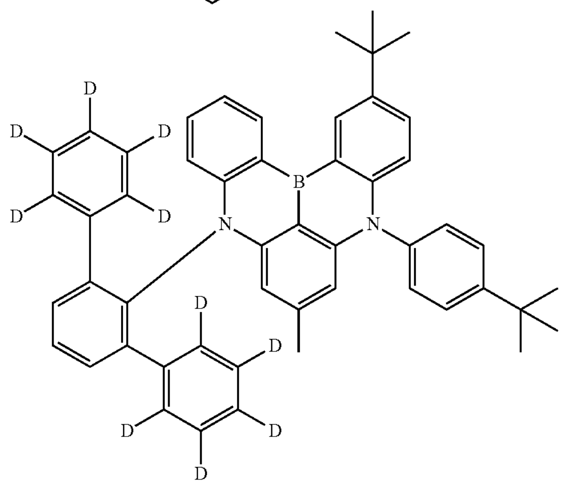

-continued
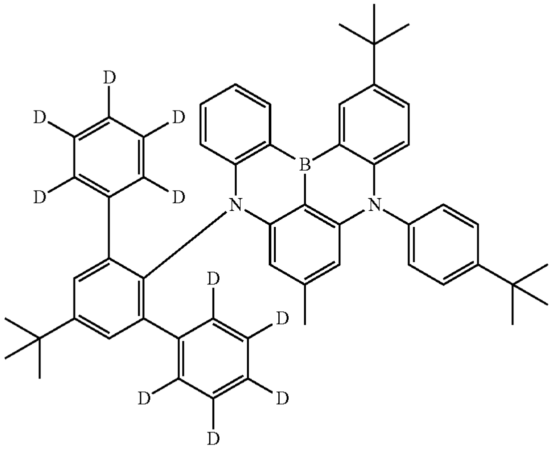
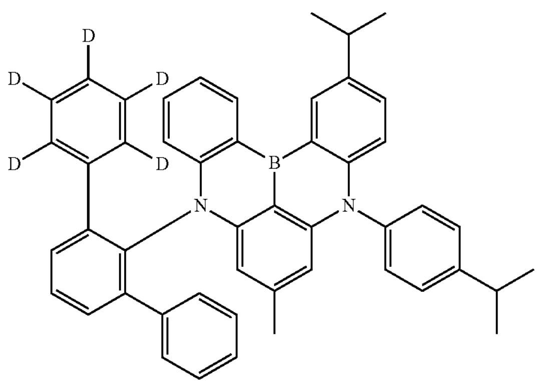
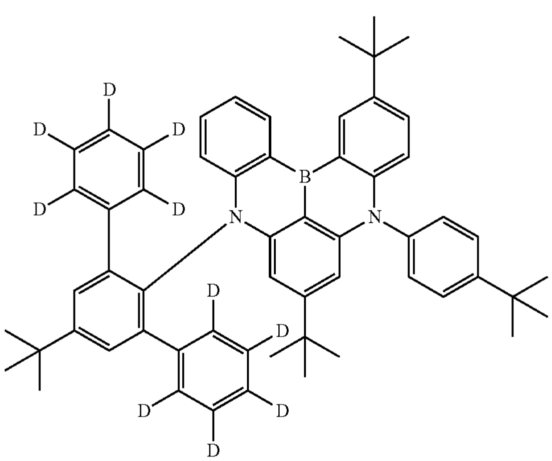
-continued
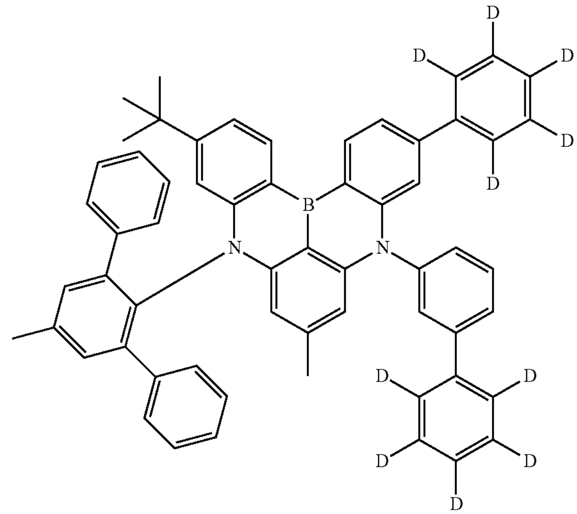
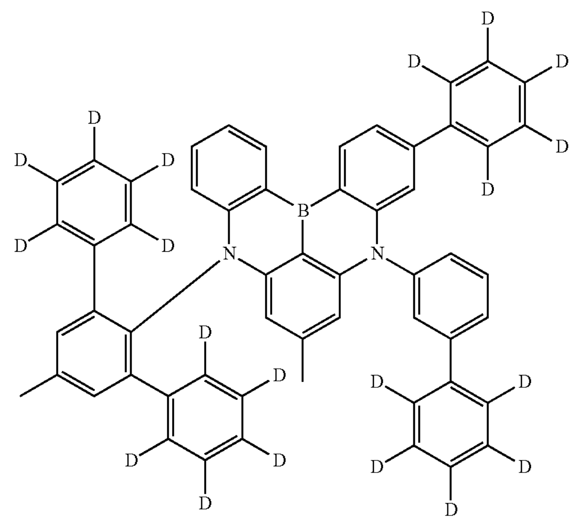
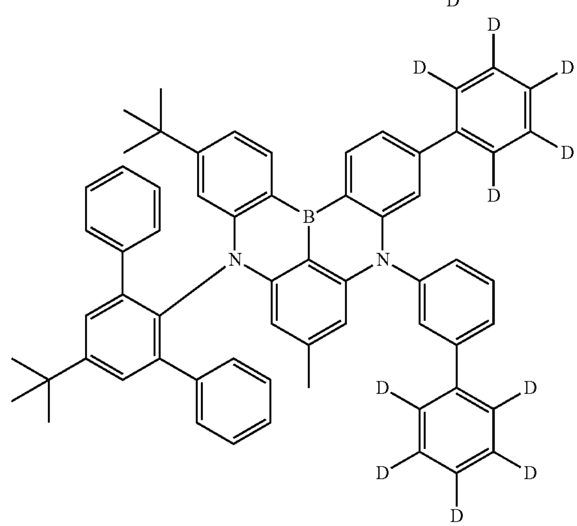

-continued
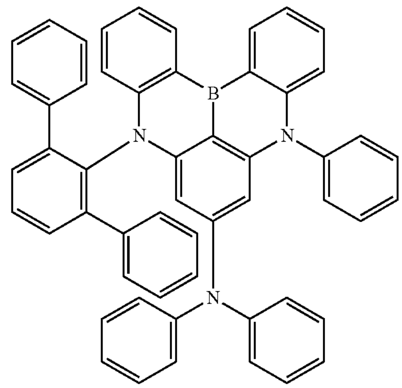
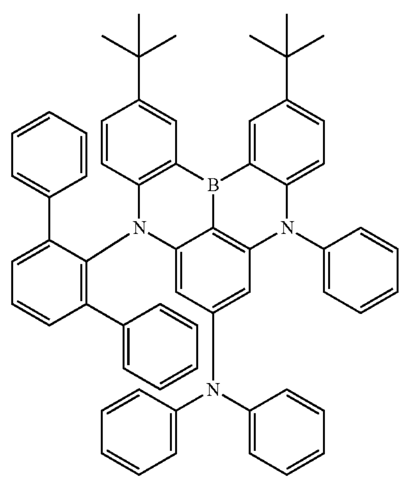
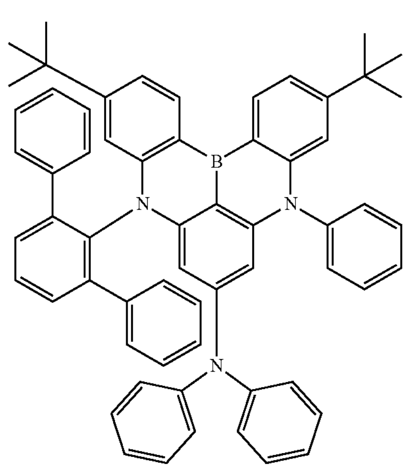
-continued
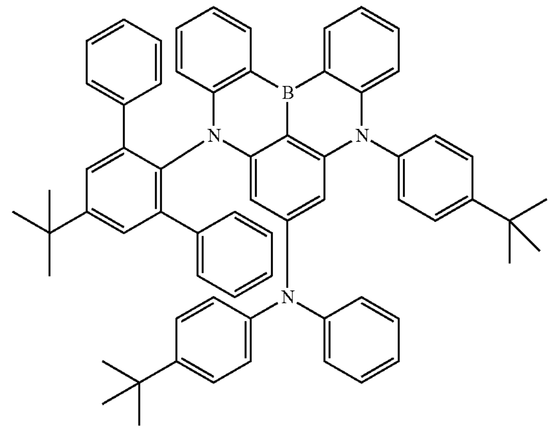
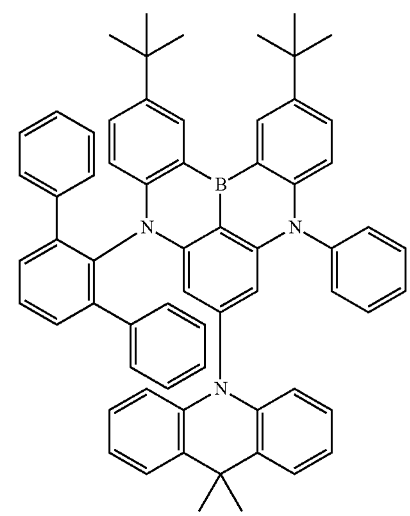
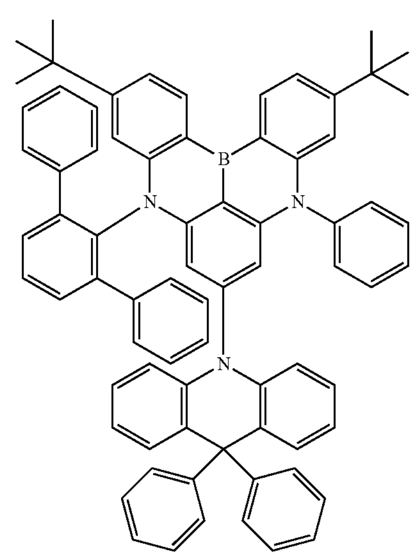

-continued
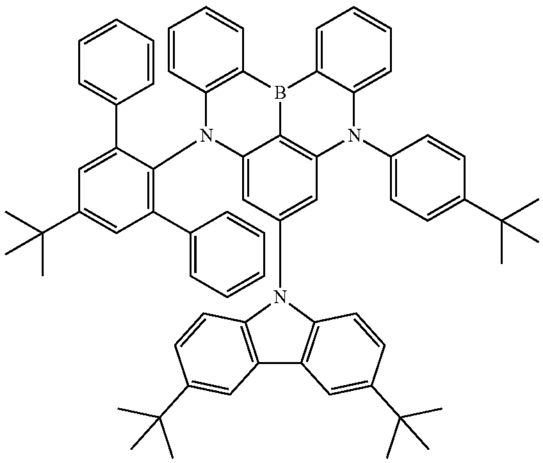
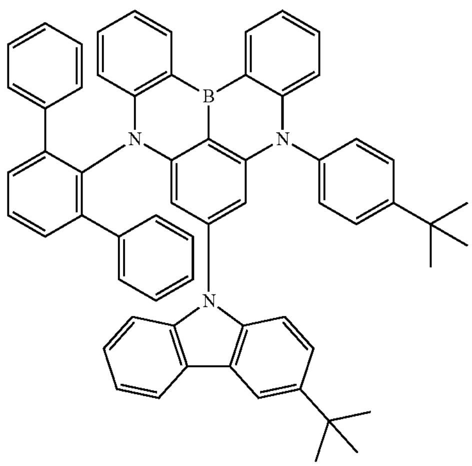
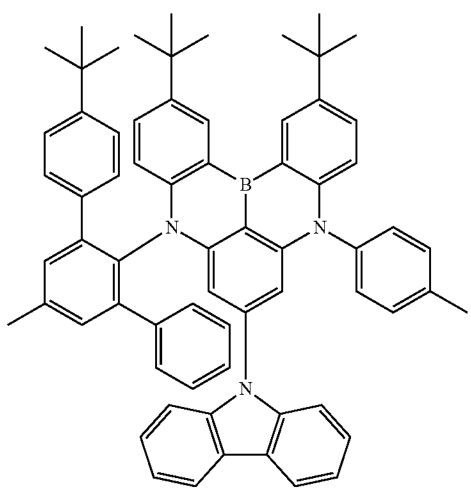
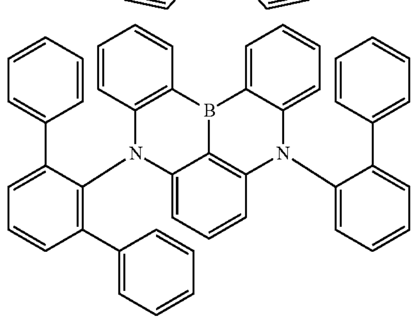
-continued
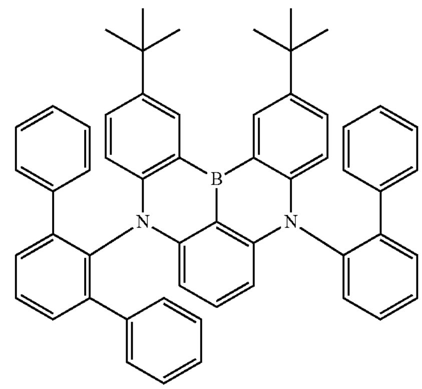
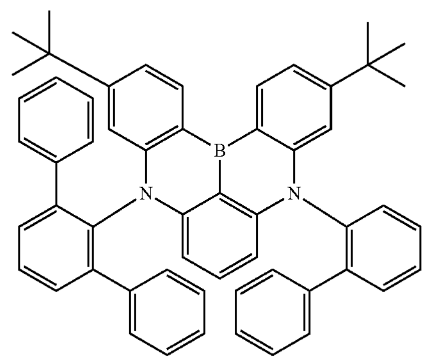
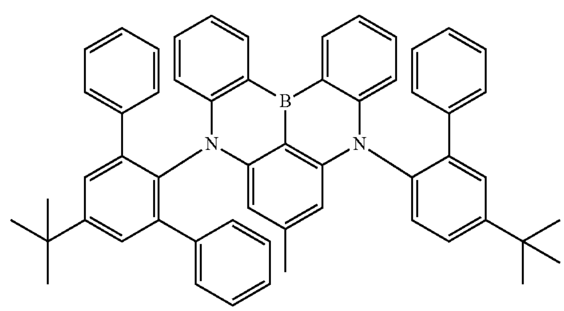
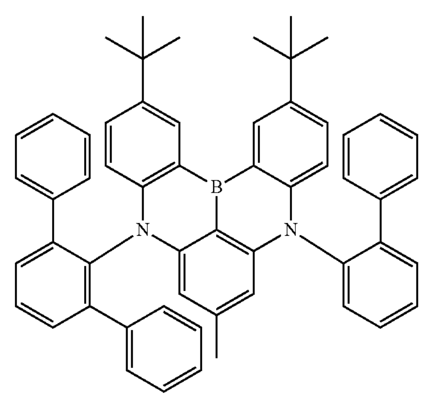

-continued
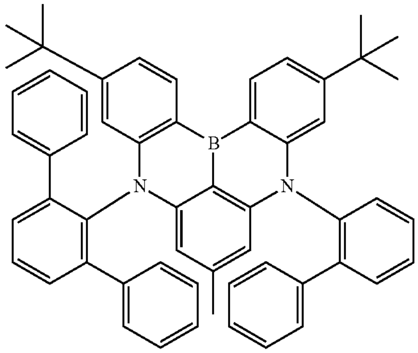
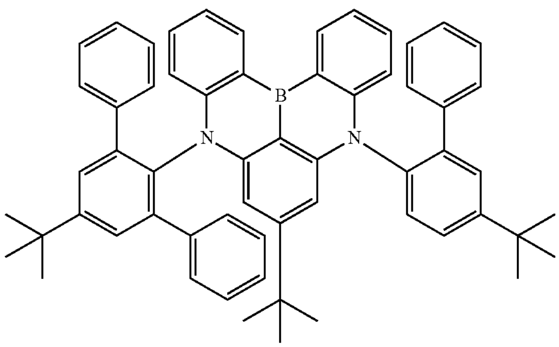
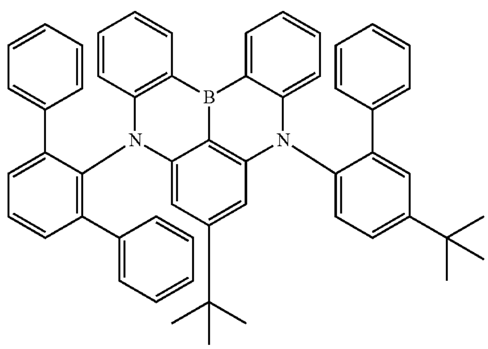
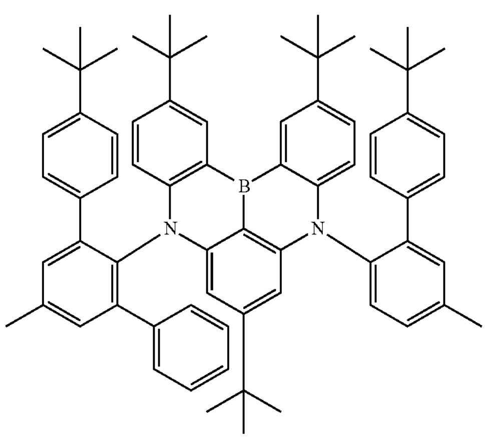
-continued
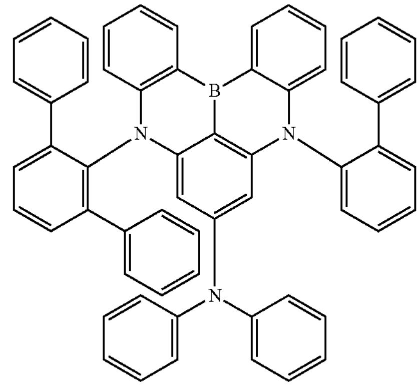
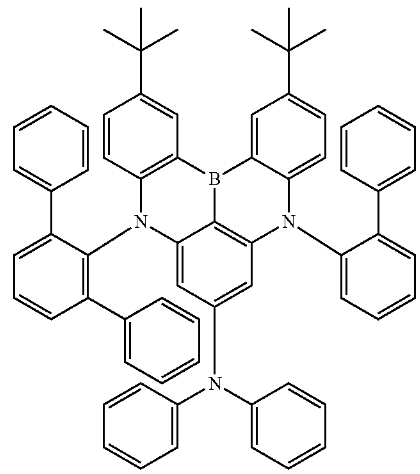
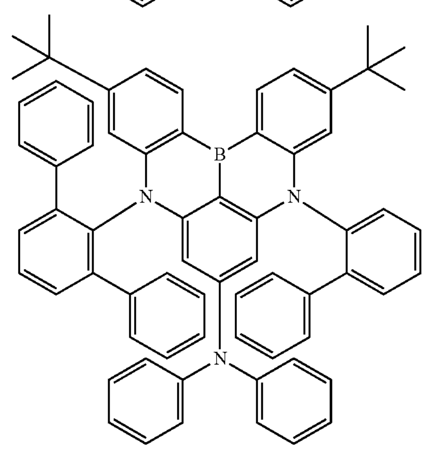
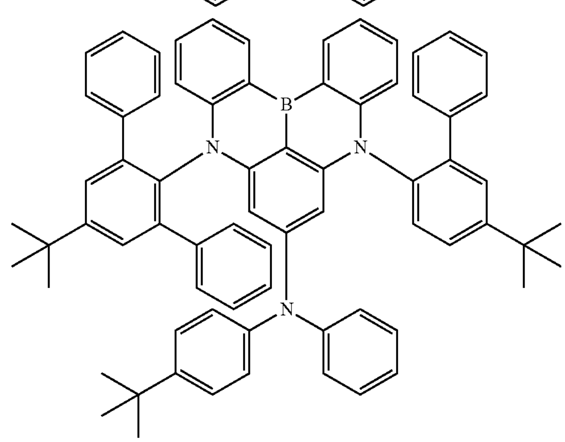

-continued
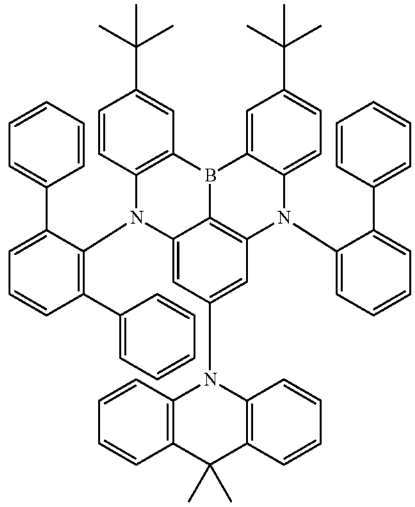
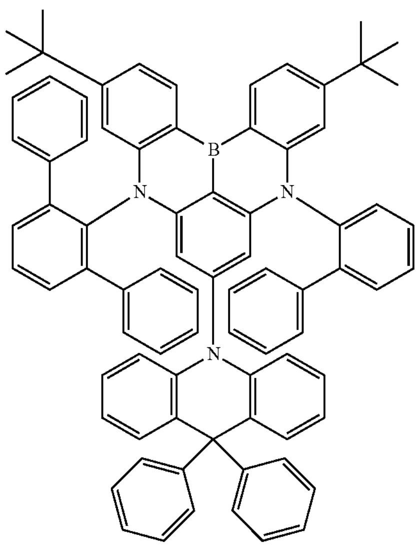
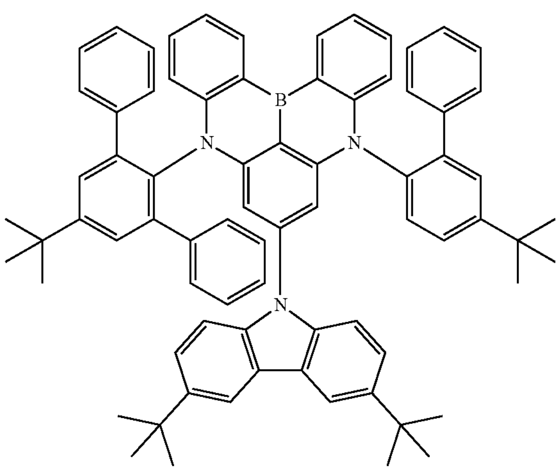
-continued
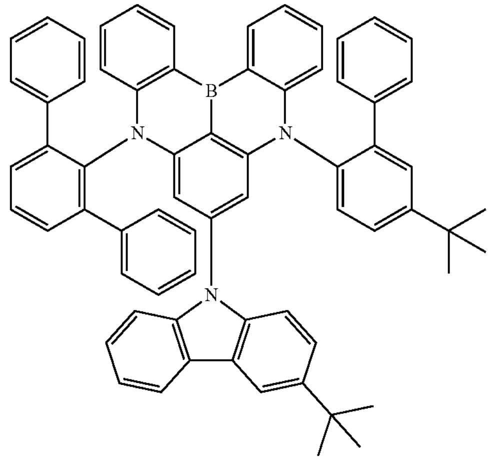
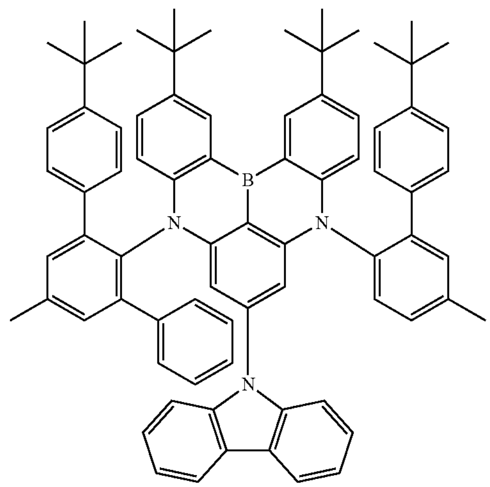
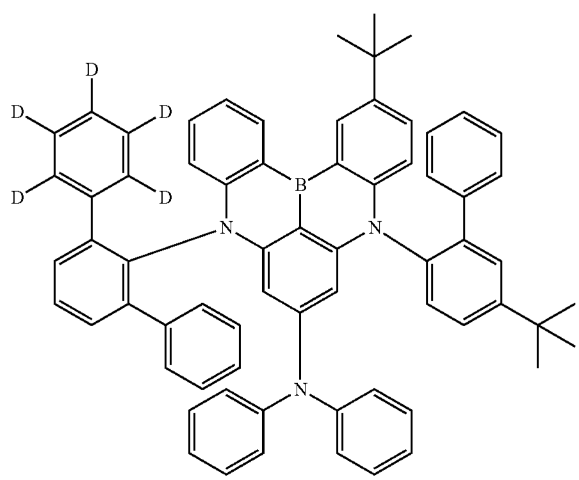

-continued
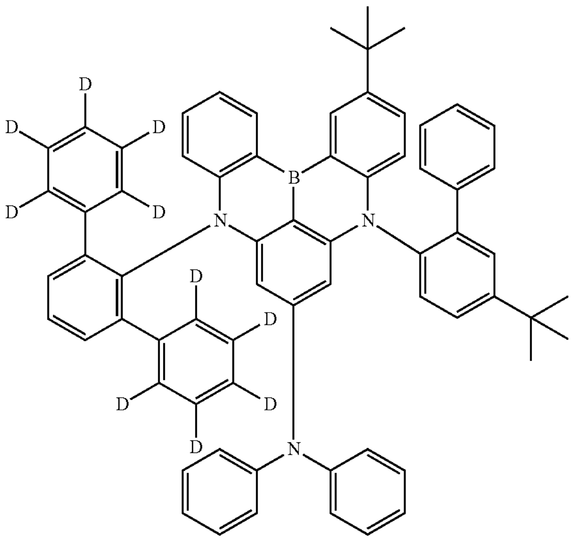
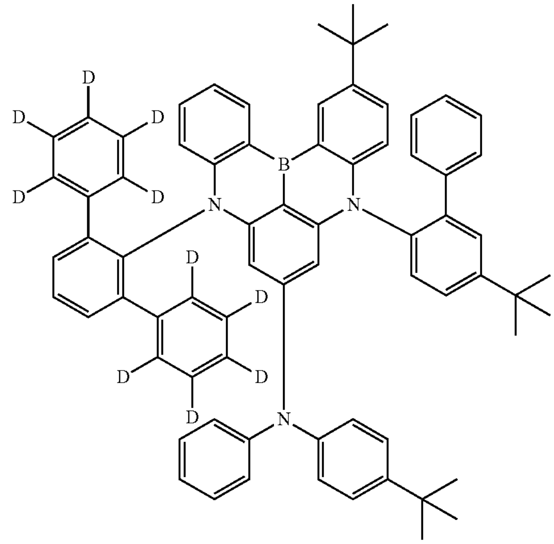
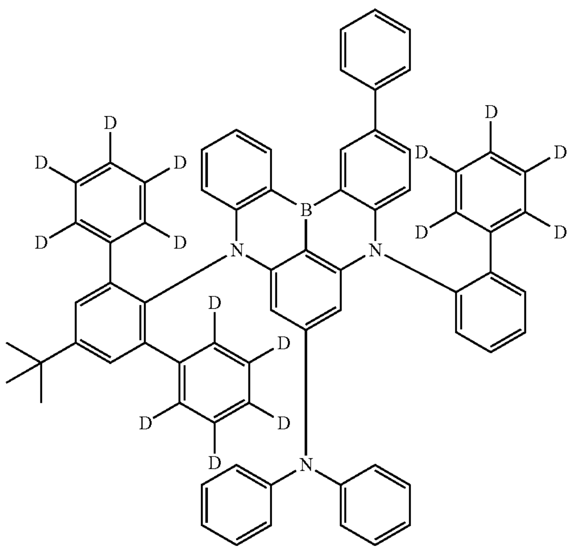
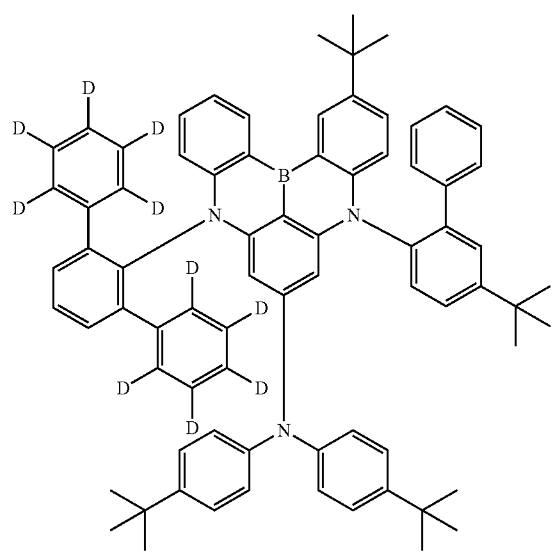
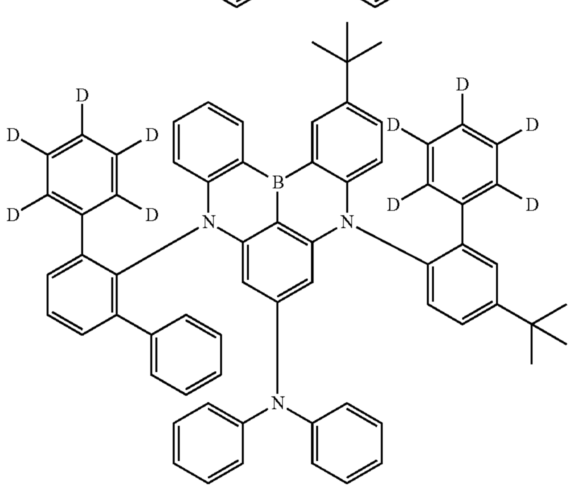
-continued
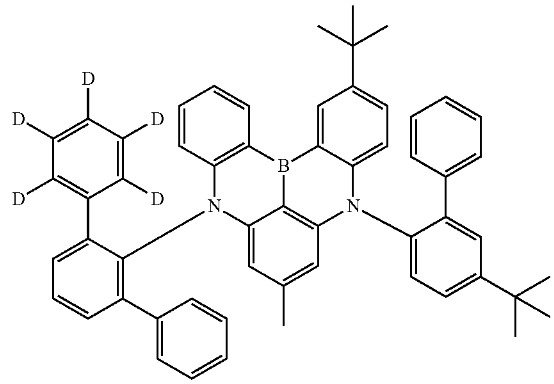

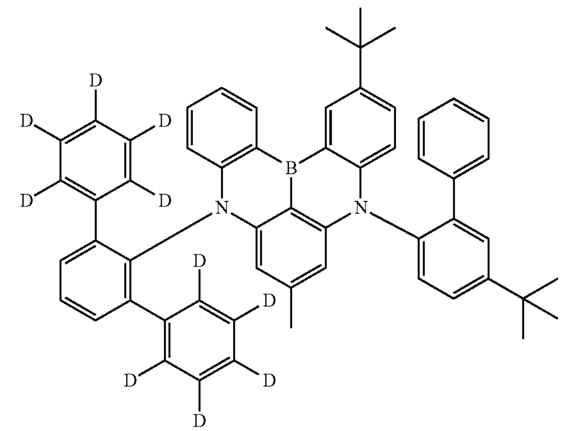
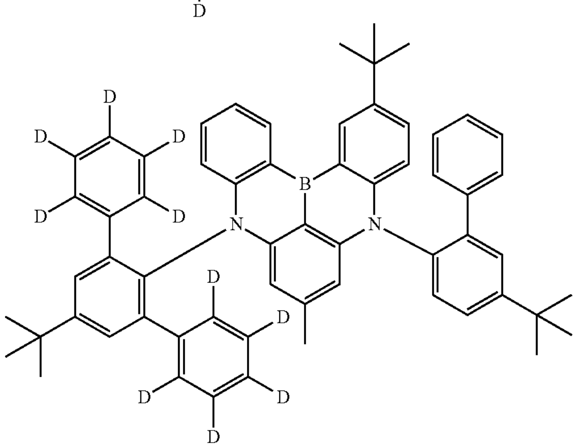
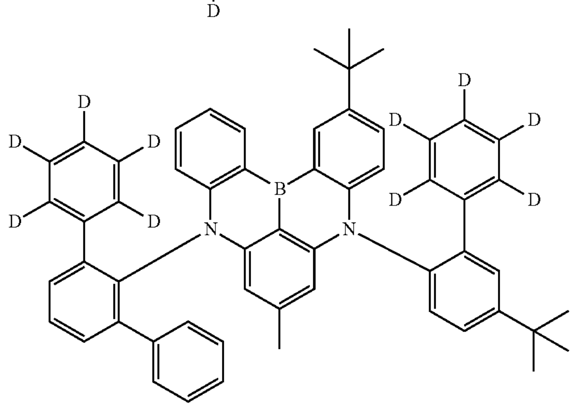
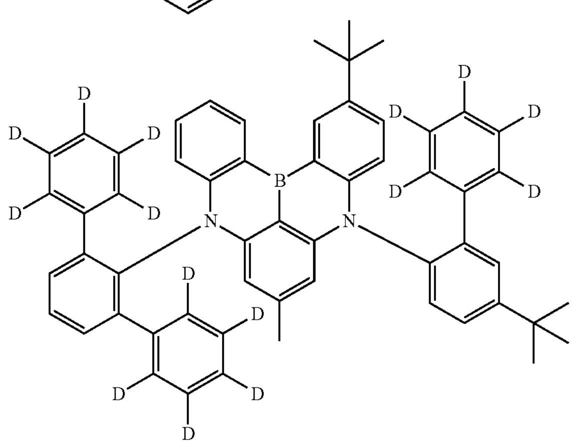
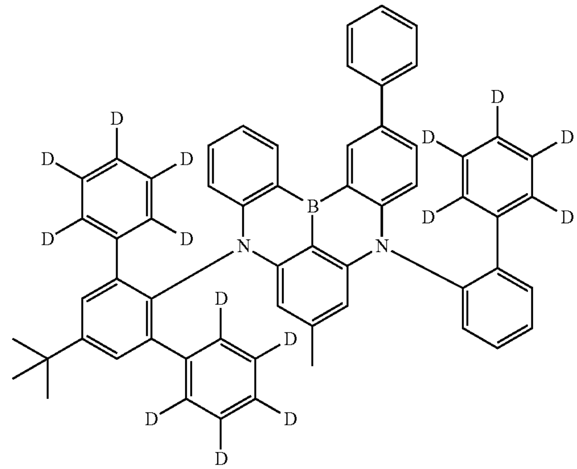
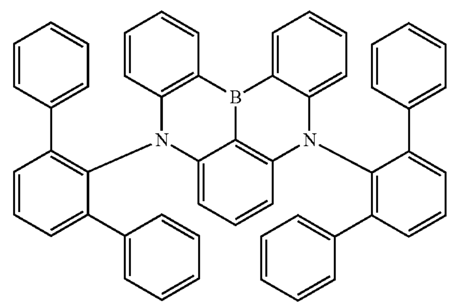
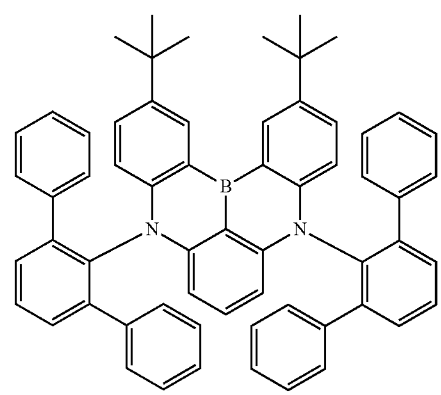
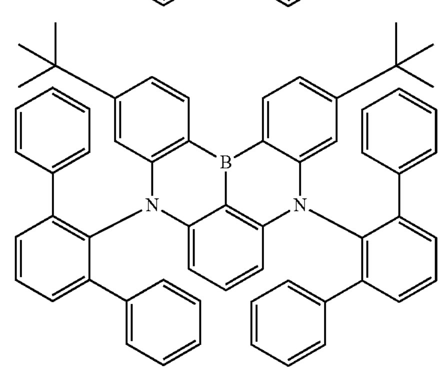

-continued
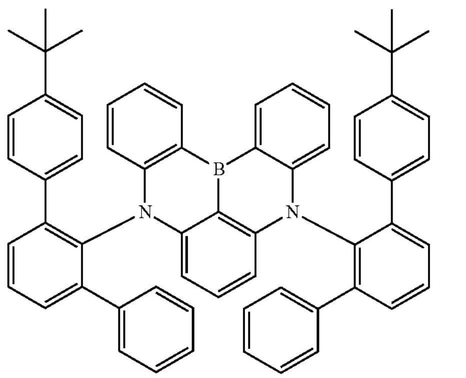
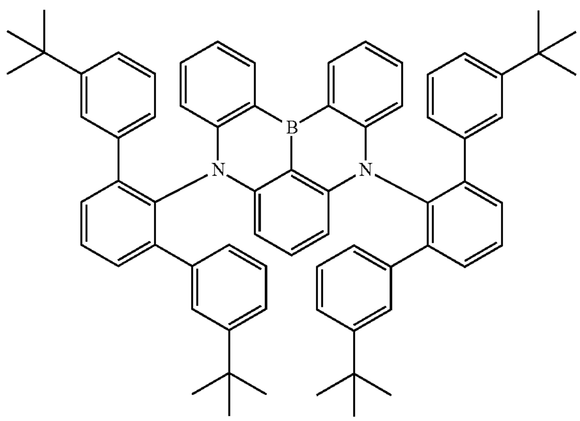
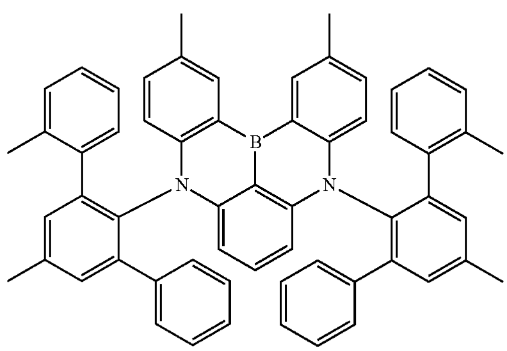
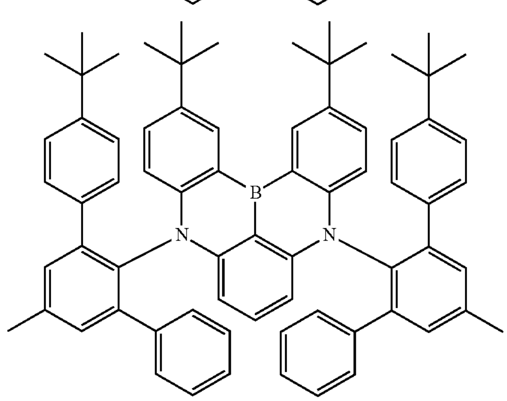
-continued
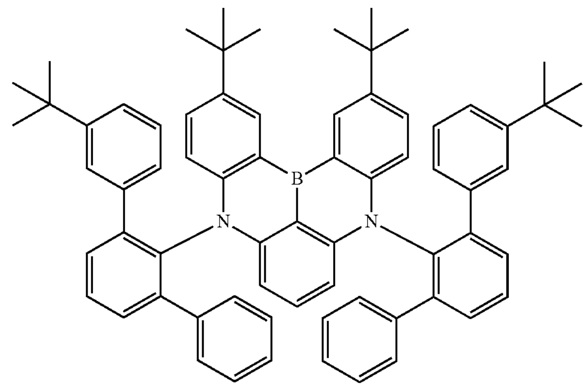
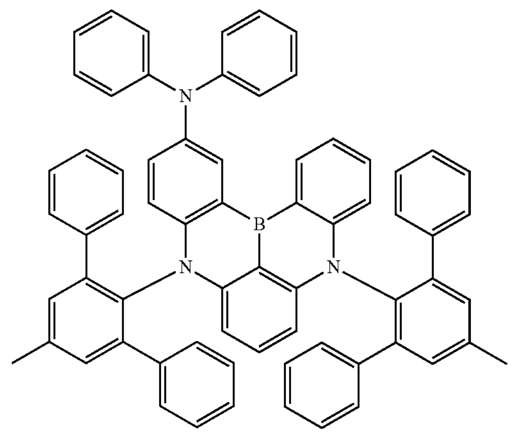
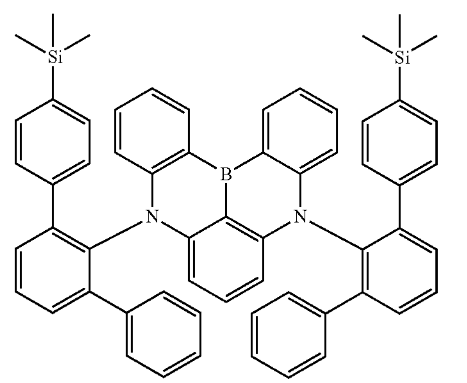
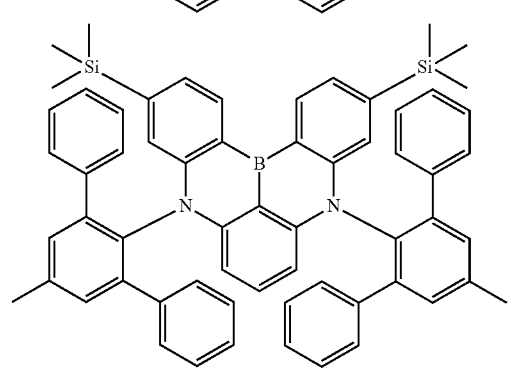

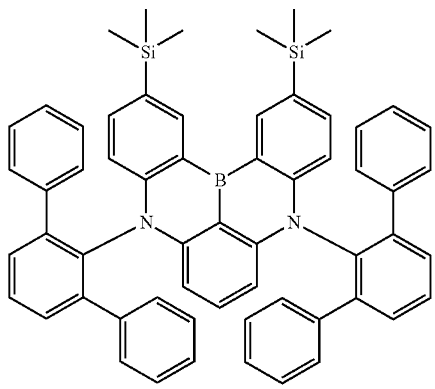
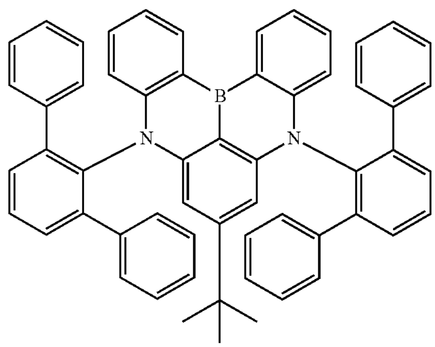
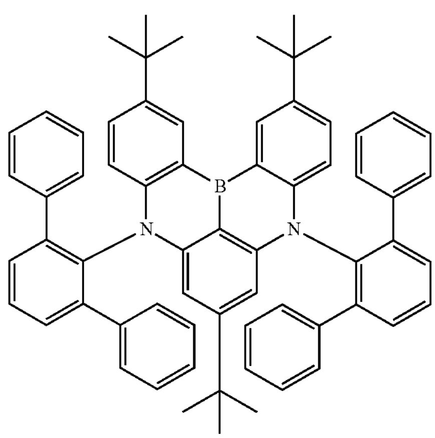
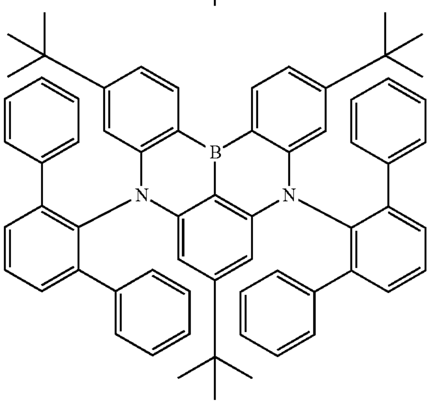
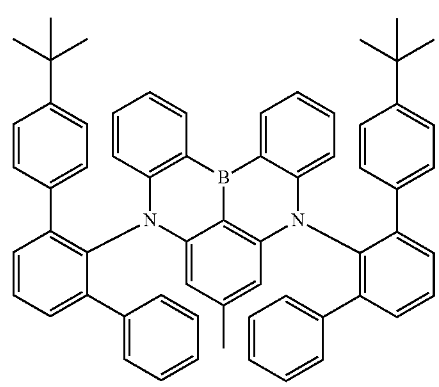
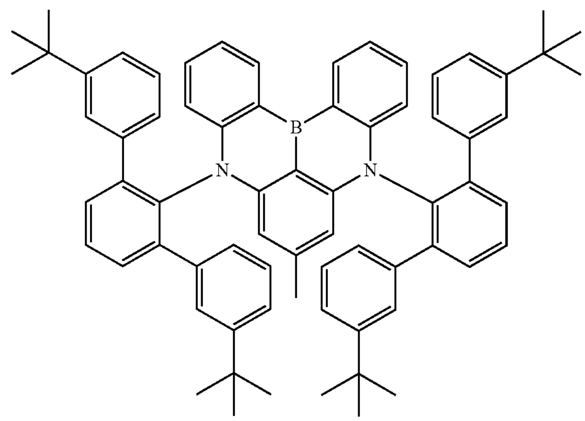
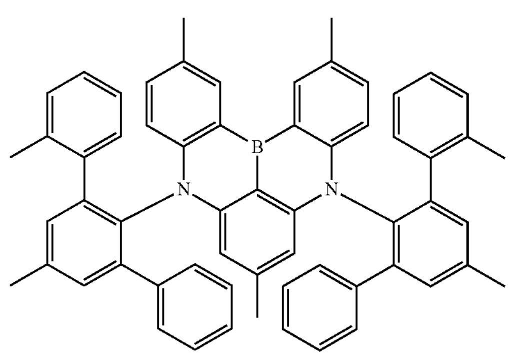
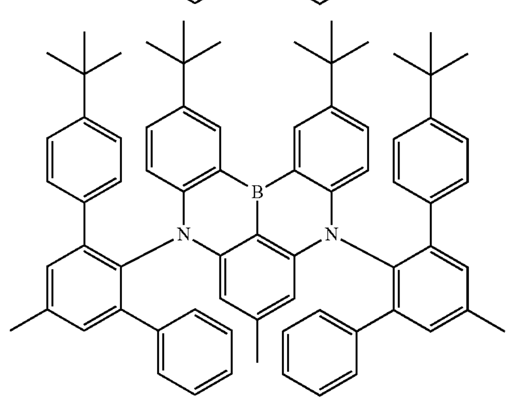

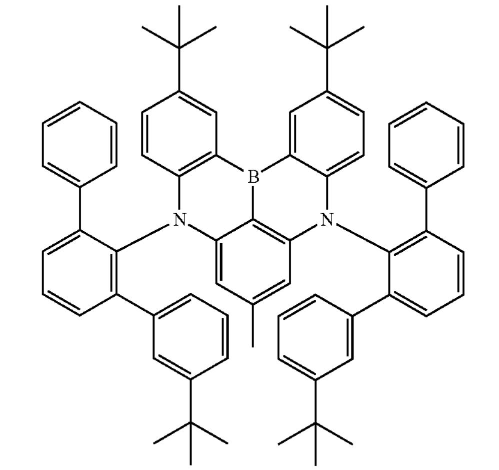
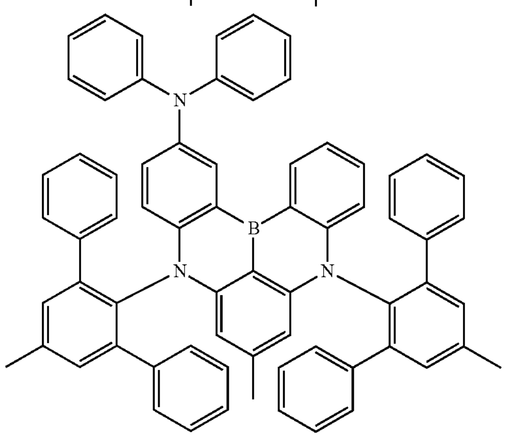
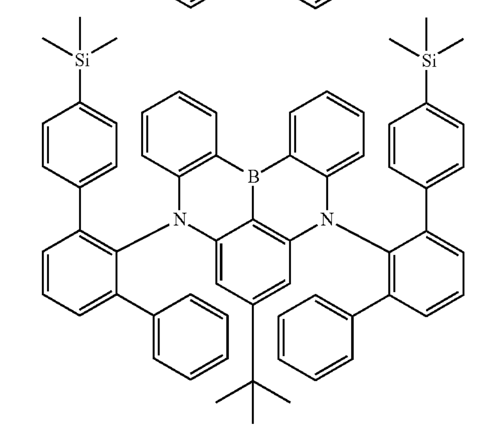
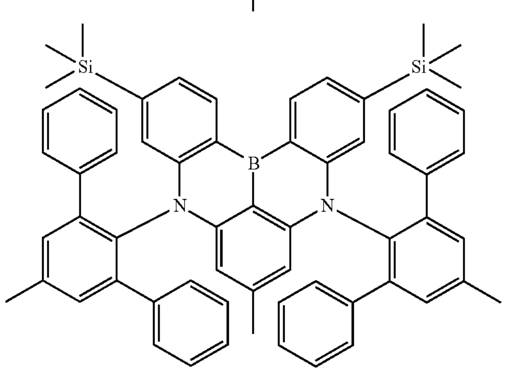
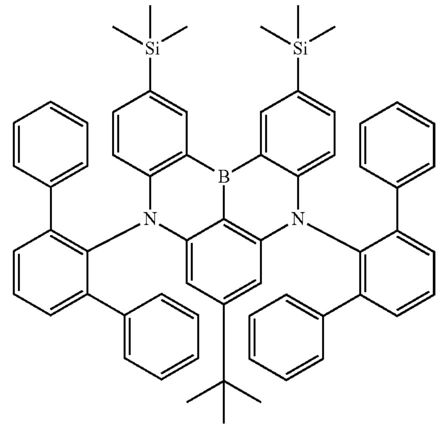
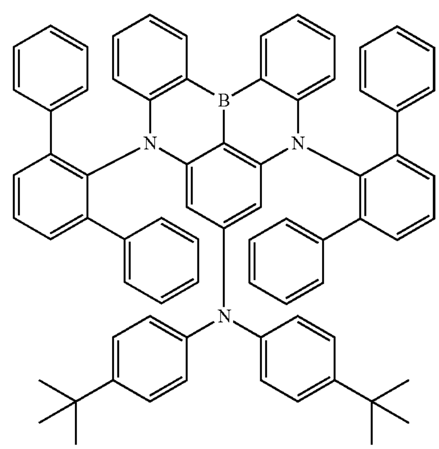
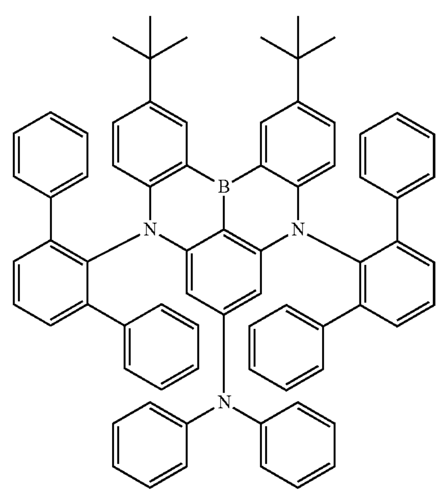

-continued
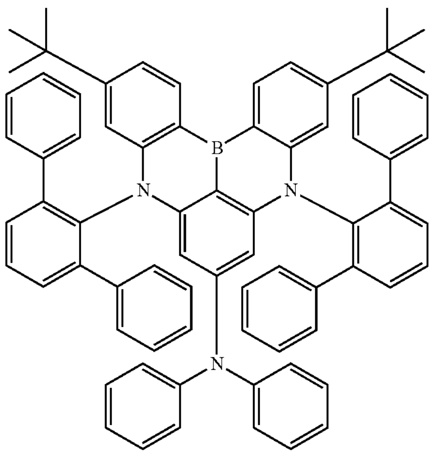
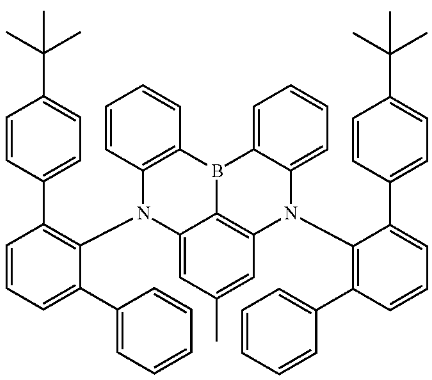
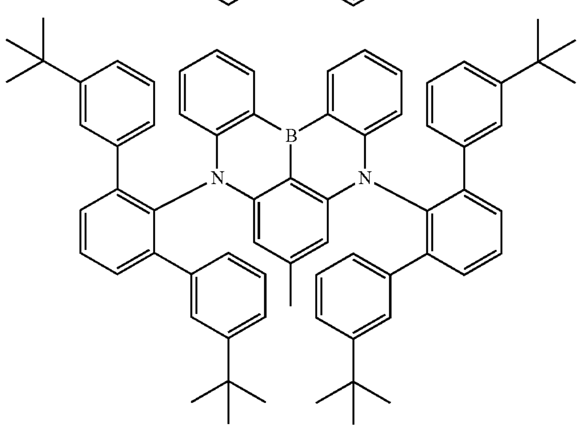
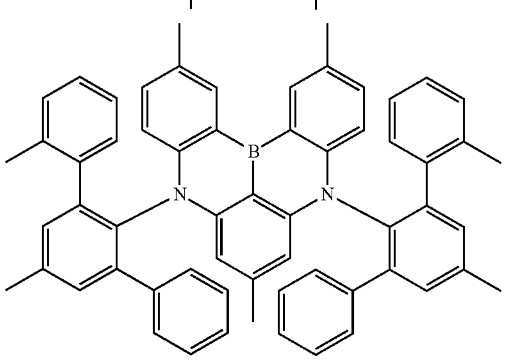
-continued
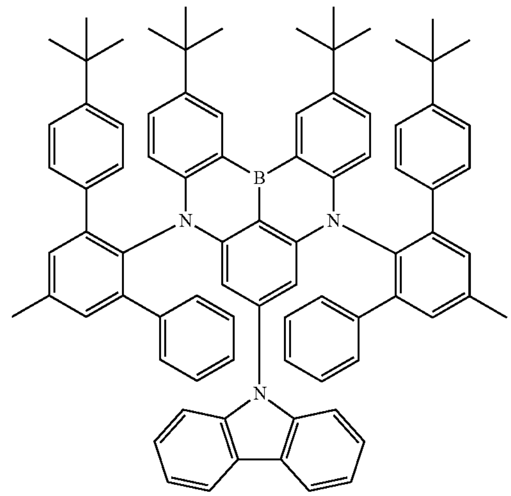
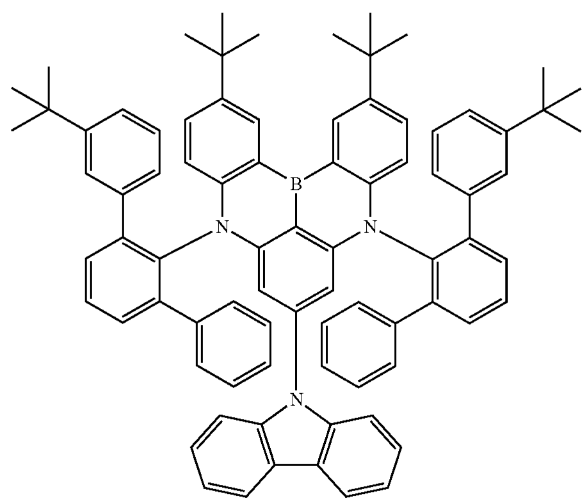
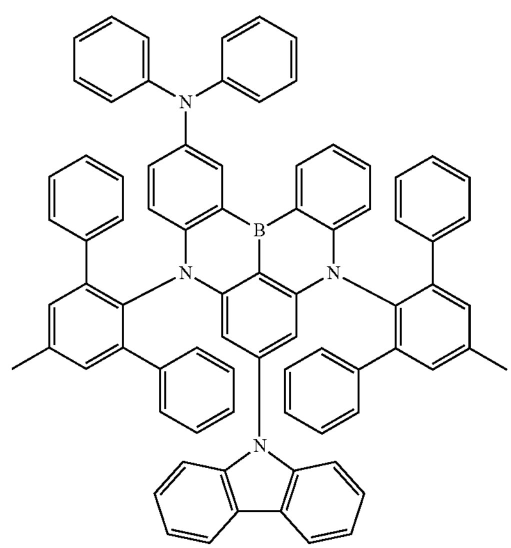

-continued
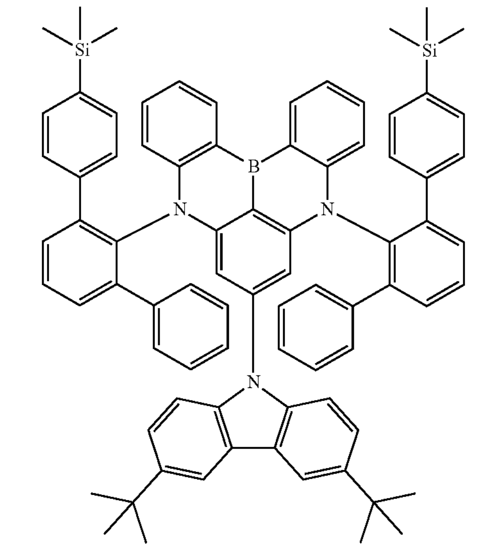
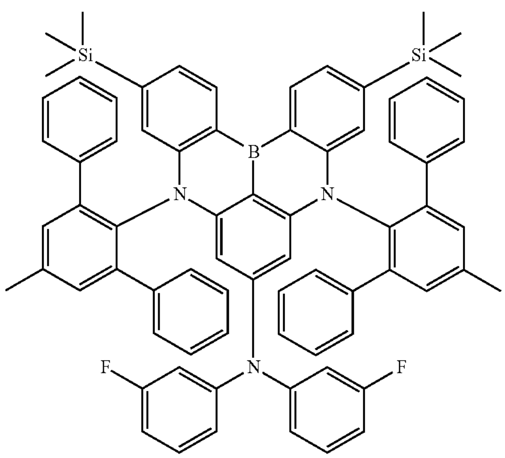
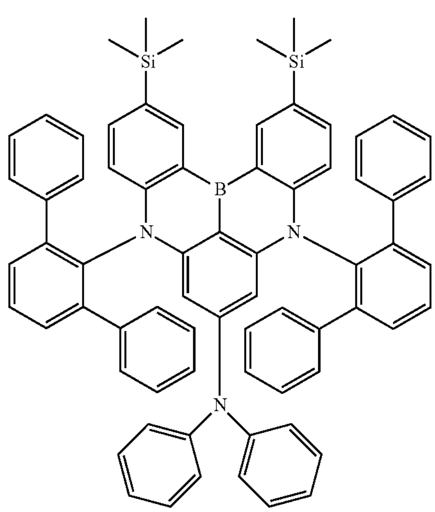
-continued
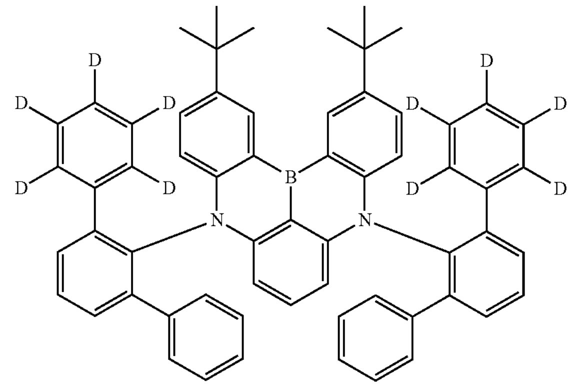
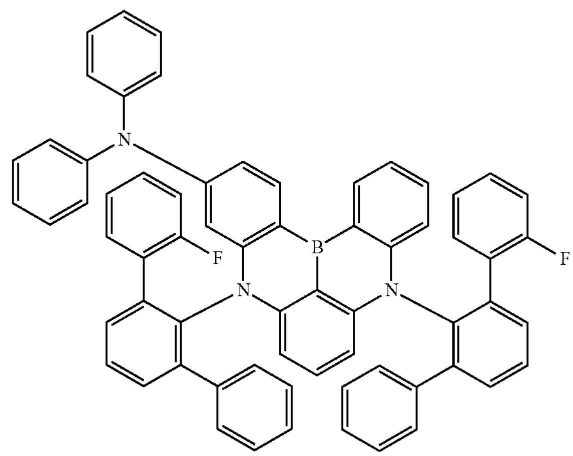
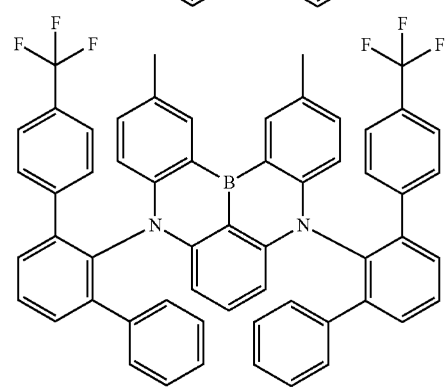
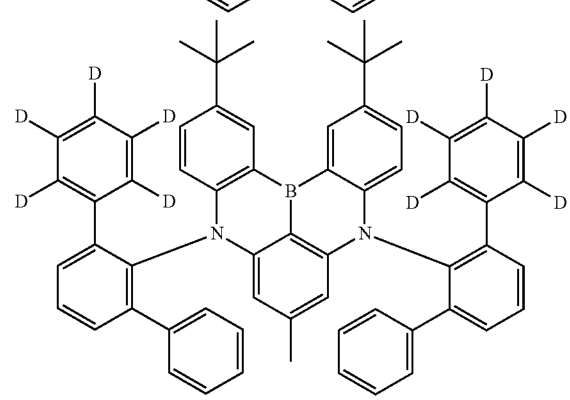

-continued
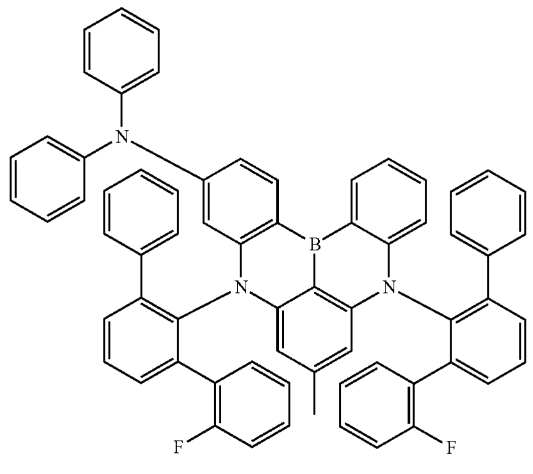
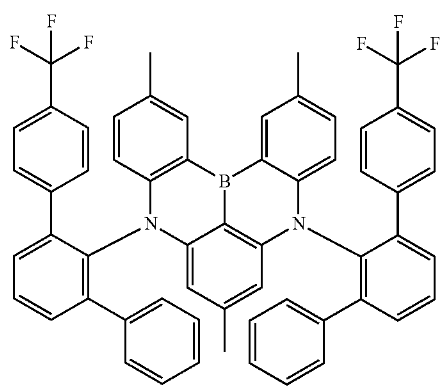
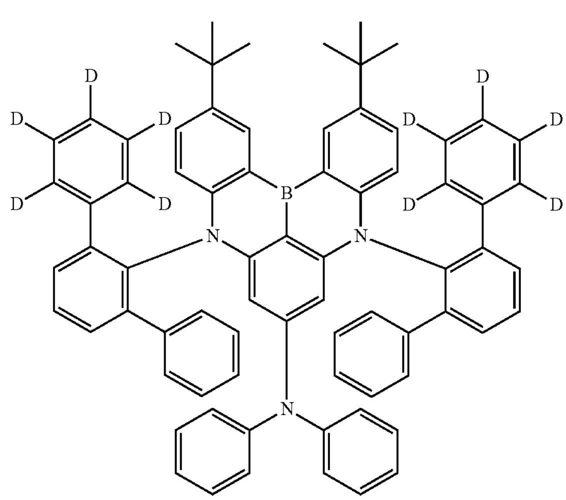
-continued
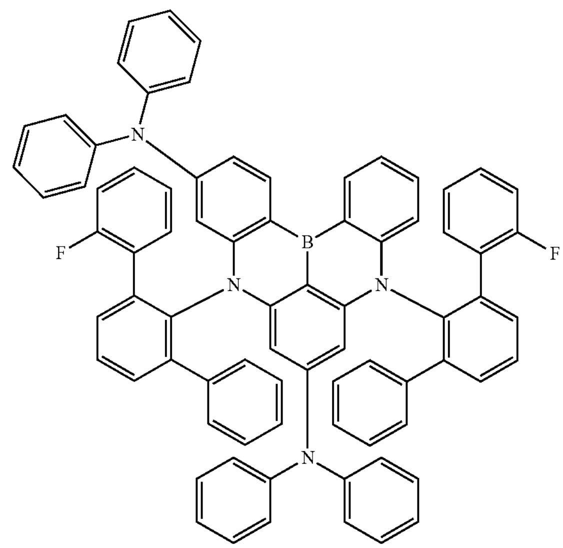
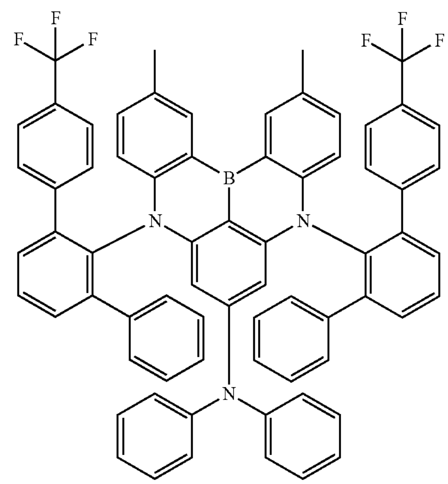
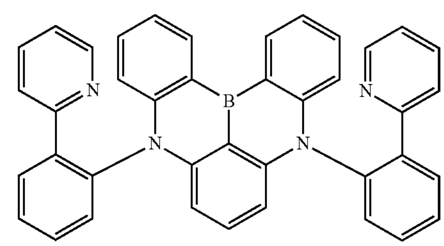
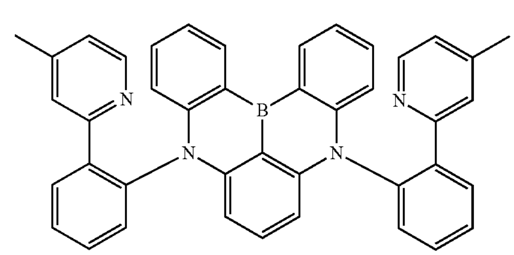

-continued
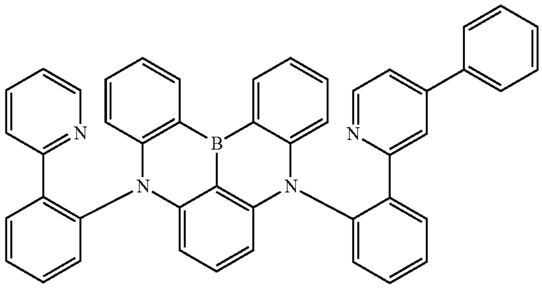
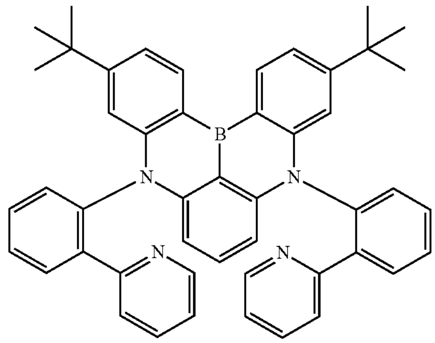
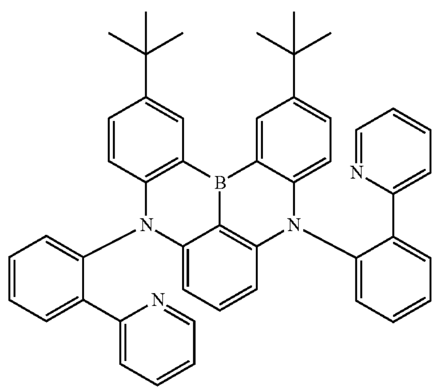
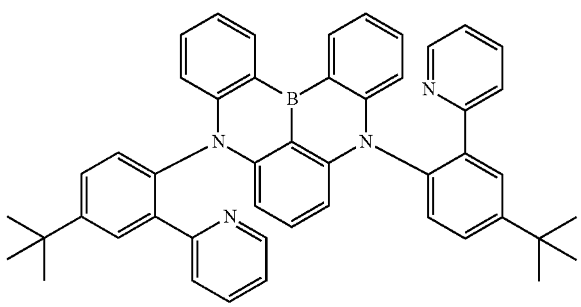
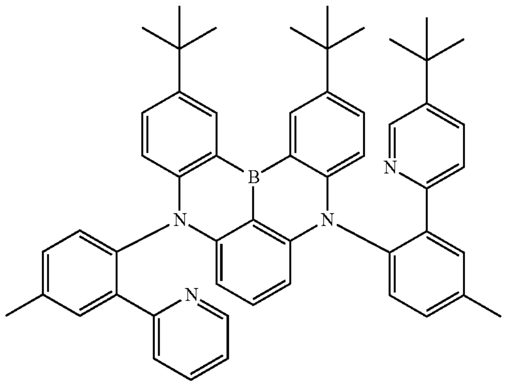
-continued
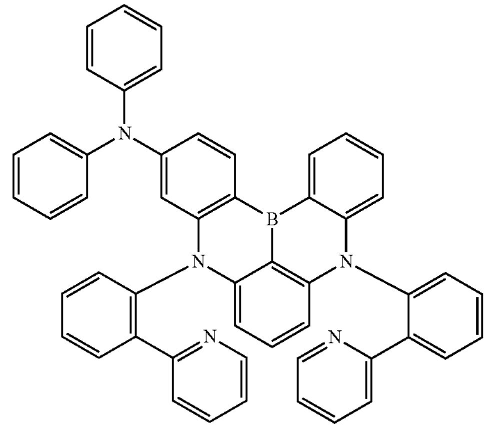
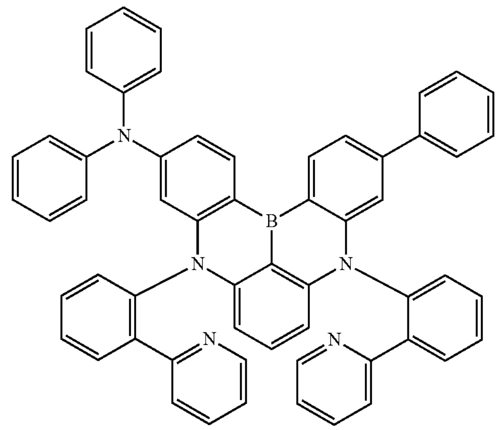
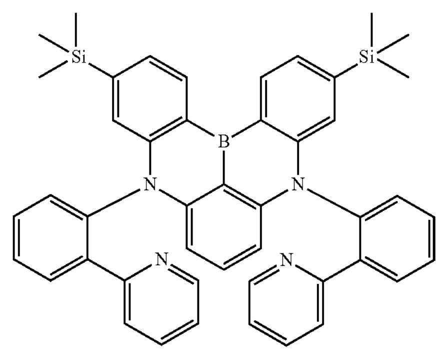
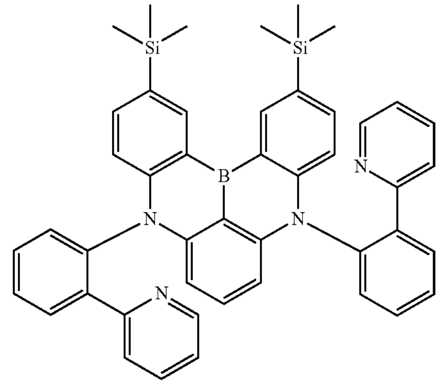

-continued
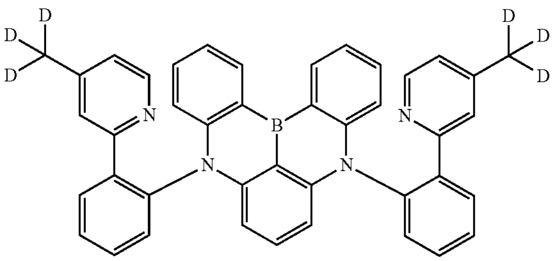
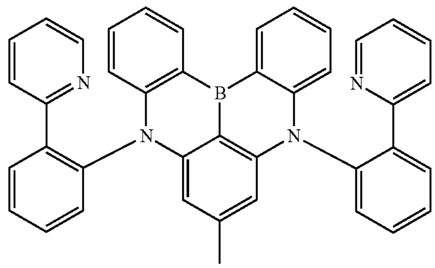
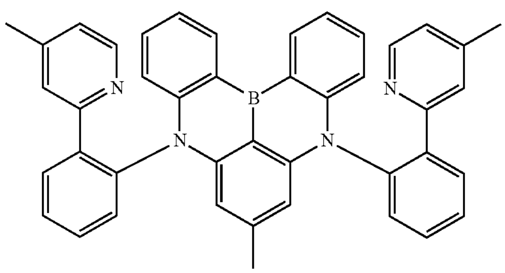
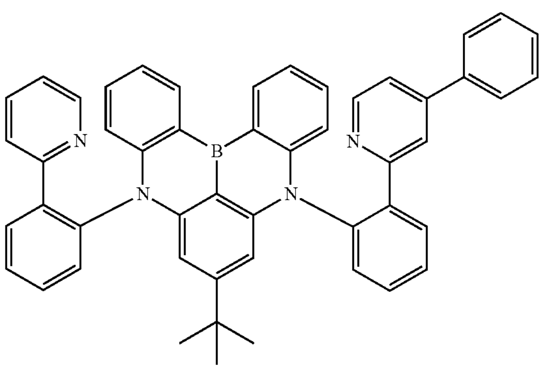
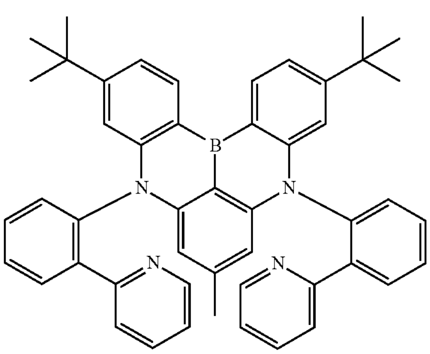
-continued
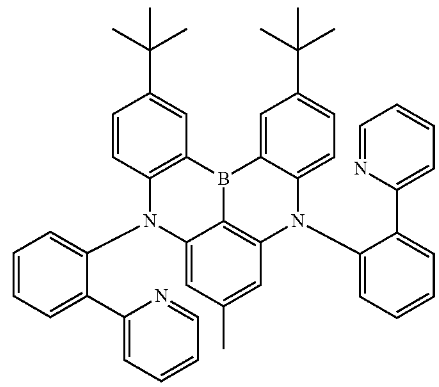
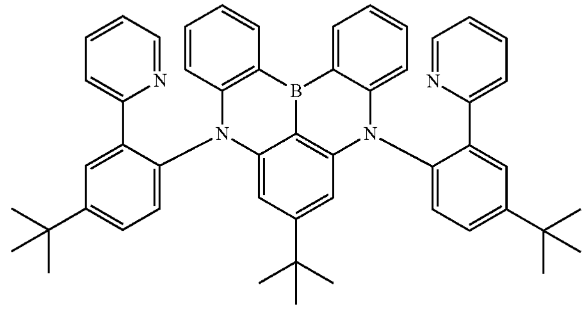
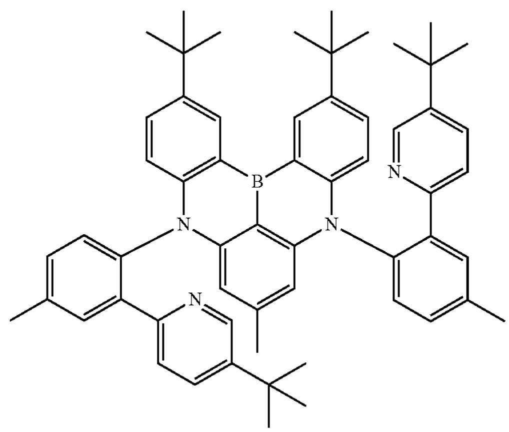
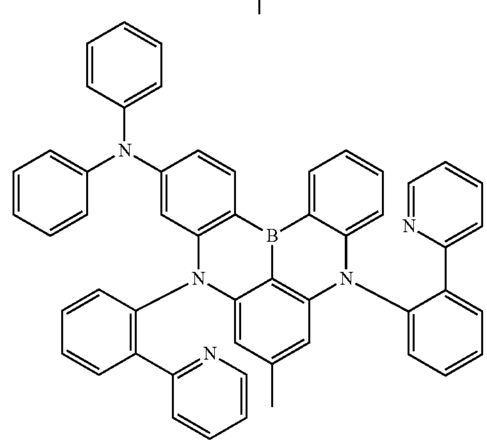

-continued
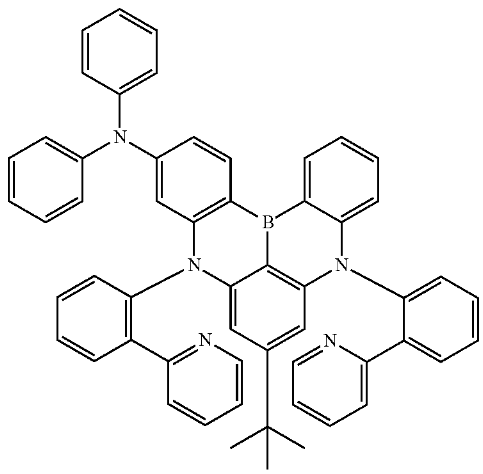
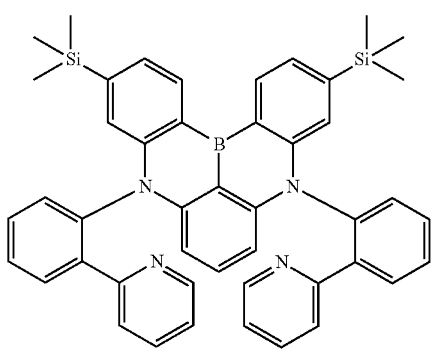
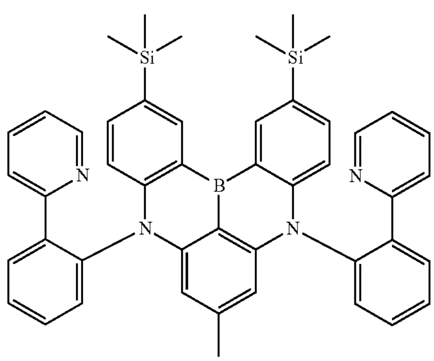
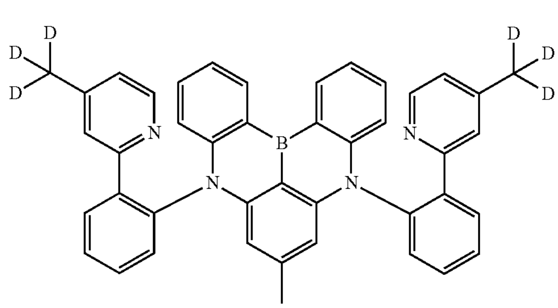
-continued
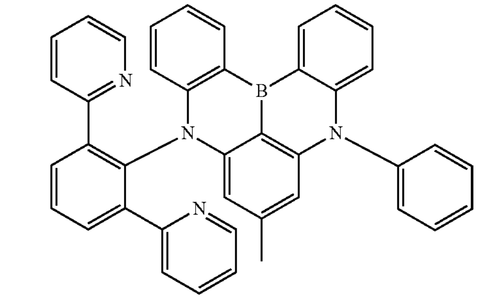
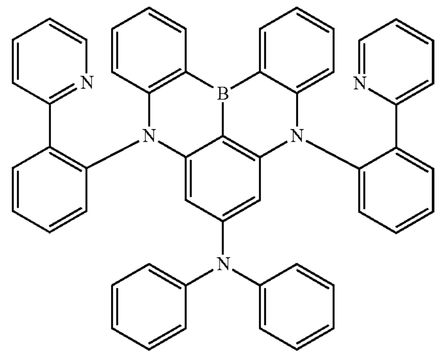
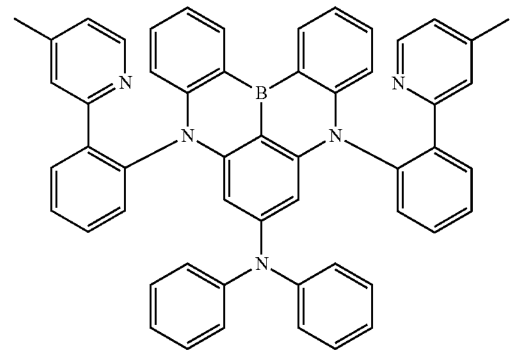
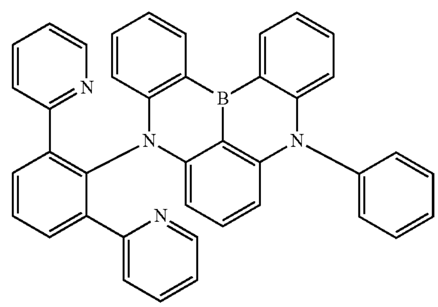
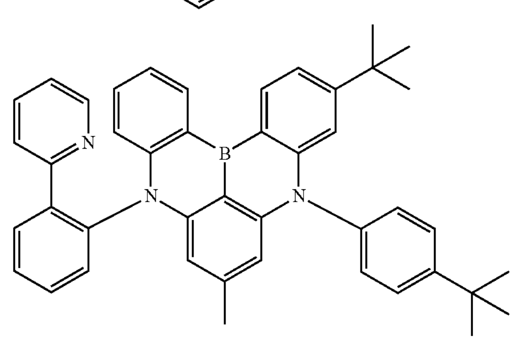

-continued
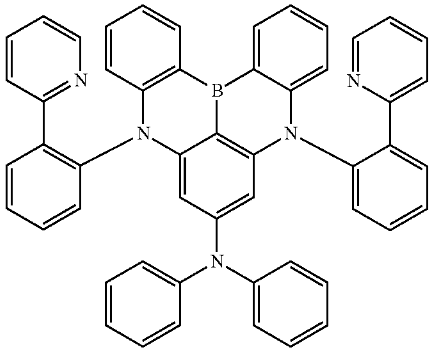
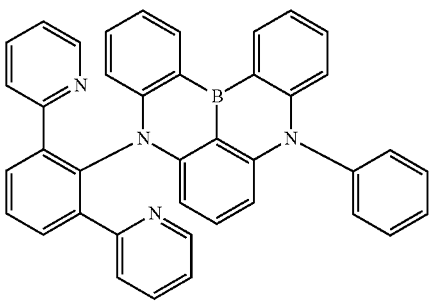
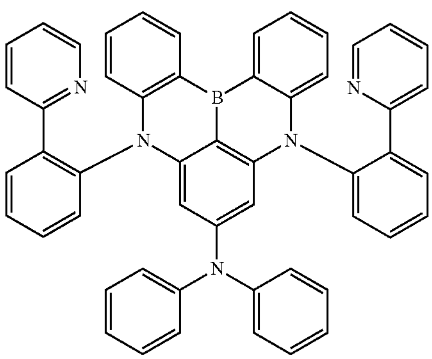
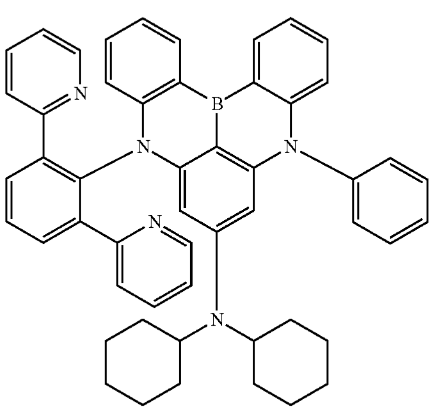
-continued
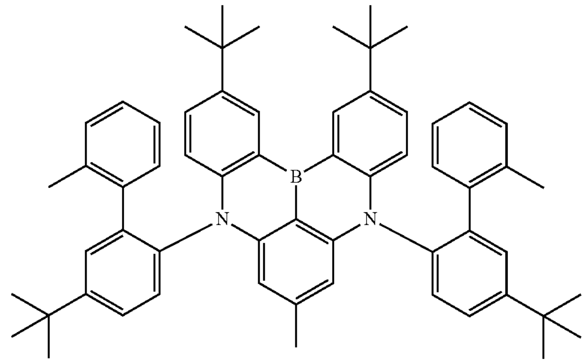
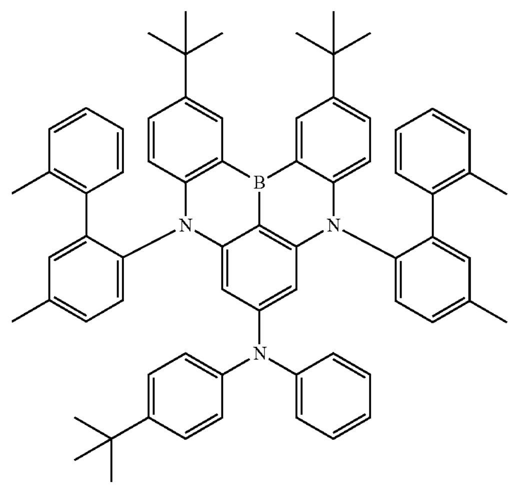
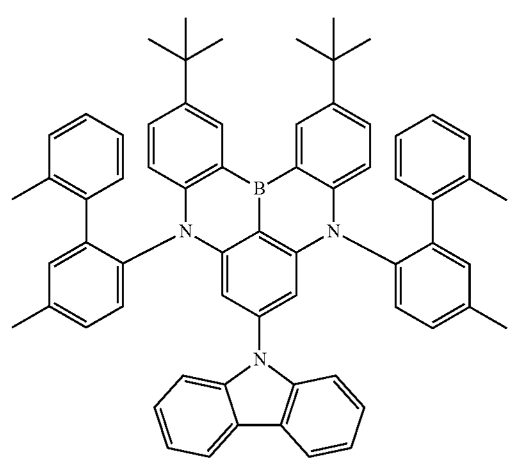

-continued
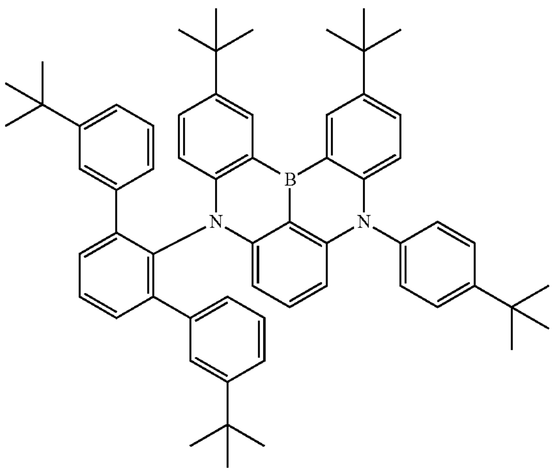
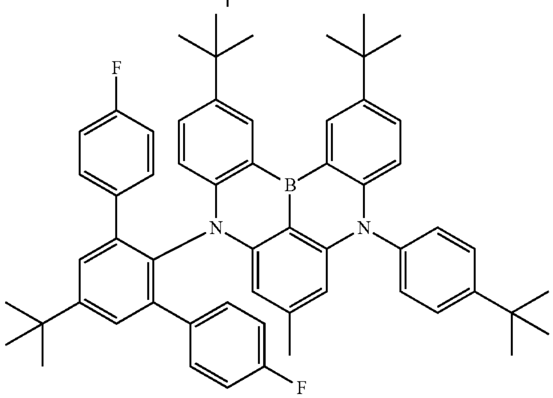
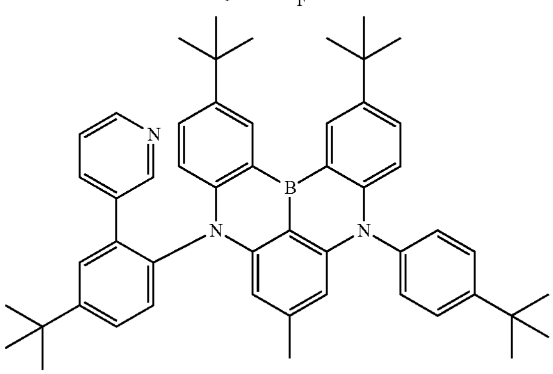
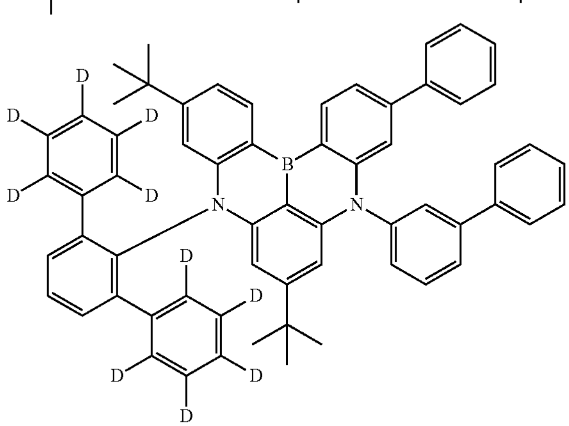
-continued
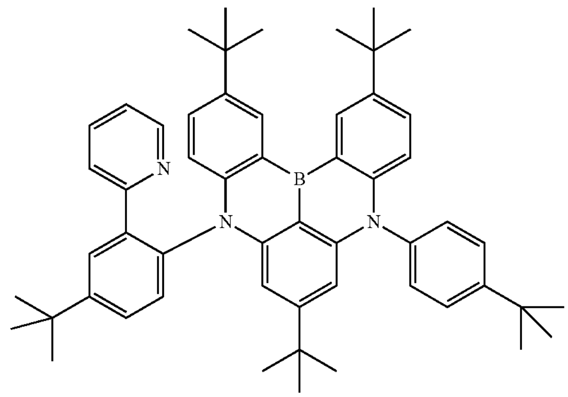
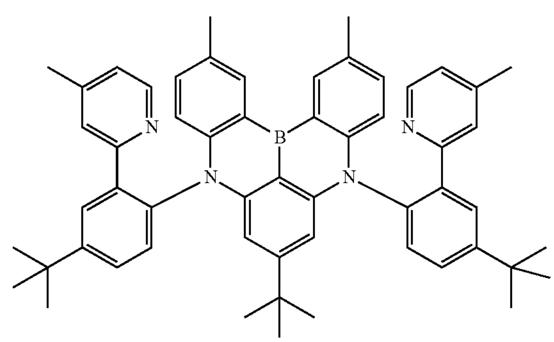
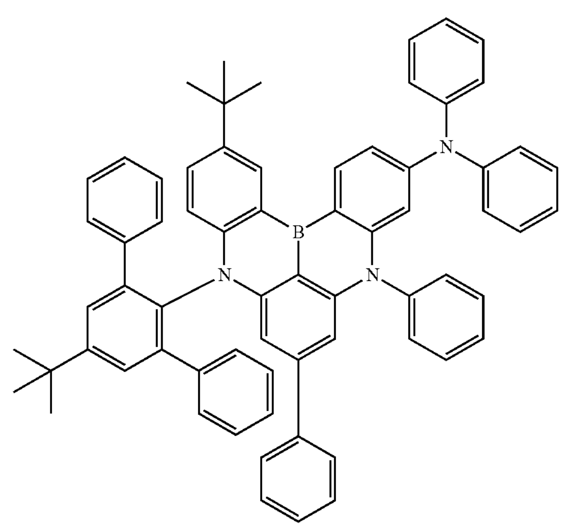

-continued

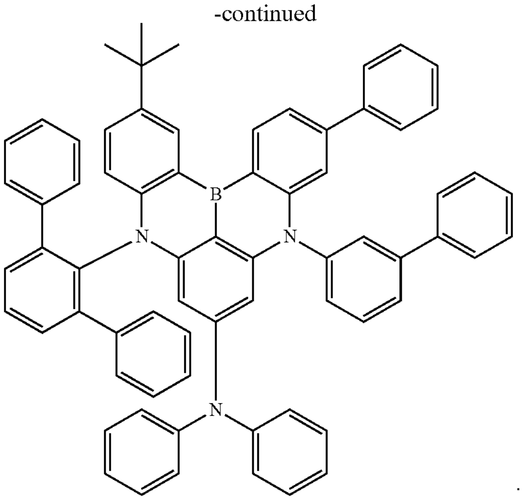

In an exemplary embodiment of the present specification, the compound of Formula 1 has a triplet energy-singlet energy value ($\Delta E_{ST}$) of 0.4 eV or less.

According to an exemplary embodiment of the present specification, the compound of Formula 1 has a triplet energy-singlet energy value ($\Delta E_{ST}$) of 0.4 eV or less, preferably 0.3 eV or less, and more preferably 0.15 eV or less, and when the triplet energy-singlet energy value satisfies the above range, high quantum yield can be obtained.

When the triplet energy-singlet energy value ($\Delta E_{ST}$) of the compound of Formula 1 satisfies the above range, the quantum yield of a material is high due to a thermally activated delayed fluorescence (TADF) effect when the compound is used as a dopant of a light emitting layer, and accordingly, the efficiency of the device can also be increased.

The thermally activated delayed fluorescence means a phenomenon in which the reverse intersystem crossing is induced from the triplet excited state to the singlet excited state by thermal energy, and the excitons in the singlet excited state move to the ground state to cause fluorescence emission.

The measurement equipment used to measure the triplet energy-singlet energy value ($\Delta E_{ST}$) is a JASCO FP-8600 fluorescence spectrophotometer.

The singlet energy $E_s$ can be obtained as follows. A sample for measurement is prepared by dissolving a compound to be measured, using toluene as a solvent, at a concentration of 1 νM. The sample solution is put into a quartz cell and degassed using nitrogen gas ($N_2$) to remove oxygen in the solution, and then the absorption spectrum is measured at room temperature (300 K) using a measuring device. In this case, the absorption spectrum has a wavelength (λ, unit: nm) on the x-axis and absorbance on the y-axis, and a tangential line that goes down in the long wavelength direction from the maximum absorption peak at the longest wavelength is drawn, and a wavelength value (nm) at a point where the tangential line and the x-axis meet is obtained. A value obtained by converting the wavelength value (nm) into an energy value (eV) is defined as a singlet energy $E_S$ (eV).

The triplet energy $E_T$ can be obtained as follows by connecting PMU-830 as a temperature adjusting device to the JASCO FP-8600 fluorescence spectrophotometer as the measurement equipment. The quartz cell containing the sample solution from which oxygen is removed, prepared to obtain the singlet energy, is placed in an apparatus containing liquid nitrogen ($N_2$). After the temperature is stabilized (77 K), the phosphorescence spectrum is measured. In this case, the phosphorescence spectrum has a wavelength (λ, unit: nm) on the x-axis and a luminescence degree on the y-axis, and when a tangential line that goes down in the short wavelength direction from the maximum emission peak at the longest wavelength is drawn, a wavelength value (nm) at a point where the tangential line and the x-axis meet is obtained. A value obtained by converting the wavelength value (nm) into an energy value (eV) is defined as a triplet energy $E_T$ (eV).

The $\Delta E_{ST}$ is defined as an absolute value of the difference between $E_S$ (eV) and $E_T$ (eV), and can be obtained by the difference between the values measured above.

According to an exemplary embodiment of the present specification, the compound of Formula 1 has a maximum emission peak of 420 nm to 470 nm. A more preferred range is 450 nm to 465 nm. When the maximum emission peak satisfies the above range, the compound is used as a blue light emitting dopant of a light emitting layer, so that the efficiency of a device can be increased.

The measurement equipment used to measure the maximum emission peak is a JASCO FP-8600 fluorescence spectrophotometer. Specifically, a sample for measuring fluorescence is prepared by dissolving a compound to be measured, using toluene as a solvent, at a concentration of 1 νM, the sample solution is put into a quartz cell, and then the fluorescence intensity and the maximum emission peak can be measured at room temperature (300 K) using a fluorescence measuring device.

According to an exemplary embodiment of the present invention, the compound of Formula 1 can be prepared as in the following Reaction Formula 1. The following Reaction Formula 1 describes a synthesis procedure of a partial compound corresponding to Formula 1 of the present application, but various compounds corresponding to Formula 1 of the present application can be synthesized using the synthesis procedure as in the following Reaction Formula 1, a substituent can be bonded by methods known in the art, and the type and position of substituent and the number of substituents can be changed according to the technology known in the art.

<Reaction Formula 1>

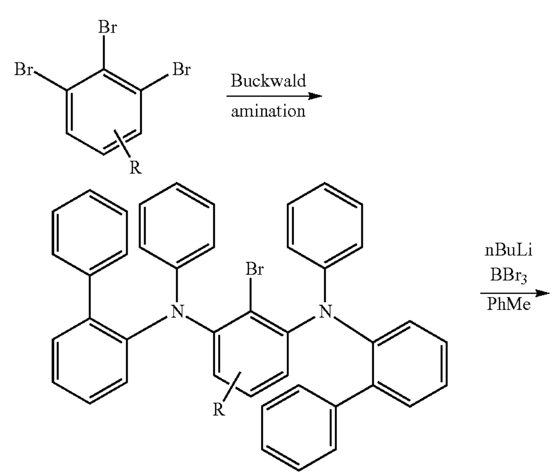

-continued

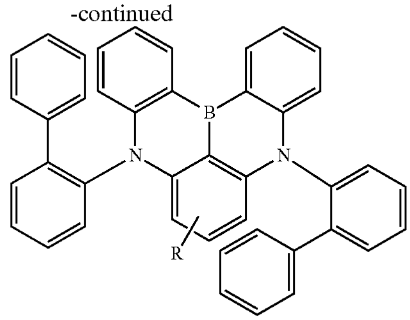

Starting from a tribromide compound, an arylbromide intermediate in which an amine is substituted is synthesized by an amination reaction using a palladium catalyst. Subsequently, after a Li-halogen exchange reaction, boron is introduced using boron tribromide.

In the present invention, compounds having various energy bandgaps can be synthesized by introducing various substituents into the core structure of Formula 1. Further, in the present invention, various substituents can be introduced into the core structure having the structure described above to adjust the HOMO and LUMO energy levels of a compound.

In addition, various substituents can be introduced into the core structure having the structure described above to synthesize a compound having inherent characteristics of the introduced substituent. For example, a substituent usually used for a material for a hole injection layer, a material for transporting holes, a material for blocking electrons, a material for a light emitting layer, and a material for an electron transport layer, which are used for manufacturing an organic light emitting device, can be introduced into the core structure to synthesize a material which satisfies conditions required for each organic material layer.

Further, the organic light emitting device according to the present invention is an organic light emitting device including: a first electrode; a second electrode provided to face the first electrode; and an organic material layer having one or more layers provided between the first electrode and the second electrode, in which one or more layers of the organic material layer include the above-described compound of Formula 1.

The organic light emitting device of the present invention can be manufactured by typical preparation methods and materials of an organic light emitting device, except that the above-described compound is used to form an organic material layer having one or more layers.

The compound can be formed as an organic material layer by not only a vacuum deposition method, but also a solution application method when an organic light emitting device is manufactured. Here, the solution application method means spin coating, dip coating, inkjet printing, screen printing, a spray method, roll coating, and the like, but is not limited thereto.

The organic material layer of the organic light emitting device of the present invention can be composed of a single-layered structure, but can be composed of a multi-layered structure in which two or more organic material layers are stacked. For example, the organic light emitting device of the present invention can have a structure including a hole injection layer, a hole transport layer, a layer which simultaneously transports and injects holes, an electron blocking layer, a light emitting layer, an electron transport layer, an electron injection layer, a layer which simultaneously transports and injects electrons, and the like as an organic material layer. However, the structure of the organic light emitting device is not limited thereto, and can include a fewer or greater number of organic material layers.

In the organic light emitting device of the present invention, the organic material layer can include an electron transport layer or an electron injection layer, and the electron transport layer or the electron injection layer can include the above-described compound.

In the organic light emitting device of the present invention, the organic material layer can include a hole injection layer or a hole transport layer, and the hole injection layer or the hole transport layer can include the above-described compound.

In the organic light emitting device of the present invention, the organic material layer includes a light emitting layer, and the light emitting layer includes the above-described compound.

According to another exemplary embodiment, the organic material layer includes a light emitting layer, and the light emitting layer can include the above-described compound as a dopant of the light emitting layer.

In still another exemplary embodiment, the organic material layer includes a light emitting layer, and the light emitting layer includes the above-described compound as a dopant of the light emitting layer, and can further include a host.

According to an exemplary embodiment of the present invention, the organic material layer includes a light emitting layer, and the light emitting layer includes the above-described compound as a dopant of the light emitting layer, and can further include a compound of the following Formula 1-A as a host.

Formula 1-A

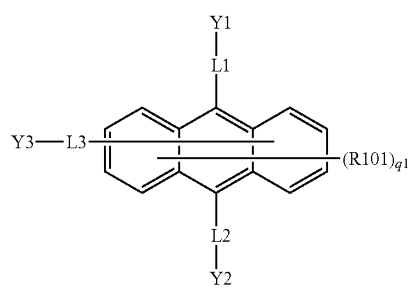

In Formula 1-A,

Y1 to Y3 are the same as or different from each other, and are each independently hydrogen, a substituted or unsubstituted aryl group, or a substituted or unsubstituted heterocyclic group, L1 to L3 are the same as or different from each other, and are each independently a direct bond, a substituted or unsubstituted arylene group, or a substituted or unsubstituted heteroarylene group, R101 is hydrogen, deuterium, a halogen group, a cyano group, a nitro group, a substituted or unsubstituted silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group, and q1 is an integer from 0 to 7, and when q1 is 2 or more, two or more R101s are the same as or different from each other.

According to an exemplary embodiment of the present invention, Y1 to Y3 are the same as or different from each other, and are each independently hydrogen, a substituted or unsubstituted aryl group, or a substituted or unsubstituted heterocyclic group.

According to another exemplary embodiment, Y1 to Y3 are the same as or different from each other, and are each independently hydrogen, a substituted or unsubstituted aryl group having 6 to 60 carbon atoms, or a substituted or unsubstituted heterocyclic group having 2 to 60 carbon atoms.

In still another exemplary embodiment, Y1 to Y3 are the same as or different from each other, and are each independently hydrogen, a substituted or unsubstituted aryl group having 6 to 30 carbon atoms, or a substituted or unsubstituted heterocyclic group having 2 to 30 carbon atoms.

According to an exemplary embodiment, Y3 is hydrogen.

In an exemplary embodiment, Y1 is hydrogen, a substituted or unsubstituted phenyl group, a substituted or unsubstituted naphthyl group, a substituted or unsubstituted dibenzofuran group, a substituted or unsubstituted naphthobenzofuran group, a substituted or unsubstituted thiophene group, or a substituted or unsubstituted indolocarbazole group.

According to another exemplary embodiment, Y1 is hydrogen; a phenyl group which is unsubstituted or substituted with deuterium, an alkyl group having 1 to 10 carbon atoms or an aryl group having 6 to 30 carbon atoms; a naphthyl group which is unsubstituted or substituted with deuterium, an alkyl group having 1 to 10 carbon atoms or an aryl group having 6 to 30 carbon atoms; a dibenzofuran group which is unsubstituted or substituted with deuterium, an alkyl group having 1 to 10 carbon atoms or an aryl group having 6 to 30 carbon atoms; a naphthobenzofuran group which is unsubstituted or substituted with deuterium, an alkyl group having 1 to 10 carbon atoms or an aryl group having 6 to 30 carbon atoms; a thiophene group which is unsubstituted or substituted with deuterium, an alkyl group having 1 to 10 carbon atoms or an aryl group having 6 to 30 carbon atoms; an indolocarbazole group which is unsubstituted or substituted with deuterium, an alkyl group having 1 to 10 carbon atoms or an aryl group having 6 to 30 carbon atoms; an isoquinoline group which is unsubstituted or substituted with deuterium, an alkyl group having 1 to 10 carbon atoms or an aryl group having 6 to 30 carbon atoms; or a benzocarbazole group which is unsubstituted or substituted with deuterium, an alkyl group having 1 to 10 carbon atoms or an aryl group having 6 to 30 carbon atoms.

In still another exemplary embodiment, Y1 is hydrogen; a phenyl group which is unsubstituted or substituted with deuterium; a naphthyl group which is unsubstituted or substituted with a methyl group; a dibenzofuran group; a naphthobenzofuran group; a thiophene group which is substituted with a phenyl group; an indolocarbazole group; an isoquinoline group; or an N-phenylbenzocarbazole group.

According to an exemplary embodiment of the present invention, Y2 is hydrogen, a substituted or unsubstituted aryl group having 6 to 30 carbon atoms, or a substituted or unsubstituted heterocyclic group having 2 to 30 carbon atoms.

According to another exemplary embodiment, Y2 is hydrogen, a substituted or unsubstituted phenyl group, a substituted or unsubstituted biphenyl group, a substituted or unsubstituted naphthyl group, a substituted or unsubstituted terphenyl group, a substituted or unsubstituted dibenzofuran group, or a substituted or unsubstituted naphthobenzofuran group.

In still another exemplary embodiment, Y2 is hydrogen; a phenyl group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms; a biphenyl group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms; a naphthyl group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms; a dibenzofuran group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms; or a naphthobenzofuran group which is unsubstituted or substituted with deuterium (D), a halogen group, a cyano group, a silyl group, an alkyl group having 1 to 10 carbon atoms, a cycloalkyl group having 3 to 30 carbon atoms, or an aryl group having 6 to 30 carbon atoms.

According to yet another exemplary embodiment, Y2 is hydrogen; a phenyl group which is unsubstituted or substituted with a cyclohexyl group, a phenyl group, or a naphthyl group; a biphenyl group which is unsubstituted or substituted with deuterium, fluorine, a cyano group, or a trimethylsilyl group; a naphthyl group which is unsubstituted or substituted with a methyl group, a phenyl group, or a naphthyl group; a dibenzofuran group; or a naphthobenzofuran group.

According to an exemplary embodiment of the present invention, L1 to L3 are the same as or different from each other, and are each independently a direct bond, a substituted or unsubstituted arylene group, or a substituted or unsubstituted heteroarylene group.

In another exemplary embodiment, L1 to L3 are the same as or different from each other, and are each independently a direct bond, a substituted or unsubstituted arylene group having 6 to 60 carbon atoms, or a substituted or unsubstituted heteroarylene group having 2 to 60 carbon atoms.

According to still another exemplary embodiment, Li to L3 are the same as or different from each other, and are each independently a direct bond, a substituted or unsubstituted arylene group having 6 to 30 carbon atoms, or a substituted or unsubstituted heteroarylene group having 2 to 30 carbon atoms.

According to yet another exemplary embodiment, L1 to L3 are the same as or different from each other, and are each independently a direct bond, or a substituted or unsubstituted arylene group having 6 to 30 carbon atoms.

In still yet another exemplary embodiment, L1 to L3 are the same as or different from each other, and are each independently a direct bond, a substituted or unsubstituted phenylene group, or a substituted or unsubstituted naphthylene group.

According to a further exemplary embodiment, L1 to L3 are the same as or different from each other, and are each independently a direct bond, a phenylene group, or a naphthylene group.

According to an exemplary embodiment of the present invention, R101 is hydrogen, deuterium, a halogen group, a cyano group (—CN), a nitro group, a silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group.

According to another exemplary embodiment, R101 is hydrogen, deuterium, a halogen group, a cyano group (—CN), a nitro group, a substituted or unsubstituted silyl group, a substituted or unsubstituted alkyl group having 1 to 20 carbon atoms, a substituted or unsubstituted cycloalkyl group having 3 to 30 carbon atoms, a substituted or unsubstituted phosphine oxide group, a substituted or unsubstituted aryl group having 6 to 30 carbon atoms, or a substituted or unsubstituted heterocyclic group having 2 to 30 carbon atoms.

In still another exemplary embodiment, R101 is hydrogen.

According to an exemplary embodiment of the present invention, q1 is an integer from 0 to 2.

In another exemplary embodiment, q1 is 0 or 1.

In an exemplary embodiment of the present specification, Formula 1-A can be any one of the following compounds:

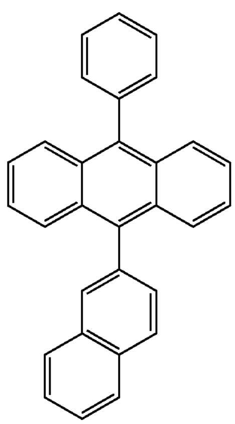

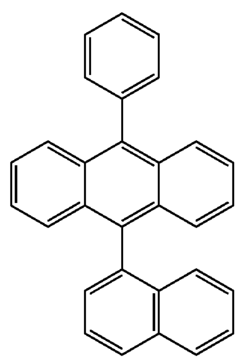

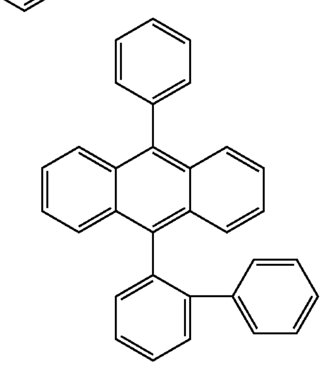

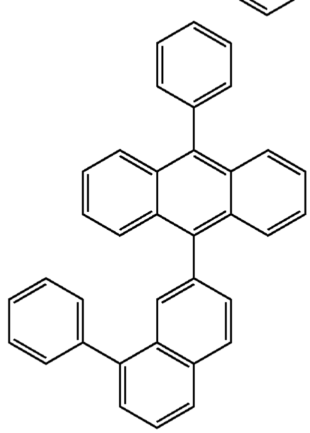

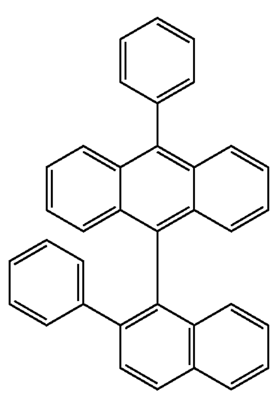

-continued

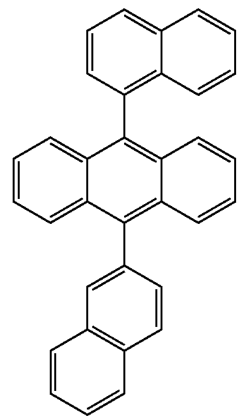

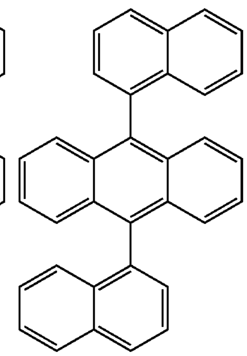

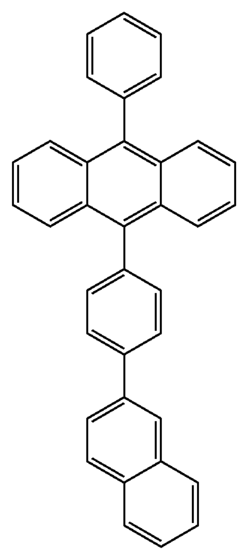

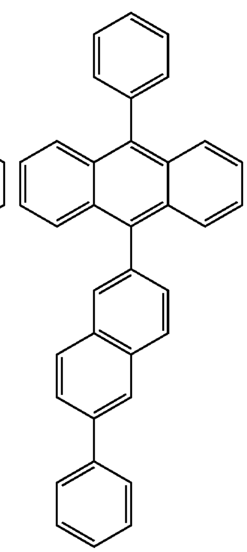

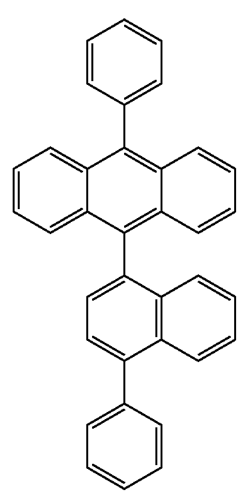

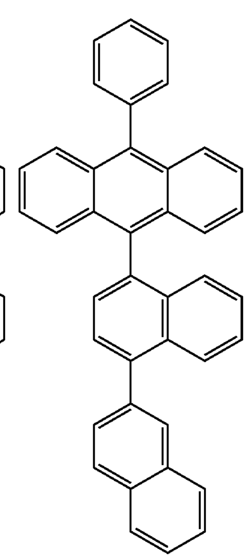

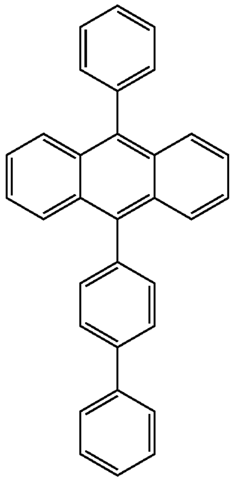
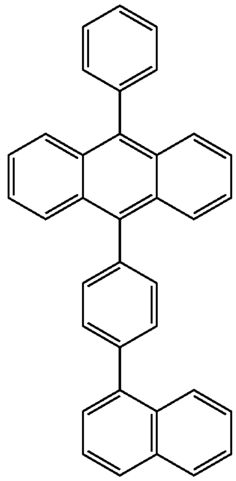
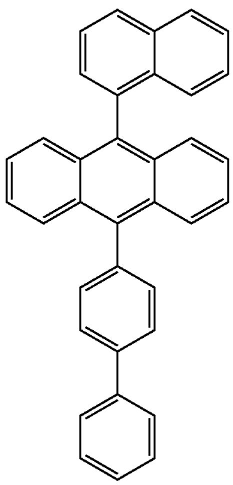
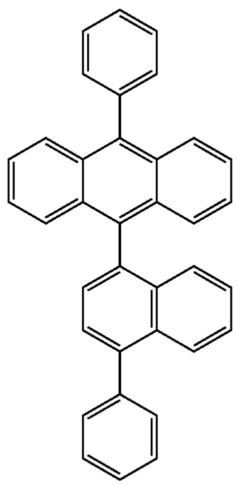
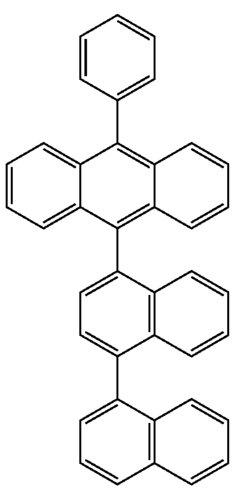
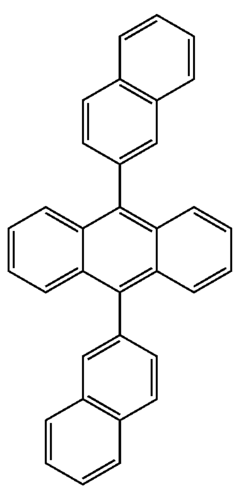
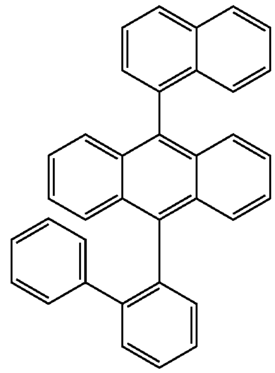
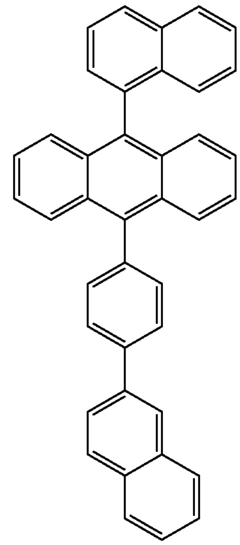
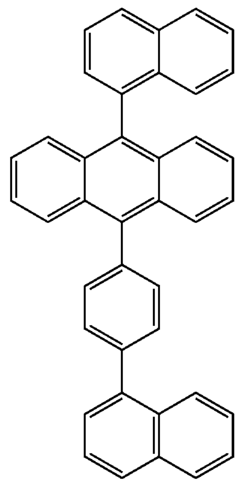
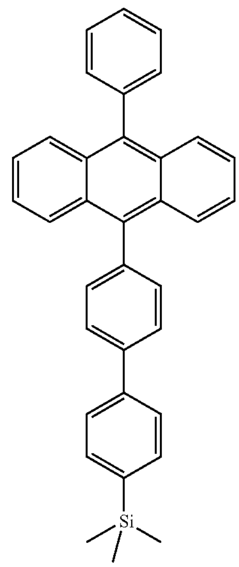
Si
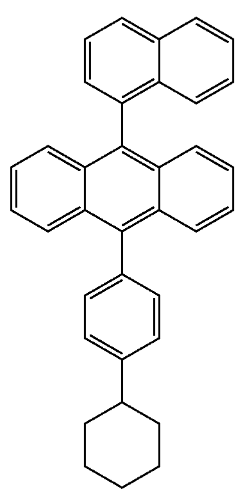
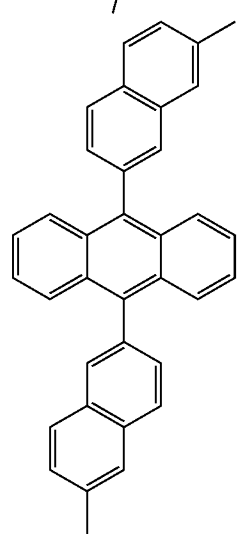

-continued
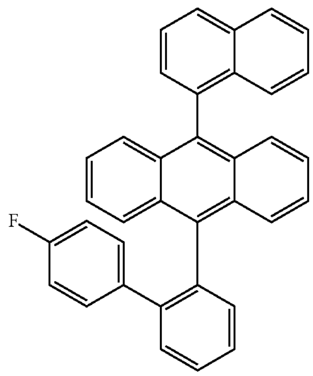
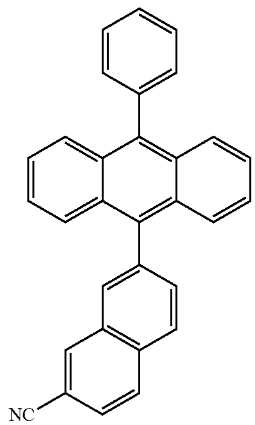
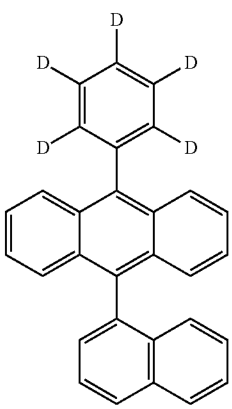
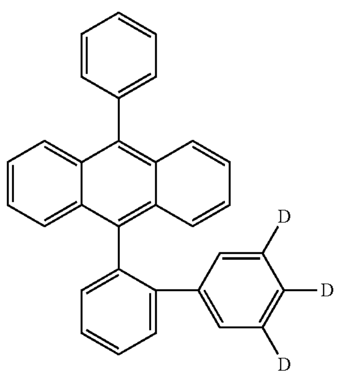
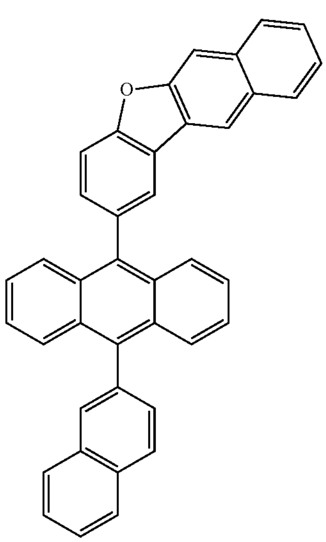
-continued
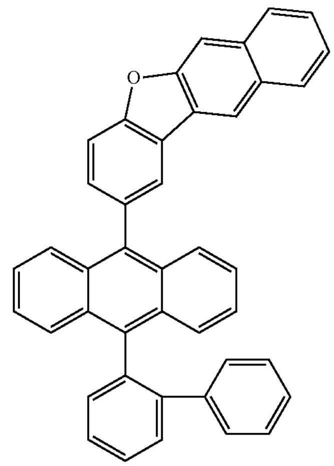
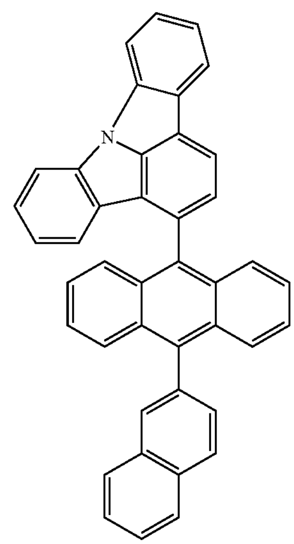
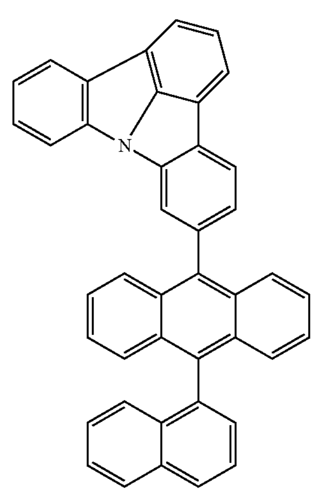

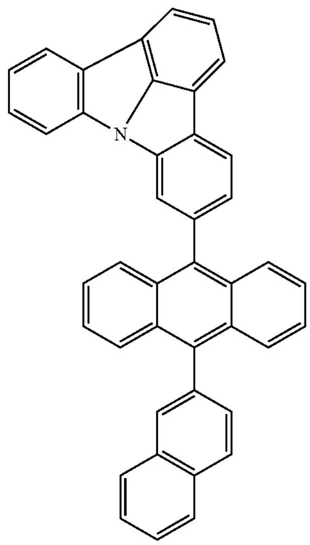
N
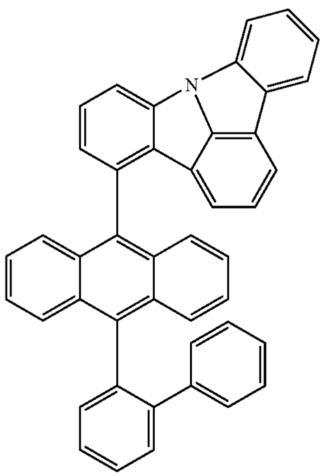
N
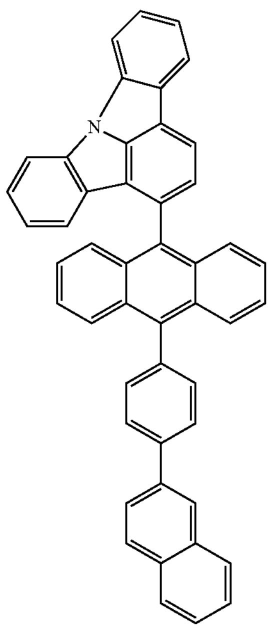
N
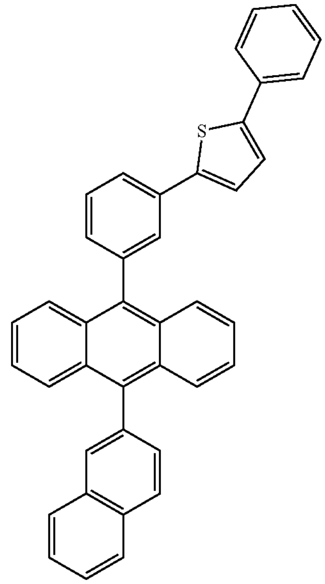
S
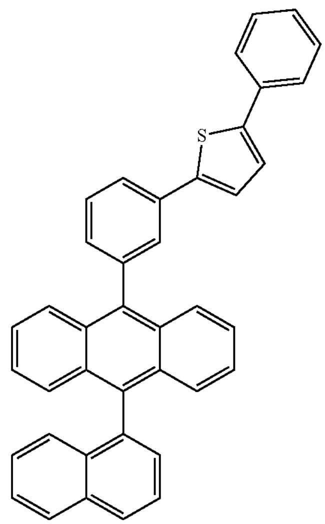
S
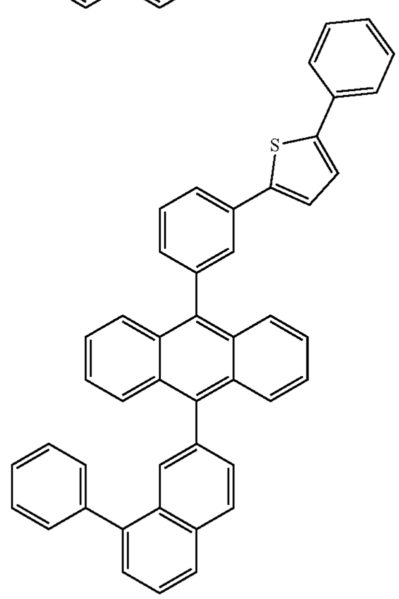
S -continued
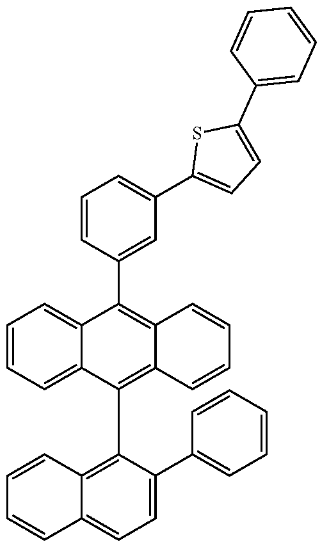
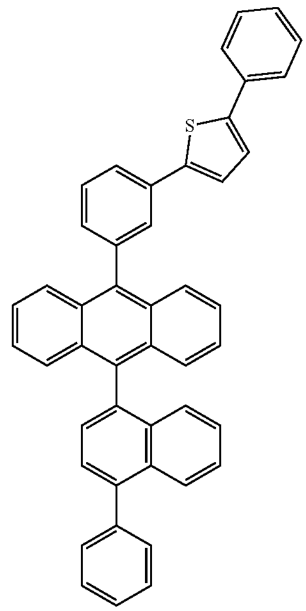
-continued
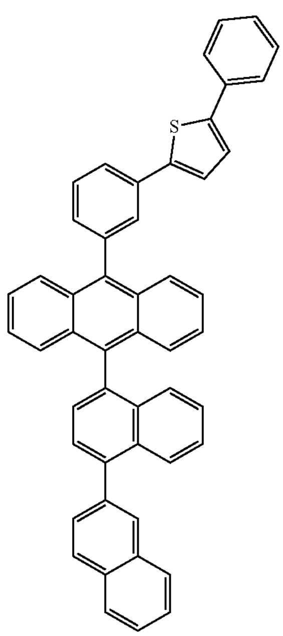
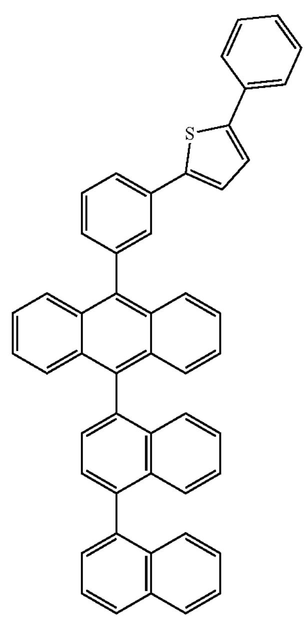

-continued
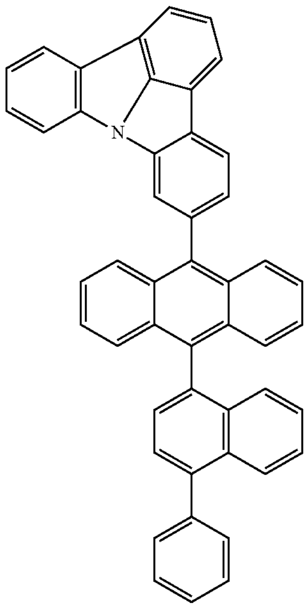
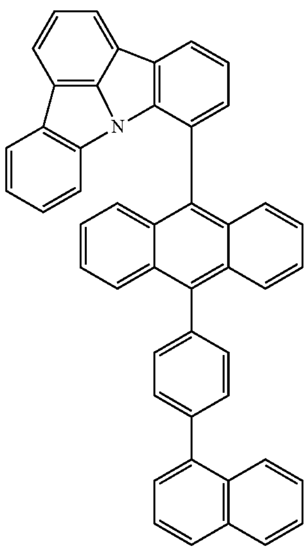
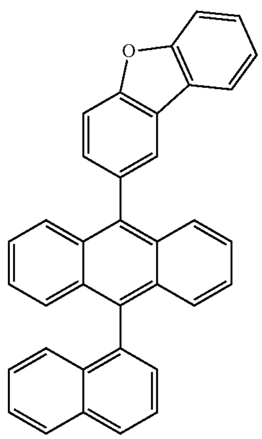
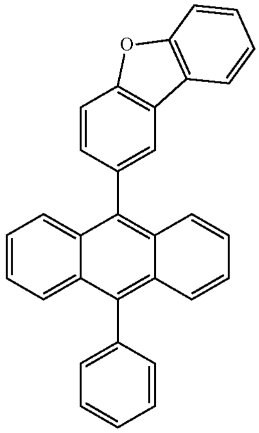
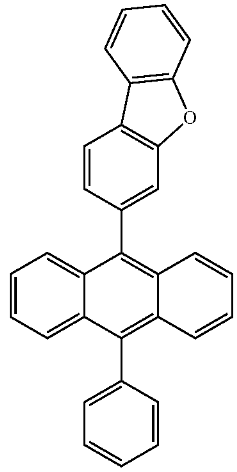
-continued
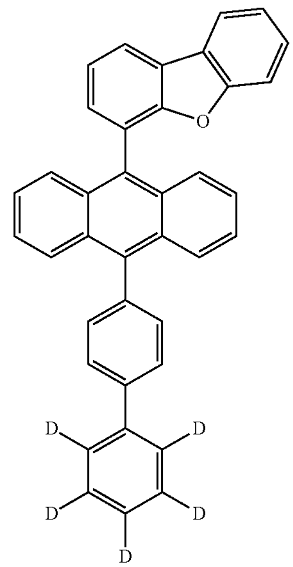
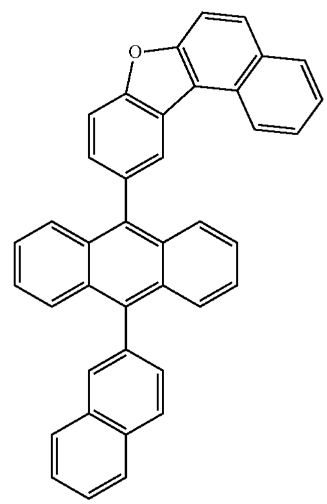
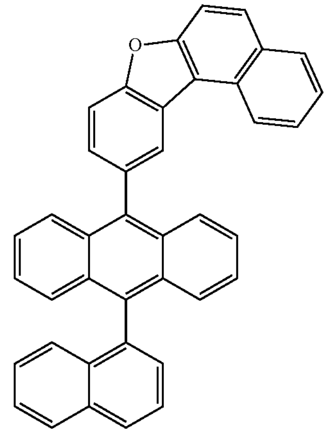

-continued
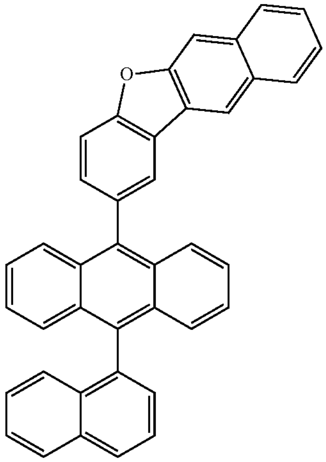
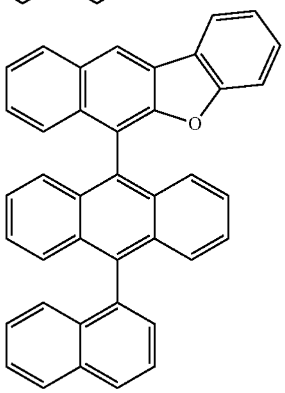
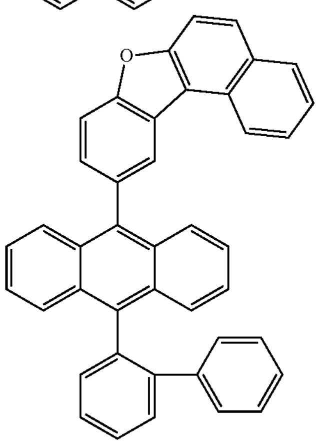
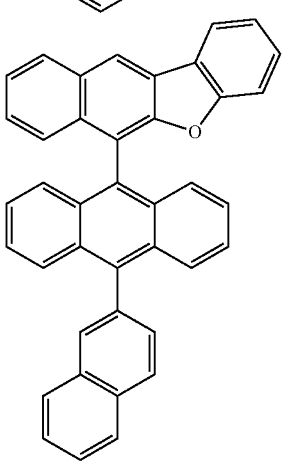
-continued
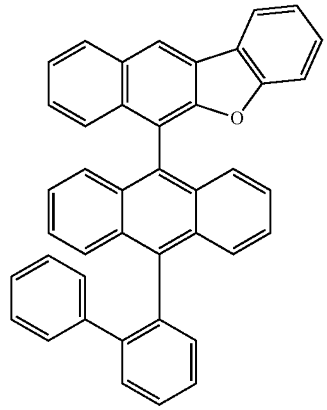
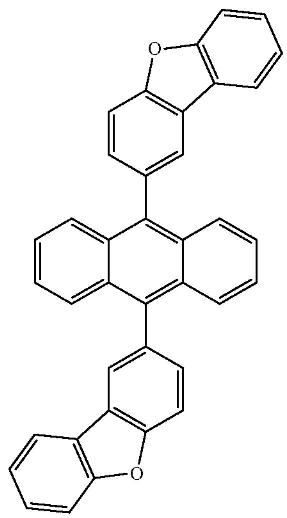
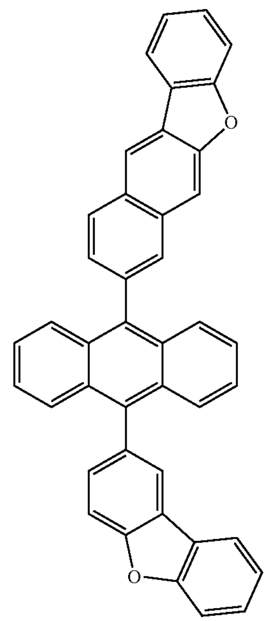
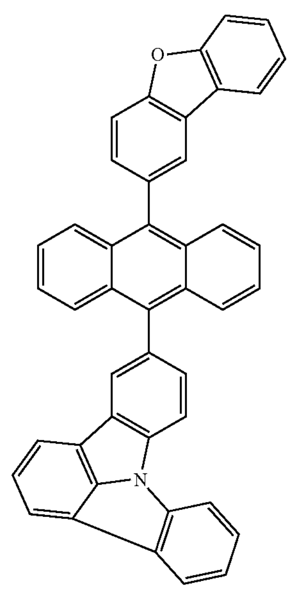

-continued

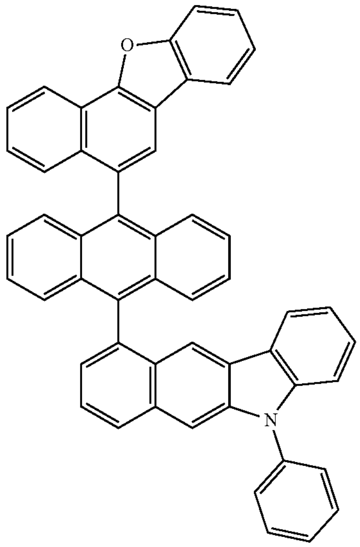

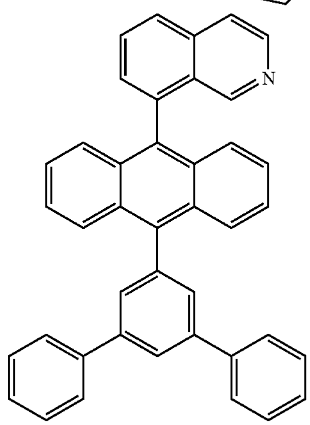

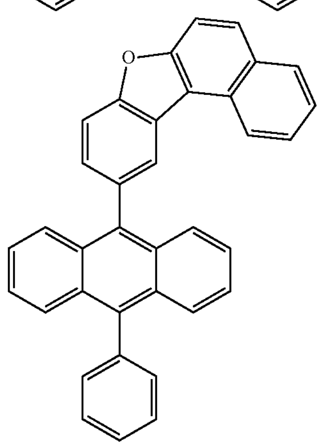

When the compound of the present invention is IC-9C, included as a dopant of a light emitting layer and Formula 1-A is included as a host thereof, the content of the dopant can be 1 part by weight to 10 parts by weight based on 100 parts by weight of the host.

According to another exemplary embodiment, the organic material layer includes a light emitting layer, and the light emitting layer includes the above-described compound as a dopant of the light emitting layer, and can further include two or more compounds of the following Formula 1-B and Formula 1-C as a host.

Formula 1-B

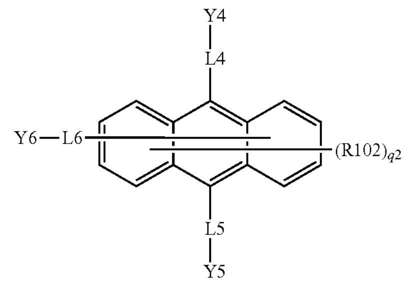

Formula 1-C

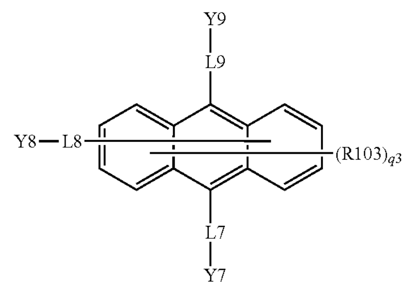

In Formulae 1-B and 1-C,

Y4, Y5, Y6, and Y8 are the same as or different from each other, and are each independently hydrogen, or a substituted or unsubstituted aryl group, Y7 is a substituted or unsubstituted aryl group, or a substituted or unsubstituted heterocyclic group, Y9 is a substituted or unsubstituted heterocyclic group, L4 to L9 are the same as or different from each other, and are each independently a direct bond, a substituted or unsubstituted arylene group, or a substituted or unsubstituted heteroarylene group, R102 and R103 are the same as or different from each other, and are each independently hydrogen, deuterium, a halogen group, a cyano group, a nitro group, a substituted or unsubstituted silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group, and q2 and q3 are each an integer from 0 to 7, and when q2 and q3 are each 2 or more, two or more substituents in the parenthesis are the same as or different from each other.

According to an exemplary embodiment of the present invention, Y4, Y5, Y6, and Y8 are the same as or different from each other, and are each independently hydrogen, or a substituted or unsubstituted aryl group having 6 to 60 carbon atoms.

According to another exemplary embodiment, Y4, Y5, Y6, and Y8 are the same as or different from each other, and are each independently hydrogen, or a substituted or unsubstituted aryl group having 6 to 30 carbon atoms.

According to still another exemplary embodiment, Y6 and Y8 are hydrogen.

According to an exemplary embodiment of the present specification, Y4 and Y5 are the same as or different from each other, and are each independently a substituted or unsubstituted aryl group having 6 to 30 carbon atoms.

According to another exemplary embodiment, Y4 and Y5 are the same as or different from each other, and are each independently a substituted or unsubstituted phenyl group, a substituted or unsubstituted biphenyl group, or a substituted or unsubstituted naphthyl group.

In still another exemplary embodiment, Y4 and Y5 are the same as or different from each other, and are each independently a phenyl group which is unsubstituted or substituted with a naphthyl group, a biphenyl group, or a naphthyl group which is unsubstituted or substituted with a phenyl group or a naphthyl group.

According to an exemplary embodiment of the present specification, Y7 is a substituted or unsubstituted aryl group having 6 to 60 carbon atoms, or a substituted or unsubstituted heterocyclic group having 2 to 60 carbon atoms.

According to another exemplary embodiment, Y7 is a substituted or unsubstituted aryl group having 6 to 30 carbon atoms, or a substituted or unsubstituted heterocyclic group having 2 to 30 carbon atoms.

According to still another exemplary embodiment, Y7 is a substituted or unsubstituted phenyl group, a substituted or unsubstituted biphenyl group, a substituted or unsubstituted naphthyl group, a substituted or unsubstituted terphenyl group, a substituted or unsubstituted dibenzofuran group, or a substituted or unsubstituted naphthobenzofuran group.

According to an exemplary embodiment of the present specification, Y9 is a substituted or unsubstituted heterocyclic group having 2 to 60 carbon atoms.

According to another exemplary embodiment, Y9 is a substituted or unsubstituted heterocyclic group having 2 to 30 carbon atoms.

In still another exemplary embodiment, Y9 is a dibenzofuran group; a naphthobenzofuran group; a thiophene group which is substituted with a phenyl group; an indolocarbazole group; or a carbazole group which is substituted with a phenyl group.

In an exemplary embodiment, Y9 is a substituted or unsubstituted dibenzofuran group, a substituted or unsubstituted naphthobenzofuran group, a substituted or unsubstituted thiophene group, or a substituted or unsubstituted indolocarbazole group.

According to another exemplary embodiment, Y9 is a dibenzofuran group which is unsubstituted or substituted with deuterium, an alkyl group having 1 to 10 carbon atoms, or an aryl group having 6 to 30 carbon atoms; a naphthobenzofuran group which is unsubstituted or substituted with deuterium, an alkyl group having 1 to 10 carbon atoms, or an aryl group having 6 to 30 carbon atoms; a thiophene group which is unsubstituted or substituted with deuterium, an alkyl group having 1 to 10 carbon atoms, or an aryl group having 6 to 30 carbon atoms; or an indolocarbazole group which is unsubstituted or substituted with deuterium, an alkyl group having 1 to 10 carbon atoms, or an aryl group having 6 to 30 carbon atoms.

In still another exemplary embodiment, Y9 is a dibenzofuran group; a naphthobenzofuran group; a thiophene group which is substituted with a phenyl group; or an indolocarbazole group.

According to an exemplary embodiment of the present invention, L4 to L9 are the same as or different from each other, and are each independently a direct bond, a substituted or unsubstituted arylene group, or a substituted or unsubstituted heteroarylene group.

In another exemplary embodiment, L4 to L9 are the same as or different from each other, and are each independently a direct bond, a substituted or unsubstituted arylene group having 6 to 60 carbon atoms, or a substituted or unsubstituted heteroarylene group having 2 to 60 carbon atoms.

According to still another exemplary embodiment, L4 to L9 are the same as or different from each other, and are each independently a direct bond, a substituted or unsubstituted arylene group having 6 to 30 carbon atoms, or a substituted or unsubstituted heteroarylene group having 2 to 30 carbon atoms.

According to yet another exemplary embodiment, L4 to L9 are the same as or different from each other, and are each independently a direct bond, or a substituted or unsubstituted arylene group having 6 to 30 carbon atoms.

In still yet another exemplary embodiment, L4 to L9 are the same as or different from each other, and are each independently a direct bond, a substituted or unsubstituted phenylene group, or a substituted or unsubstituted naphthylene group.

According to a further exemplary embodiment, L4 to L9 are the same as or different from each other, and are each independently a direct bond, a phenylene group, or a naphthylene group.

According to an exemplary embodiment of the present invention, R102 and R103 are the same as or different from each other, and are each independently hydrogen, deuterium, a halogen group, a cyano group (—CN), a nitro group, a substituted or unsubstituted silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group.

According to another exemplary embodiment, R102 and R103 are the same as or different from each other, and are each independently hydrogen, deuterium, a halogen group, a cyano group (—CN), a nitro group, a substituted or unsubstituted silyl group, a substituted or unsubstituted alkyl group having 1 to 20 carbon atoms, a substituted or unsubstituted cycloalkyl group having 3 to 30 carbon atoms, a substituted or unsubstituted phosphine oxide group, a substituted or unsubstituted aryl group having 6 to 30 carbon atoms, or a substituted or unsubstituted heterocyclic group having 2 to 30 carbon atoms.

In still another exemplary embodiment, R101 and R102 are hydrogen.

According to an exemplary embodiment of the present specification, q2 is an integer from 0 to 7, and when q2 is 2 or more, two or more R102s are the same as or different from each other.

According to another exemplary embodiment, q2 is an integer from 0 to 2.

According to still another exemplary embodiment, q2 is 0 or 1.

According to an exemplary embodiment of the present specification, q3 is an integer from 0 to 7, and when q3 is 2 or more, two or more R103s are the same as or different from each other.

According to another exemplary embodiment, q3 is an integer from 0 to 2.

According to still another exemplary embodiment, q3 is 0 or 1.

In an exemplary embodiment of the present specification, Formula 1-B can be any one of the following compounds:

-continued
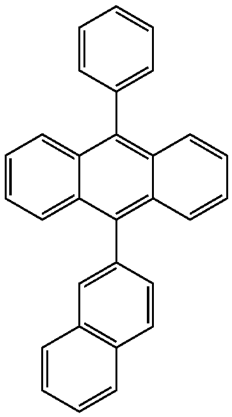
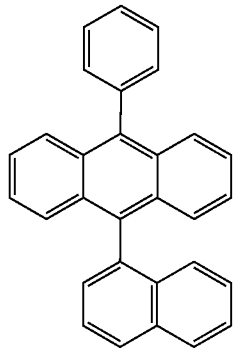
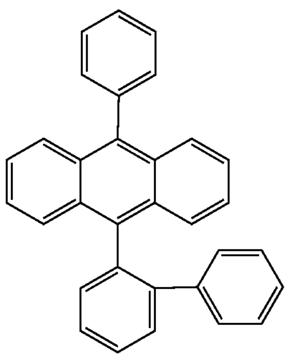
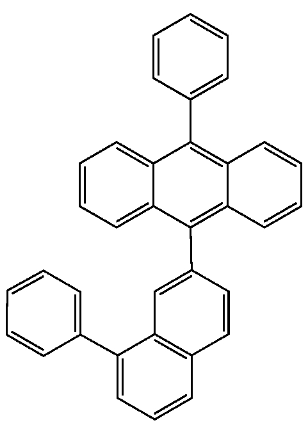
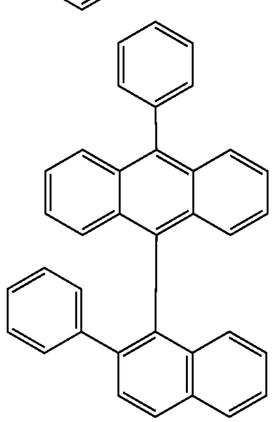
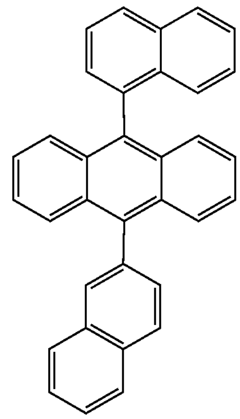
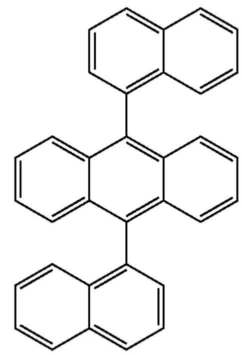
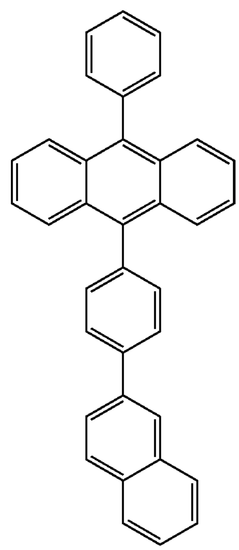
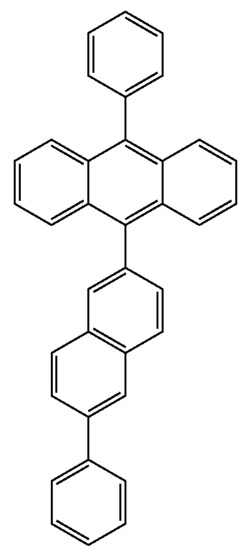
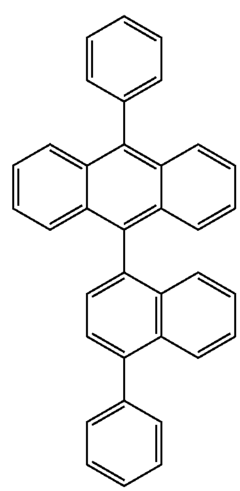
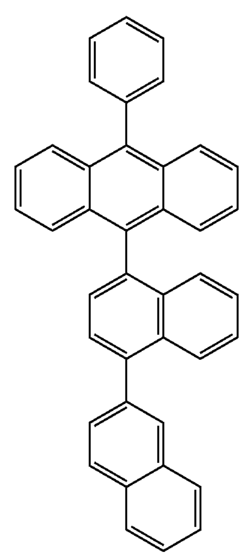

-continued
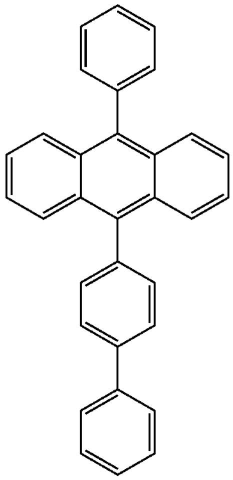
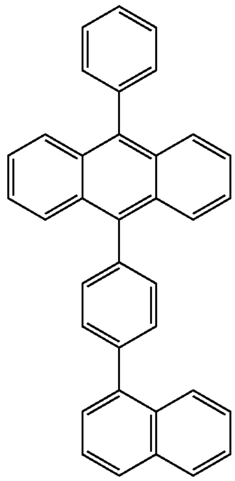
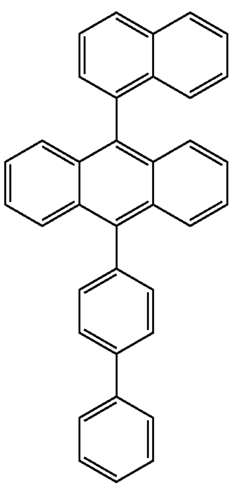
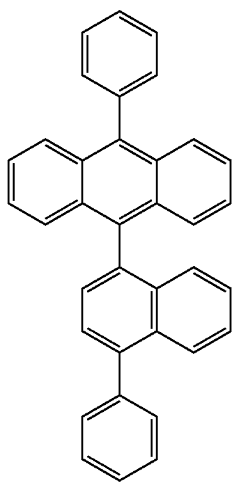
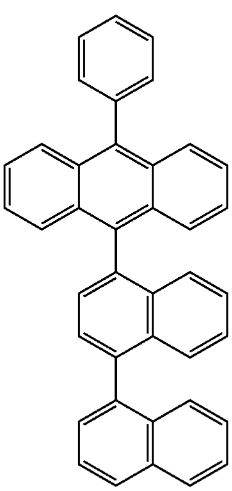
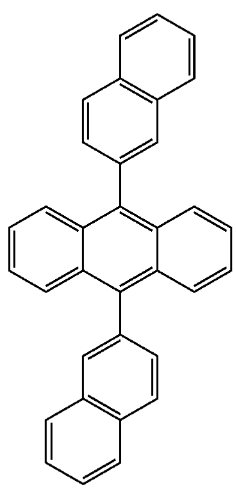
-continued
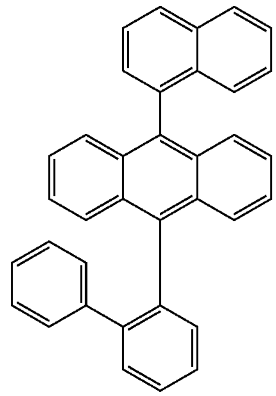
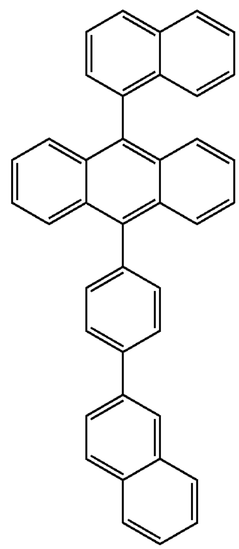
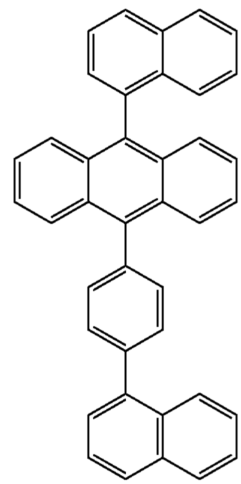
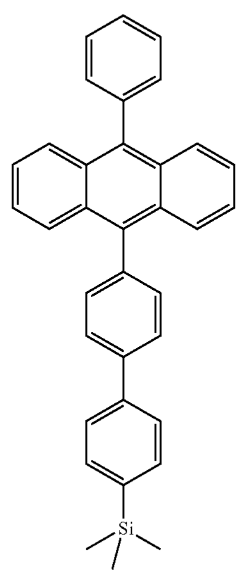
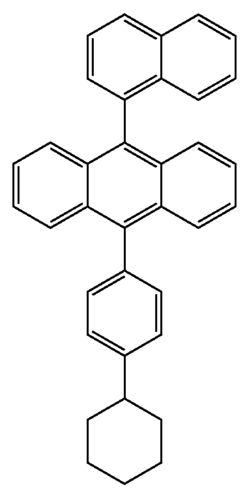

-continued
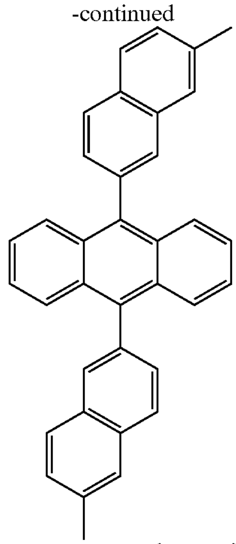
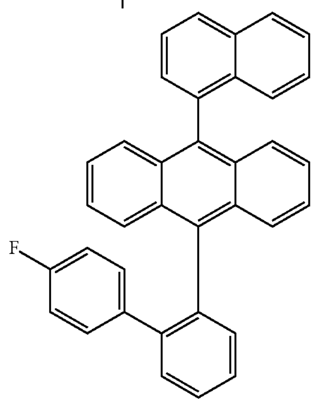
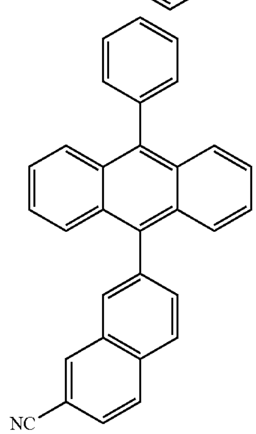
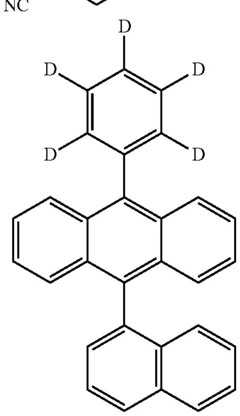
-continued
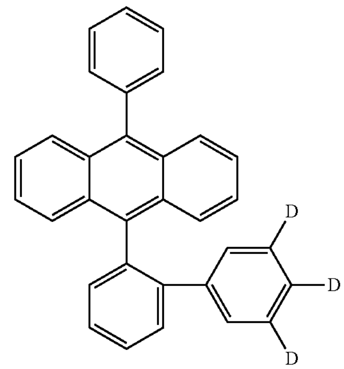
In an exemplary embodiment of the present specification, Formula 1-C can be any one of the following compounds:
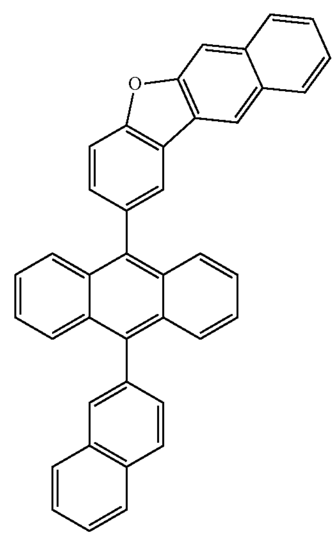
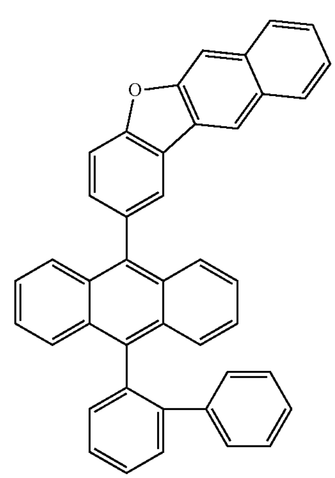

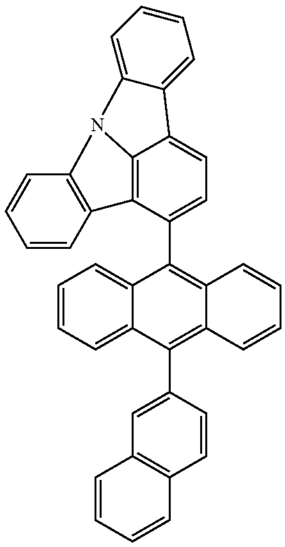
N
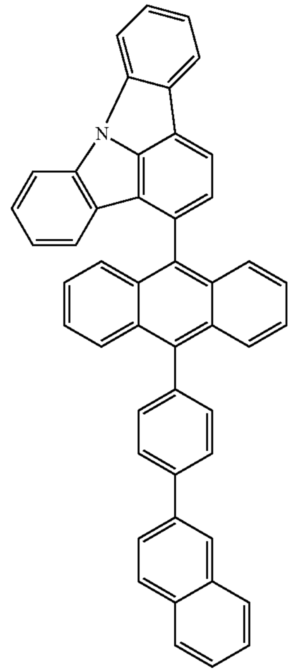
N
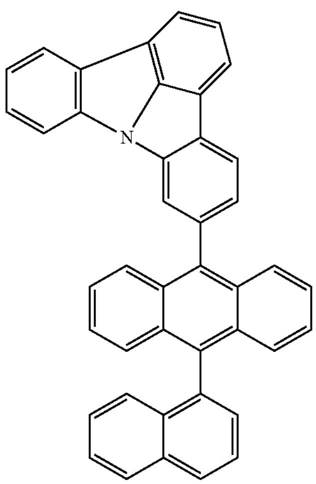
N
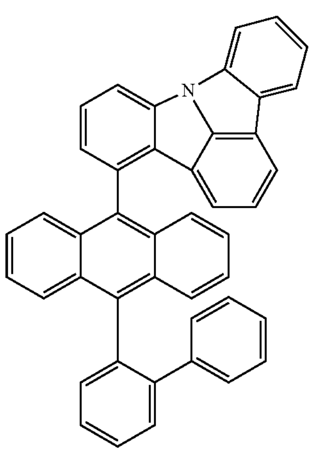
N
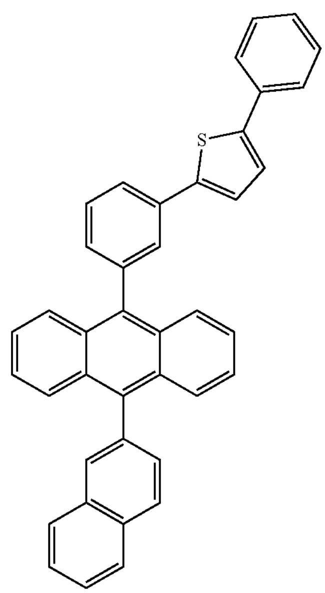
S

-continued
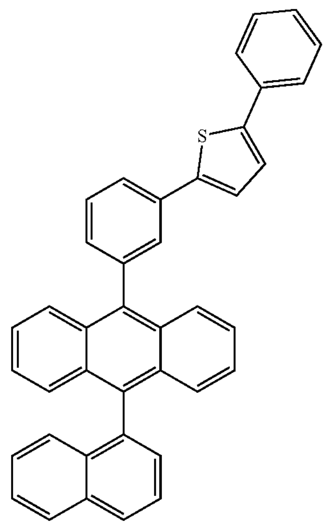
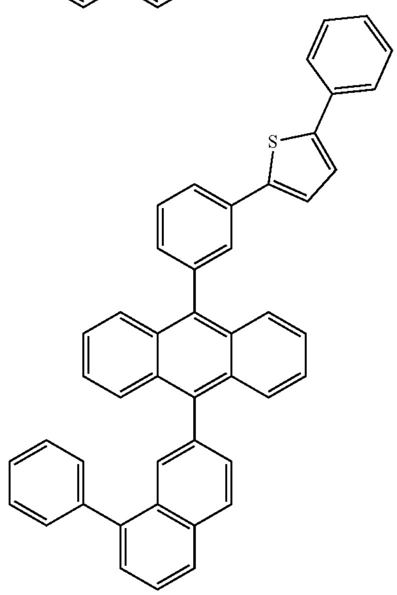
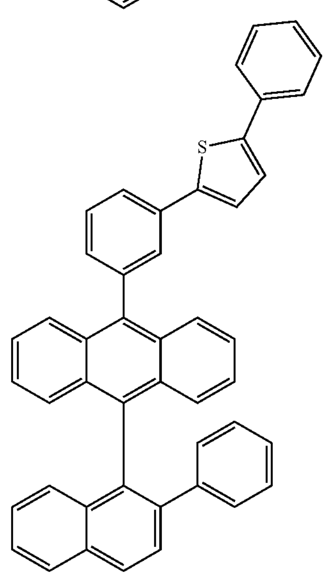
-continued
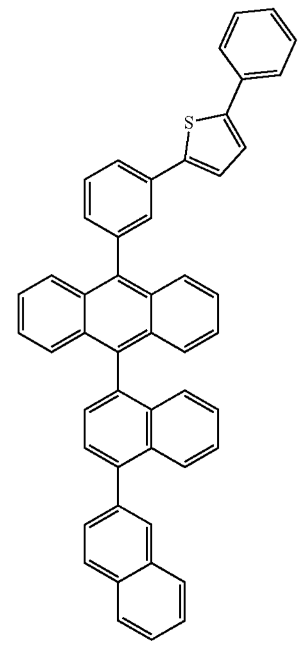
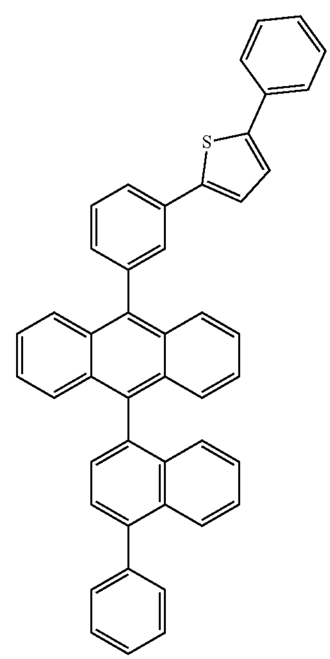

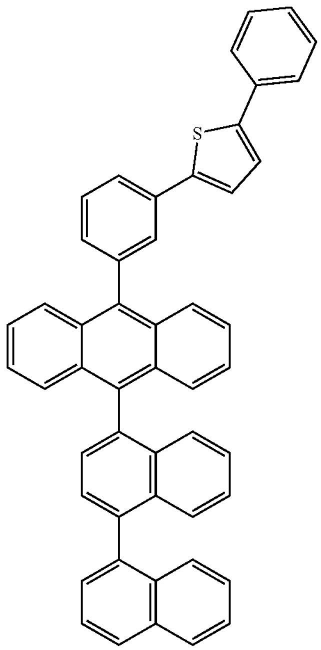
S
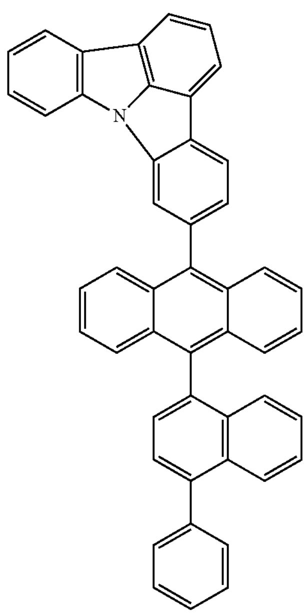
N
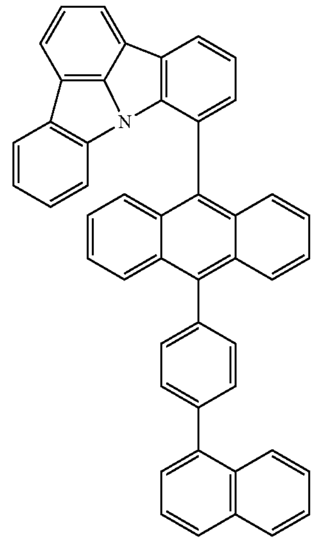
N
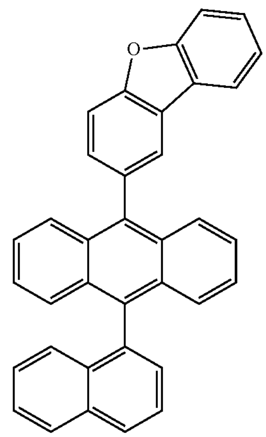
O
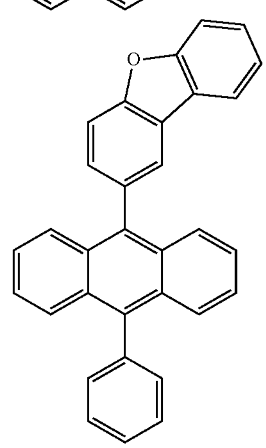
O

-continued
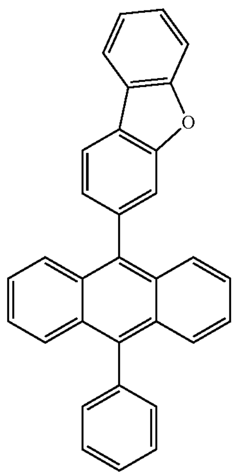
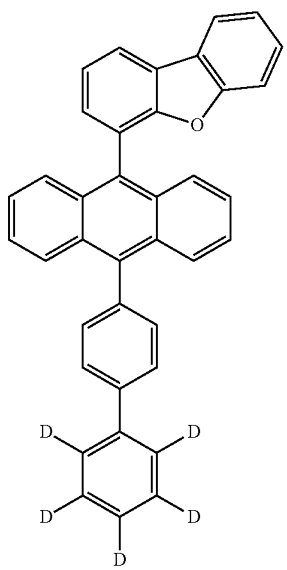
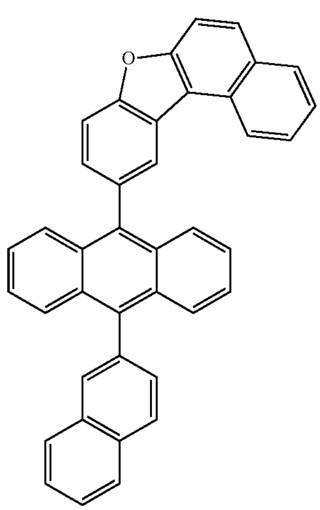
-continued
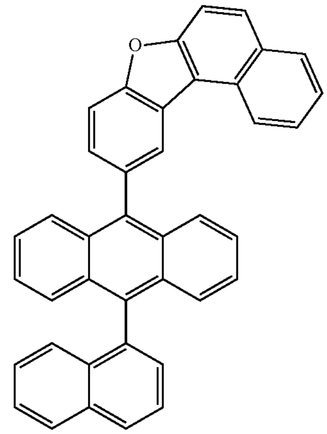
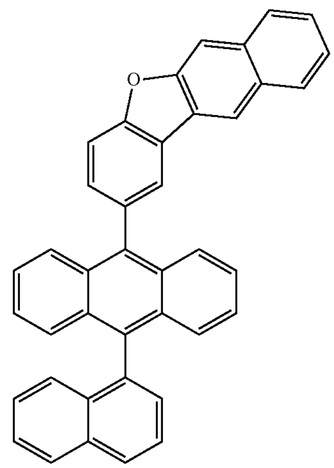
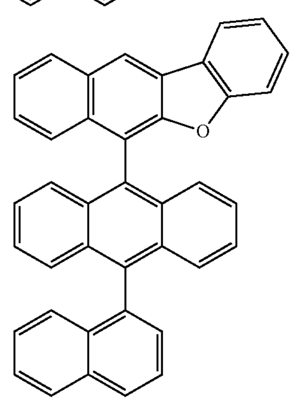
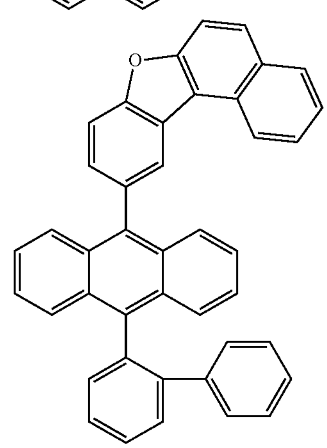

-continued
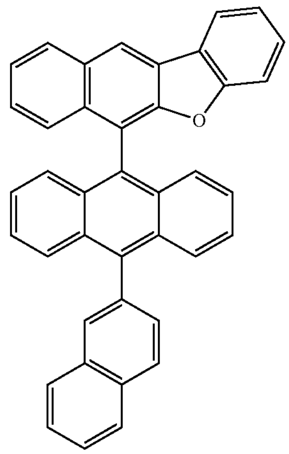
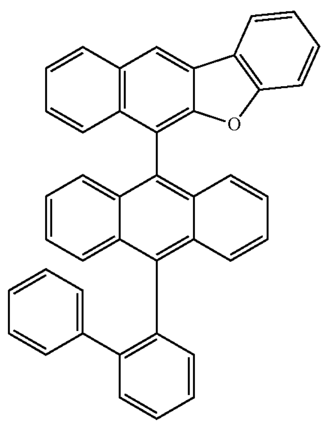
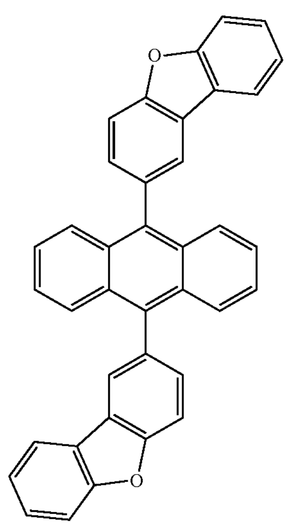
-continued
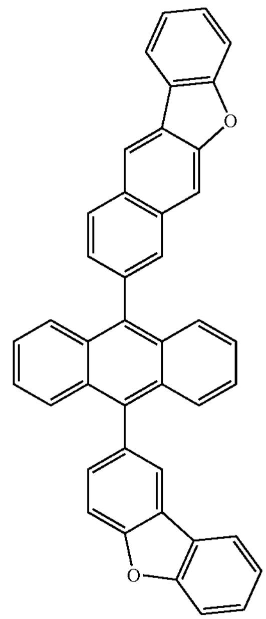
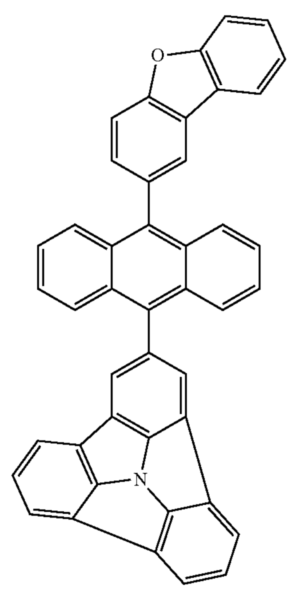

-continued

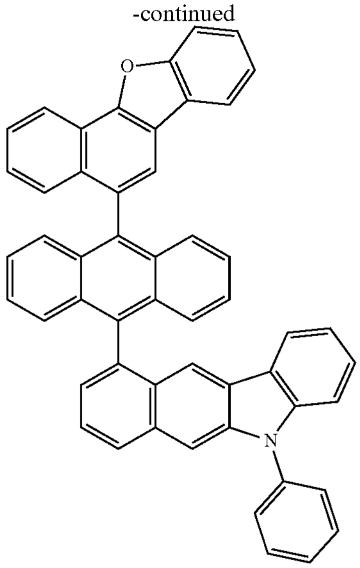

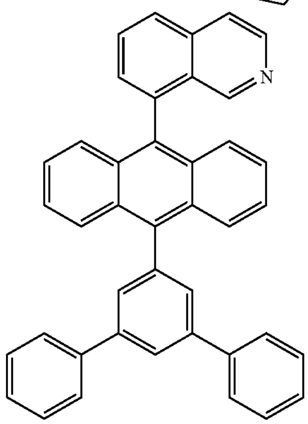

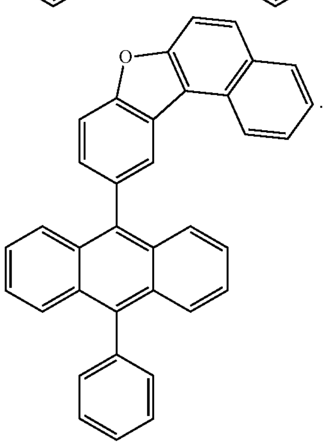

When the compound of the present invention is included as a dopant of a light emitting layer and two or more of the compounds of Formulae 1-B and 1-C are included as hosts thereof, the content of the dopant can be 0.5 part by weight to 10 parts by weight based on 100 parts by weight of the hosts. When the dopant is included within the above content range in the light emitting layer, there are advantages in that the manufactured organic light emitting device has a low driving voltage, a long service life, and excellent light emitting efficiency.

According to another exemplary embodiment, the compound can be included as a dopant of a light emitting layer, the compound of Formula 1-B and the compound of Formula 1-C can be included as hosts of the light emitting layer, and a mixed weight ratio (1-B:1-C) of the hosts can be 95:5 to 5:95. A more preferred range is 30:70 to 70:30.

In still another exemplary embodiment, the organic material layer can include a light emitting layer, and the light emitting layer can include the above-described compound as a dopant of the light emitting layer, include a fluorescent host or a phosphorescent host, and include another organic compound, a metal, or a metal compound as a dopant.

As another example, the organic material layer can include a light emitting layer, the light emitting layer can include the above-described compound as a dopant of the light emitting layer, and include a fluorescent host or a phosphorescent host, and the above-described compound be used along with an iridium (Ir)-based dopant.

According to yet another exemplary embodiment, the organic material layer can include a light emitting layer, and the light emitting layer can include the above-described compound as a host of the light emitting layer.

As another example, the organic material layer can include a light emitting layer, and the light emitting layer can include the above-described compound as a host of the light emitting layer, and further include a dopant.

In the organic light emitting device of the present invention, the organic material layer can include an electron blocking layer, and the electron blocking layer can include the above-described compound.

In an exemplary embodiment of the present specification, the first electrode is a positive electrode, and the second electrode is a negative electrode.

According to another exemplary embodiment, the first electrode is a negative electrode, and the second electrode is a positive electrode.

The organic light emitting device can have, for example, the stacking structure described below, but the stacking structure is not limited thereto.

(1) Positive electrode/Hole transport layer/Light emitting layer/Negative electrode (2) Positive electrode/Hole injection layer/Hole transport layer/Light emitting layer/Negative electrode (3) Positive electrode/Hole injection layer/Hole buffer layer/Hole transport layer/Light emitting layer/Negative electrode (4) Positive electrode/Hole transport layer/Light emitting layer/Electron transport layer/Negative electrode (5) Positive electrode/Hole transport layer/Light emitting layer/Electron transport layer/Electron injection layer/Negative electrode (6) Positive electrode/Hole injection layer/Hole transport layer/Light emitting layer/Electron transport layer/Negative electrode (7) Positive electrode/Hole injection layer/Hole transport layer/Light emitting layer/Electron transport layer/Electron injection layer/Negative electrode (8) Positive electrode/Hole injection layer/Hole buffer layer/Hole transport layer/Light emitting layer/Electron transport layer/Negative electrode (9) Positive electrode/Hole injection layer/Hole buffer layer/Hole transport layer/Light emitting layer/Electron transport layer/Electron injection layer/Negative electrode

(10) Positive electrode/Hole transport layer/Electron blocking layer/Light emitting layer/Electron transport layer/Negative electrode

(11) Positive electrode/Hole transport layer/Electron blocking layer/Light emitting layer/Electron transport layer/Electron injection layer/Negative electrode

(12) Positive electrode/Hole injection layer/Hole transport layer/Electron blocking layer/Light emitting layer/Electron transport layer/Negative electrode

(13) Positive electrode/Hole injection layer/Hole transport layer/Electron blocking layer/Light emitting layer/Electron transport layer/Electron injection layer/Negative electrode

(14) Positive electrode/Hole transport layer/Light emitting layer/Hole blocking layer/Electron transport layer/Negative electrode

(15) Positive electrode/Hole transport layer/Light emitting layer/Hole blocking layer/Electron transport layer/Electron injection layer/Negative electrode

(16) Positive electrode/Hole injection layer/Hole transport layer/Light emitting layer/Hole blocking layer/Electron transport layer/Negative electrode

(17) Positive electrode/Hole injection layer/Hole transport layer/Light emitting layer/Hole blocking layer/Electron transport layer/Electron injection layer/Negative electrode

Figure 2:
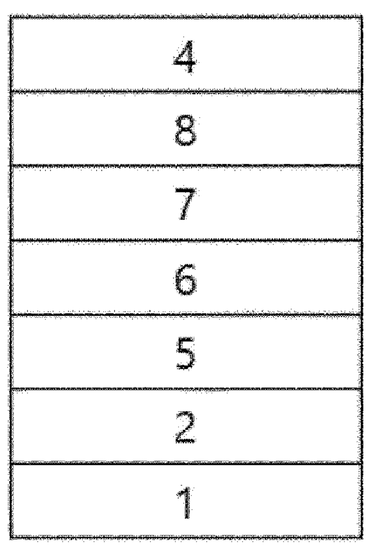
FIG. 2 illustrates an example of an organic light emitting device composed of a substrate 1, a positive electrode 2, a hole injection layer 5, a hole transport layer 6, a light emitting layer 7, a layer 8 which simultaneously injects and transports electrons, and a negative electrode 4.

(18) Positive electrode/Hole injection layer/Hole transport layer/Light emitting layer/Layer which simultaneously injects and transports electrons/Negative electrode The structure of the organic light emitting device of the present invention can have a structure illustrated in FIGS. 1 and 2, but is not limited thereto.

FIG. 1 exemplifies the structure of an organic light emitting device in which a positive electrode 2, a light emitting layer 3, and a negative electrode 4 are sequentially stacked on a substrate 1. In the structure described above, the compound can be included in the light emitting layer 3.

FIG. 2 exemplifies the structure of an organic light emitting device in which a positive electrode 2, a hole injection layer 5, a hole transport layer 6, a light emitting layer 7, a layer 8 which simultaneously injects and transports electrons, and a negative electrode 4 are sequentially stacked on a substrate 1. In the structure described above, the compound can be included in the hole injection layer 5, the hole transport layer 6, the light emitting layer 7, or the layer 8 which simultaneously injects and transports electrons.

Figure 3:
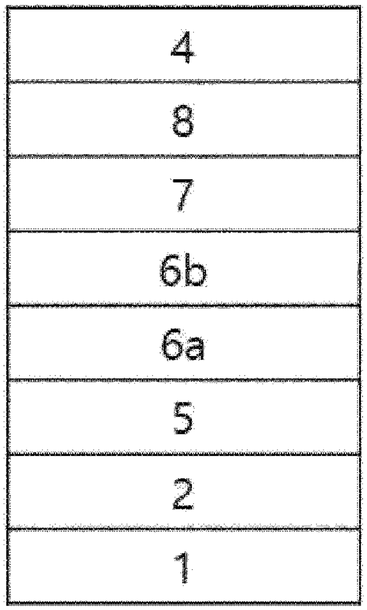
FIG. 3 illustrates an example of an organic light emitting device composed of a substrate 1, a positive electrode 2, a hole injection layer 5, a first hole transport layer 6*a*, a second hole transport layer 6*b*, a light emitting layer 7, a layer 8 which simultaneously injects and transports electrons, and a negative electrode 4.

FIG. 3 exemplifies the structure of an organic light emitting device in which a positive electrode 2, a hole injection layer 5, a first hole transport layer 6*a*, a second hole transport layer 6*b*, a light emitting layer 7, a layer 8 which simultaneously injects and transports electrons, and a negative electrode 4 are sequentially stacked on a substrate 1. In the structure described above, the compound can be included in the hole injection layer 5, the first hole transport layer 6*a*, the second hole transport layer 6*b*, the light emitting layer 7, or the layer 8 which simultaneously injects and transports electrons.

For example, the organic light emitting device according to the present invention can be manufactured by depositing a metal or a metal oxide having conductivity, or an alloy thereof on a substrate to form a positive electrode, forming an organic material layer including a hole injection layer, a hole transport layer, a light emitting layer, an electron blocking layer, an electron transport layer, and an electron injection layer thereon, and then depositing a material, which can be used as a negative electrode, thereon, by using a physical vapor deposition (PVD) method such as sputtering or e-beam evaporation. In addition to the method described above, an organic light emitting device can also be made by sequentially depositing a negative electrode material, an organic material layer, and a positive electrode material on a substrate.

The organic material layer can also have a multi-layered structure including a hole injection layer, a hole transport layer, a layer which simultaneously injects and transports electrons, an electron blocking layer, a light emitting layer, an electron transport layer, an electron injection layer, a layer which simultaneously injects and transports electrons, and the like, but is not limited thereto, and can have a single-layered structure. Further, the organic material layer can be manufactured as a fewer number of layers by a method such as a solvent process, for example, spin coating, dip coating, doctor blading, screen printing, inkjet printing, or a thermal transfer method, using various polymer materials, instead of a deposition method.

The positive electrode is an electrode which injects holes, and as a positive electrode material, materials having a high work function are usually preferred so as to facilitate the injection of holes into an organic material layer. Specific examples of the positive electrode material which can be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of metal and oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

The negative electrode is an electrode which injects electrons, and as a negative electrode material, materials having a low work function are usually preferred so as to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which serves to facilitate the injection of holes from a positive electrode to a light emitting layer, and a hole injection material is preferably a material which can proficiently accept holes from a positive electrode at low voltage, and the highest occupied molecular orbital (HOMO) of the hole injection material is preferably a value between the work function of the positive electrode material and the HOMO of the peripheral organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto. The hole injection layer can have a thickness of 1 to 150 nm. When the hole injection layer has a thickness of 1 nm or more, there is an advantage in that it is possible to prevent hole injection characteristics from deteriorating, and when the hole injection layer has a thickness of 150 nm or less, there is an advantage in that it is possible to prevent the driving voltage from being increased in order to improve the movement of holes due to the too thick hole injection layer.

The hole transport layer can serve to smoothly transport holes. The hole transport layer can have a single-layered structure or a multi-layered structure of two or more layers, and a hole transport material is suitably a material having high hole mobility, which can accept holes from a positive electrode or a hole injection layer and transfer the holes to a light emitting layer. Specific examples thereof include arylamine-based organic materials, conductive polymers, block copolymers having both conjugated portions and non-conjugated portions, and the like, but are not limited thereto.

In an exemplary embodiment of the present specification, the hole transport layer has a multi-layered structure.

A hole buffer layer can be additionally provided between a hole injection layer and a hole transport layer, and can include hole injection or transport materials known in the art.

An electron blocking layer can be provided between a hole transport layer and a light emitting layer. In the electron blocking layer, the above-described compound or a material known in the art can be used.

The light emitting layer can emit red, green, or blue light, and can be composed of a phosphorescent material or a fluorescent material. The light emitting material is a material which can receive holes and electrons from a hole transport layer and an electron transport layer, respectively, and combine the holes and the electrons to emit light in a visible ray region, and is preferably a material having good quantum efficiency to fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, rubrene, and the like, but are not limited thereto.

Examples of the host material for the light emitting layer include fused aromatic ring derivatives, or hetero ring-containing compounds, and the like. Specifically, examples of the fused aromatic ring derivatives include anthracene derivatives, pyrene derivatives, naphthalene derivatives, pentacene derivatives, phenanthrene compounds, fluoranthene compounds, and the like, and examples of the hetero ring-containing compounds include carbazole derivatives, dibenzofuran derivatives, ladder-type furan compounds, pyrimidine derivatives, and the like, but the examples thereof are not limited thereto.

When the light emitting layer emits red light, it is possible to use a phosphorescent material such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP), or a fluorescent material such as tris(8-hydroxy-quinolino)aluminum ($Alq_3$) as a light emitting dopant, but the light emitting dopant is not limited thereto. When the light emitting layer emits green light, it is possible to use a phosphorescent material such as fac-tris(2-phenylpyridine)iridium ($Ir(ppy)_3$), or a fluorescent material such as tris(8-hydroxyquinolino)aluminum ($Alq_3$) as the light emitting dopant, but the light emitting dopant is not limited thereto. When the light emitting layer emits blue light, it is possible to use a phosphorescent material such as $(4,6\text{-}F_2ppy)_2Irpic$, or a fluorescent material such as spiro-DPVBi, spiro-6P, distyryl benzene (DSB), distyryl arylene (DSA), a PFO-based polymer or a PPV-based polymer as the light emitting dopant, but the light emitting dopant is not limited thereto.

A hole blocking layer can be provided between the electron transport layer and the light emitting layer, and materials known in the art can be used.

The electron transport layer can serve to smoothly transport electrons. The electron transport material is suitably a material having high electron mobility which can proficiently accept electrons from a negative electrode and transfer the electrons to a light emitting layer. Specific examples thereof include: Al complexes of 8-hydroxyquinoline; complexes including $Alq_3$; organic radical compounds; hydroxyflavone-metal complexes; and the like, but are not limited thereto. The electron transport layer can have a thickness of 1 to 50 nm. When the electron transport layer has a thickness of 1 nm or more, there is an advantage in that it is possible to prevent electron transport characteristics from deteriorating, and when the electron transport layer has a thickness of 50 nm or less, there is an advantage in that it is possible to prevent the driving voltage from being increased in order to improve the movement of electrons due to the too thick electron transport layer.

The electron injection layer can serve to smoothly inject electrons. An electron injection material is preferably a compound which has a capability of transporting electrons, an effect of injecting electrons from a negative electrode, and an excellent effect of injecting electrons into a light emitting layer or a light emitting material, prevents excitons produced from a light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo-[h] quinolinato) beryllium, bis(10-hydroxybenzo[h]-quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a negative electrode, and can be generally formed under the same conditions as those of the hole injection layer. Specific examples of a hole blocking material include oxadiazole derivatives or triazole derivatives, phenanthroline derivatives, BCP, aluminum complexes, and the like, but are not limited thereto.

The organic light emitting device according to the present invention can be a top emission type, a bottom emission type, or a dual emission type according to the material to be used.

EXAMPLES

Hereinafter, the present specification will be described in detail with reference to Examples for specifically describing the present specification.

However, the Examples according to the present specification can be modified in various forms, and it is not interpreted that the scope of the present application is limited to the Examples described in detail below. The Examples of the present application are provided to more completely explain the present specification to a person with ordinary skill in the art.

Synthesis Examples

Synthesis Example 1. Synthesis of Intermediate A-1-1

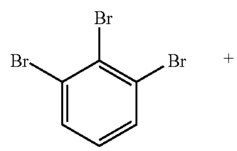

X-1

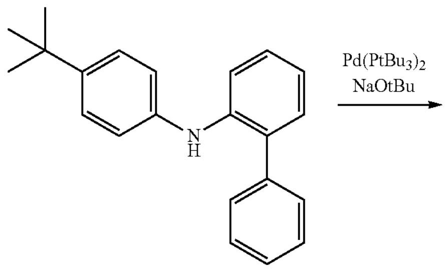

N-1

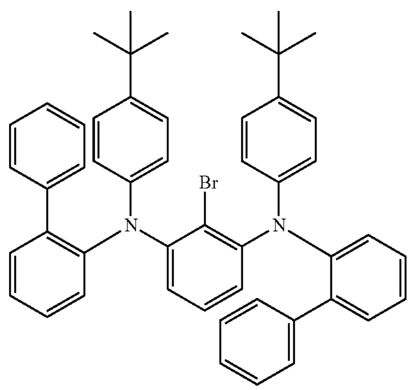

A-1-1

A flask containing 1,2,3-tribromobenzene (X-1, 5 g), N-(4-(tert-butyl)phenyl)-[1,1'-biphenyl]-2-amine (N-1, 10 g), $Pd(PtBu_3)_2$ (0.16 g), NaOtBu (4.6 g) and xylene (50 ml) was heated at 130° C., and the resulting solution was stirred for 3 hours. The reaction solution was cooled to room temperature, the liquid was aliquoted by adding water and ethyl acetate thereto, and then the solvent was distilled off under reduced pressure. The product was purified with recrystallization (ethyl acetate/hexane) to obtain Compound A-1-1 (9.2 g). As a result of measuring the mass spectrum of the obtained solid, a peak was confirmed at [M+H+]=755.

Synthesis Example 2. Synthesis of Compound A-1

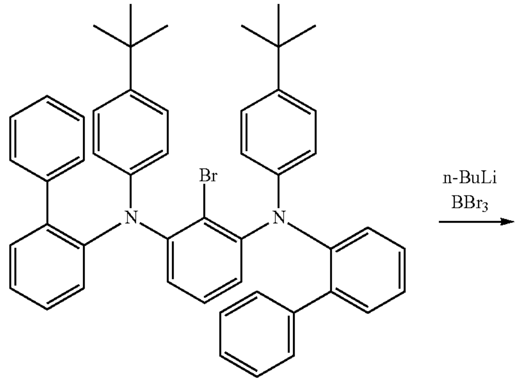

A-1-1

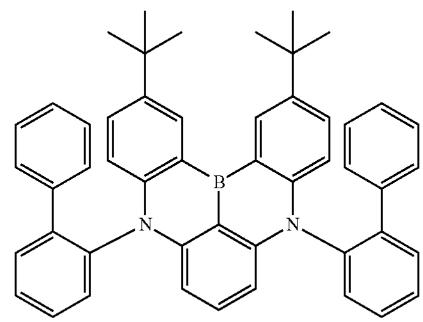

A-1

An n-butyllithium pentane solution (9.5 ml, 2.5 M in hexane) was added to a flask containing Intermediate A-1-1 (9 g) and xylene (120 ml) at 0° C. under an argon atmosphere. After the completion of dropwise addition, the resulting solution was warmed to 50° C. and stirred for 2 hours. The resulting solution was cooled to −40° C., boron tribromide (3.44 ml) was added thereto, and the resulting solution was stirred for 4 hours while being warmed to room temperature. Thereafter, the resulting solution was cooled again to 0° C., N,N-diisopropyl-ethylamine (10 ml) was added thereto, and the reaction solution was further stirred at room temperature for 30 minutes. After the liquid was aliquoted by adding sat. aq. NaCl and ethyl acetate thereto, the solvent was distilled off under reduced pressure. The resulting product was purified with a silica gel column chromatography (eluent: hexane/ethyl acetate=1/30) to obtain Compound A-1 (2.7 g). As a result of measuring the mass spectrum of the obtained solid, a peak was confirmed at [M+H+]=684.

Synthesis Example 3. Synthesis of Intermediate A-2-1

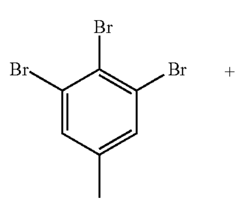

X-2

-continued

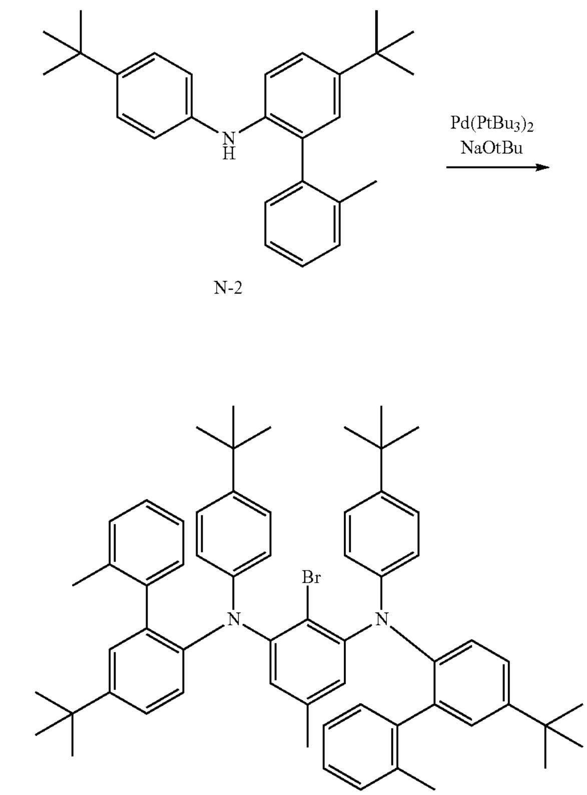

N-2

A-2-1

Intermediate A-2-1 (9.4 g) was prepared using X-2 (5 g) and N-2 (11.9 g) in the same manner as in "Synthesis Example 1". As a result of measuring the mass spectrum of the obtained solid, a peak was confirmed at [M+H+]=910.

Synthesis Example 4. Synthesis of Compound A-2

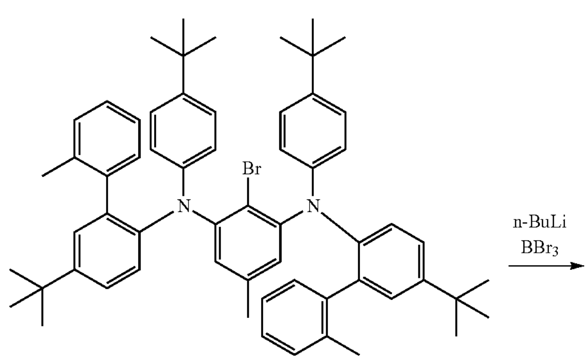

A-2-1

-continued

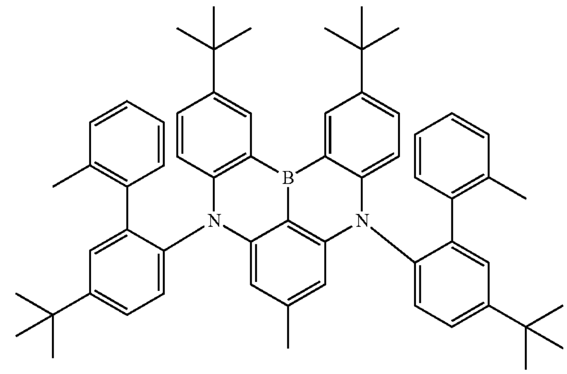

A-2

Compound A-2 (2.5 g) was prepared using A-2-1 (9 g) in the same manner as in "Synthesis Example 2". As a result of measuring the mass spectrum of the obtained solid, a peak was confirmed at [M+H+]=839.

Synthesis Example 5. Synthesis of Intermediate A-3-2

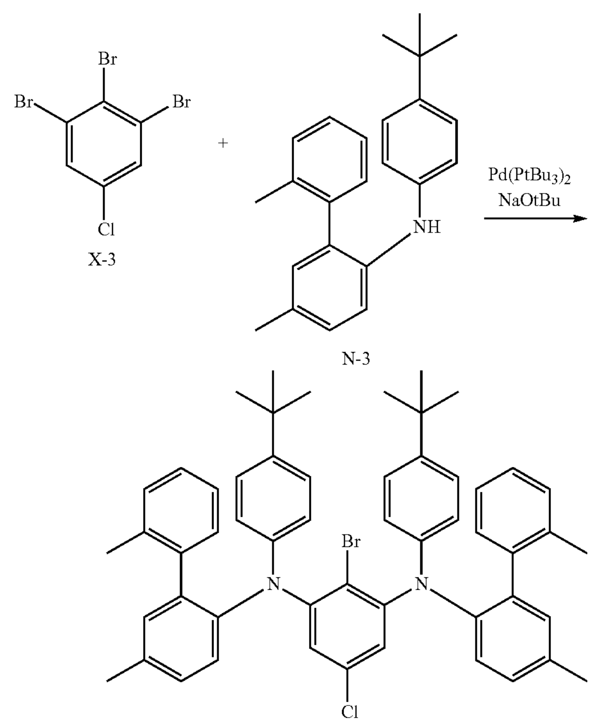

X-3

N-3

A-3-2

Intermediate A-3-2 (15.9 g) was prepared using X-3 (10 g) and N-3 (18.9 g) in the same manner as in "Synthesis Example 1". As a result of measuring the mass spectrum of the obtained solid, a peak was confirmed at [M+H+]=846.

Synthesis Example 6. Synthesis of Intermediate A-3-1

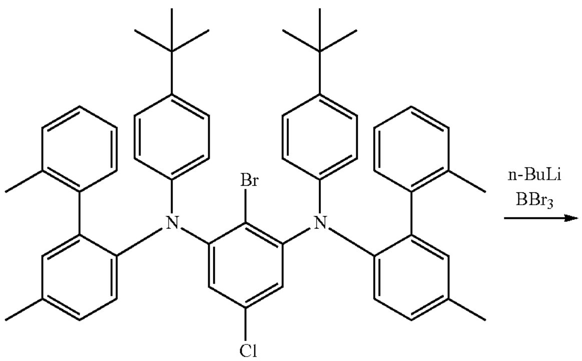

A-3-2

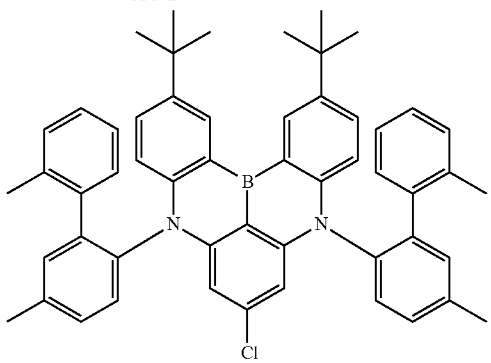

A-3-1

Intermediate A-3-1 (4.5 g) was prepared using A-3-2 (15.5 g) in the same manner as in "Synthesis Example 2". As a result of measuring the mass spectrum of the obtained solid, a peak was confirmed at [M+H+]=775.

Synthesis Example 7. Synthesis of Compound A-3

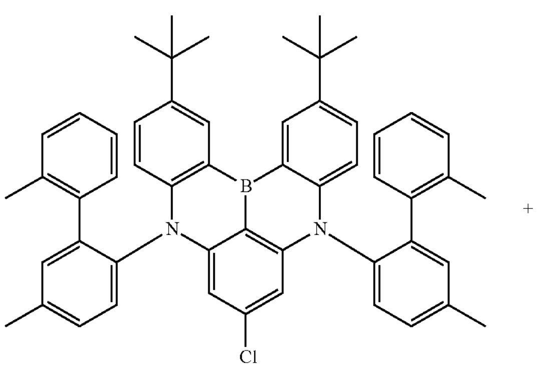

A-3-1

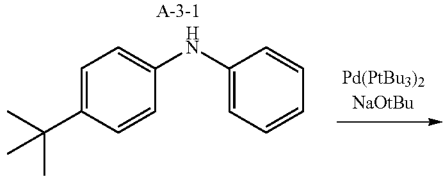

N-4

-continued

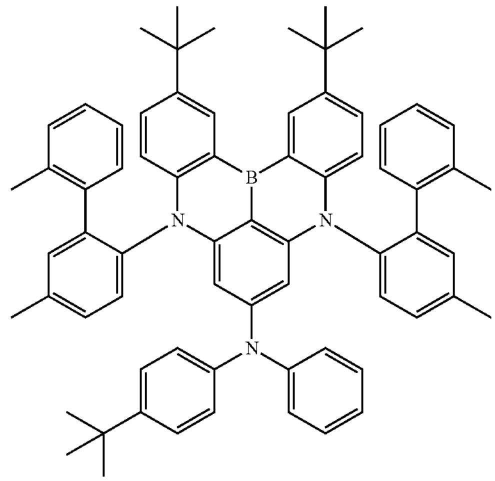

A-3

A flask containing Intermediate A-3-1 (2.0 g), Intermediate N-4 (0.64 g), $Pd(PLBu_3)_2$ (26 mg), $CsCO_3$ (3.4 g) and xylene (20 ml) was heated at 130° C., and the resulting solution was stirred for 2 hours. The reaction solution was cooled to room temperature, the liquid was aliquoted by adding sat. aq. $NH_4Cl$ and toluene thereto, and then the solvent was distilled off under reduced pressure. The resulting product was purified with a silica gel column chromatography (eluent: hexane/ethyl acetate=1/30) to obtain Compound A-3 (1.8 g). As a result of measuring the mass spectrum of the obtained solid, a peak was confirmed at [M+H+]=964.

Synthesis Example 8. Synthesis of Compound A-4

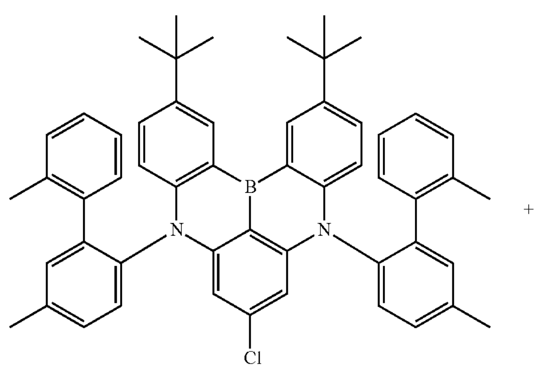

A-3-1

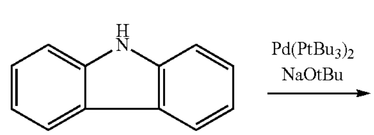

N-5

-continued

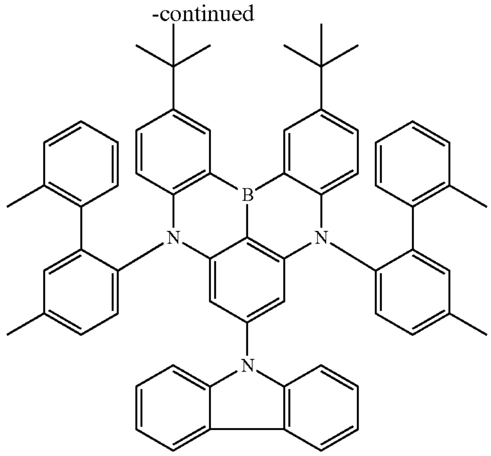

A-4

Compound A-4 (1.9 g) was prepared using Intermediate N-5 (0.5 g) in the same manner as in "Synthesis Example 7". As a result of measuring the mass spectrum of the obtained solid, a peak was confirmed at [M+H+]=906.

Synthesis Example 9: Synthesis of Intermediate B-1-2

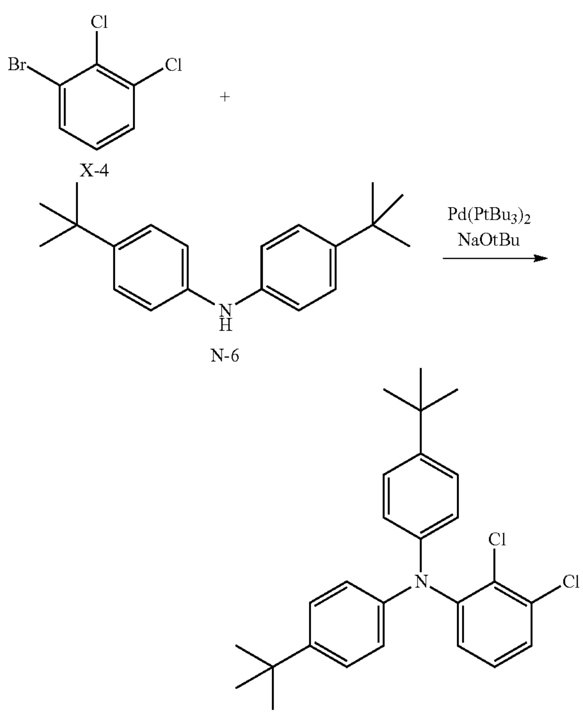

B-1-2

A flask containing Intermediate X-4 (5.0 g), Intermediate N-6 (6.67 g), $Pd(PtBu_3)_2$ (0.11 g), NaOtBu (3.2 g) and toluene (110 ml) was heated at 110° C., and the resulting solution was stirred for 30 hours. The reaction solution was cooled to room temperature, the liquid was aliquoted by adding sat. aq. $NH_4Cl$ and toluene thereto, and then the solvent was distilled off under reduced pressure. The resulting product was purified with recrystallization (methyl tert-butyl ether/hexane) to obtain Intermediate B-1-2 (6.3 g). As a result of measuring the mass spectrum of the obtained solid, a peak was confirmed at [M+H+]=426.

Synthesis Example 10: Synthesis of Intermediate B-1-1

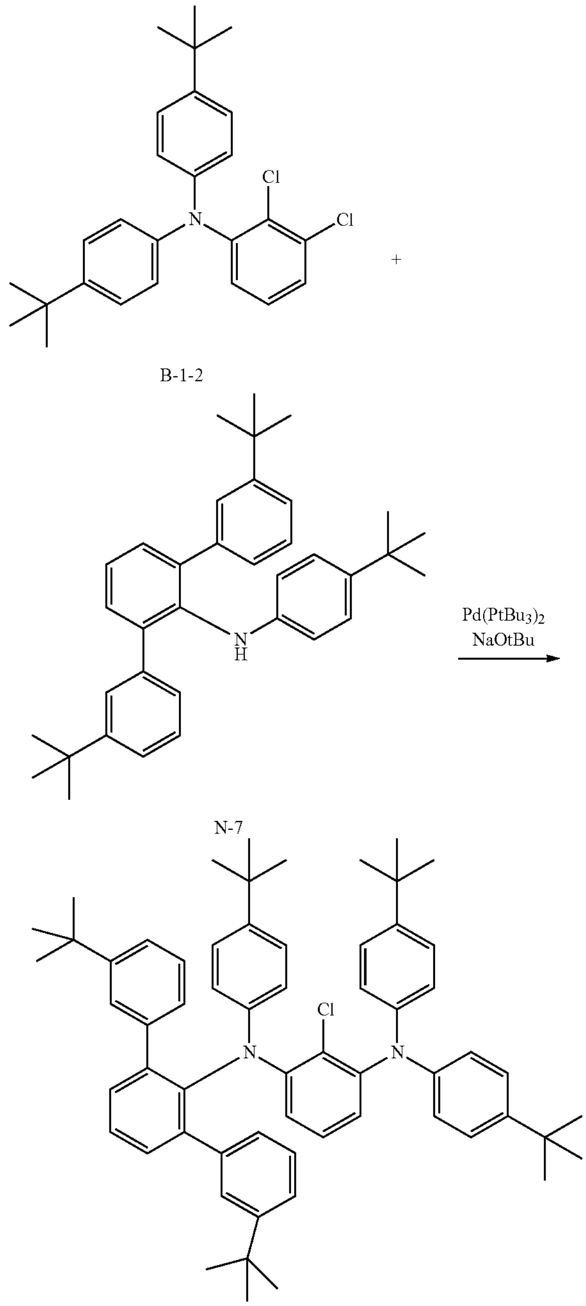

B-1-1

A flask containing Intermediate B-1-2 (6 g), Intermediate N-7 (7.6 g), $Pd(PtBu_3)_2$ (0.14 g), NaOtBu (2.7 g) and xylene (50 ml) was heated at 110° C., and the resulting solution was stirred for 3 hours. The reaction solution was cooled to room temperature, the liquid was aliquoted by adding sat. aq.

$NH_4Cl$ and toluene thereto, and then the solvent was distilled off under reduced pressure. The resulting product was purified with recrystallization (ethyl acetate/hexane) to obtain Intermediate B-1-1 (8.7 g). As a result of measuring the mass spectrum of the obtained solid, a peak was confirmed at [M+H+]=880.

Synthesis Example 11. Synthesis of Compound B-1

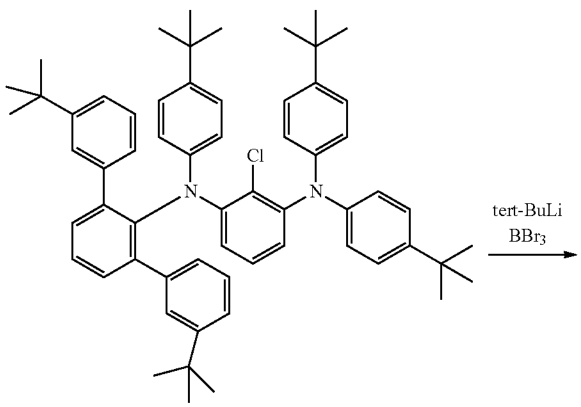

B-1-1

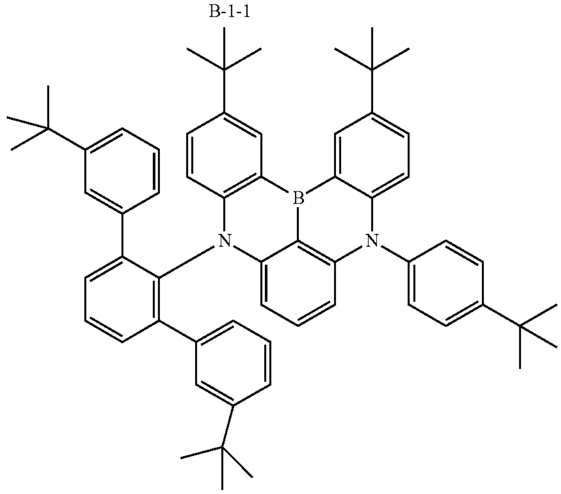

B-1

A 1.7 M tert-butyllithium pentane solution (21 ml) was added to a flask containing Intermediate B-1-1 (8.0 g) and toluene (90 ml) at 0° C. under an argon atmosphere. After the completion of dropwise addition, the resulting solution was warmed to 70° C. and stirred for 4 hours. The resulting solution was cooled to −40° C., boron tribromide (2.6 ml) was added thereto, and the resulting mixture was stirred for 4 hours while being warmed to 40° C. Thereafter, the resulting solution was cooled again to 0° C., triethylamine (10 ml) was added thereto, and the resulting solution was stirred at room temperature for 30 minutes.

After the liquid was aliquoted by adding sat. aq. NaCl and ethyl acetate thereto, the solvent was distilled off under reduced pressure. The resulting product was purified with a silica gel column chromatography (eluent: hexane/ethyl acetate=1/30) to obtain Compound B-1 (1.9 g). As a result of measuring the mass spectrum of the obtained solid, a peak was confirmed at [M+H+]=853.

Synthesis Example 12: Synthesis of Intermediate B-2-2

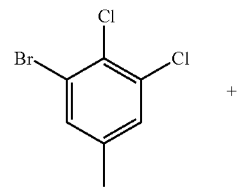

X-5

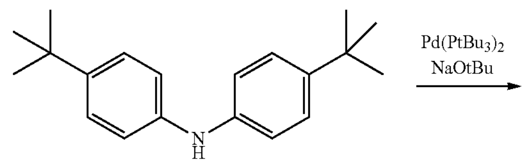

N-6

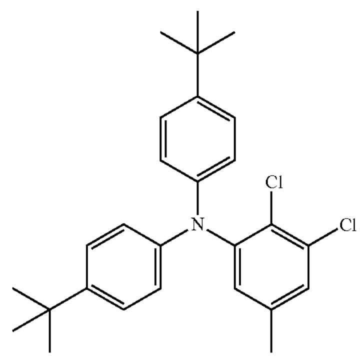

B-2-2

Compound B-2-2 (13.9 g) was prepared using Intermediate X-5 (10 g) in the same manner as in "Synthesis Example 9". As a result of measuring the mass spectrum of the obtained solid, a peak was confirmed at [M+H+]=440.

Synthesis Example 13: Synthesis of Intermediate B-2-1

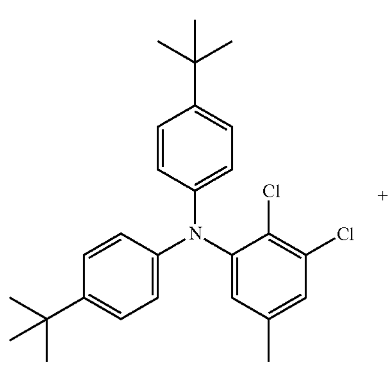

B-2-2

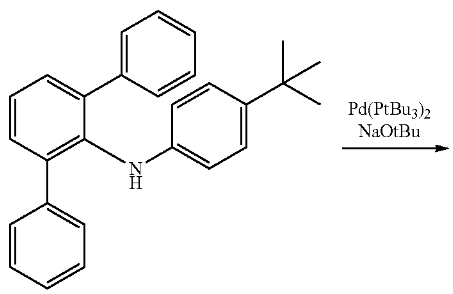

N-8

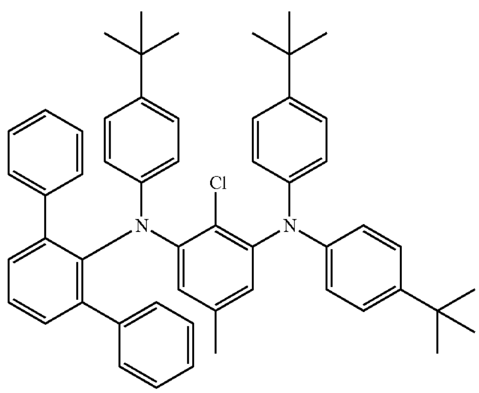

B-2-1

Compound B-2-1 (5.5 g) was prepared using Intermediate B-2-2 (4.5 g) and Intermediate N-8 (4.2 g) in the same manner as in "Synthesis Example 10". As a result of measuring the mass spectrum of the obtained solid, a peak was confirmed at [M+H+]=781.

Synthesis Example 14. Synthesis of Compound B-2

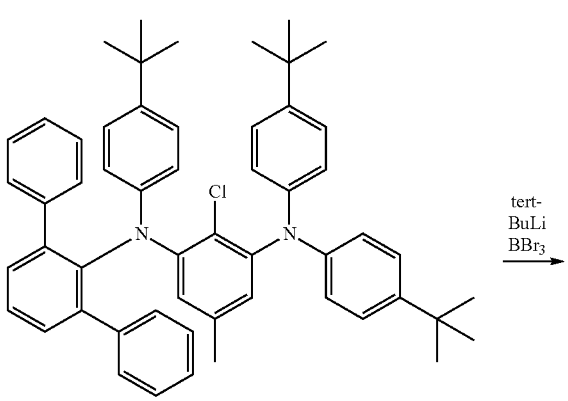

B-2-1

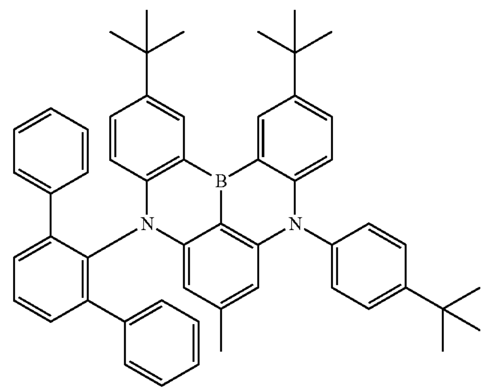

B-2

Compound B-2 (0.9 g) was prepared using Intermediate B-2-1 (5.5 g) in the same manner as in "Synthesis Example 11". As a result of measuring the mass spectrum of the obtained solid, a peak was confirmed at [M+H+]=754.

Synthesis Example 15. Synthesis of Compound B-3

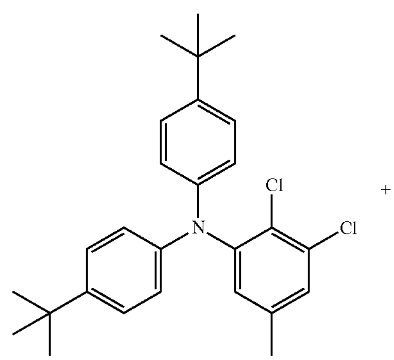

B-2-2

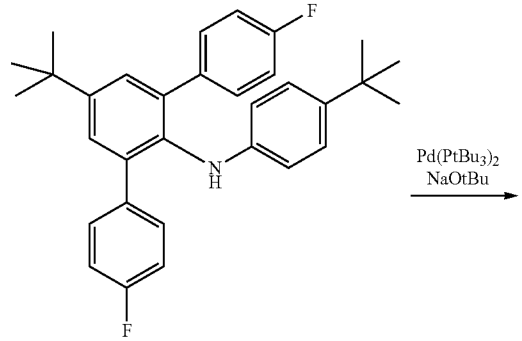

N-9

-continued

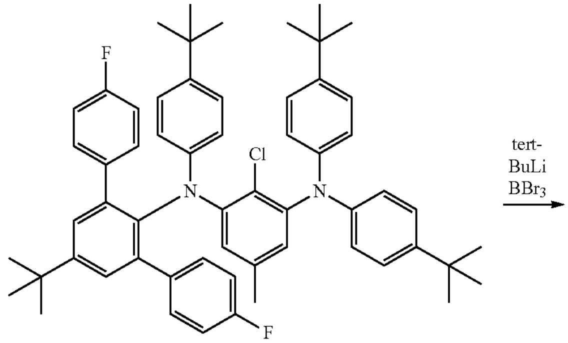

B-3-1

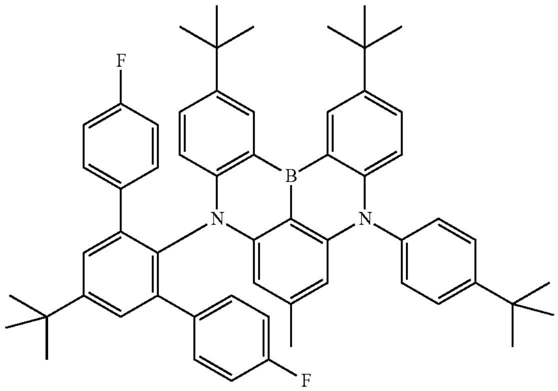

B-3

Compound B-3-1 (5.9 g) was prepared using Intermediate B-2-2 and Intermediate N-9 in the same manner as in "Synthesis Example 10". As a result of measuring the mass spectrum of the obtained solid, a peak was confirmed at [M+H+]=873.

Compound B-3 (1.2 g) was prepared using Intermediate B-3-1 (5.5 g) in the same manner as in 'Synthesis Example 11'. As a result of measuring the mass spectrum of the obtained solid, a peak was confirmed at [M+H+]=846.

Synthesis Example 16. Synthesis of Compound C-1

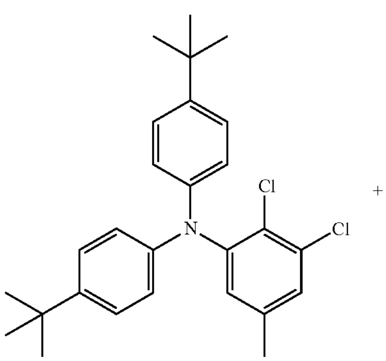

B-2-2

-continued

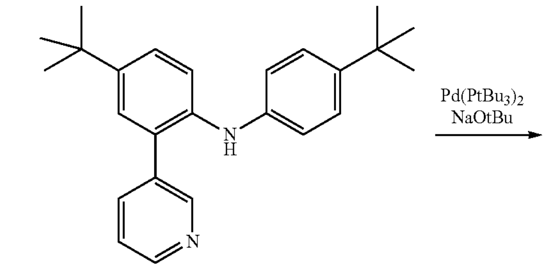

N-10

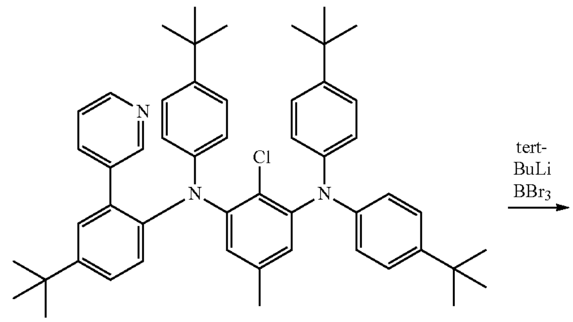

C-1-1

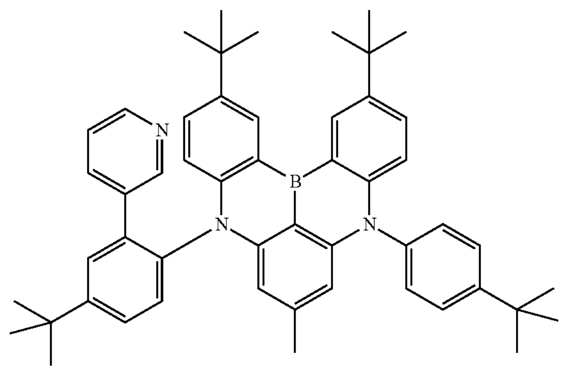

C-1

Compound C-1 (1.0 g) was prepared using Intermediate B-2-2, Intermediate N-10, and Intermediate C-1-1 in the same manner as in "Synthesis Example 15". As a result of measuring the mass spectrum of the obtained solid, a peak was confirmed at [M+H+]=735.

Synthesis Example 17: Synthesis of Intermediate B-4-1

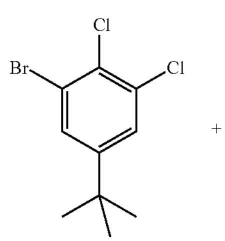

X-6

-continued

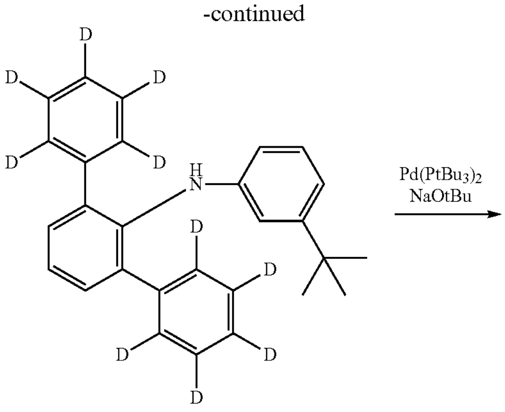

N-11

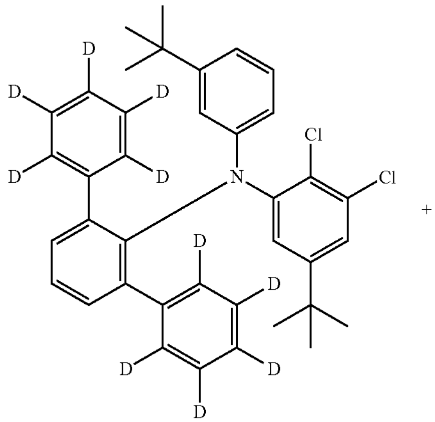

B-4-2

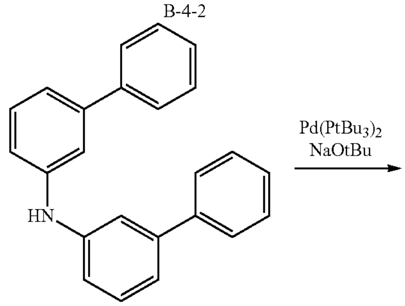

N-12

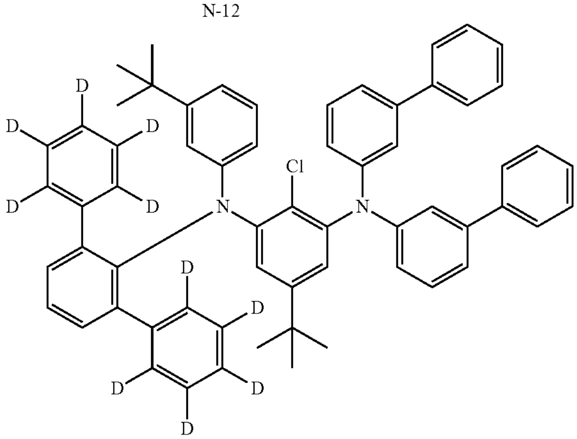

B-4-1

Compound B-4-1 (6.9 g) was prepared using Intermediate X-6 (5 g), Intermediate N-11, Intermediate B-4-2, and Intermediate N-12 in the same manner as in "Synthesis Example 12". As a result of measuring the mass spectrum of the obtained solid, a peak was confirmed at [M+H+]=873.

Synthesis Example 18. Synthesis of Compound B-4

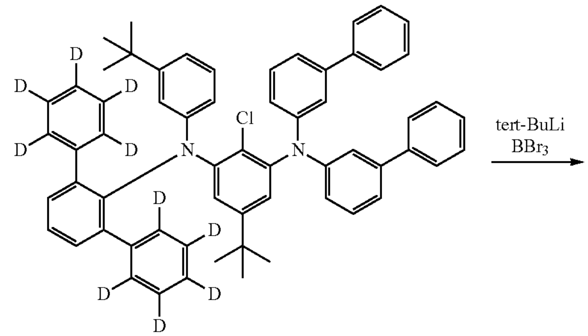

B-4-1

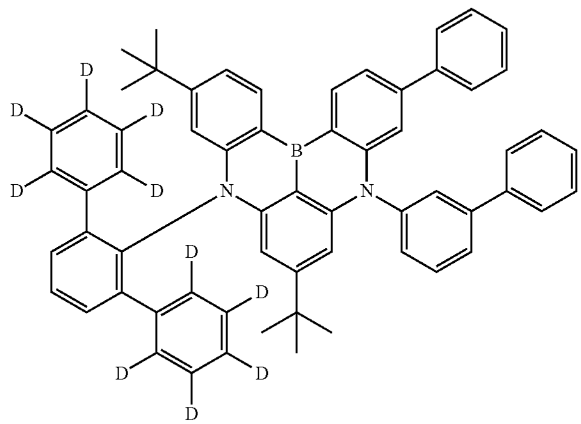

B-4

Compound B-4 (0.8 g) was prepared using Intermediate B-4-1 (6.9 g) in the same manner as in "Synthesis Example 11". As a result of measuring the mass spectrum of the obtained solid, a peak was confirmed at [M+H+]=847.

Synthesis Example 19. Synthesis of Compound C-2

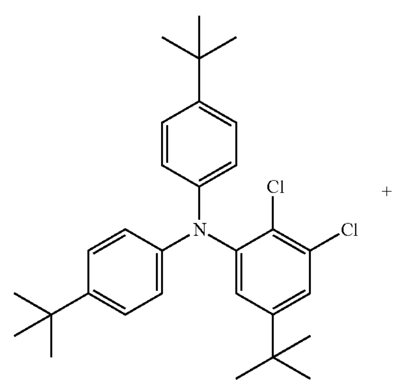

C-2-2

-continued

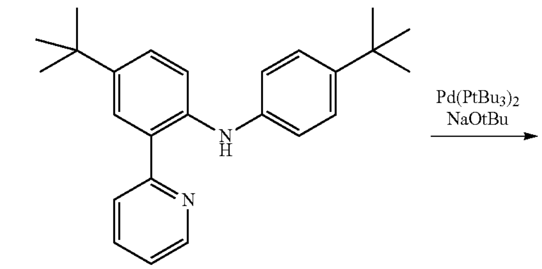

N-13

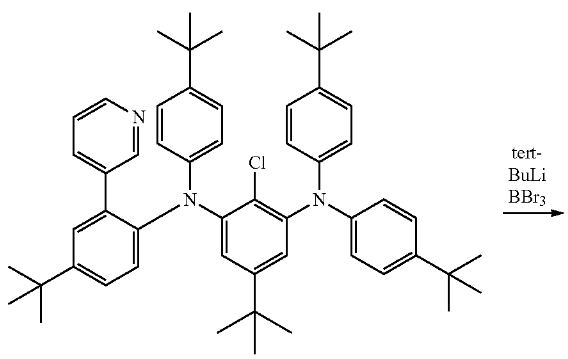

C-2-1

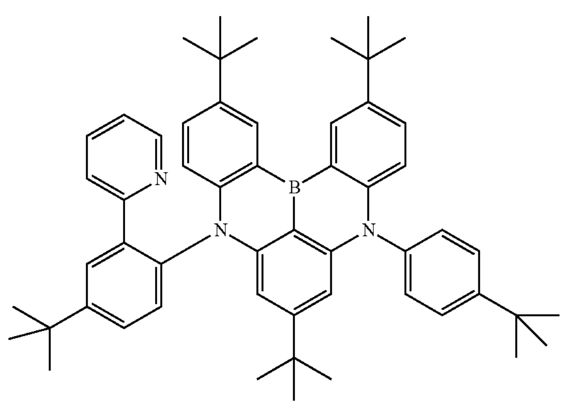

C-2

Intermediate C-2-2 (6.1 g) was prepared using Intermediate X-6 in the same manner as in "Synthesis Example 12". As a result of measuring the mass spectrum of the obtained solid, a peak was confirmed at [M+H+]=482.

Compound C-2 (1.1 g) was prepared using Intermediate C-2-2, Intermediate N-13, and Intermediate C-2-1 in the same manner as in "Synthesis Example 16". As a result of measuring the mass spectrum of the obtained solid, a peak was confirmed at [M+H+]=778.

Synthesis Example 20. Synthesis of Compound C-3

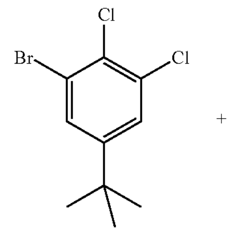

X-6

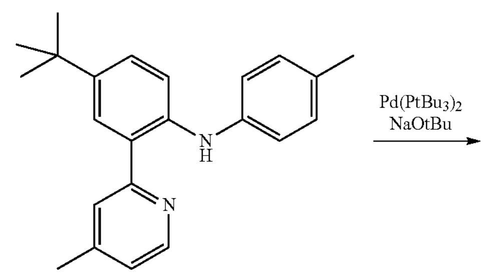

N-14

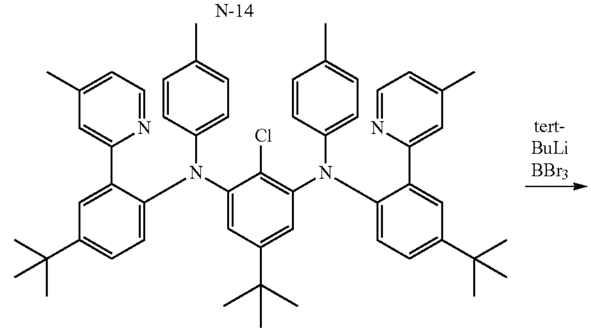

C-3-1

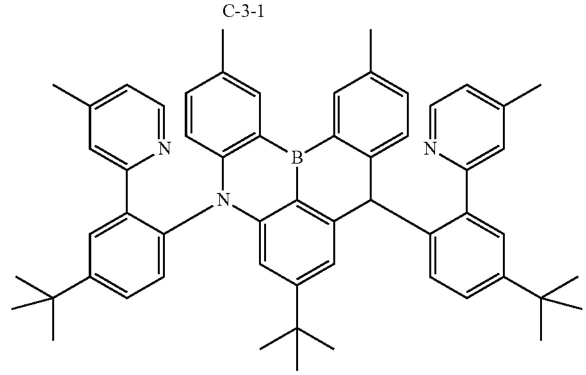

C-3

Intermediate C-3-1 (10.8 g) was prepared using X-6 (5 g) and N-14 in the same manner as in "Synthesis Example 1". As a result of measuring the mass spectrum of the obtained solid, a peak was confirmed at [M+H+]=825.

Compound C-3 (1.9 g) was prepared using Intermediate C-3-1 (9.5 g) in the same manner as in "Synthesis Example 11". As a result of measuring the mass spectrum of the obtained solid, a peak was confirmed at [M+H+]=799.

Synthesis Example 21: Synthesis of Intermediate B-5-3
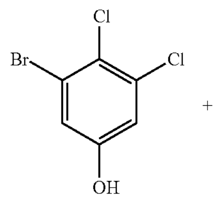
X-7
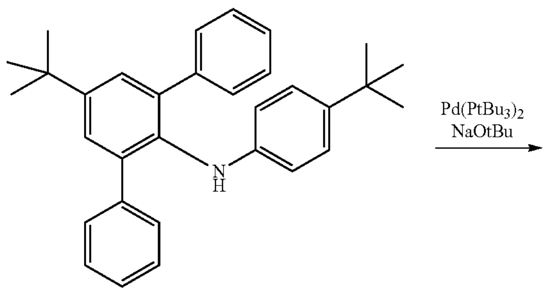
N-15
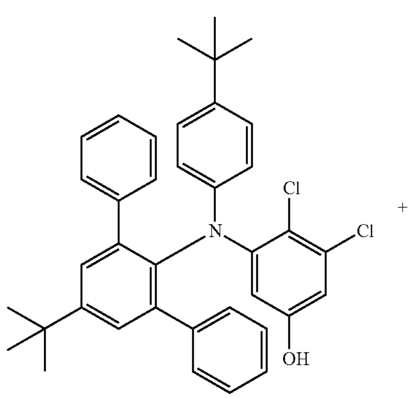
B-5-4
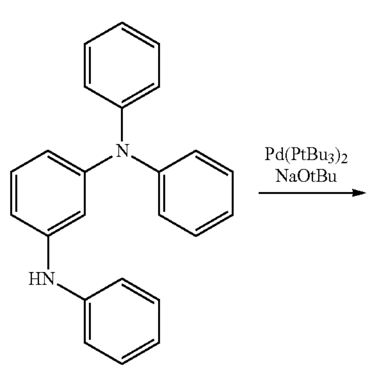
N-16
-continued
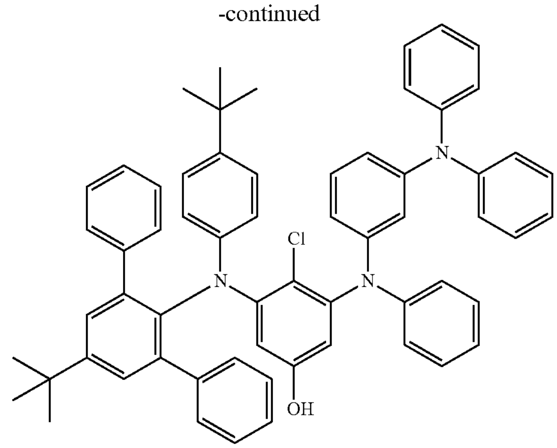
B-5-3
Compound B-5-3 (11.0 g) was prepared using Intermediate X-7 (13 g), Intermediate N-15, Intermediate B-5-4 (11 g), and Intermediate N-16 in the same manner as in "Synthesis Example 17". As a result of measuring the mass spectrum of the obtained solid, a peak was confirmed at [M+H+]=894.
Synthesis Example 22: Synthesis of Intermediate B-5-2
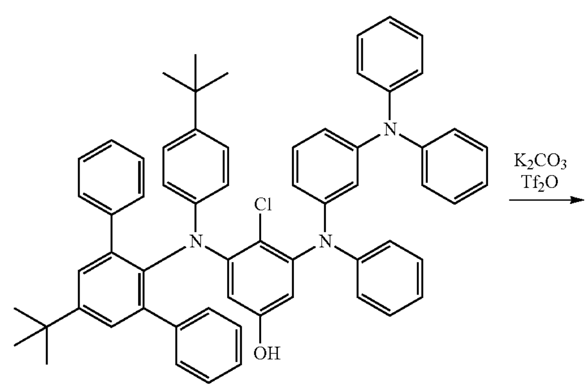
B-5-3
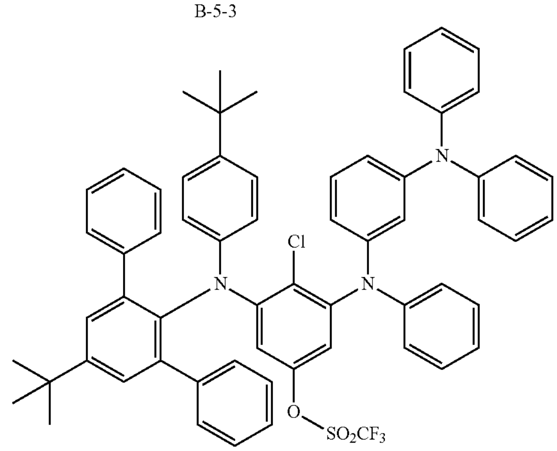
B-5-2

After Intermediate B-5-3 (5 g) was dissolved in DMF (20 mL), potassium carbonate (1.2 g) was added thereto at room temperature, and then triflic anhydride (1.1 g) was slowly added dropwise thereto at 0° C. After the reaction was completed by stirring the resulting solution for 2 hours, 20 mL of water was added thereto, and the resulting mixture was stirred for 30 minutes. A solid obtained by filtering the produced solid was dissolved in toluene, the liquid was aliquoted using sat. aq. $NH_4Cl$, and then the organic layer was recovered and filtered by treatment with $Na_2SO_4$ (anhydrous). The solvent of the filtered solution was distilled off under reduced pressure, and the residue was recrystallized (ethyl acetate/hexane), and then dried to obtain 41 g of Intermediate B-5-2.

Synthesis Example 23: Synthesis of Intermediate B-5-1

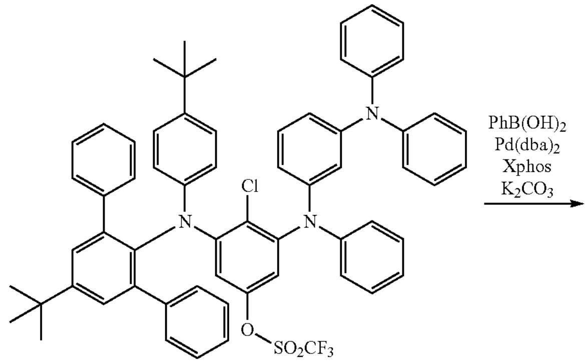

B-5-2

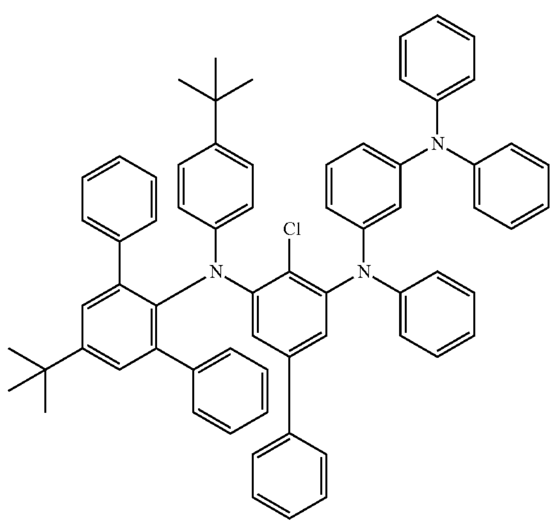

B-5-1

A flask containing Intermediate B-5-2 (4.8 g), phenyl boronic acid (0.75 g), $Pd(dba)_2$ (27 mg), Xphos(45 mg), $K_2CO_3$ (1.0 g), dioxane (40 ml), and water (10 ml) was heated at 90° C., and the resulting solution was stirred for 2 hours. The reaction solution was cooled to room temperature, the liquid was aliquoted by adding sat. aq. $NH_4Cl$ and ethyl acetate thereto, and then the solvent was distilled off under reduced pressure. The resulting product was purified with recrystallization (ethyl acetate/hexane) to obtain Compound B-5-1 (3.7 g). As a result of measuring the mass spectrum of the obtained solid, a peak was confirmed at [M+H+]=954.

Synthesis Example 24. Synthesis of Compound B-5

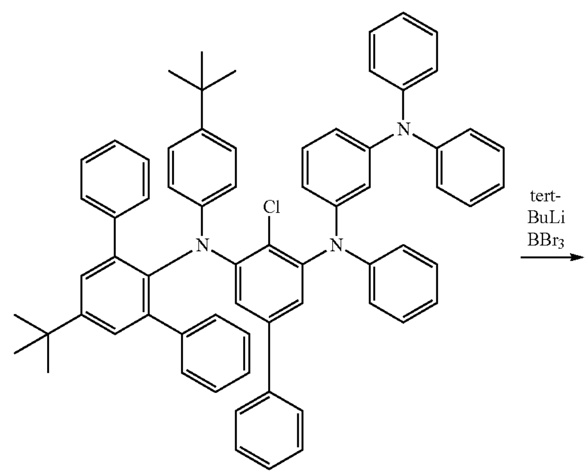

B-5-1

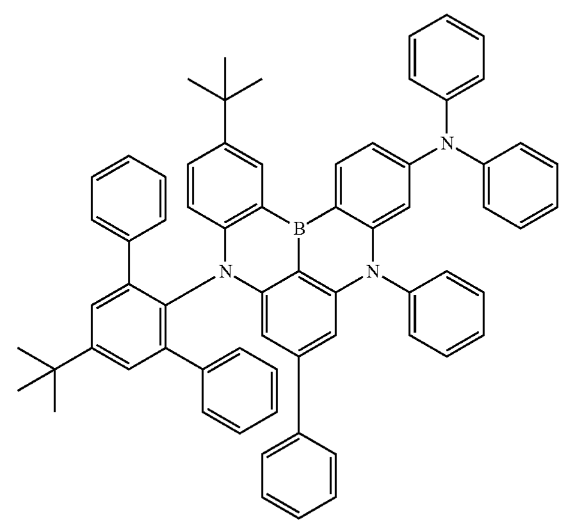

B-5

Compound B-5 (0.9 g) was prepared using Intermediate B-5-1 (3.7 g) in the same manner as in "Synthesis Example 11". As a result of measuring the mass spectrum of the obtained solid, a peak was confirmed at [M+H+]=928.

Synthesis Example 25: Synthesis of Intermediate B-6-2

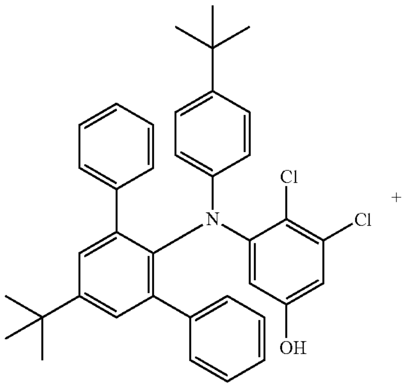

B-5-4

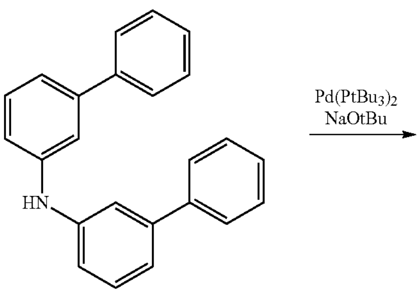

N-12

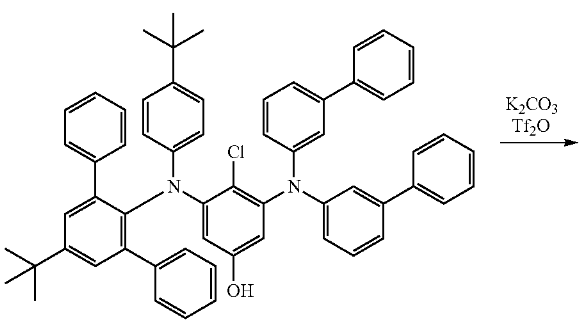

B-6-3

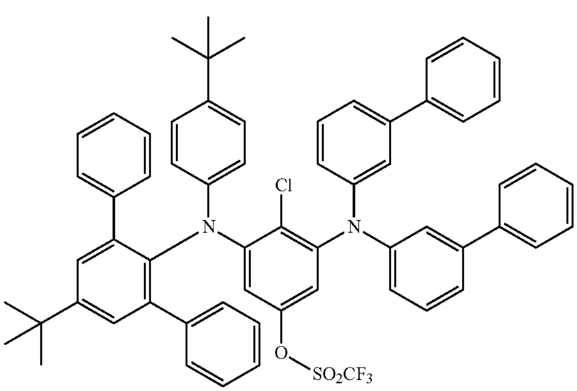

B-6-2

Intermediate B-6-3 (11.5 g) was prepared using Intermediate B-5-4 (11 g) and Intermediate N-12 in the same manner as in 'Synthesis Example 20'. As a result of measuring the mass spectrum of the obtained solid, a peak was confirmed at [M+H+]=879.

Compound B-6-2 (10.4 g) was prepared using Intermediate B-6-3 (11.5 g) in the same manner as in "Synthesis Example 21".

Synthesis Example 26. Synthesis of Compound B-6

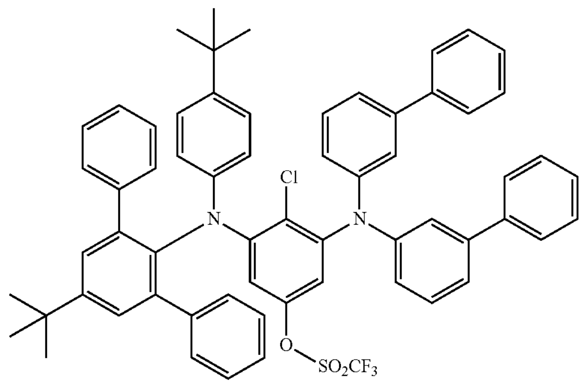

B-6-2

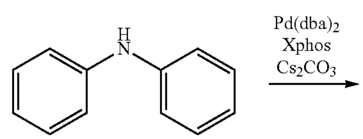

N-17

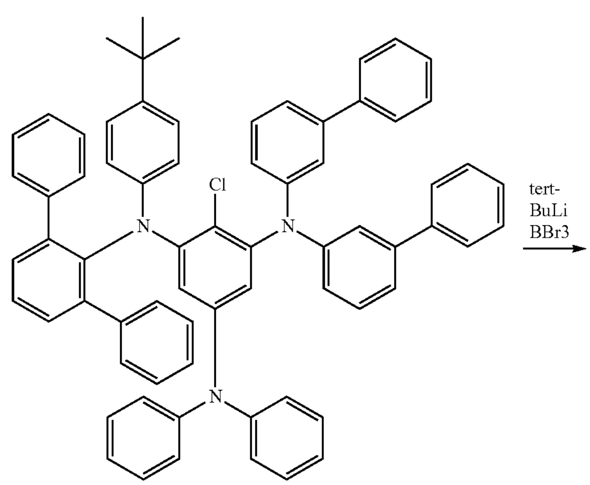

B-6-1

-continued

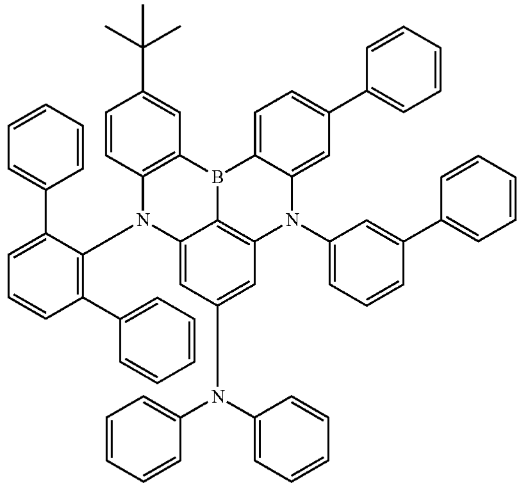

B-6

Compound B-6-1 (3.8 g) was prepared using Intermediate B-6-2 (5 g) and Intermediate N-17 in the same manner as in “Synthesis Example 7”. As a result of measuring the mass spectrum of the obtained solid, a peak was confirmed at [M+H+]=974.

Compound B-6 (1.0 g) was prepared using Intermediate B-6-1 (3.8 g) in the same manner as in “Synthesis Example 11”. As a result of measuring the mass spectrum of the obtained solid, a peak was confirmed at [M+H+]=948.

Experimental Example 1

Example 1

A glass substrate thinly coated with indium tin oxide (ITO) to have a thickness of 1,300 Å was put into distilled water in which a detergent was dissolved, and ultrasonically washed. In this case, a product manufactured by Fischer Co. was used as the detergent, and distilled water, which had been filtered twice with a filter manufactured by Millipore Co., was used as the distilled water. After the ITO was washed for 30 minutes, ultrasonic washing was repeated twice by using distilled water for 10 minutes. After the washing using distilled water was completed, ultrasonic washing was conducted by using isopropyl alcohol, acetone, and methanol solvents, and the resulting product was dried and then transported to a plasma washing machine. The substrate was cleaned by using oxygen plasma for 5 minutes, and then was transported to a vacuum deposition machine.

The following compoundHAT was thermally vacuum-deposited to have a thickness of 50 Å on the ITO transparent electrode thus prepared, thereby forming a hole injection layer. The following compound HT-A was vacuum-deposited to have a thickness of 1,000 Å as a first hole transport layer thereon, and subsequently, the following compound HT-B was deposited to have a thickness of 100 Å as a second hole transport layer. A host BH-A and a dopant Compound A-1 were vacuum-deposited at a weight ratio of 95:5, thereby forming a light emitting layer having a thickness of 200 Å.

Next, the following compound ET-A and the following compound Liq were deposited to have a thickness of 300 Å, as a layer which simultaneously injects and transports electrons, at a ratio of 1:1, and lithium fluoride (LiF) and aluminum were deposited to have a thickness of 10 Å and 1,000 Å, respectively, thereon to form a negative electrode, thereby manufacturing an organic light emitting device.

In the aforementioned procedure, the deposition rate of the organic material was maintained at 0.4 to 1.0 Å/sec, the deposition rates of lithium fluoride and aluminum of the negative electrode were maintained at 0.3 Å/sec and 2 Å/sec, respectively, and the degree of vacuum during the deposition was maintained at $1\times10^{-7}$ to $5\times10^{-8}$ torr, thereby manufacturing an organic light emitting device.

HAT

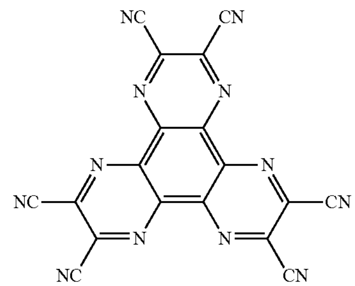

HT-A

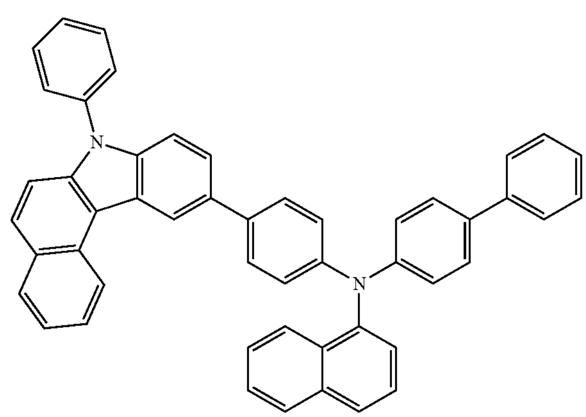

HT-B

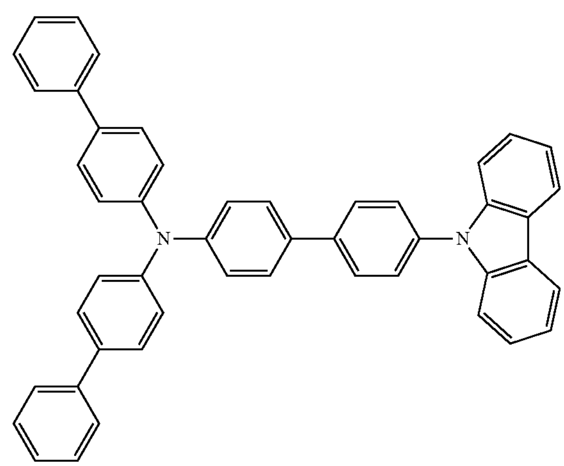

-continued
BH-A
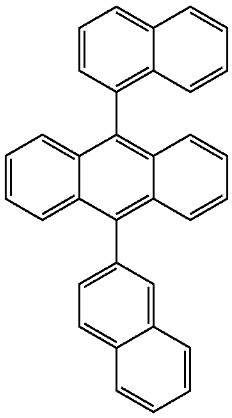
ET-A
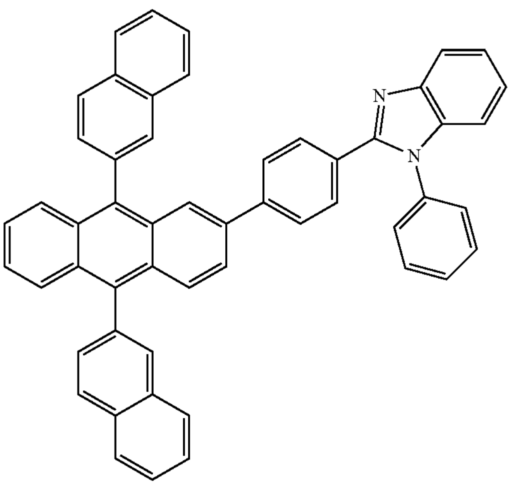
A-1
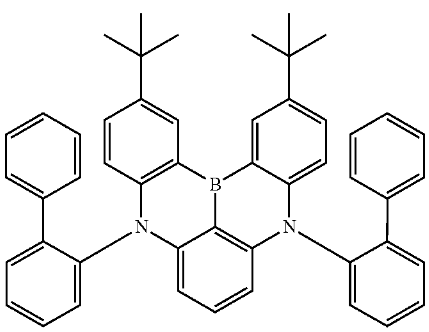
Liq
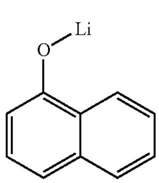
Examples 2 to 14
Organic light emitting devices were manufactured in the same manner as in Example 1, except that the host and dopant compounds described in the following Table 1 were used as materials for a light emitting layer in Example 1.
A-3
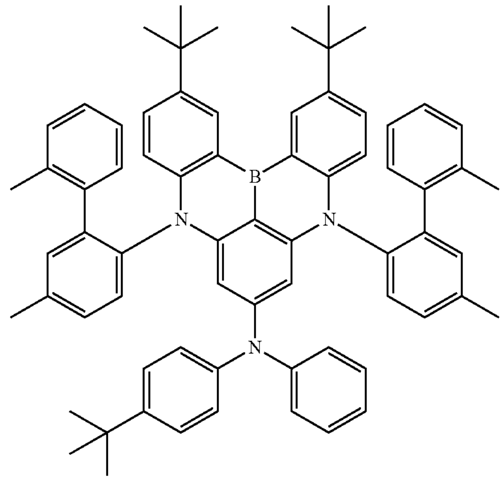
B-2
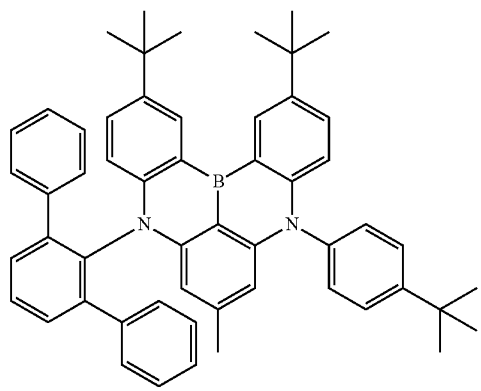
B-4
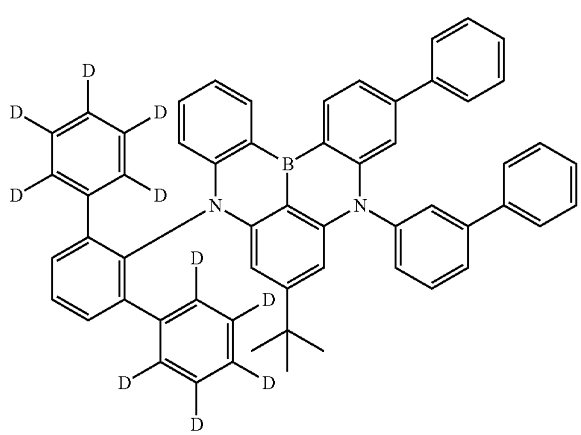

-continued
B-5
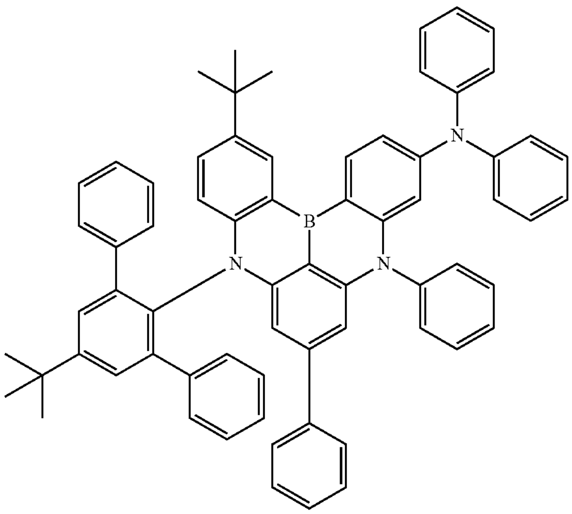
C-1
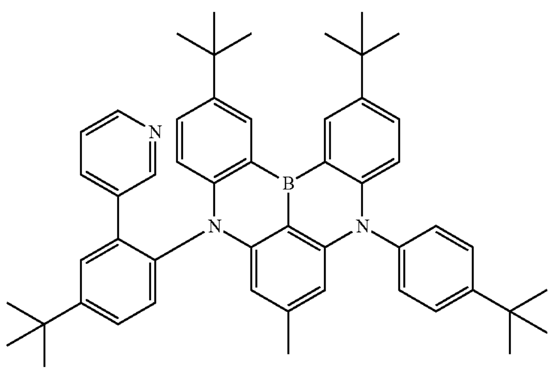
C-3
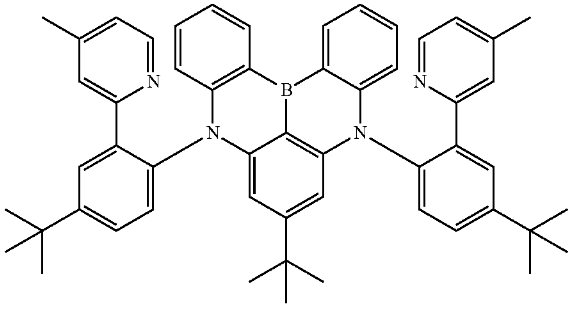
-continued
BH-A
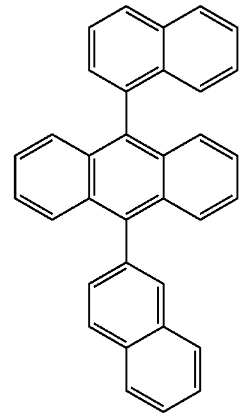
BH-B
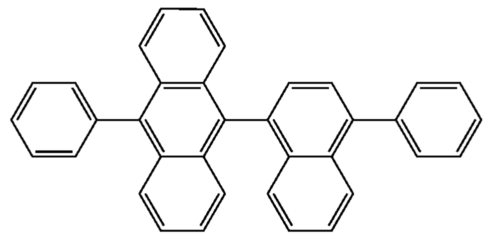
BH-C
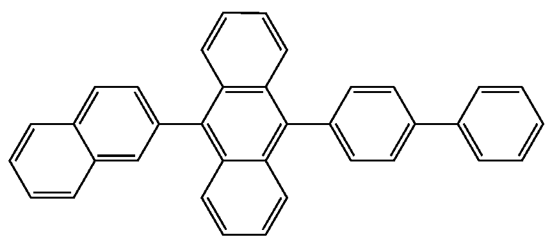
BH-D
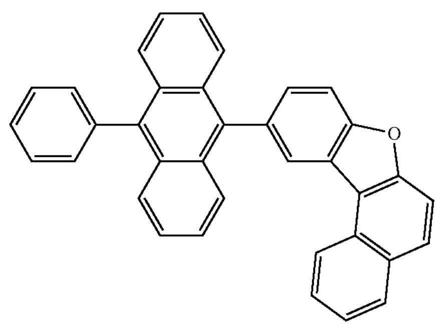
BH-E
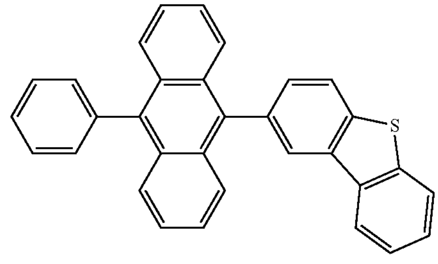
Comparative Examples 1 to 4
Organic light emitting devices were manufactured in the same manner as in Example 1, except that the host and dopant compounds described in the following Table 1 were used as materials for a light emitting layer in Example 1.

R-1

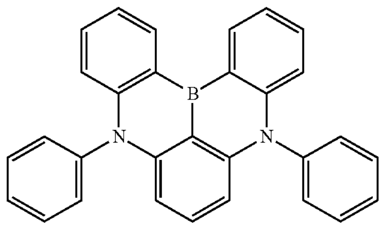

R-2

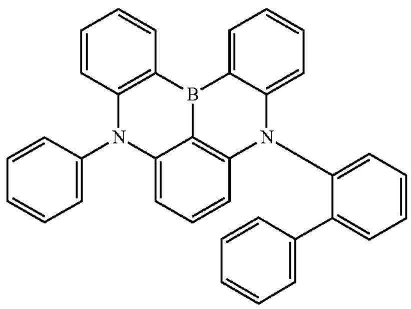

Examples 15 to 19 and Comparative Example 5

Organic light emitting devices were manufactured in the same manner as in Example 1, except that the host and dopant compounds described in the following Table 1 were used as materials for a light emitting layer in Example 1. Specifically, as the host, a first host and a second host were used as a weight ratio of 1:1 instead of BH-A of Example 1.

For the organic light emitting devices manufactured by Examples 1 to 19 and Comparative Examples 1 to 5, the driving voltage and the efficiency were measured at a current density of 10 mA/cm$^2$, and a time (T97) for reaching a 97% value compared to the initial luminance was measured at a current density of 20 mA/cm$^2$. The results are shown in the following Table 1.

TABLE 1

| | First | Second | | 10 mA/cm$^2$ | | 20 mA/cm$^2$ |
|---|---|---|---|---|---|---|
| | host (light emitting layer) | host (light emitting layer) | Dopant (light emitting layer) | Driving voltage (V) | Light emitting efficiency (Cd/A) | Service life, T97 (time) |
| Example 1 | BH-A | — | A-1 | 4.4 | 5.5 | 187 |
| Example 2 | BH-A | — | A-3 | 4.1 | 5.7 | 192 |
| Example 3 | BH-A | — | B-2 | 4.2 | 6.4 | 243 |
| Example 4 | BH-A | — | B-4 | 4.5 | 6.0 | 275 |
| Example 5 | BH-A | — | B-5 | 4.4 | 6.7 | 228 |
| Example 6 | BH-A | — | C-1 | 4.0 | 6.2 | 236 |
| Example 7 | BH-A | — | C-3 | 3.8 | 6.0 | 228 |
| Comparative Example 1 | BH-A | — | R-1 | 4.4 | 5.0 | 157 |
| Comparative Example 2 | BH-A | — | R-2 | 4.3 | 5.2 | 173 |
| Example 8 | BH-B | — | A-1 | 4.4 | 5.6 | 192 |
| Example 9 | BH-B | — | B-2 | 4.2 | 6.3 | 248 |
| Example 10 | BH-B | — | C-1 | 4.0 | 6.5 | 231 |
| Comparative Example 3 | BH-B | — | R-1 | 4.4 | 5.1 | 160 |

TABLE 1-continued

| | First | Second | | 10 mA/cm$^2$ | | 20 mA/cm$^2$ |
|---|---|---|---|---|---|---|
| | host (light emitting layer) | host (light emitting layer) | Dopant (light emitting layer) | Driving voltage (V) | Light emitting efficiency (Cd/A) | Service life, T97 (time) |
| Example 11 | BH-C | — | A-3 | 4.1 | 5.6 | 192 |
| Example 12 | BH-C | — | B-4 | 4.5 | 6.2 | 277 |
| Example 13 | BH-C | — | B-5 | 4.3 | 7.0 | 237 |
| Example 14 | BH-C | — | C-3 | 3.9 | 5.8 | 225 |
| Comparative Example 4 | BH-C | — | R-2 | 4.3 | 5.1 | 173 |
| Example 15 | BH-A | BH-D | A-3 | 3.9 | 5.5 | 180 |
| Example 16 | BH-A | BH-E | B-4 | 4.2 | 5.7 | 253 |
| Example 17 | BH-A | BH-E | B-5 | 3.7 | 6.3 | 207 |
| Example 18 | BH-B | BH-D | C-1 | 3.7 | 6.2 | 208 |
| Example 19 | BH-B | BH-E | B-5 | 3.9 | 6.5 | 220 |
| Comparative Example 5 | BH-B | BH-E | R-1 | 4.0 | 4.6 | 141 |

As observed in Table 1, the devices in Examples 1 to 19 in which the compound having the structure of Formula 1 is used have lower voltage, higher efficiency, and longer service life characteristics than those of the devices in Comparative Examples 1 to 5.

Experimental Example 2

BD-X

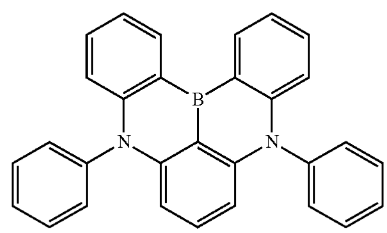

BD-A

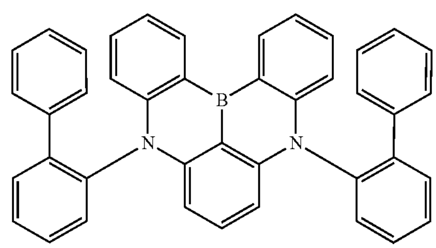

BD-B

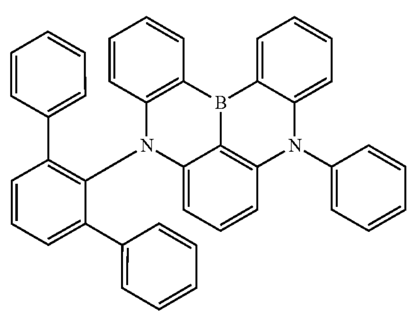

-continued

Host-1

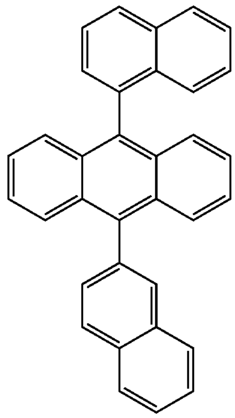

Figure 4:
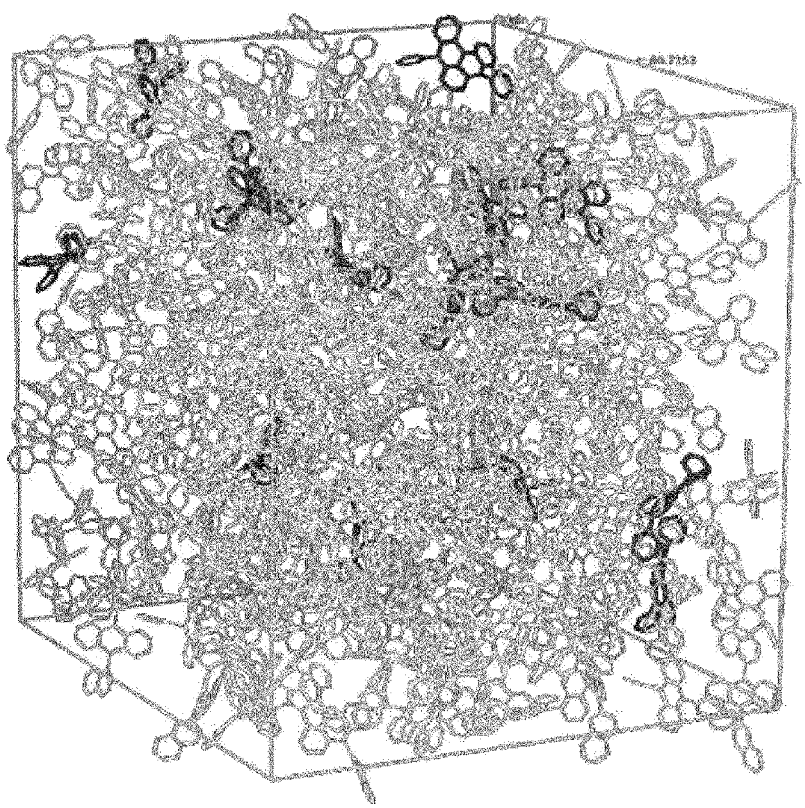
FIG. 4 illustrates a system including a comparative compound BD-X.
Figure 5:
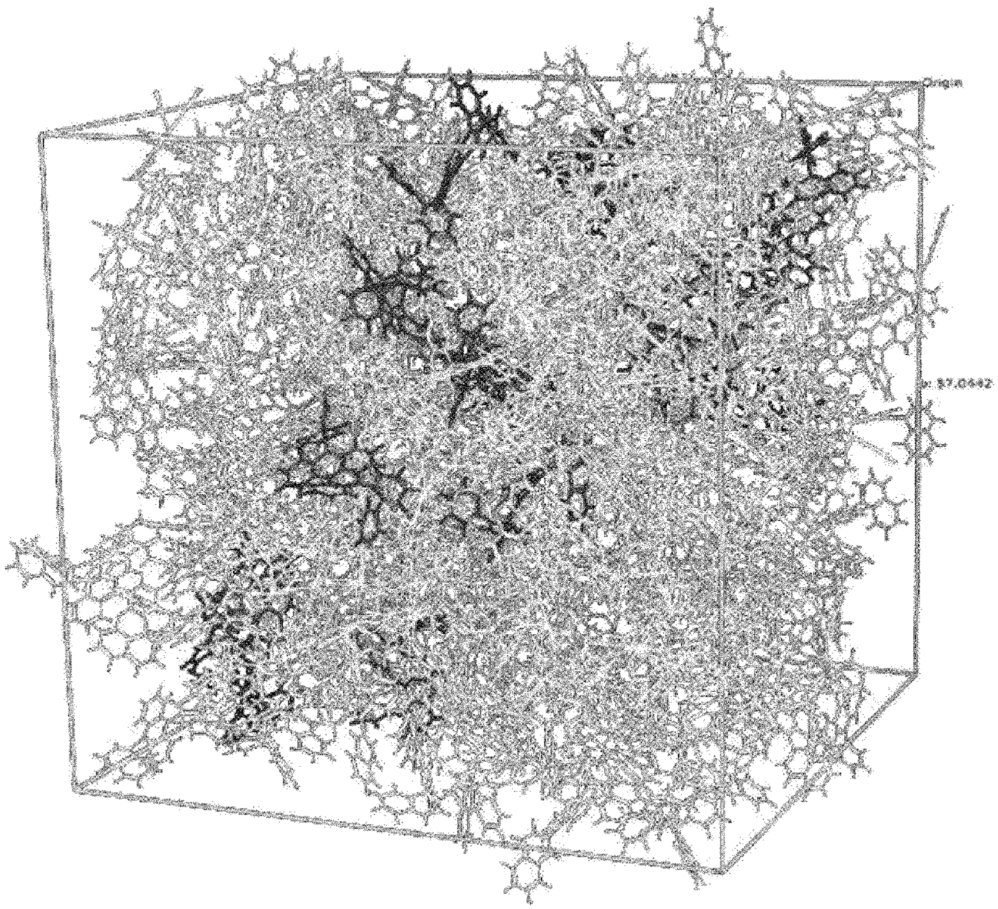
FIGS. 5 and 6 illustrate a system including a compound BD-A or BD-B according to an exemplary embodiment of the present specification.
Figure 6:
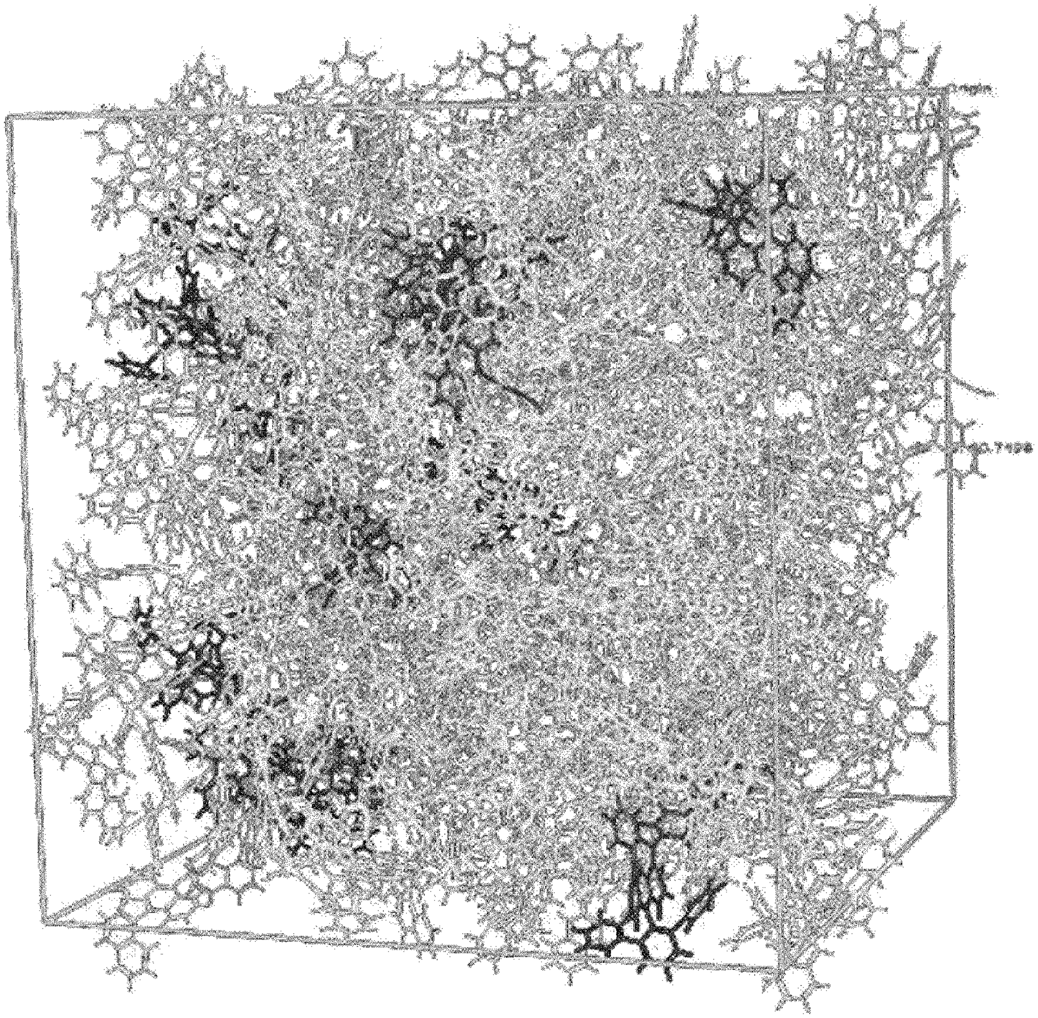

A system including Compound BD-X, BD-A or BD-B, and Host-1 at a ratio of 5% and 95% was implemented. Specifically, the environment of the doped device was computationally and chemically implemented through NVT and NPT calculations by setting the molecules, the temperature, and the simulation time to 300 (a ratio of 95% of Host-1 and 5% of BD-X or BD-A or BD-B), 300 K, and 30 ns, respectively, using an OPLS3e force field. The implemented molecular models are illustrated in FIGS. 4 to 6. FIGS. 4, 5, and 6 illustrate a system of BD-X and Host-1, a system of BD-A and Host-1, and a system of BD-B and Host-1, respectively.

In this case, the total volume and density of the molecules and the average distance between different molecules were obtained by calculation. The results are shown in the following Table 2.

TABLE 2

| | System of BD-X and Host-1 | System of BD-A and Host-1 | System of BD-B and Host-1 |
|---|---|---|---|
| Total volume | $193.60 * 10^{-27}$ $cm^3$ | $198.76 * 10^{-27}$ $cm^3$ | $198.63 * 10^{-27}$ $cm^3$ |
| Total density | 1.107 $g/cm^3$ | 1.097 $g/cm^3$ | 1.098 $g/cm^3$ |
| Distance between molecules | 7.1 Å | 15.15 Å | 14.95 Å |

BD-A and BD-B are compounds corresponding to Formula 1 of the present invention, and have a structure in which a substituent is bonded to the ortho position centered on a carbon atom that is linked to N of the core structure.

When Table 2 and FIGS. 4 to 6 are observed, it can be confirmed that in BD-A (FIG. 5) and BD-B (FIG. 6) compounds in which a bulky substituent is introduced, the distance from the host is further increased than that in BD-X (FIG. 4). Therefore, the Dexter energy transfer with the triplet energy of a host of a device into which a relatively bulky substituent is introduced occurs less frequently, so that the efficiency of the device is increased.

The invention claimed is:

1. A compound of Formulae 2-1-1 to 2-1-3:

Formula 2-1-1

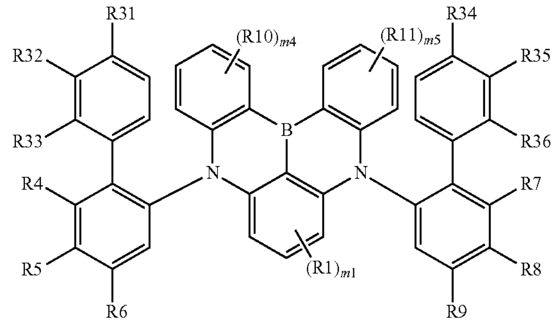

Formula 2-1-2

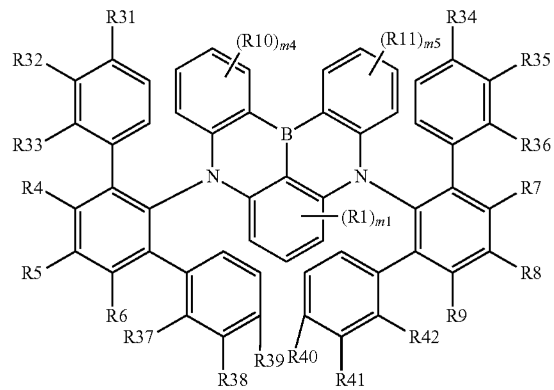

-continued

Formula 2-1-3

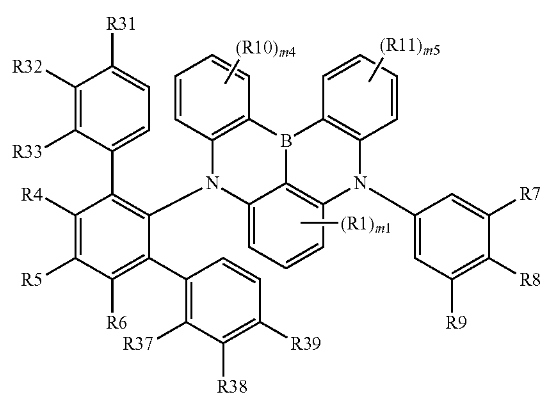

wherein in Formulae 2-1-1 to 2-1-3:

R1 is hydrogen, deuterium, a substituted or unsubstituted methyl group, a substituted or unsubstituted butyl group, a substituted or unsubstituted phenyl group, a substituted or unsubstituted diphenylamine group, a substituted or unsubstituted dicyclohexylamine group, a substituted or unsubstituted carbazole group, or a substituted or unsubstituted dihydroacridine;

R4 to R9 are the same as or different from each other, and are each independently hydrogen, deuterium, a halogen group, a substituted or unsubstituted silyl group, a substituted or unsubstituted C1 to C10 alkyl group, a substituted or unsubstituted aryl group selected from among a phenyl group, a biphenyl group, a terphenyl group, and a quaterphenyl group, a substituted or unsubstituted diphenylamine group, or a substituted or unsubstituted heterocyclic group selected from among a dibenzofuran group, a dibenzothiophene group, a carbazole group, and a benzocarbazole group;

m1 is an integer from 0 to 3, and when m1 is 2 or more, two or more substituents in the parenthesis are the same as or different from each other;

R10, R11, and R31 to R42 are the same as or different from each other, and are each independently hydrogen, deuterium, a halogen group, a cyano group, a nitro group, a substituted or unsubstituted silyl group, a substituted or unsubstituted alkyl group, a substituted or unsubstituted alkoxy group, substituted or unsubstituted aryl group, a substituted or unsubstituted amine group, or a substituted or unsubstituted heterocyclic group; and m4 and m5 are each an integer from 0 to 4, and when m4 and m5 are each 2 or more, two or more substituents in the parenthesis are the same as or different from each other.

2. A compound that is any one of the following Formulae 1-1-1 to 1-1-4:

Formula 1-1-1

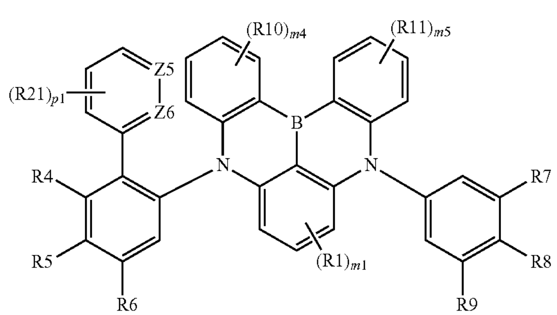

Formula 1-1-2

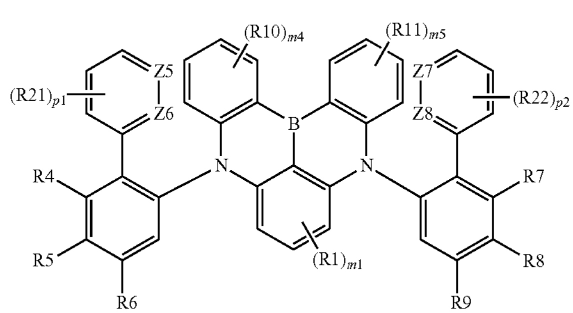

-continued

Formula 1-1-3

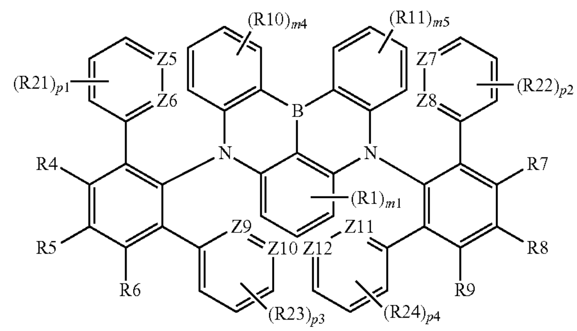

Formula 1-1-4

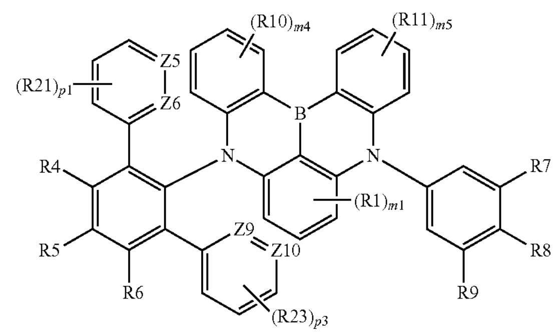

wherein in Formulae 1-1-1 to 1-1-4:

R1 is hydrogen, deuterium, a substituted or unsubstituted methyl group, a substituted or unsubstituted butyl group, a substituted or unsubstituted phenyl group, a substituted or unsubstituted diphenylamine group, a substituted or unsubstituted dicyclohexylamine group, a substituted or unsubstituted carbazole group, or a substituted or unsubstituted dihydroacridine;

R4 to R9 are the same as or different from each other, and are each independently hydrogen, deuterium, a halogen group, a substituted or unsubstituted silyl group, a substituted or unsubstituted C1 to C10 alkyl group, a substituted or unsubstituted aryl group selected from among a phenyl group, a biphenyl group, a terphenyl group, and a quaterphenyl group, a substituted or unsubstituted diphenylamine group, or a substituted or unsubstituted heterocyclic group selected from among a dibenzofuran group, a dibenzothiophene group, a carbazole group, and a benzocarbazole group;

m1 is an integer from 0 to 3, and when m1 is 2 or more, two or more substituents in the parenthesis are the same as or different from each other;

one of Z5 and Z6 is N, and the other is N or CH;

Z7 to Z12 are the same as or different from each other, and are each independently CH or N;

R10 and R11 are the same as or different from each other, and are each independently hydrogen; a methyl group which is unsubstituted or substituted with deuterium or fluorine; a propyl group; a butyl group; a trimethylsilyl group; a phenyl group which is unsubstituted or substituted with deuterium; a diphenylamine group; or a carbazole group;

R21 to R24 are the same as or different from each other, and are each independently hydrogen, deuterium, fluorine, a trifluoromethyl group, a (trideutero)methyl group, a methyl group, a tert-butyl group, a phenyl group, or a trimethylsilyl group;

p1 is an integer from 0 to 4, p2 to p4 are each an integer from 0 to 5, and when p1 to p4 are each 2 or more, two or more substituents in the parenthesis are the same as or different from each other; and m4 and m5 are each an integer from 0 to 4, and when m4 and m5 are each 2 or more, two or more substituents in the parenthesis are the same as or different from each other.

3. The compound of claim 1 that is any one of the following compounds:

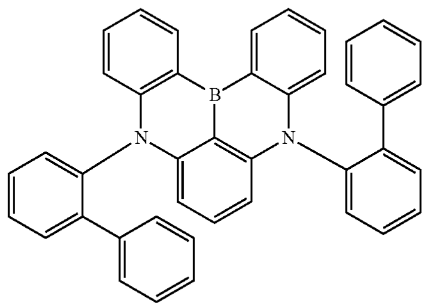

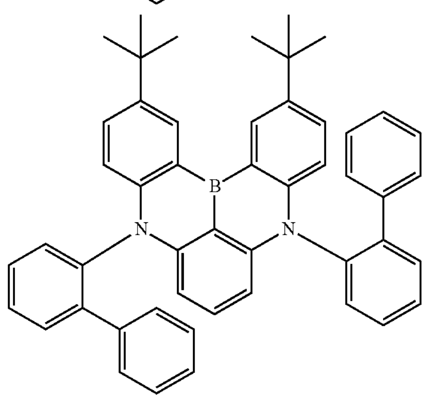

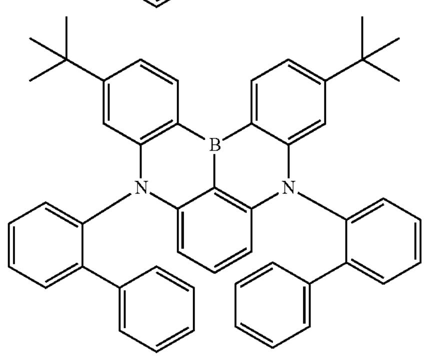

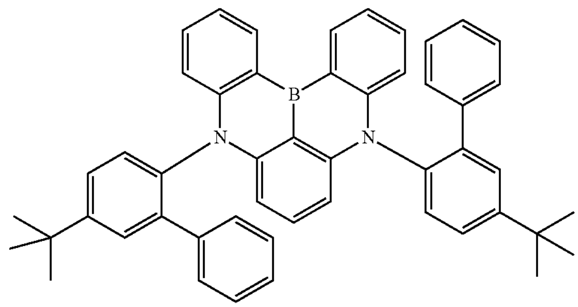

-continued

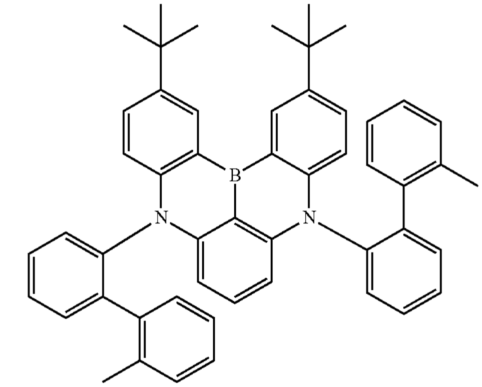

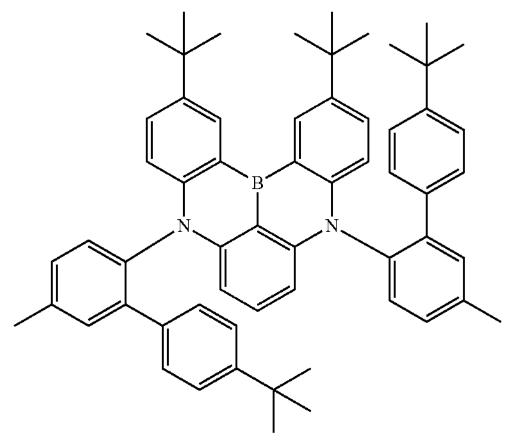

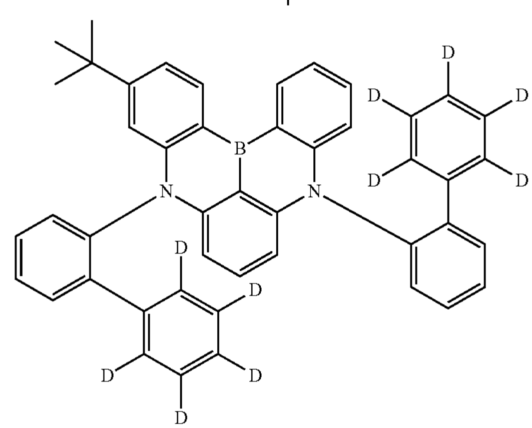

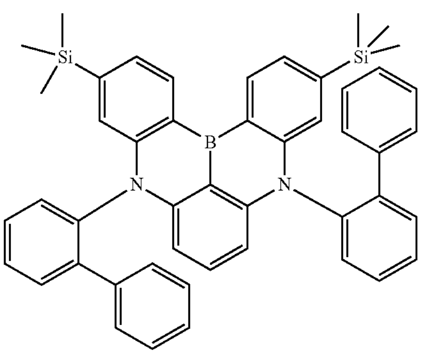

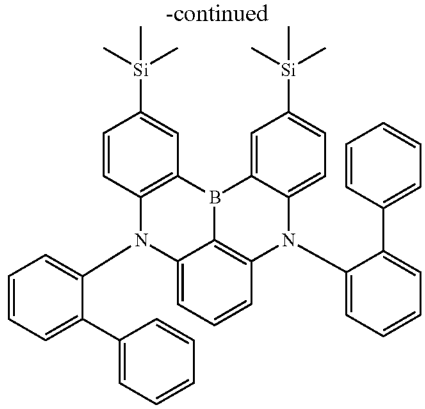
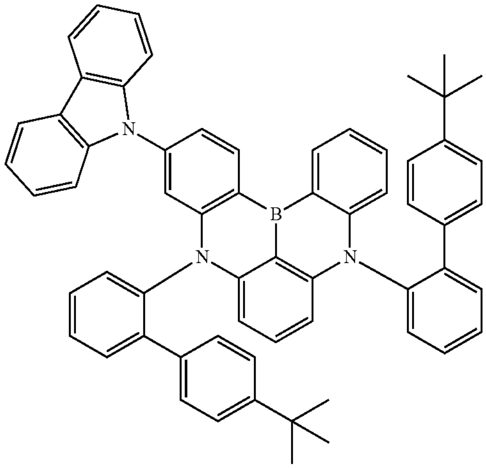
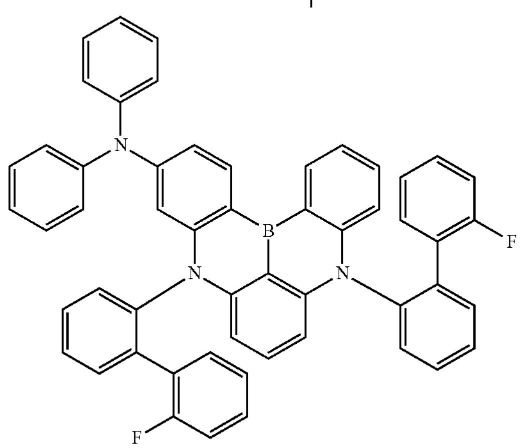
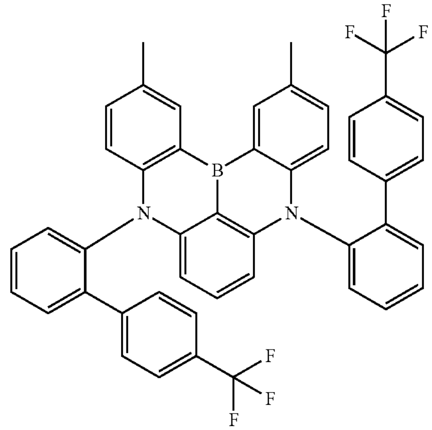
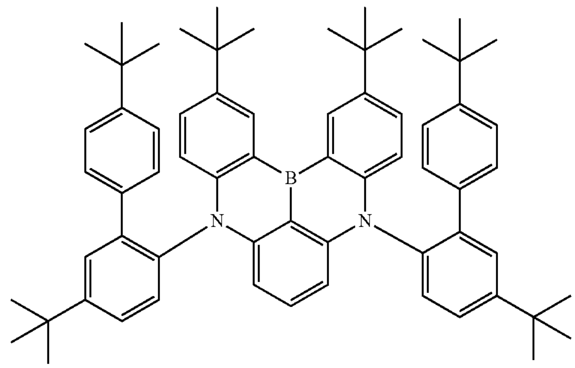
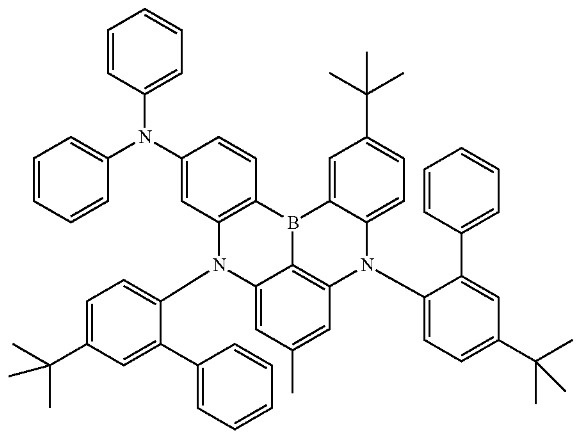
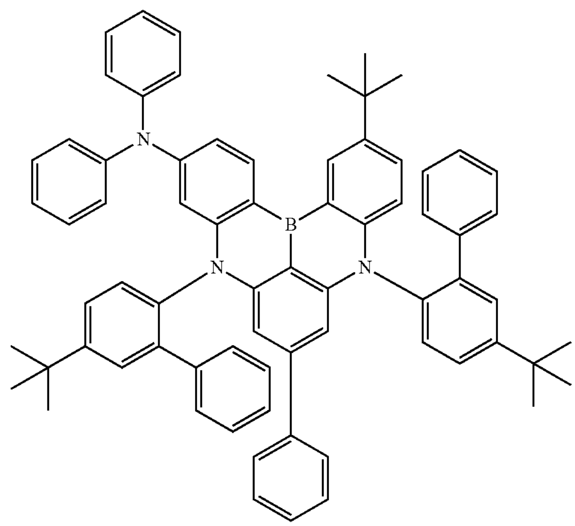
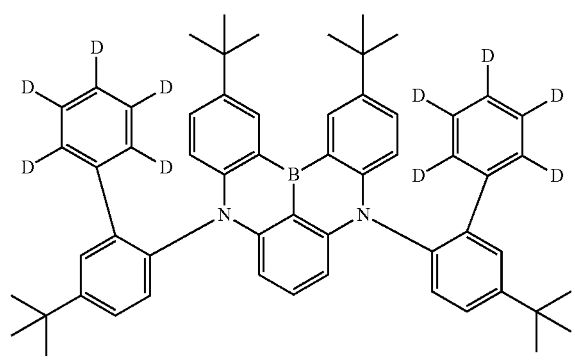

-continued
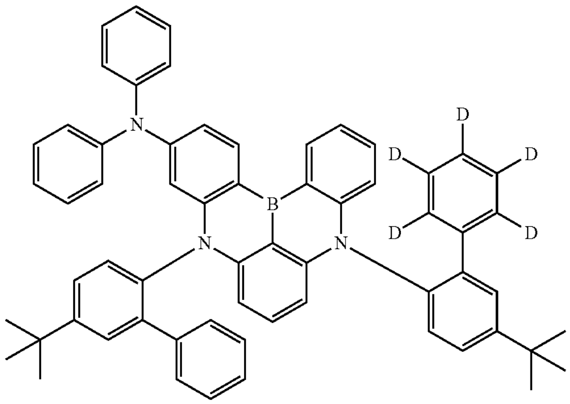
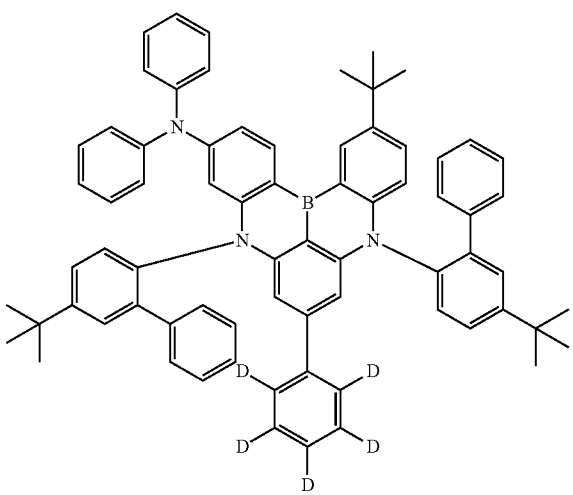
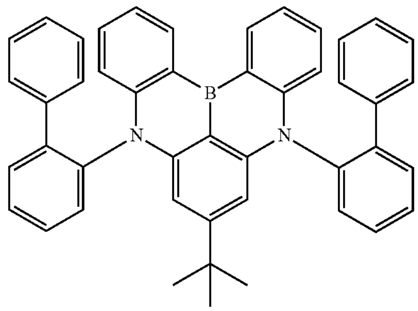
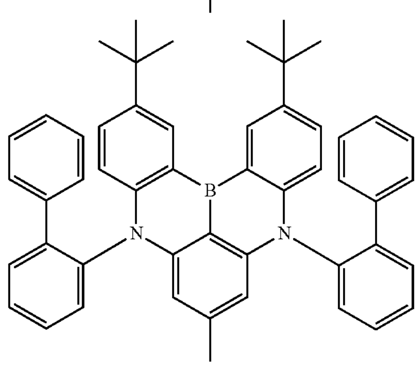
-continued
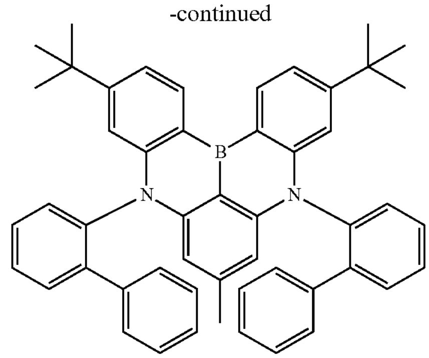
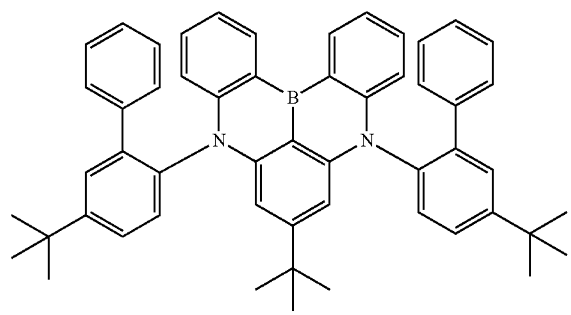
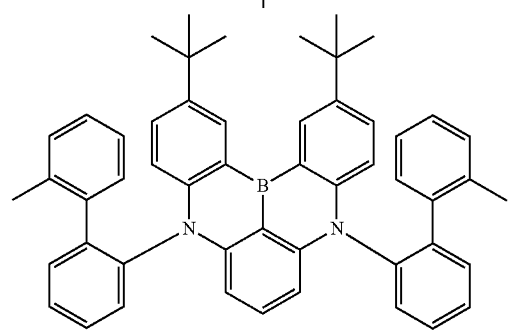
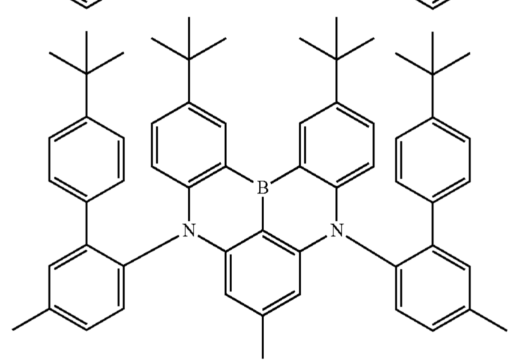
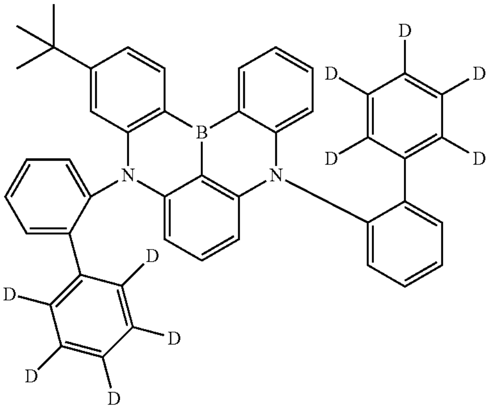

-continued
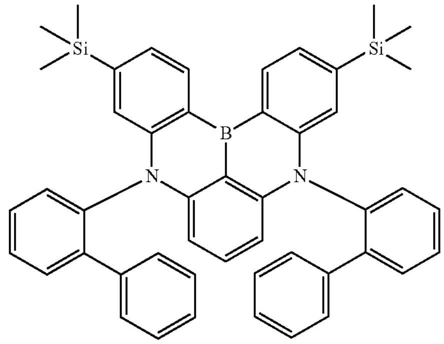
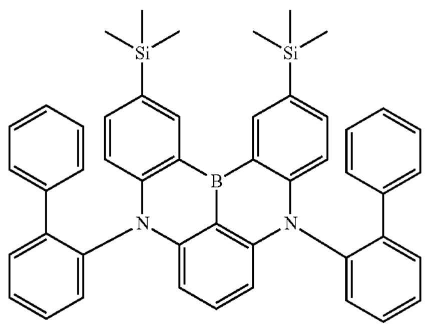
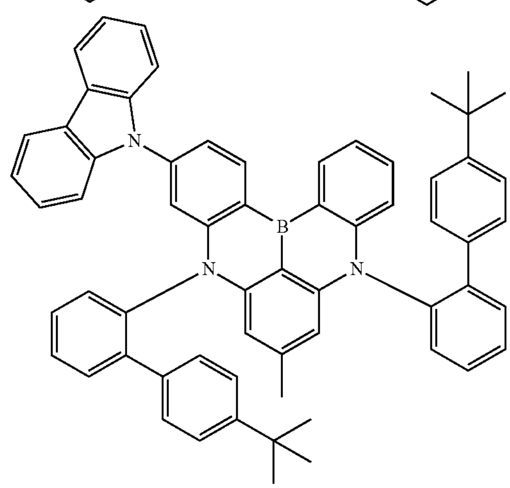
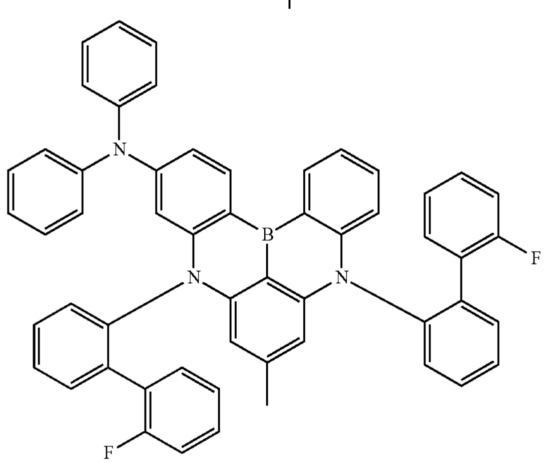
-continued
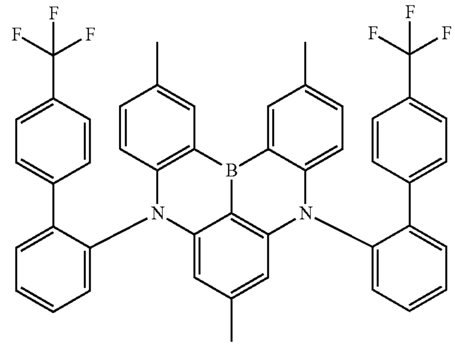
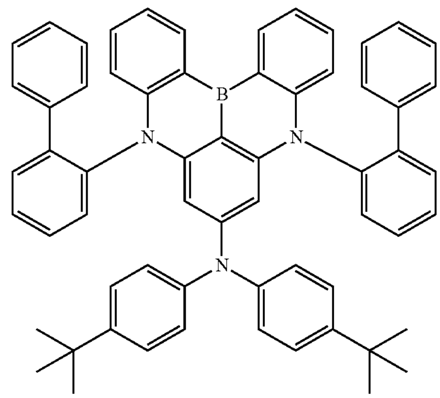
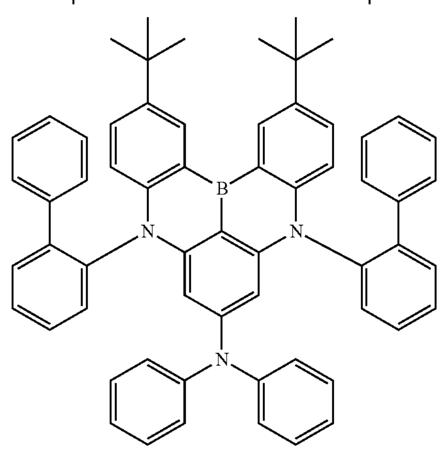
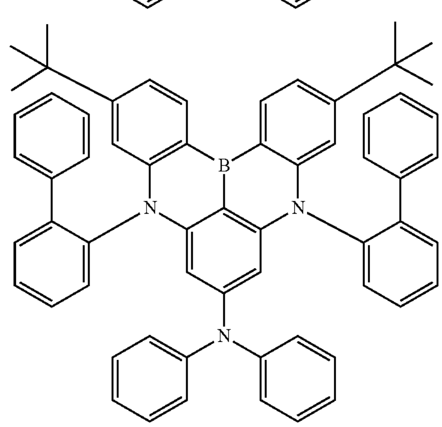

-continued
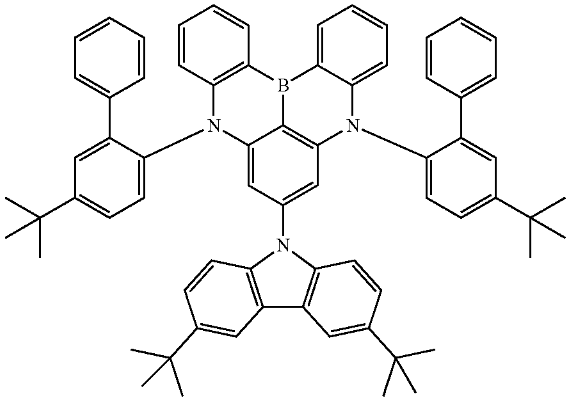
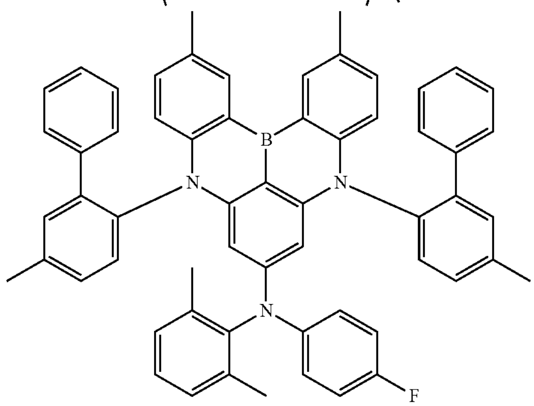
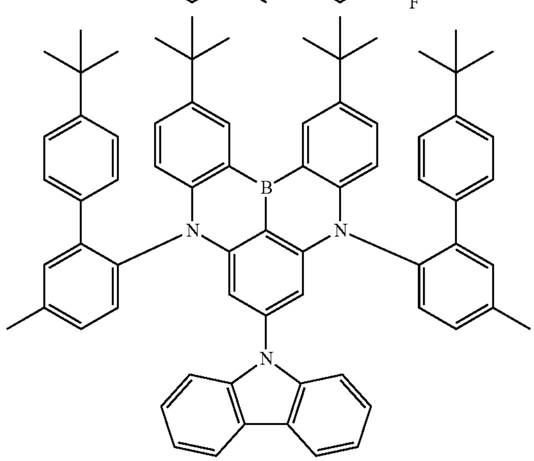
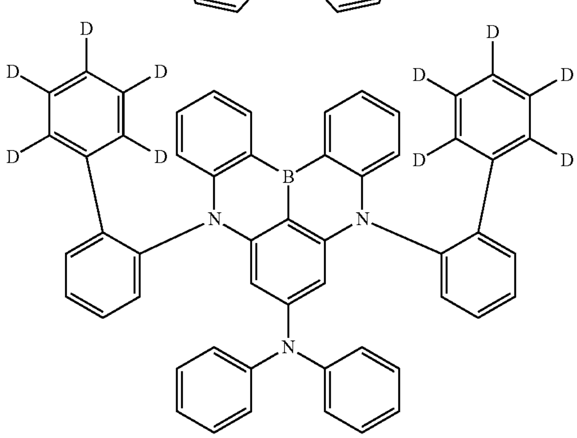
-continued
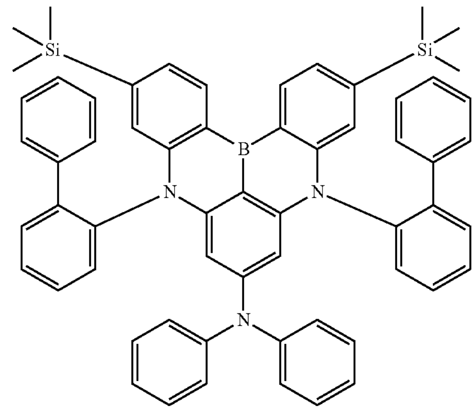
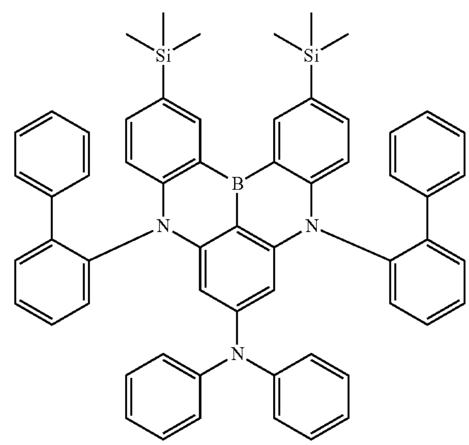
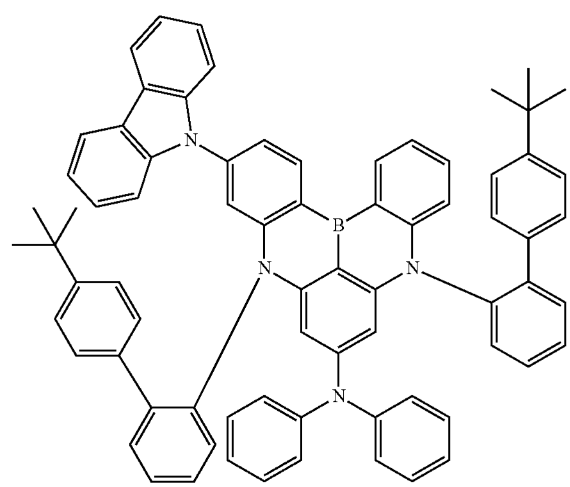

-continued
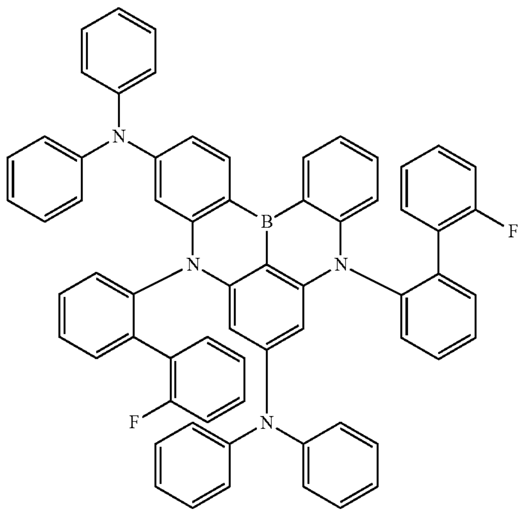
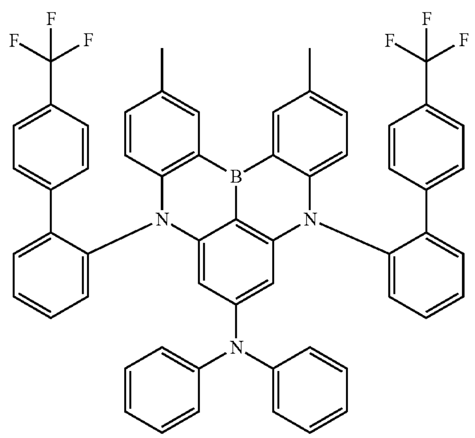
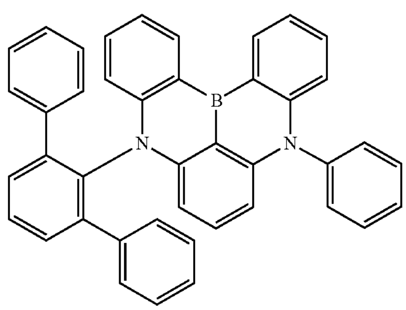
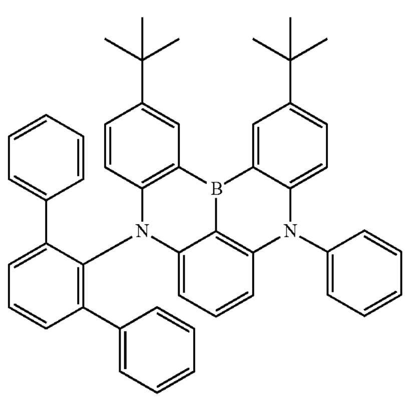
-continued
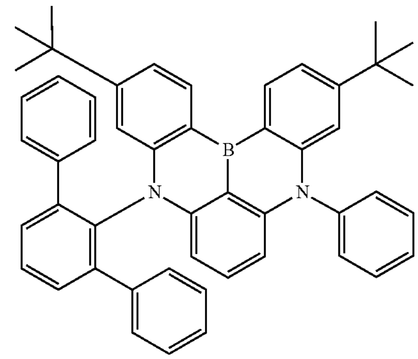
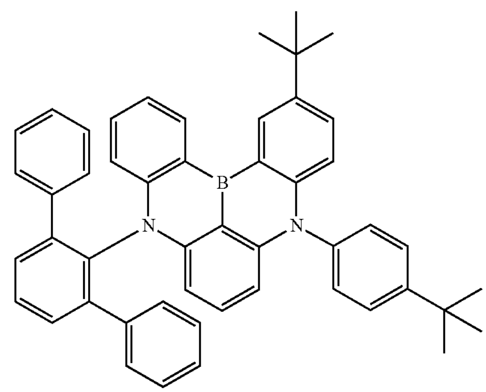
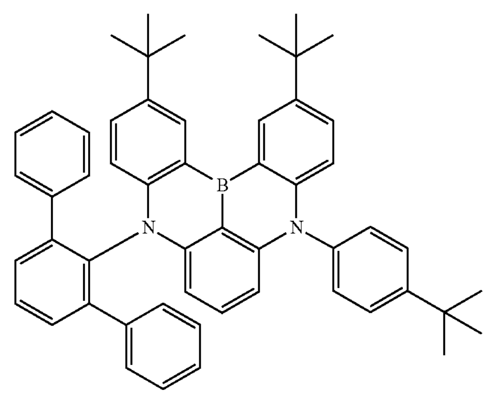
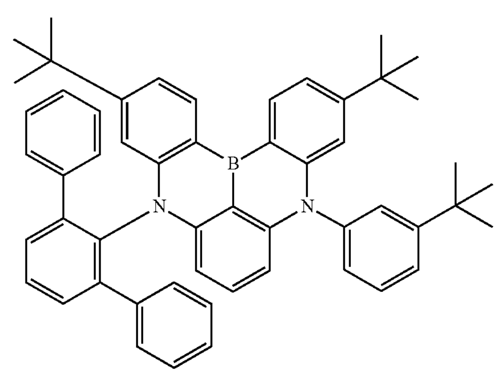

-continued
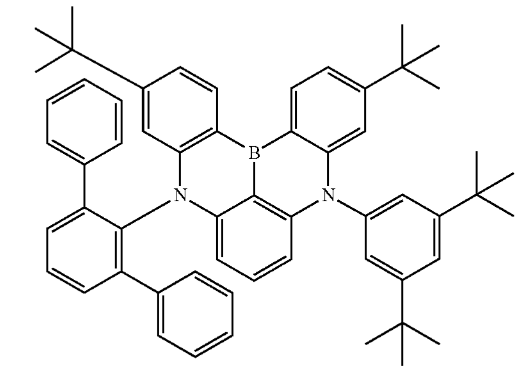
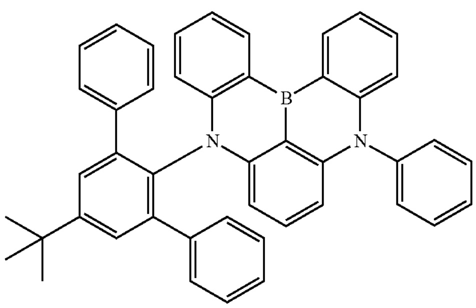
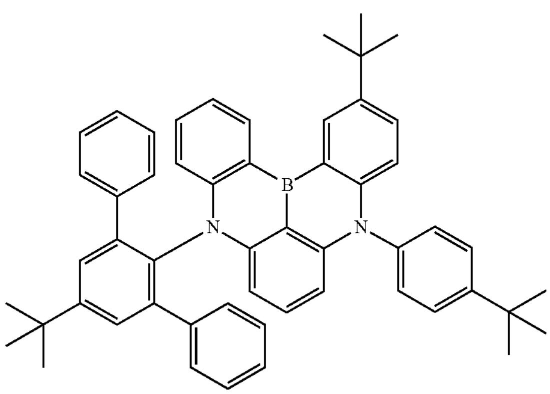
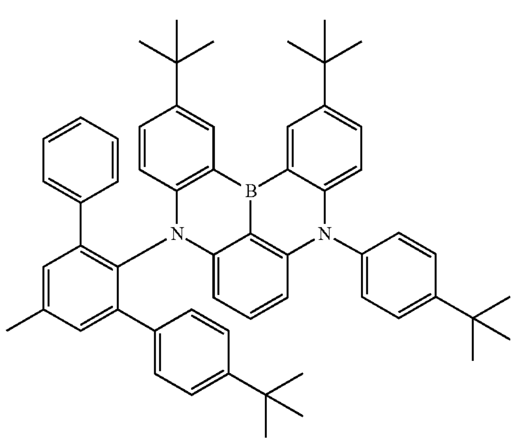
-continued
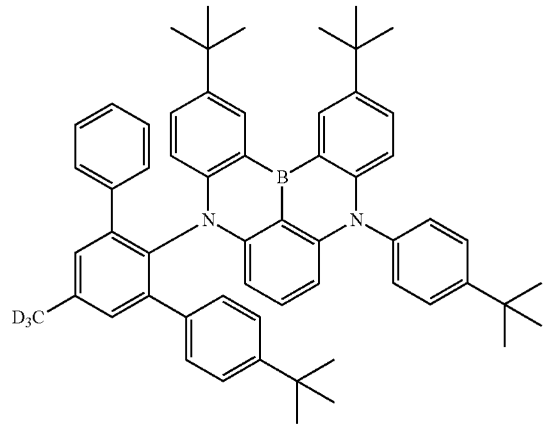
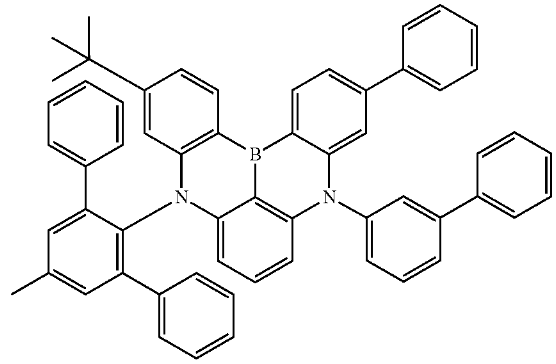
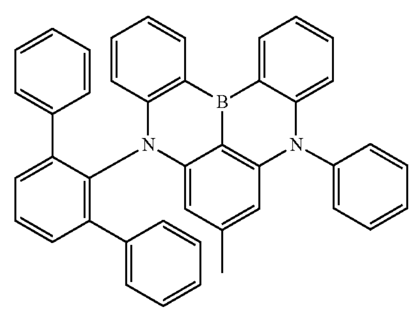
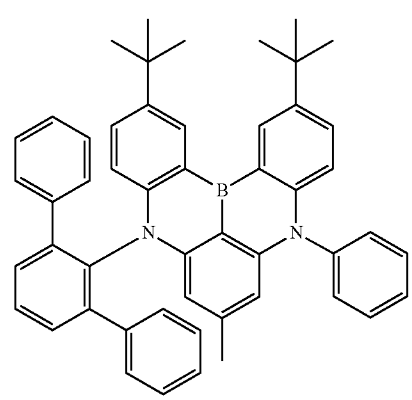

-continued
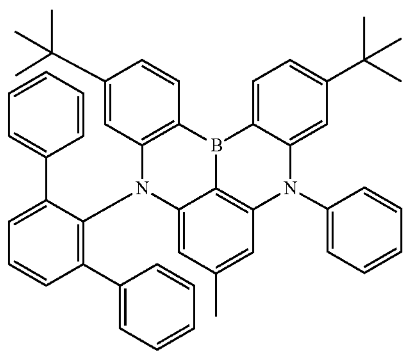
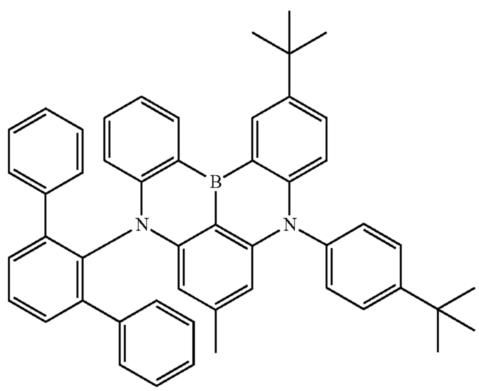
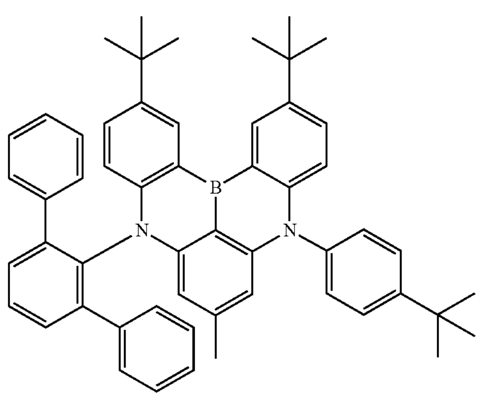
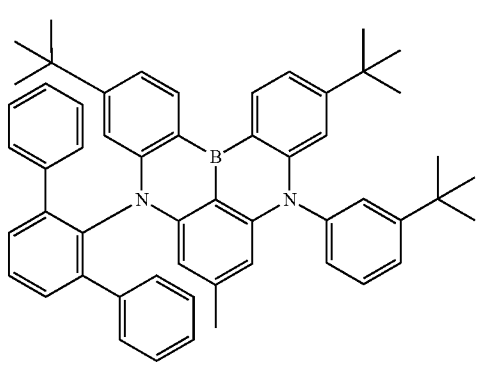
-continued
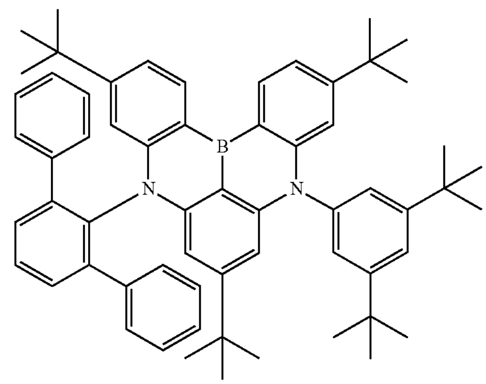
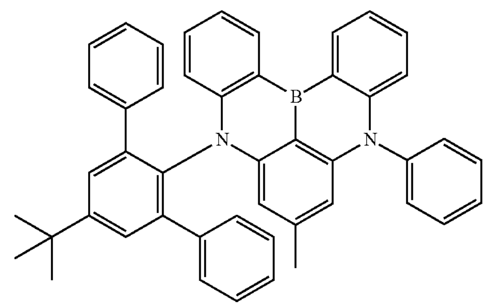
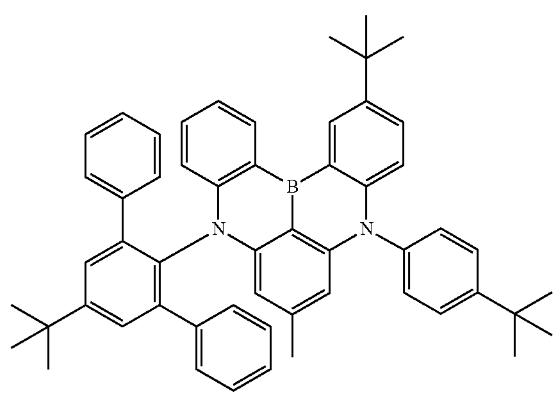
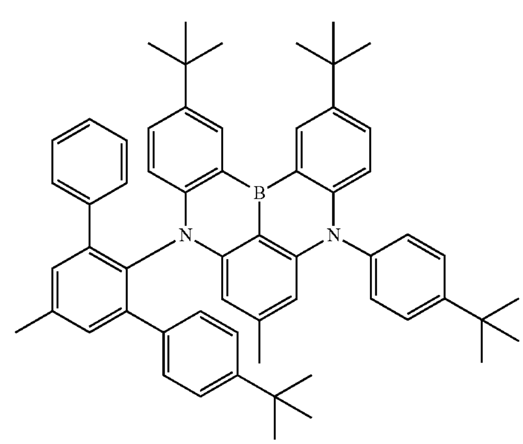

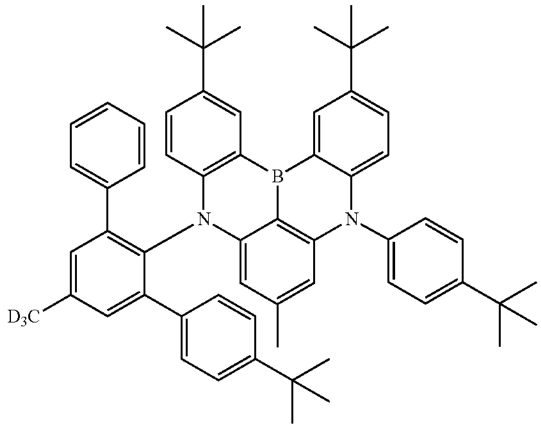
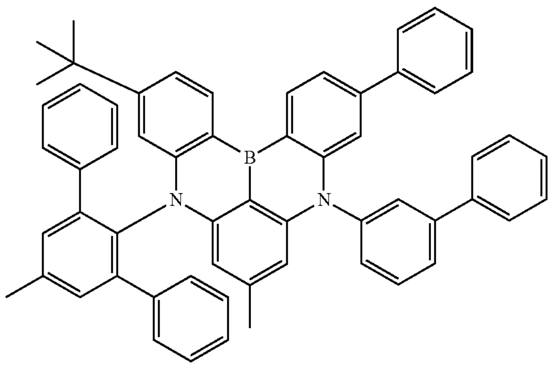
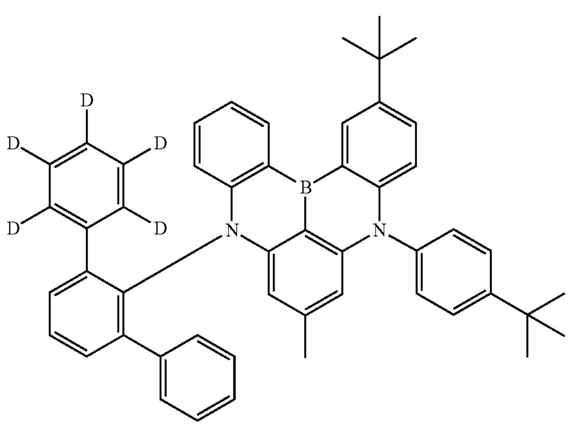
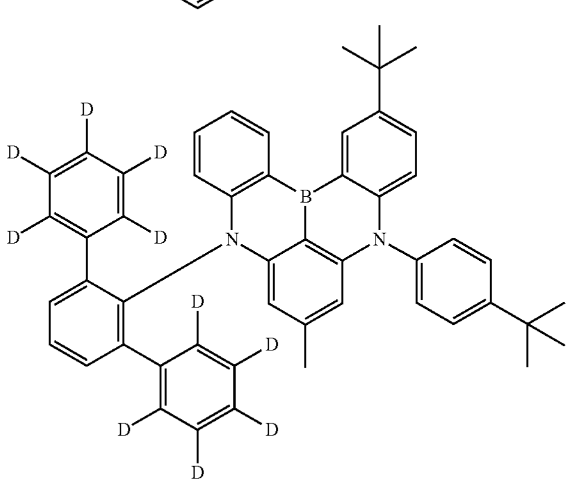
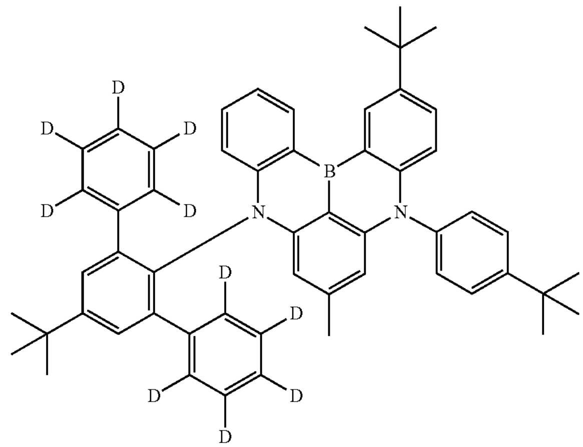
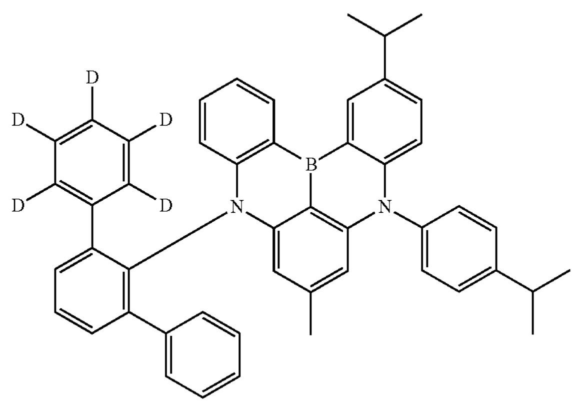
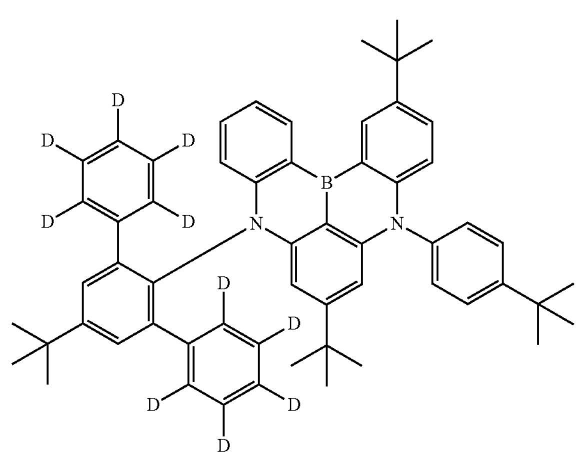

-continued
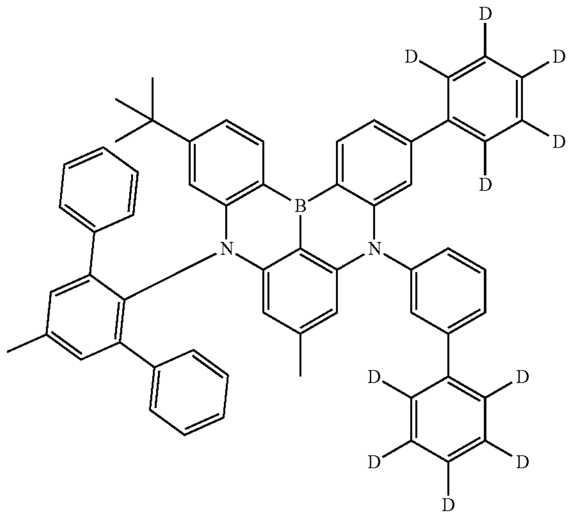
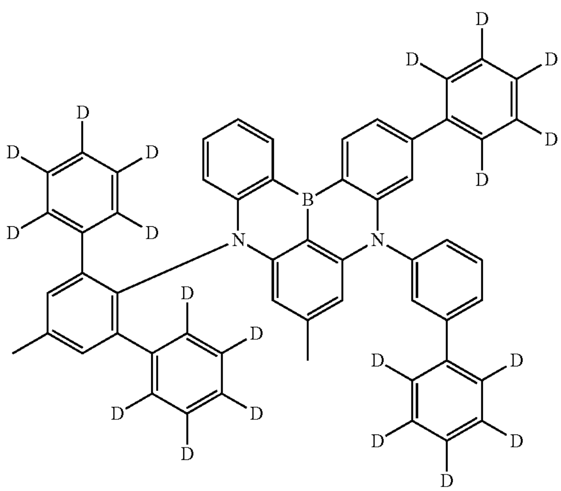
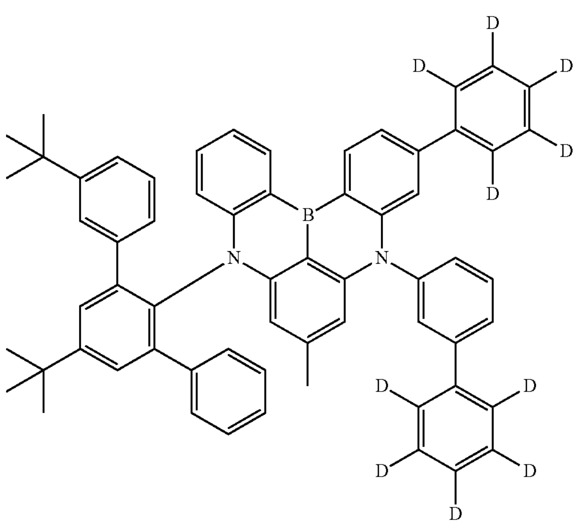
-continued
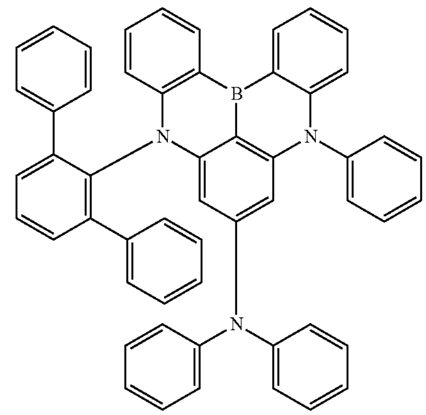
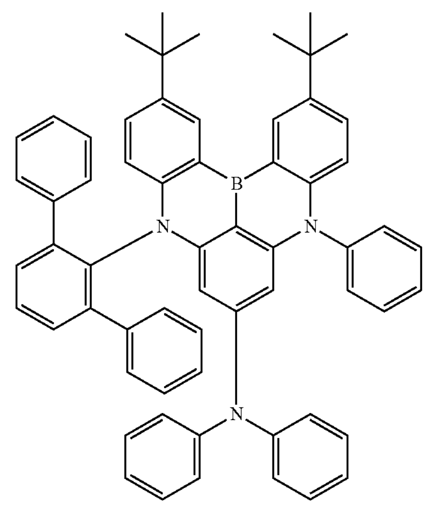
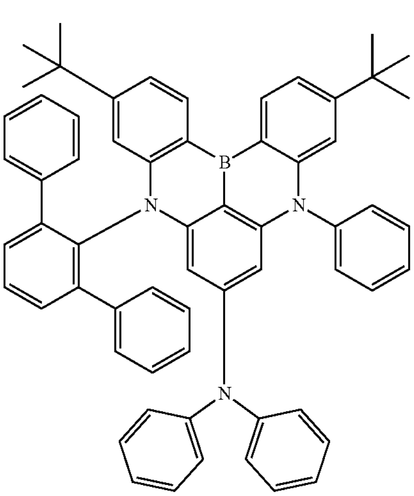

-continued
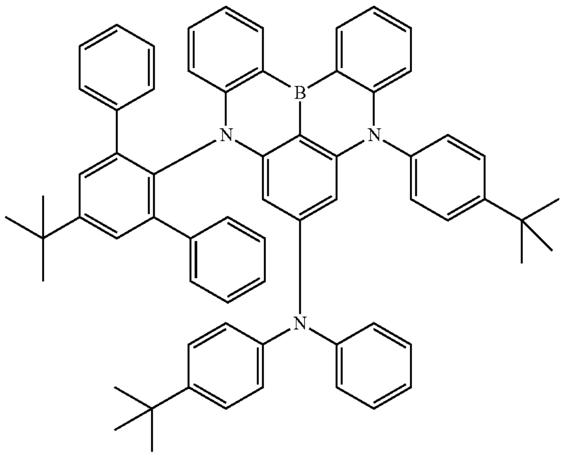
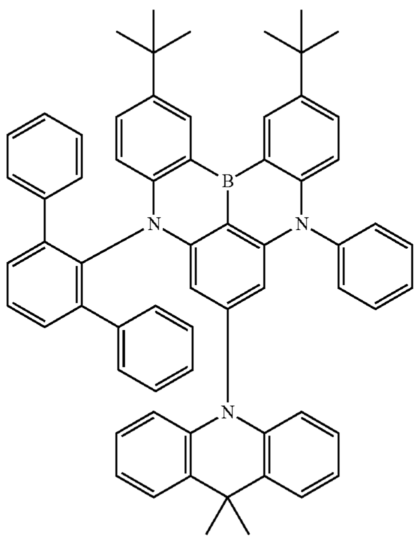
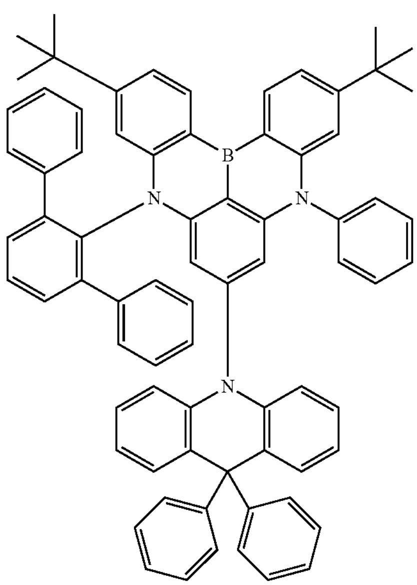
-continued
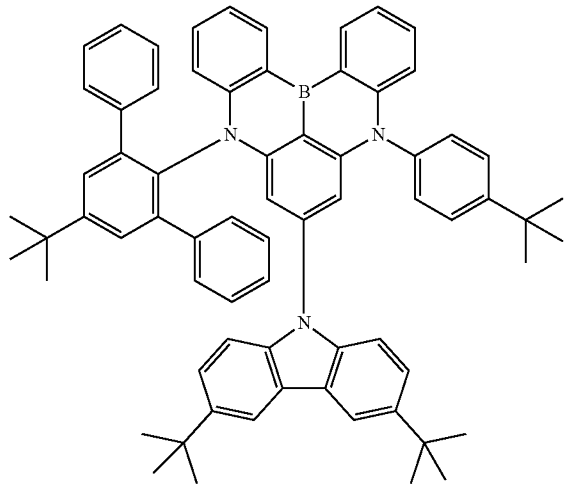
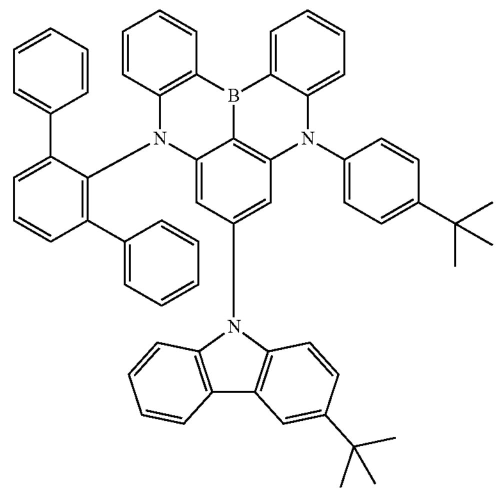
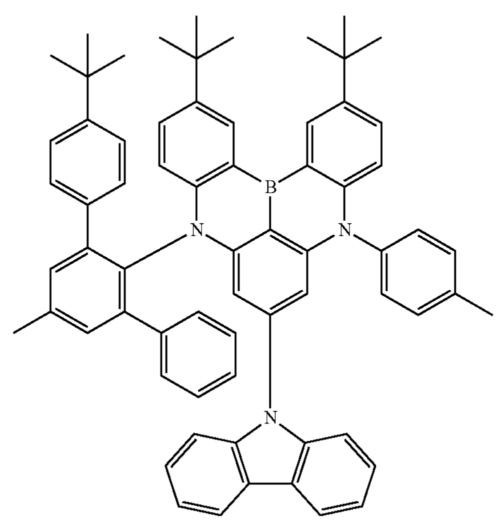

-continued
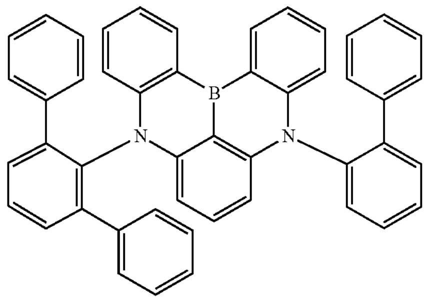
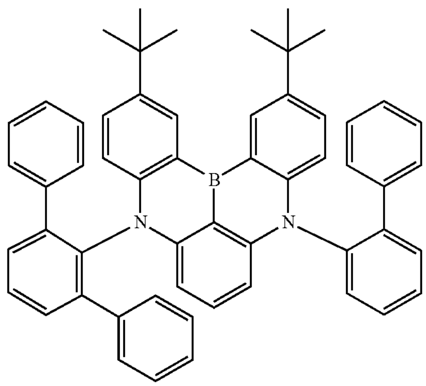
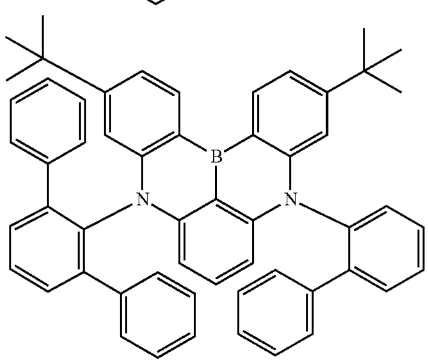
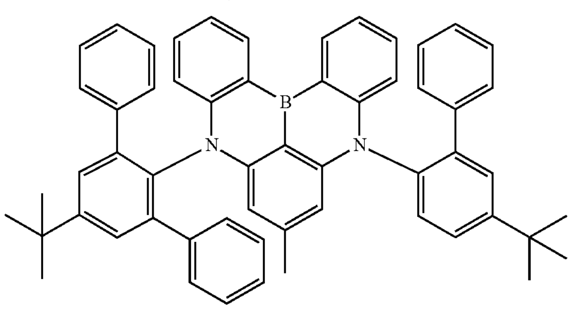
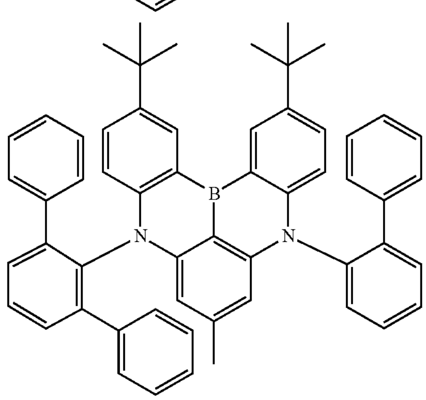
-continued
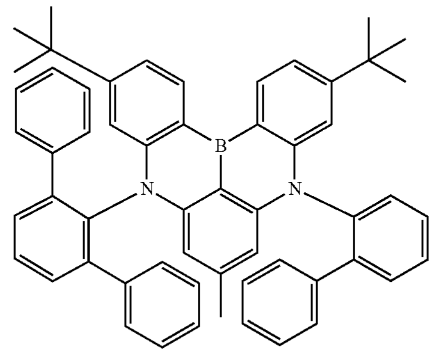
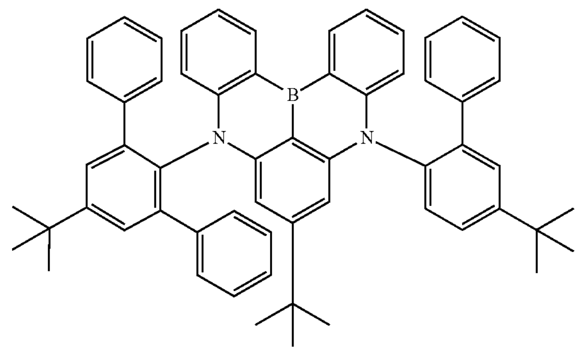
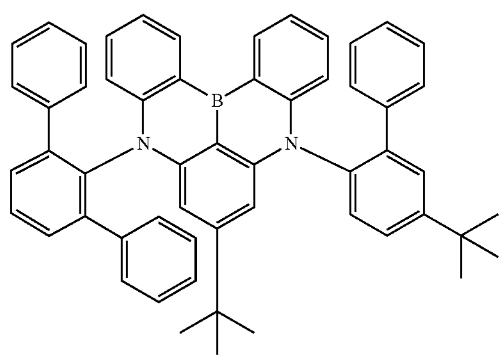
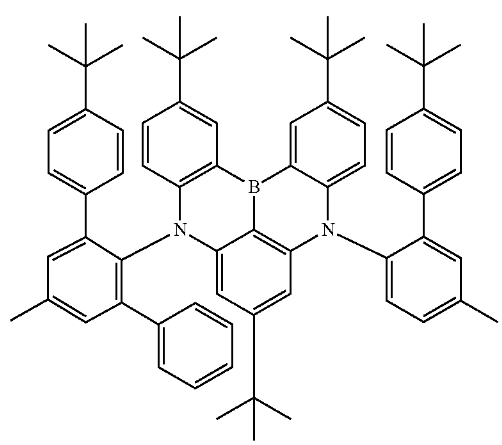

-continued
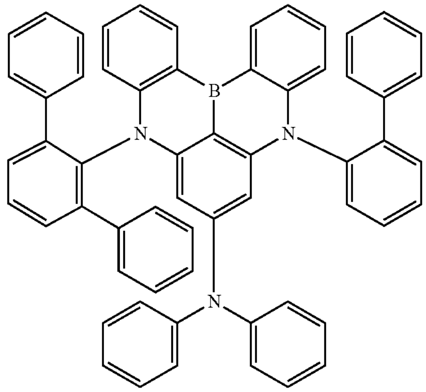
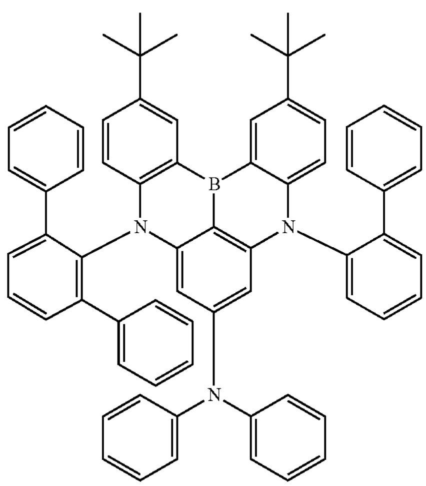
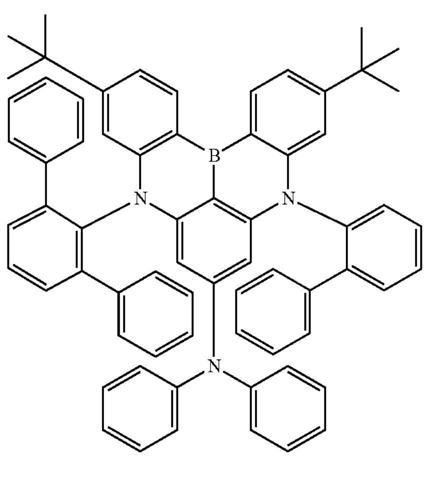
-continued
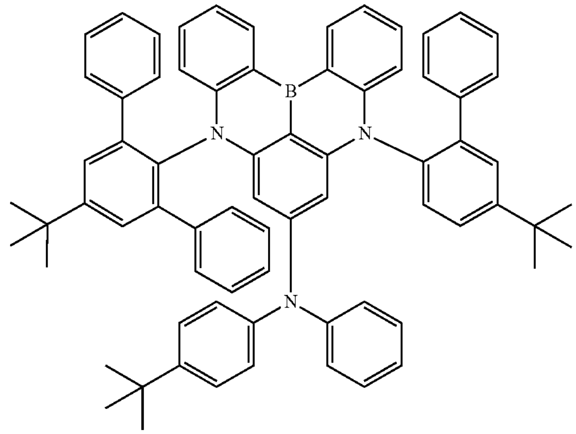
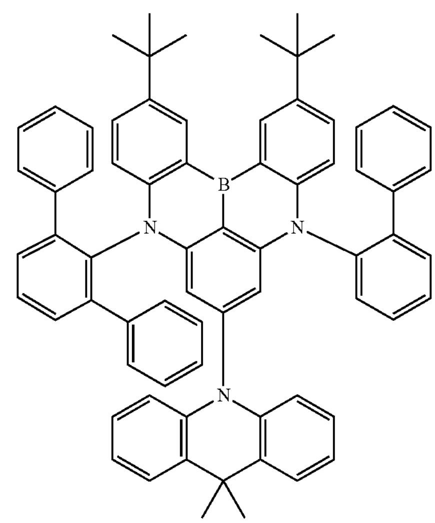
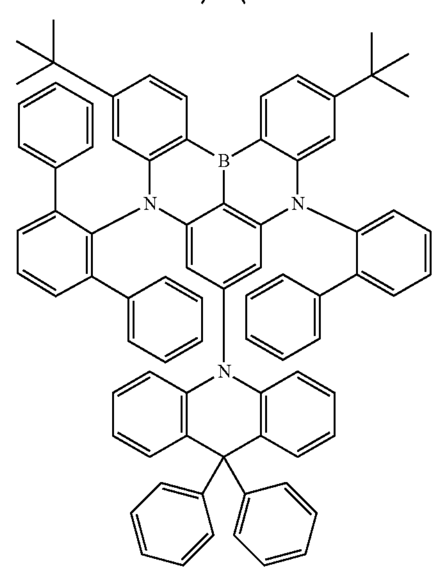

-continued
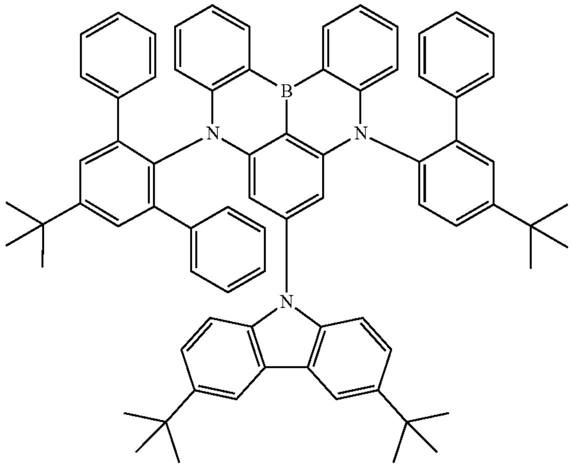
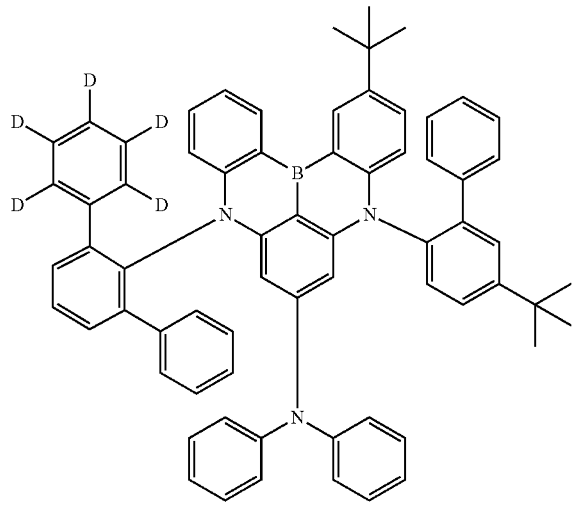
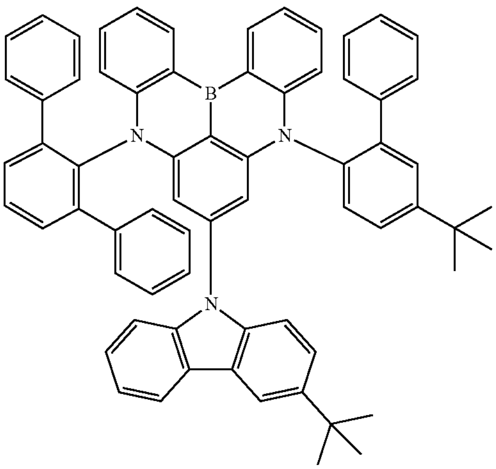
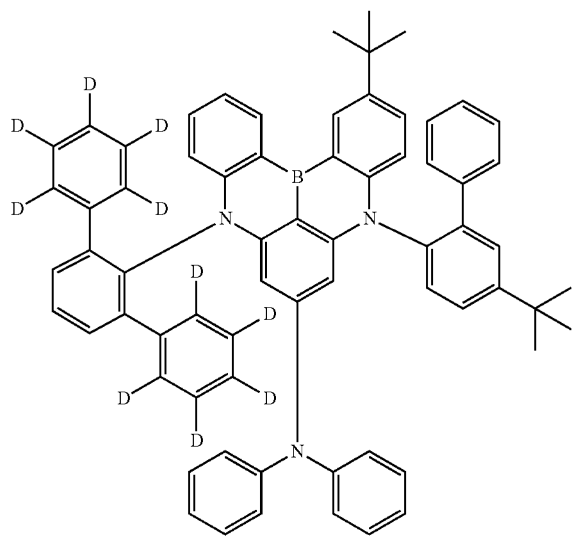
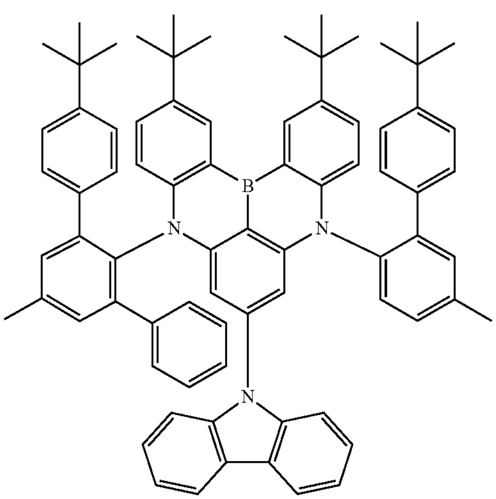
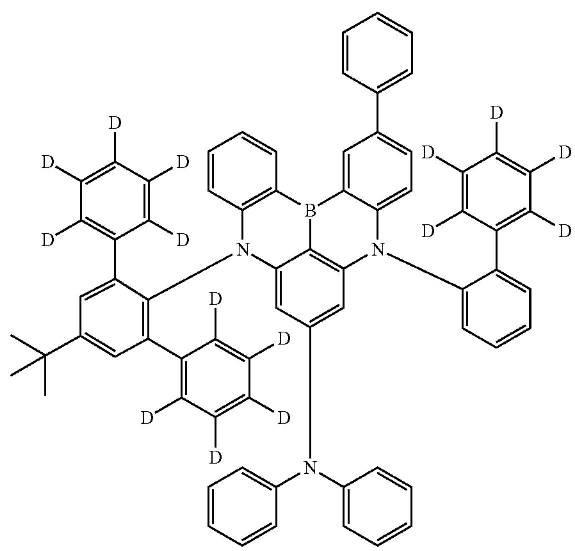

-continued
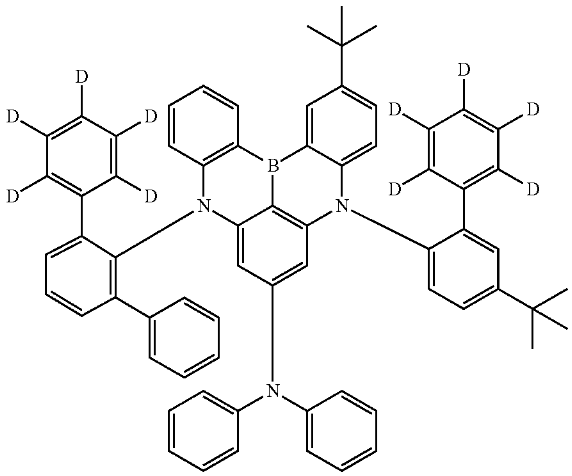
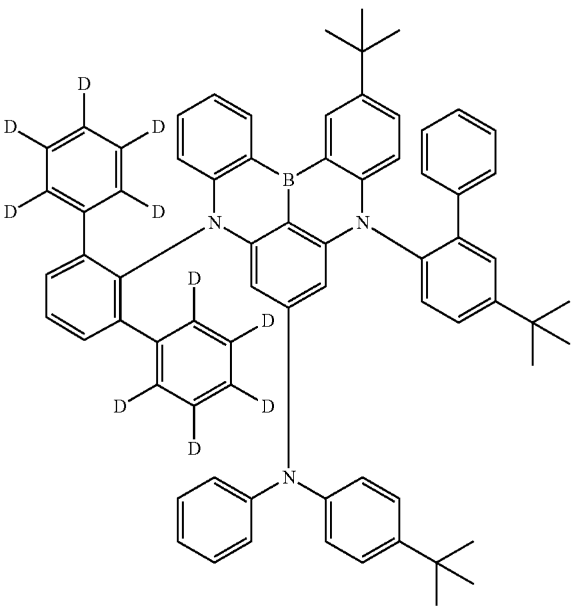
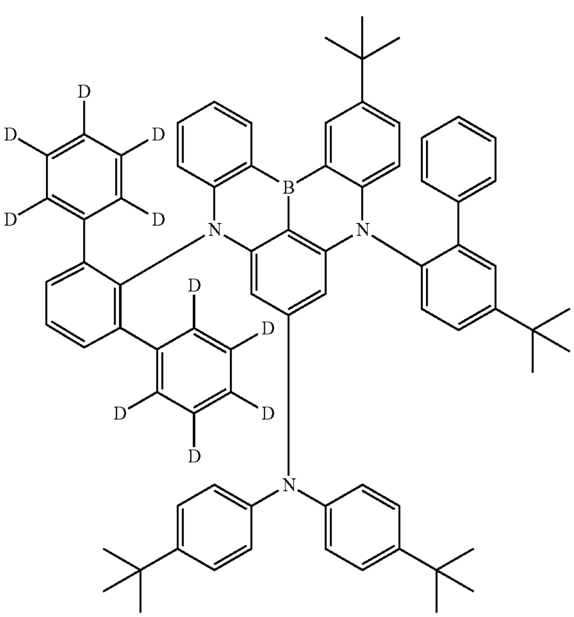
-continued
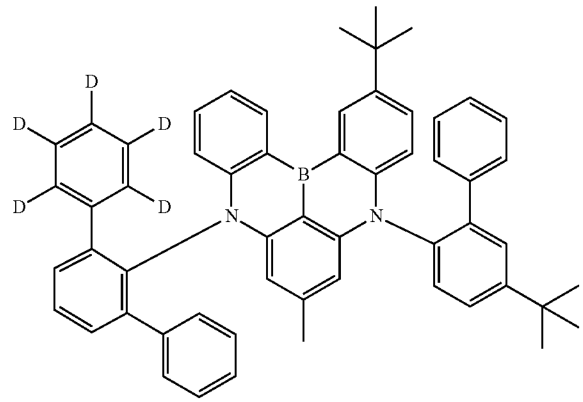
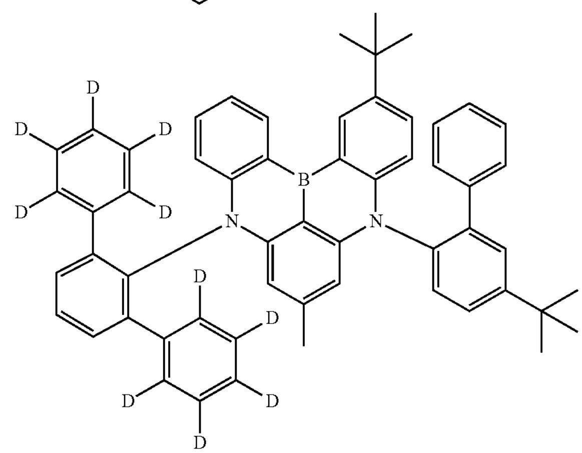
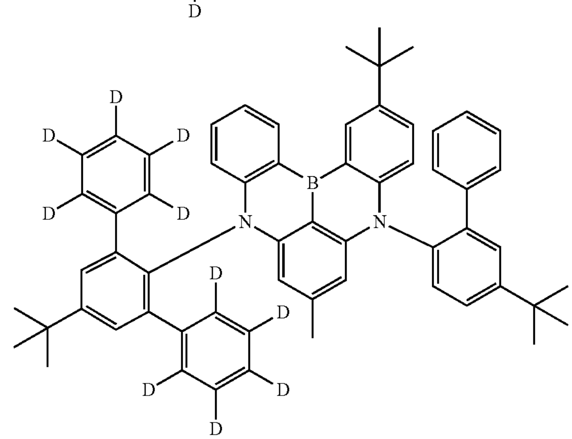

-continued
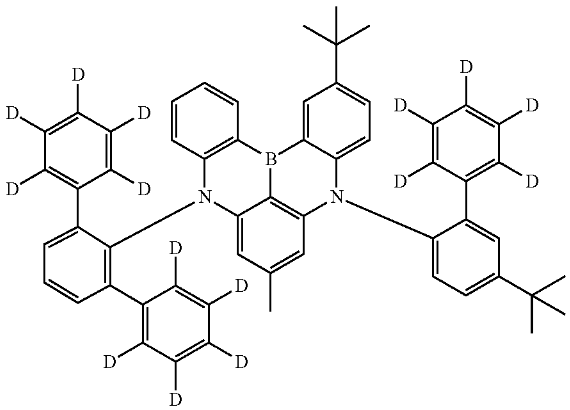
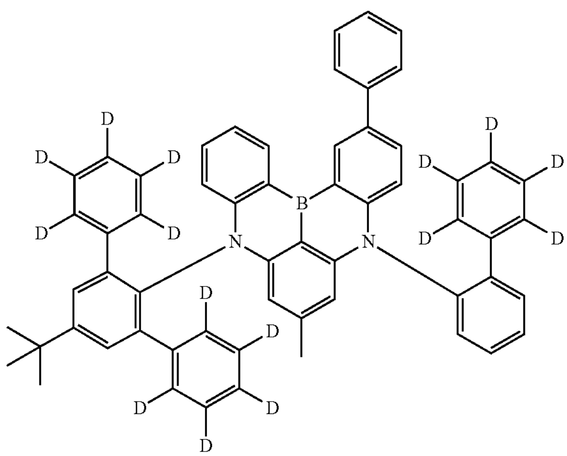
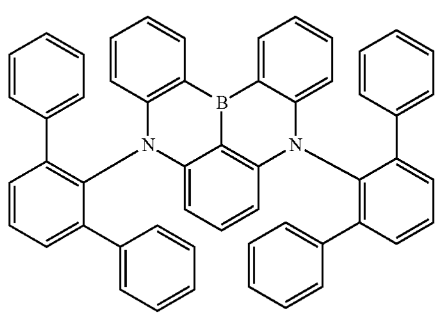
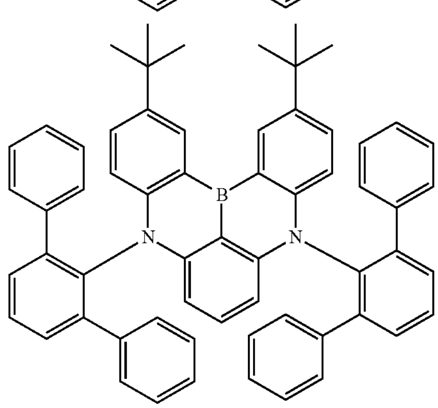
-continued
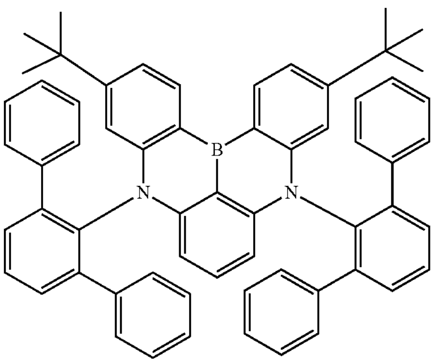
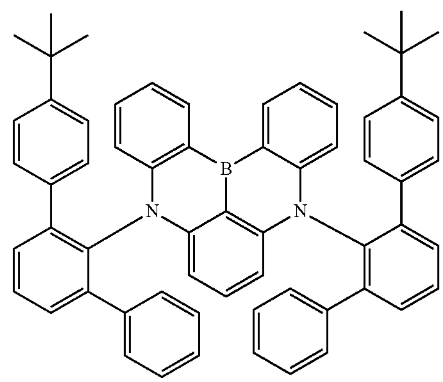
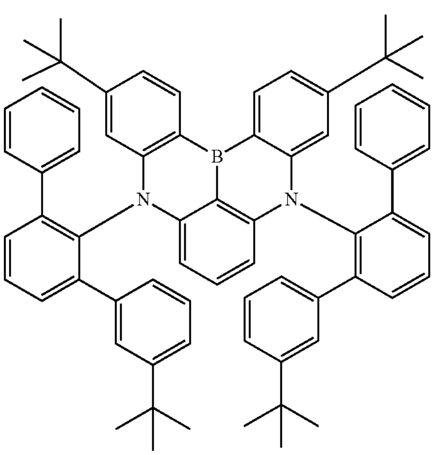
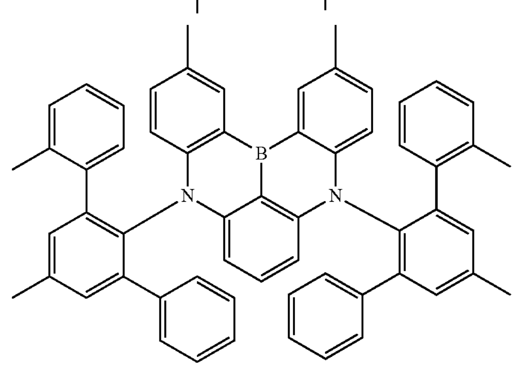

-continued
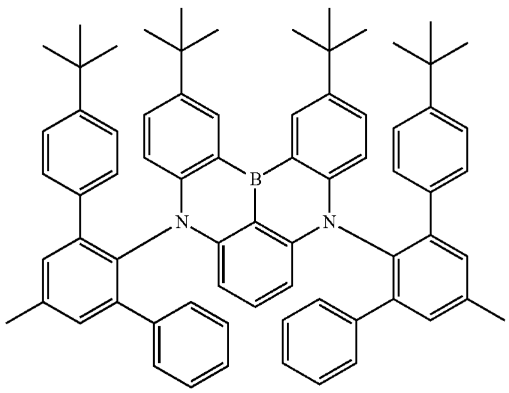
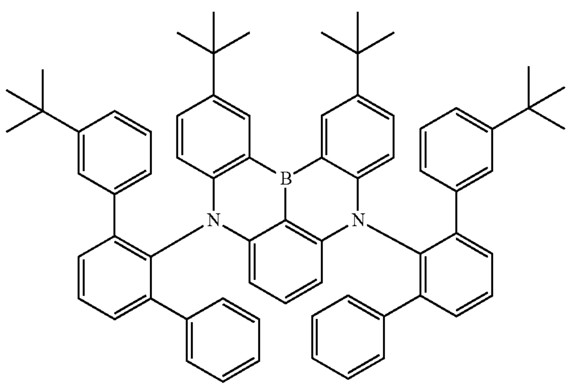
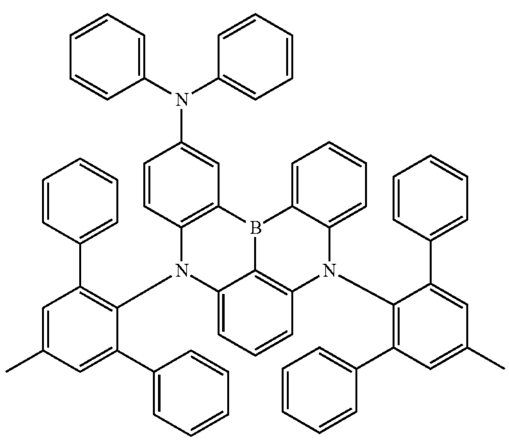
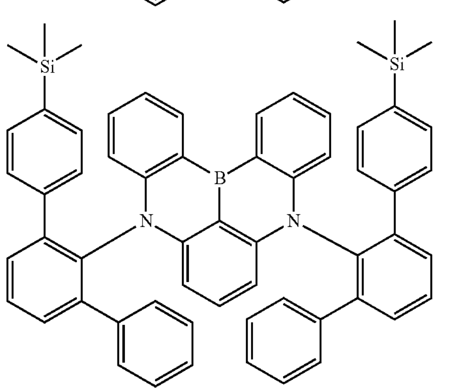
-continued
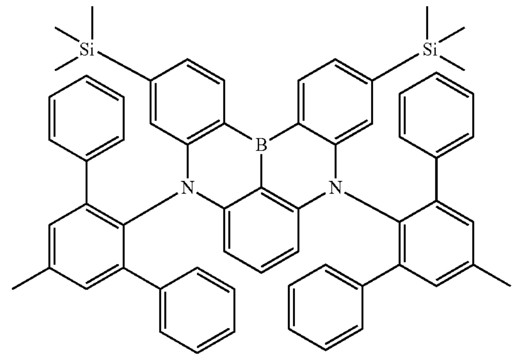
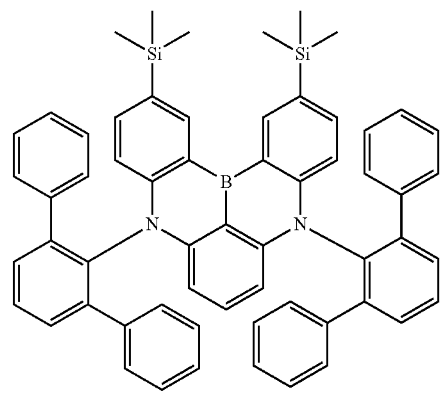
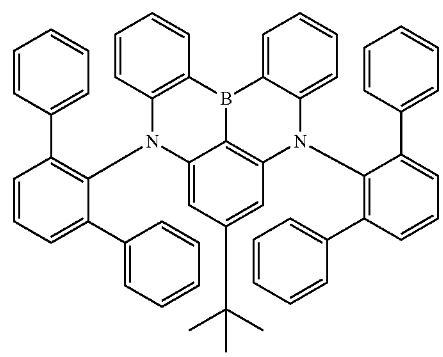
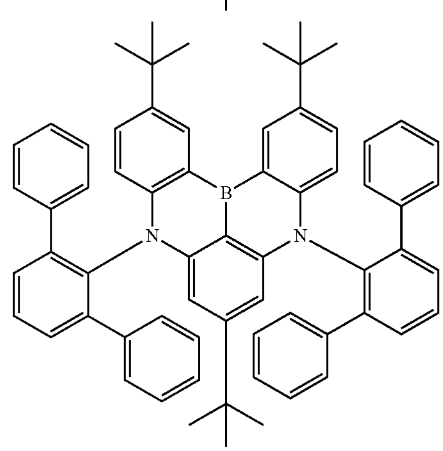

-continued
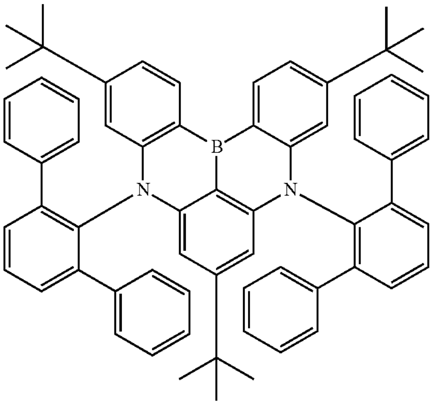
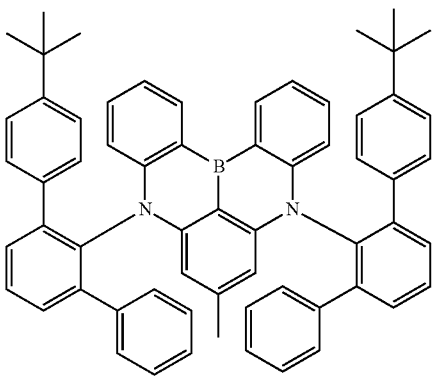
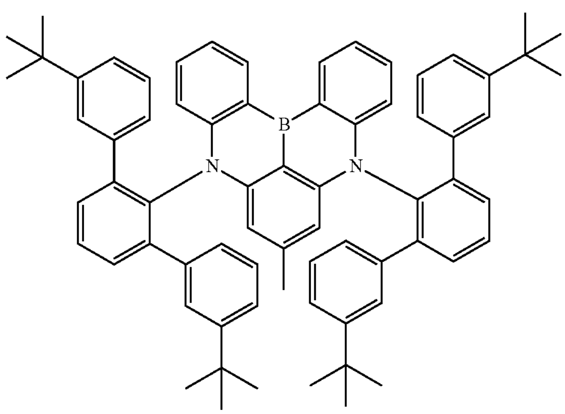
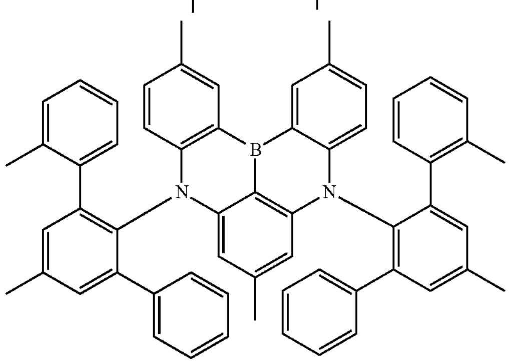
-continued
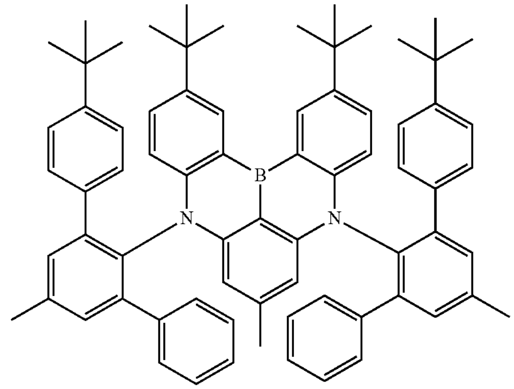
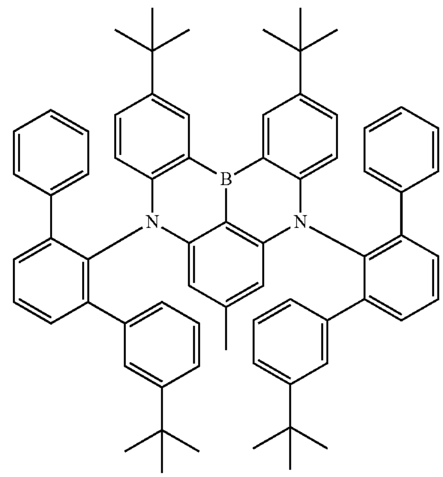
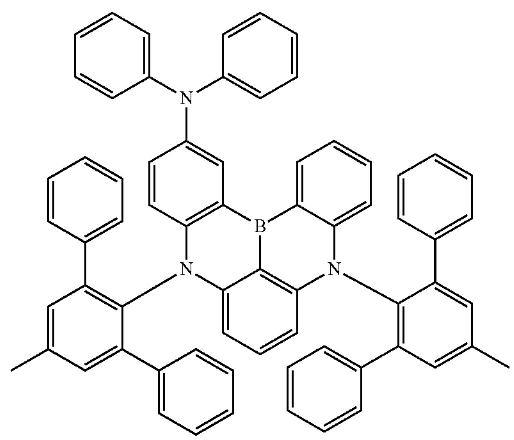
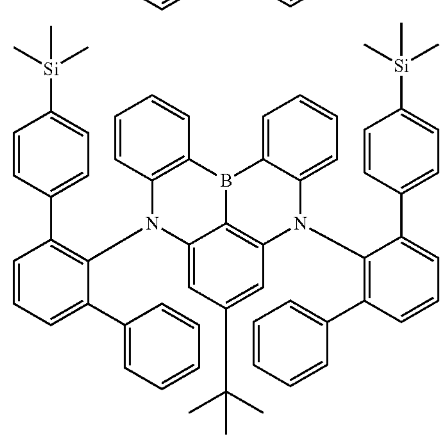

-continued
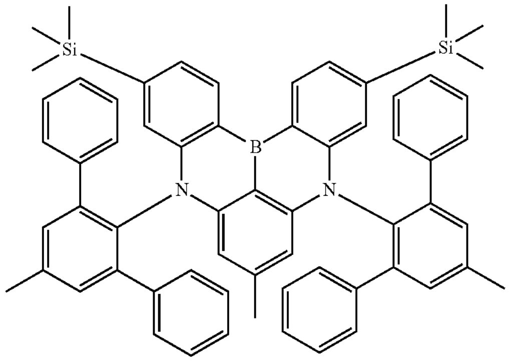
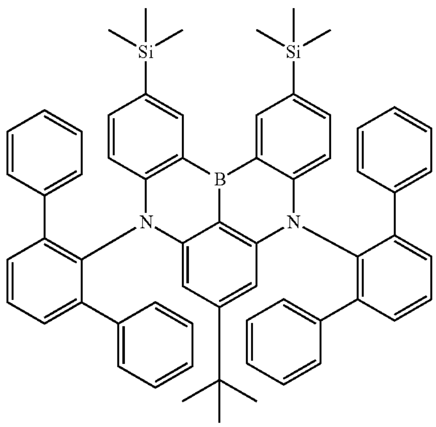
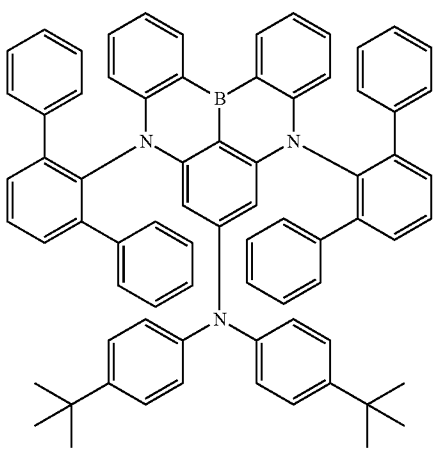
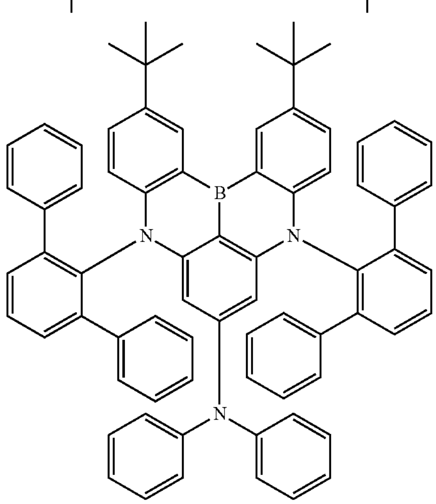
-continued
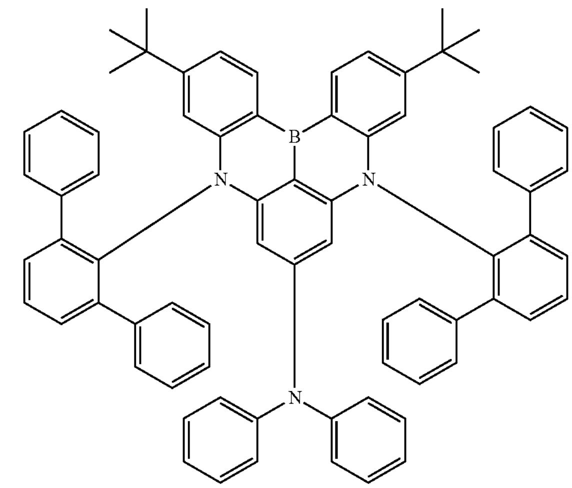
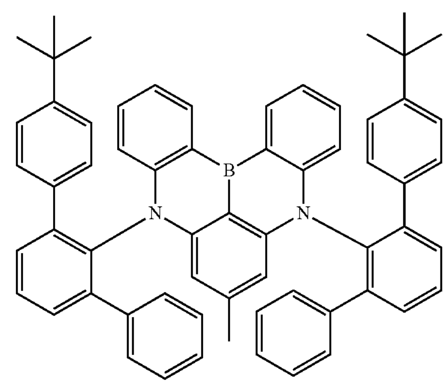
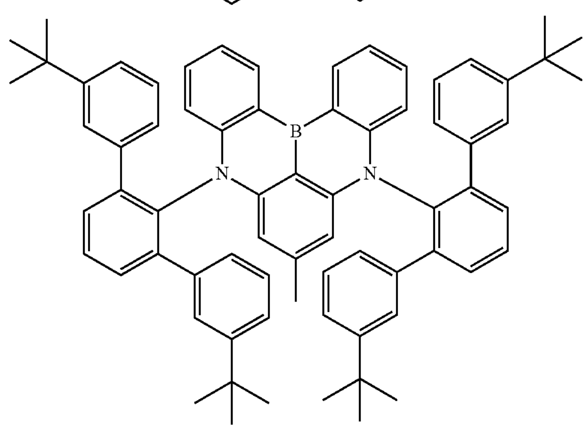
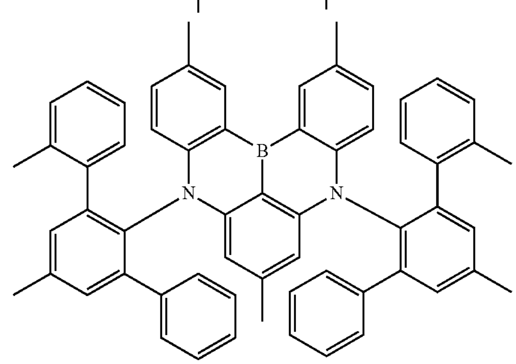

-continued
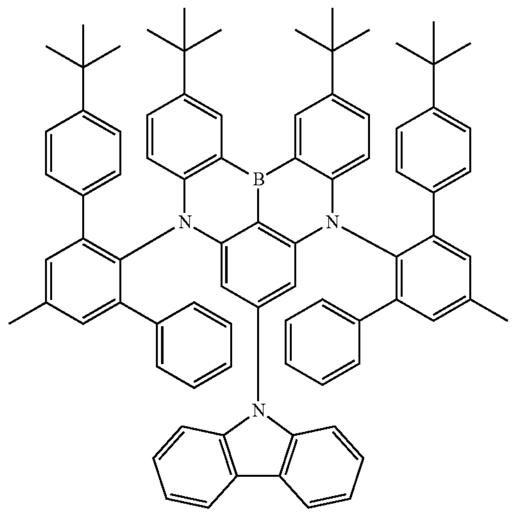
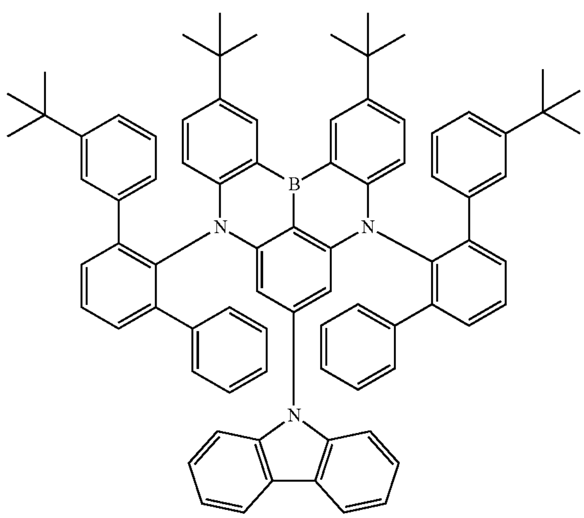
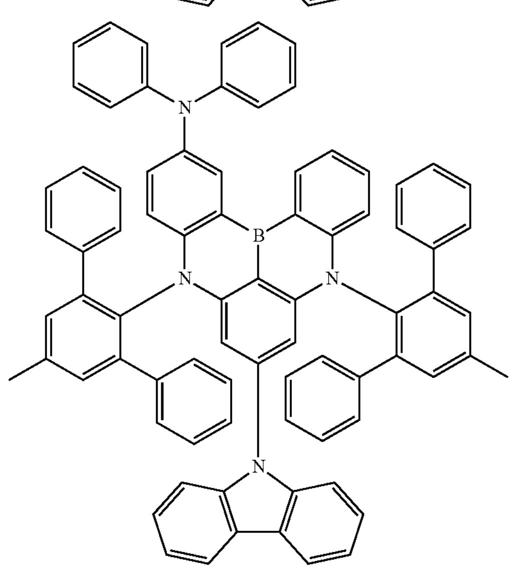
-continued
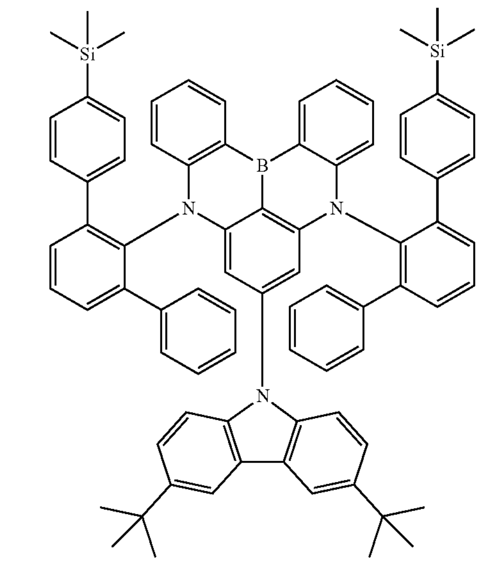
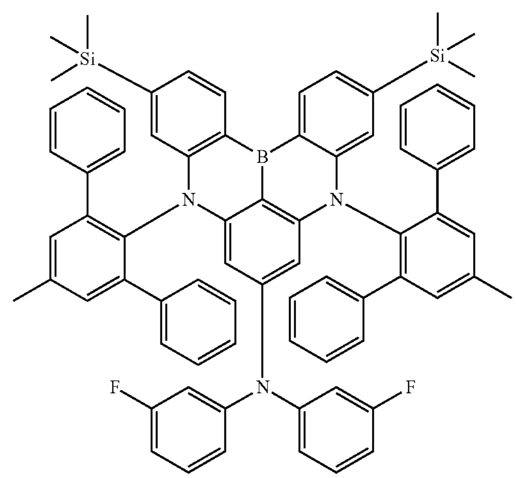
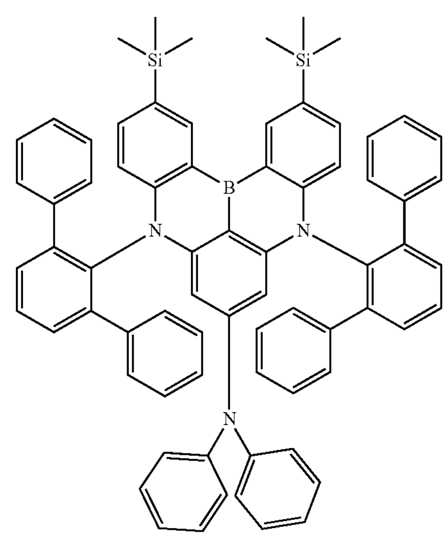

-continued
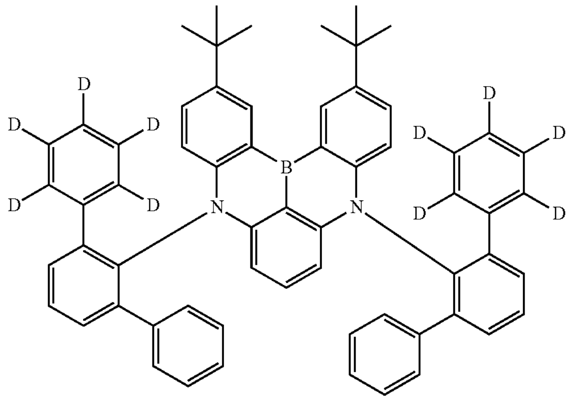
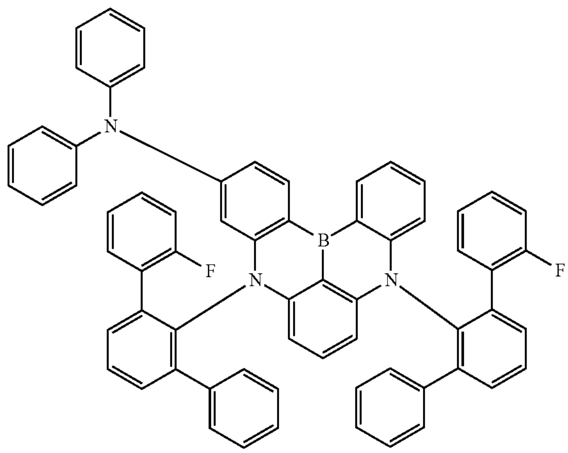
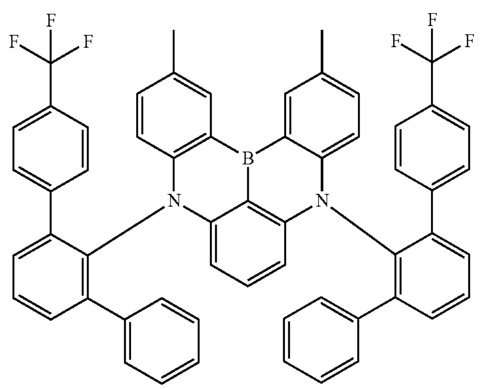
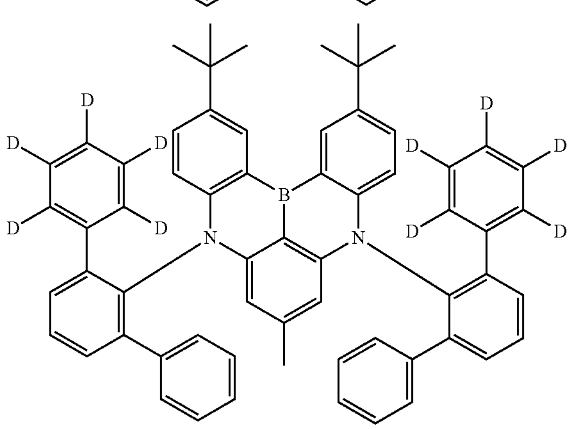
-continued
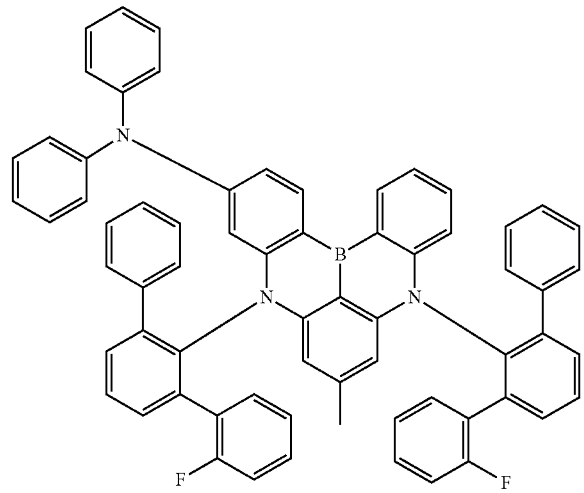
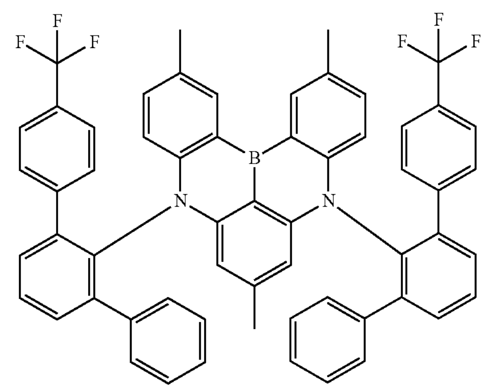
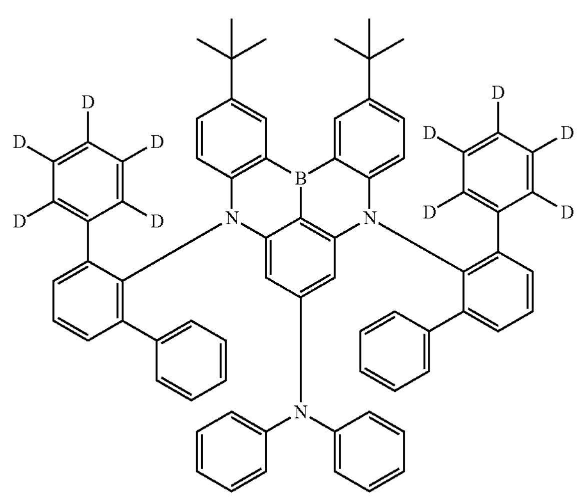

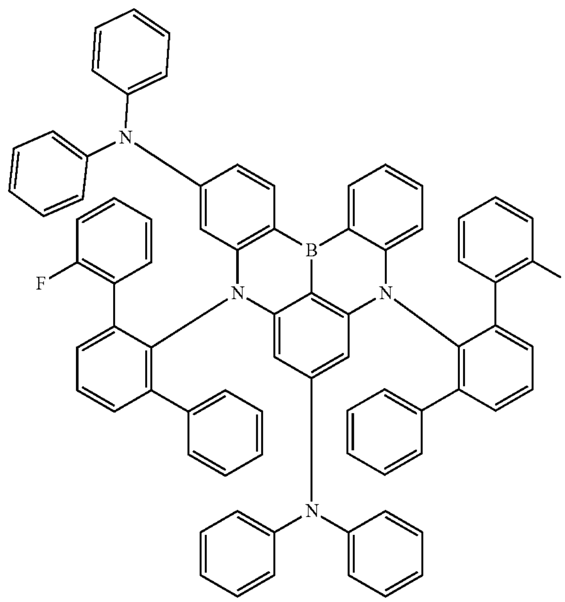
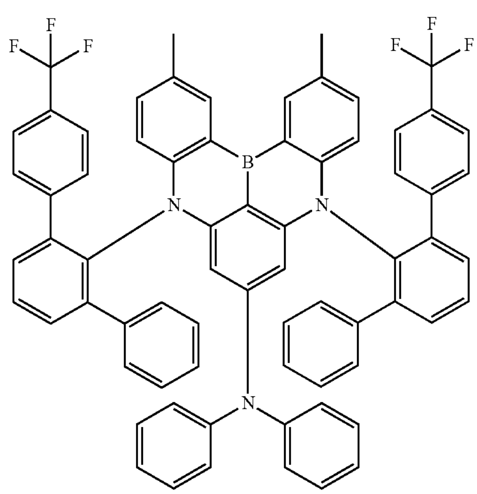
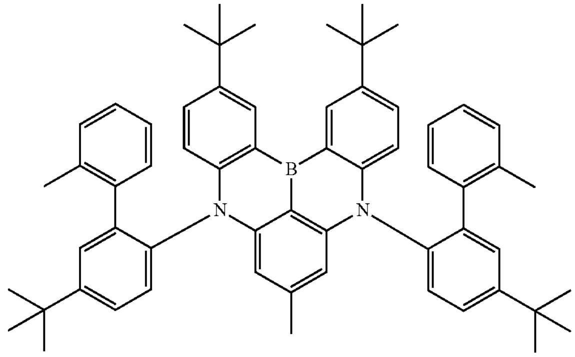
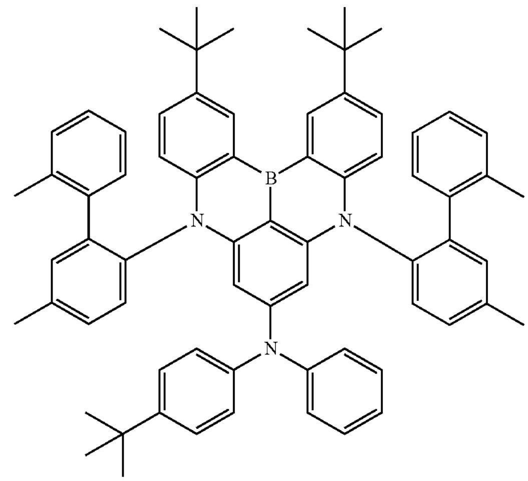
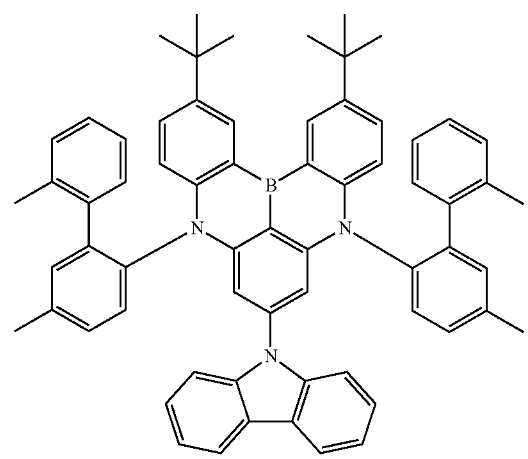
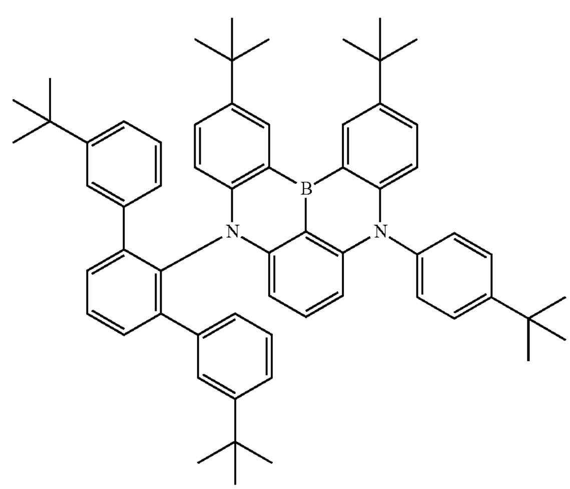

-continued

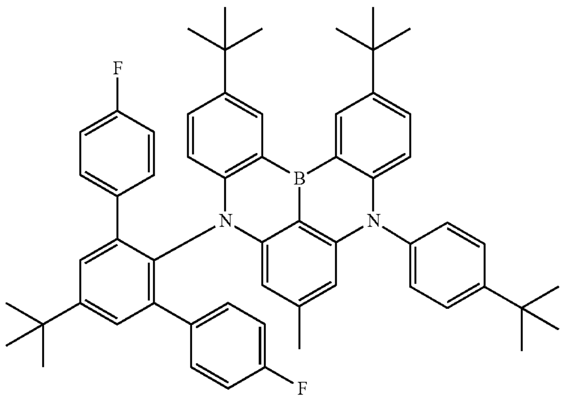

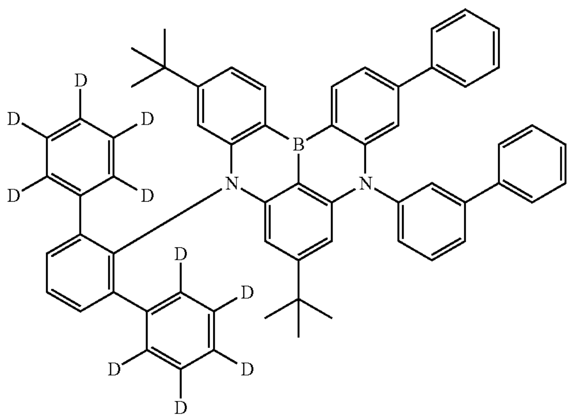

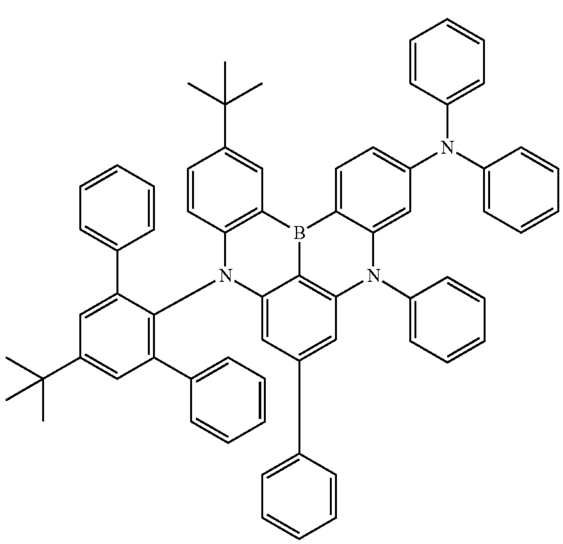

-continued

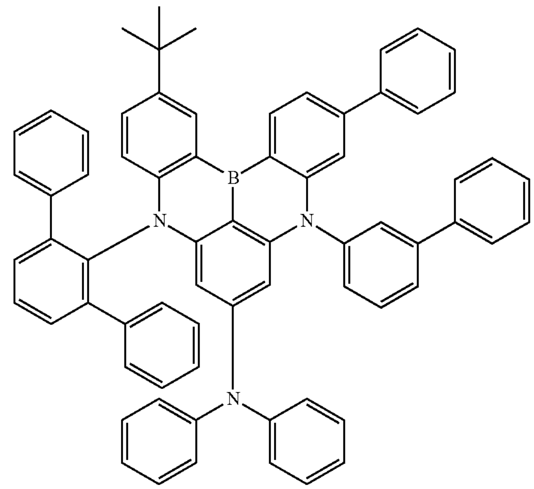

4. The compound of claim 1, wherein the compound of Formula 1 has a triplet energy-singlet energy value ($\Delta E_{ST}$) of 0.4 eV or less.

5. The compound of claim 1, wherein the compound of Formula 1 has a maximum emission peak of 420 nm to 470 nm.

6. An organic light emitting device comprising:

a first electrode;

a second electrode provided to face the first electrode; and an organic material layer having one or more layers provided between the first electrode and the second electrode, wherein one or more layers of the organic material layer comprise the compound of claim 1.

7. The organic light emitting device of claim 6, wherein the organic material layer comprises a hole injection layer or a hole transport layer, and the hole injection layer or the hole transport layer comprises the compound.

8. The organic light emitting device of claim 6, wherein the organic material layer comprises an electron transport layer or an electron injection layer, and the electron transport layer or the electron injection layer comprises the compound.

9. The organic light emitting device of claim 6, wherein the organic material layer comprises a light emitting layer, and the light emitting layer comprises the compound.

10. The organic light emitting device of claim 6, wherein the organic material layer comprises a light emitting layer, and the light emitting layer comprises the compound as a dopant of the light emitting layer.

11. The organic light emitting device of claim 10, wherein the light emitting layer further comprises, as a host, a compound of Formula 1-A:

Formula 1-A

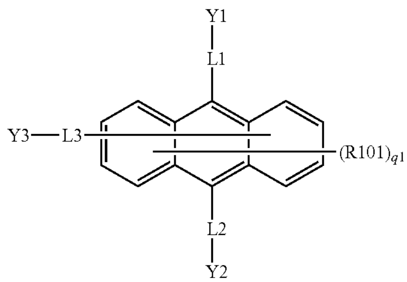

wherein in Formula 1-A:

Y1 to Y3 are the same as or different from each other, and are each independently hydrogen, a substituted or unsubstituted aryl group, or a substituted or unsubstituted heterocyclic group;

L1 to L3 are the same as or different from each other, and are each independently a direct bond, a substituted or unsubstituted arylene group, or a substituted or unsubstituted heteroarylene group;

R101 is hydrogen, deuterium, a halogen group, a cyano group, a nitro group, a substituted or unsubstituted silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group; and q1 is an integer from 0 to 7, and when q1 is 2 or more, two or more R101s are the same as or different from each other.

12. The organic light emitting device of claim 10, wherein the light emitting layer further comprises, as a host, two or more of compounds of the following Formulae 1-B and 1-C:

Formula 1-B

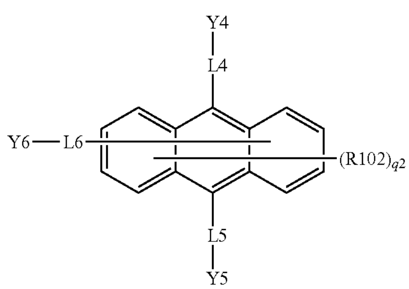

[Formula 1-C]

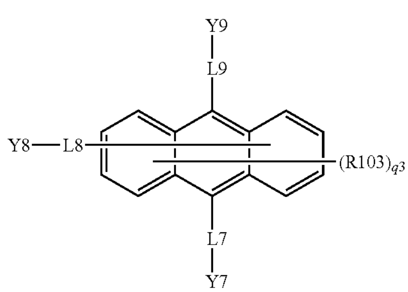

wherein in Formulae 1-B and 1-C:

Y4, Y5, Y6, and Y8 are the same as or different from each other, and are each independently hydrogen or a substituted or unsubstituted aryl group;

Y7 is a substituted or unsubstituted aryl group or a substituted or unsubstituted heterocyclic group;

Y9 is a substituted or unsubstituted heterocyclic group;

L4 to L9 are the same as or different from each other, and are each independently a direct bond, a substituted or unsubstituted arylene group, or a substituted or unsubstituted heteroarylene group;

R102 and R103 are the same as or different from each other, and are each independently hydrogen, deuterium, a halogen group, a cyano group, a nitro group, a substituted or unsubstituted silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group; and q2 and q3 are each an integer from 0 to 7, and when q2 and q3 are each 2 or more, two or more substituents in the parenthesis are the same as or different from each other.

13. The compound of claim 2 that is any one of the following compounds:

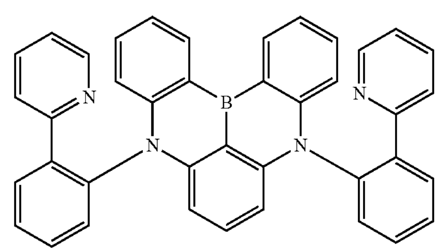

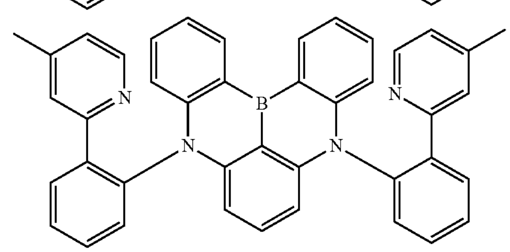

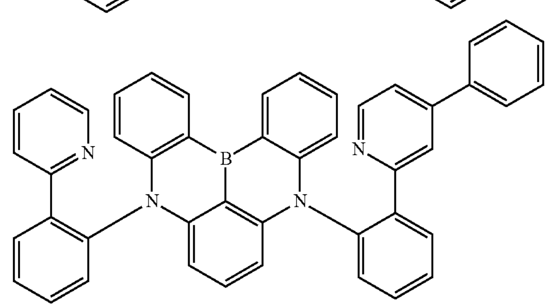

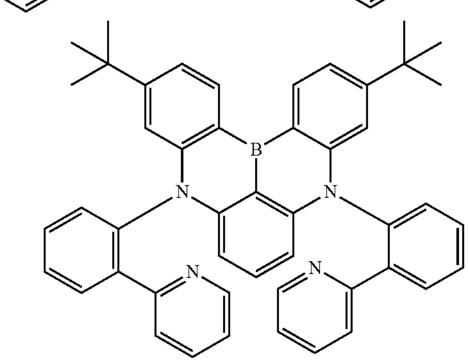

-continued
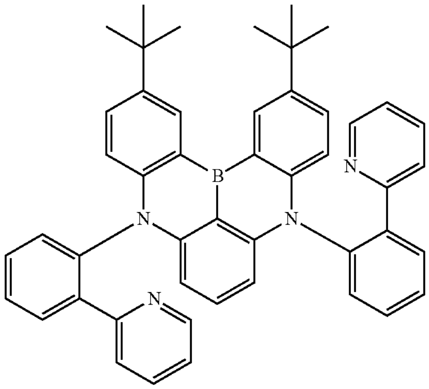
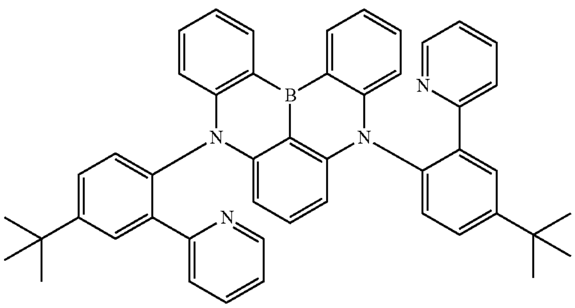
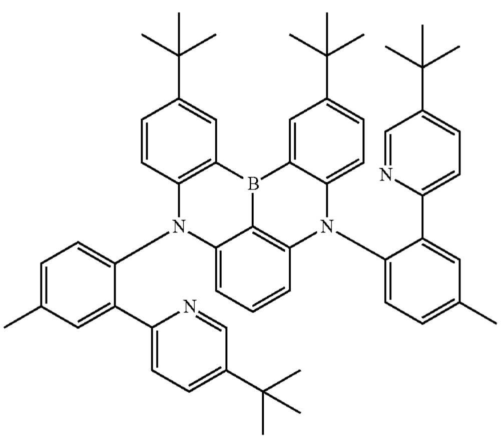
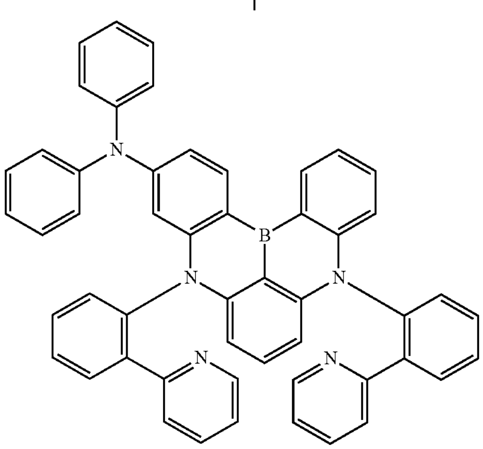
-continued
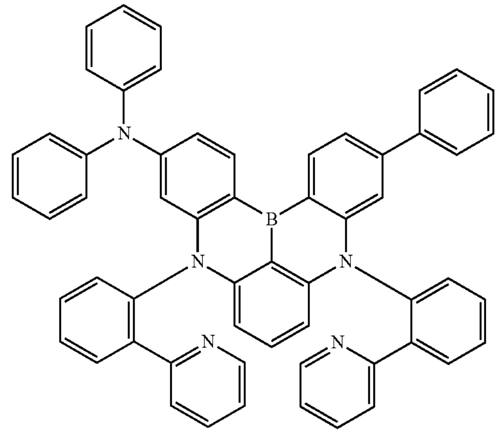
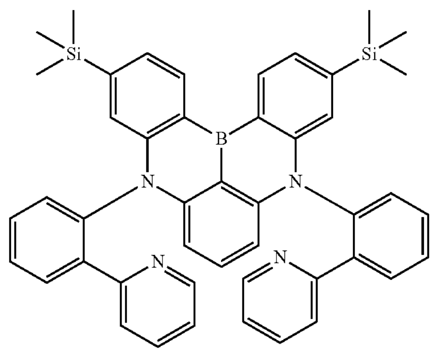
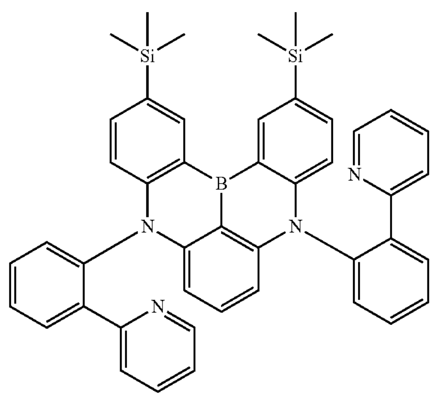
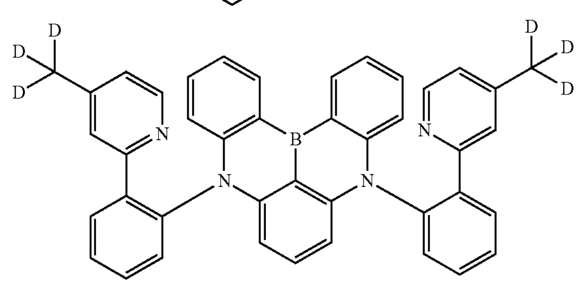
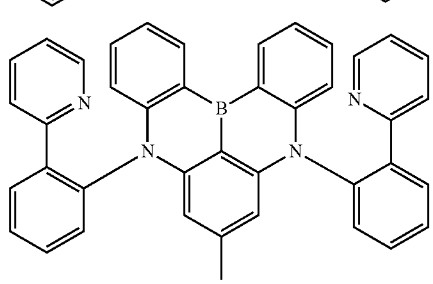

-continued
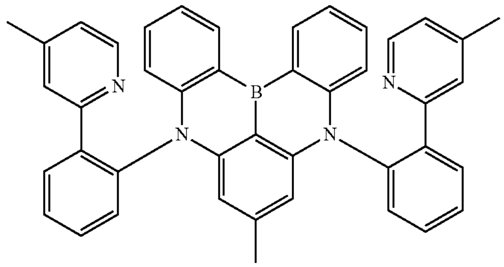
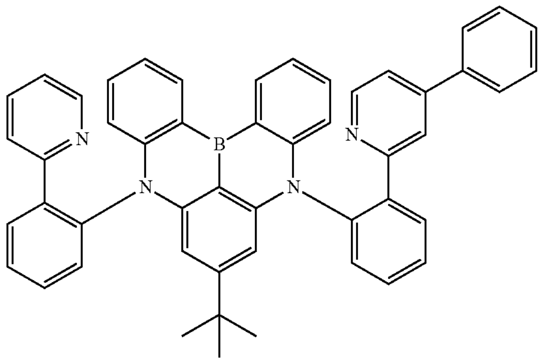
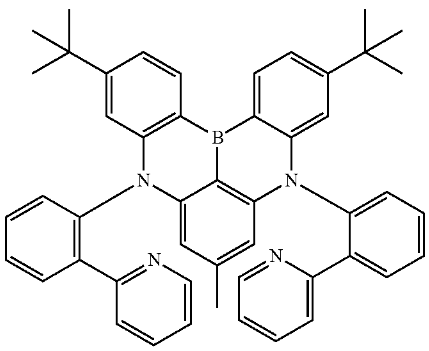
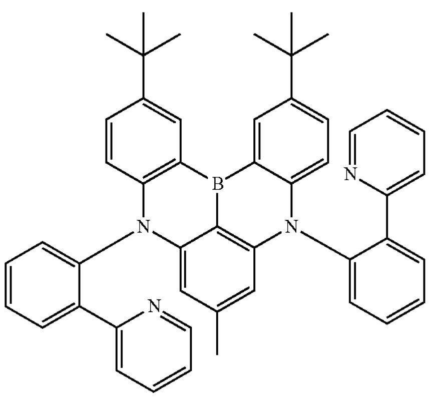
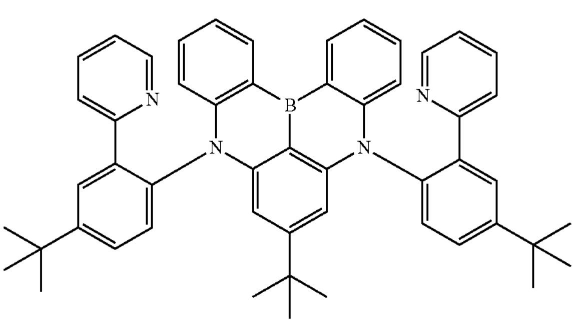
-continued
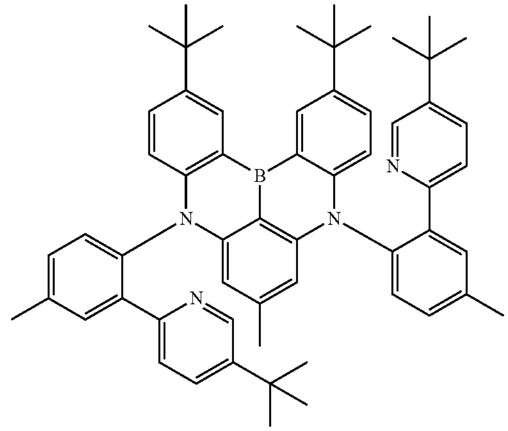
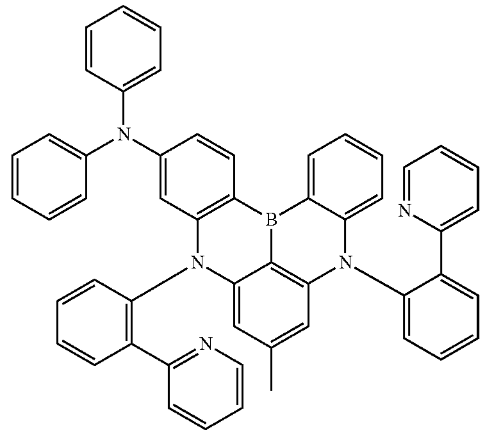
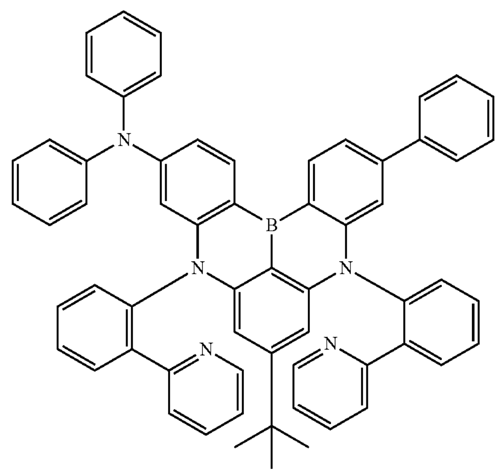
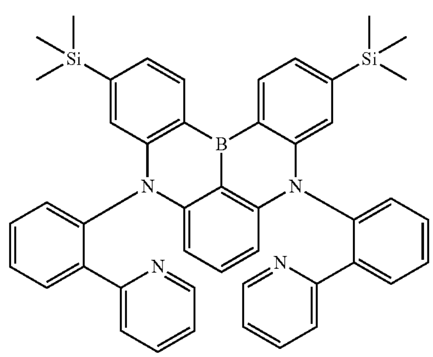

-continued
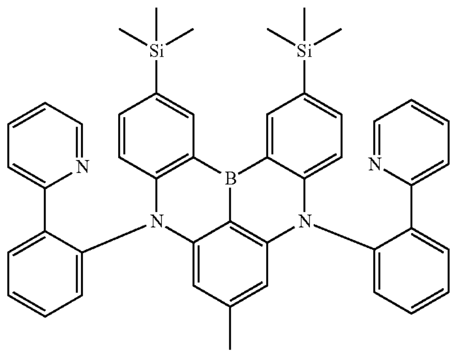
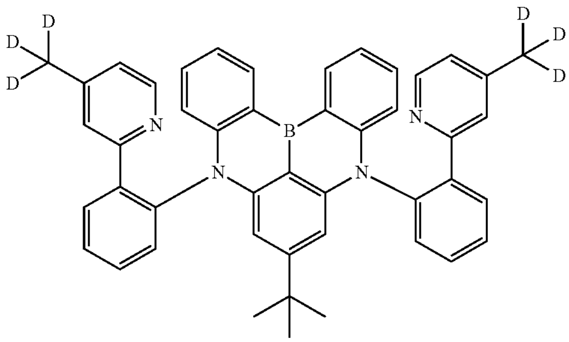
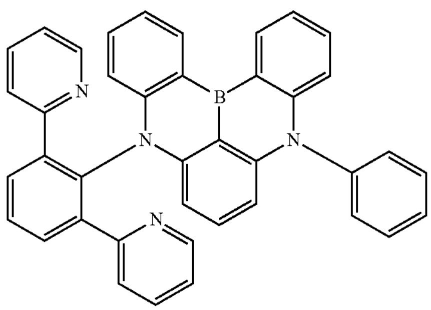
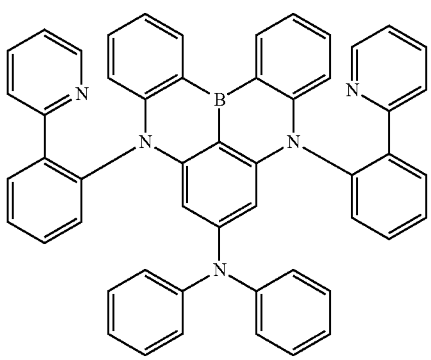
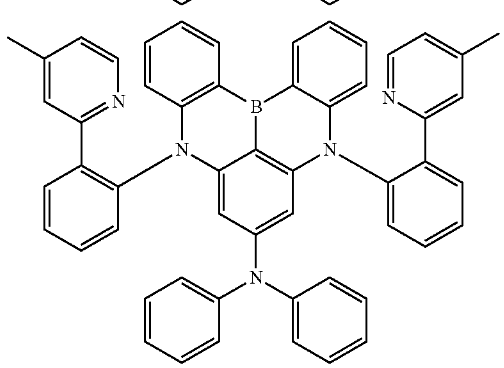
-continued
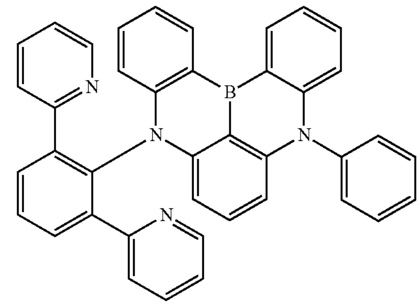
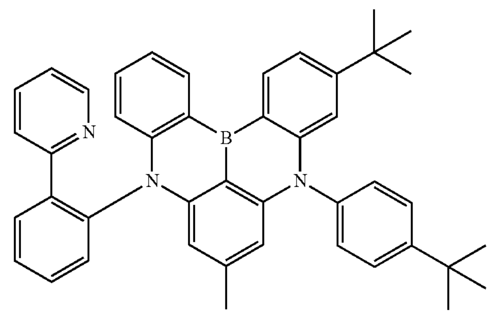
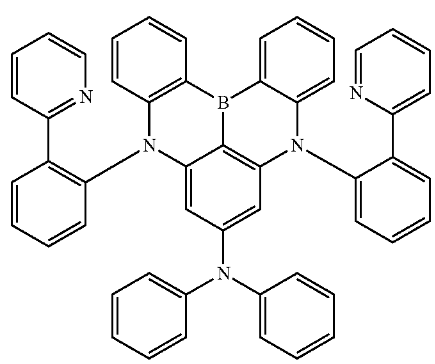
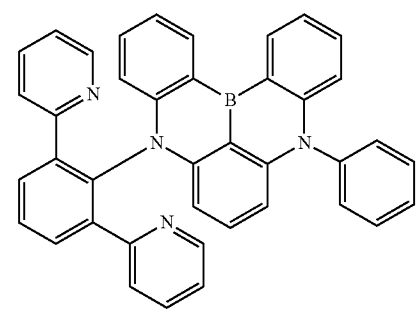
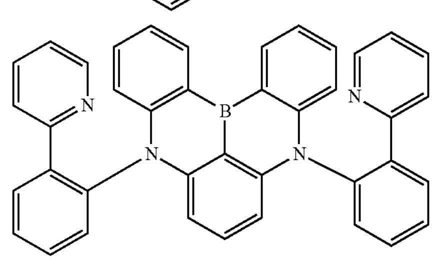

-continued

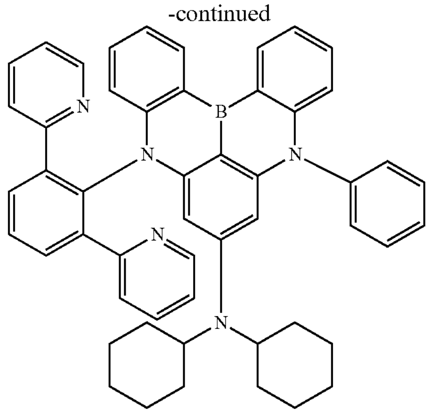

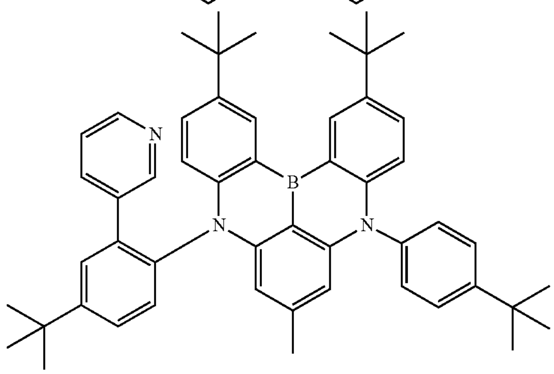

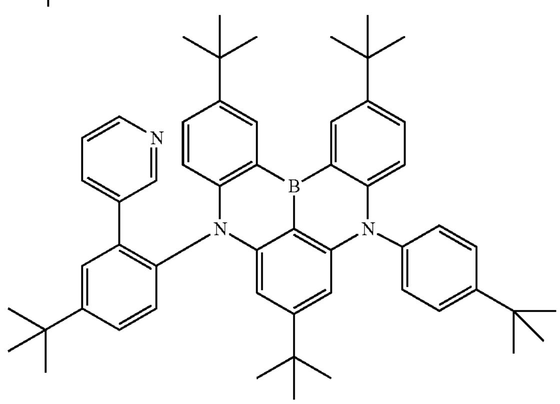

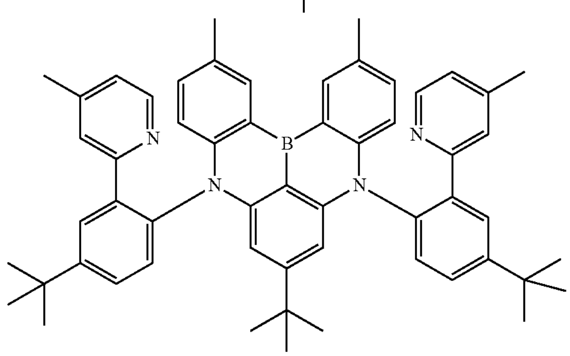

14. An organic light emitting device comprising:

a first electrode;

a second electrode provided to face the first electrode; and an organic material layer having one or more layers provided between the first electrode and the second electrode, wherein one or more layers of the organic material layer comprise the compound of claim 2.

15. The organic light emitting device of claim 14, wherein:

the organic material layer comprises a hole injection layer or a hole transport layer, and the hole injection layer or the hole transport layer comprises the compound; or the organic material layer comprises an electron transport layer or an electron injection layer, and the electron transport layer or the electron injection layer comprises the compound; or the organic material layer comprises a light emitting layer, and the light emitting layer comprises the compound.

16. The organic light emitting device of claim 14, wherein the organic material layer comprises a light emitting layer, and the light emitting layer comprises the compound as a dopant of the light emitting layer.

17. The organic light emitting device of claim 16, wherein the light emitting layer further comprises, as a host, a compound of Formula 1-A:

Formula 1-A

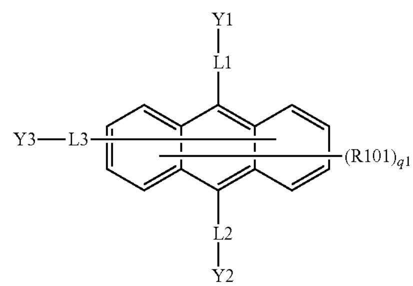

wherein in Formula 1-A:

Y1 to Y3 are the same as or different from each other, and are each independently hydrogen, a substituted or unsubstituted aryl group, or a substituted or unsubstituted heterocyclic group;

L1 to L3 are the same as or different from each other, and are each independently a direct bond, a substituted or unsubstituted arylene group, or a substituted or unsubstituted heteroarylene group;

R101 is hydrogen, deuterium, a halogen group, a cyano group, a nitro group, a substituted or unsubstituted silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group; and q1 is an integer from 0 to 7, and when q1 is 2 or more, two or more R101s are the same as or different from each other.

18. The organic light emitting device of claim 16, wherein the light emitting layer further comprises, as a host, two or more of compounds of the following Formulae 1-B and 1-C:

Formula 1-B

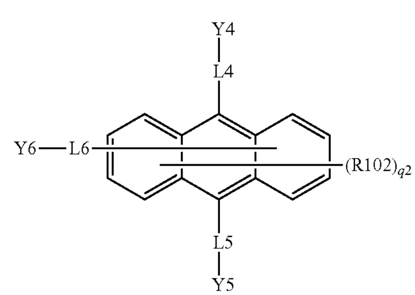

-continued

[Formula 1-C]

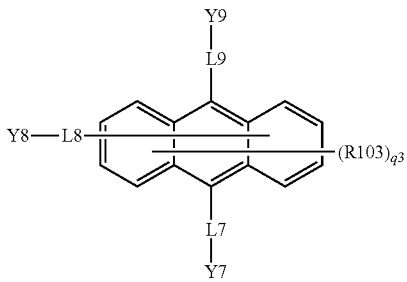

wherein in Formulae 1-B and 1-C:

Y4, Y5, Y6, and Y8 are the same as or different from each other, and are each independently hydrogen or a substituted or unsubstituted aryl group;

Y7 is a substituted or unsubstituted aryl group or a substituted or unsubstituted heterocyclic group;

Y9 is a substituted or unsubstituted heterocyclic group;

L4 to L9 are the same as or different from each other, and are each independently a direct bond, a substituted or unsubstituted arylene group, or a substituted or unsubstituted heteroarylene group;

R102 and R103 are the same as or different from each other, and are each independently hydrogen, deuterium, a halogen group, a cyano group, a nitro group, a substituted or unsubstituted silyl group, a substituted or unsubstituted alkyl group, a substituted or unsubstituted cycloalkyl group, a substituted or unsubstituted phosphine oxide group, a substituted or unsubstituted aryl group, or a substituted or unsubstituted heterocyclic group; and q2 and q3 are each an integer from 0 to 7, and when q2 and q3 are each 2 or more, two or more substituents in the parenthesis are the same as or different from each other.

* * * * *